(12) United States Patent
Jin et al.

(10) Patent No.: US 7,875,872 B2
(45) Date of Patent: Jan. 25, 2011

(54) BISTABLE RESISTANCE VALUE ACQUISITION DEVICE, MANUFACTURING METHOD THEREOF, METAL OXIDE THIN FILM, AND MANUFACTURING METHOD THEREOF

(75) Inventors: Yoshito Jin, Kanagawa (JP); Hideaki Sakai, Kanagawa (JP); Masaru Shimada, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 12/712,024

(22) Filed: Feb. 24, 2010

(65) Prior Publication Data
US 2010/0190033 A1  Jul. 29, 2010

Related U.S. Application Data

(62) Division of application No. 10/566,522, filed on Jan. 27, 2006, now Pat. No. 7,696,502.

(51) Int. Cl.
*H01L 29/02* (2006.01)

(52) U.S. Cl. .................. 257/2; 257/E29.002; 438/102; 438/103; 365/163; 365/1

(58) Field of Classification Search ............. 257/1–5, 257/E29.002; 438/102–103; 365/163
See application file for complete search history.

(56) References Cited

U.S. PATENT DOCUMENTS

| | | | |
|---|---|---|---|
| 3,795,977 A | 3/1974 | Berkenblit et al. | |
| 3,796,926 A | 3/1974 | Cole et al. | |
| 5,811,181 A | * 9/1998 | Kijima et al. | 428/328 |
| 7,099,141 B1 | * 8/2006 | Kaufman et al. | 361/311 |
| 2005/0111256 A1 | * 5/2005 | Bednorz et al. | 365/177 |

FOREIGN PATENT DOCUMENTS

| | | |
|---|---|---|
| DE | 101 04 611 A1 | 8/2002 |
| EP | 1 335 417 A2 | 8/2003 |
| EP | 1 628 352 A1 | 2/2006 |
| JP | 49-034390 B | 9/1974 |
| JP | 50-004986 A | 1/1975 |
| JP | 07-263646 A | 10/1995 |

(Continued)

OTHER PUBLICATIONS

Beck et al.("Reproducible switching effect in thin oxide films for memory applications" Applied Physics Letters, vol. 77, No. 1, Jul. 2000, p. 139).*

(Continued)

*Primary Examiner*—Bradley K Smith
*Assistant Examiner*—Jami M Valentine
(74) *Attorney, Agent, or Firm*—Blakely, Sokoloff, Taylor & Zafman LLP

(57) ABSTRACT

A ferroelectric layer (104) is sandwiched between a lower electrode layer (103) and an upper electrode (105). When a predetermined voltage (DC or pulse) is applied between the lower electrode layer (103) and the upper electrode (105) to change the resistance value of the ferroelectric layer (104) to switch a stable high resistance mode and low resistance mode, a memory operation is obtained. A read can easily be done by reading a current value when a predetermined voltage is applied to the upper electrode (105).

1 Claim, 66 Drawing Sheets

FOREIGN PATENT DOCUMENTS

| | | |
|---|---|---|
| JP | 07-326683 | 12/1995 |
| JP | 08-031960 A | 2/1996 |
| JP | 08-161933 A | 6/1996 |
| JP | 08-306806 A | 11/1996 |
| JP | 08306806 * | 11/1996 |
| JP | 09-092792 | 4/1997 |
| JP | 2779997 B | 5/1998 |
| JP | 10-152397 A | 6/1998 |
| JP | 10-152398 A | 6/1998 |
| JP | 2814416 B | 8/1998 |
| JP | 10-341002 | 12/1998 |
| JP | 11-231349 | 8/1999 |
| JP | 2001-237387 | 8/2001 |
| JP | 2003-077911 A | 3/2003 |
| JP | 2005-167064 | 6/2005 |
| JP | 2005-347468 | 12/2005 |
| JP | 2006-019444 | 1/2006 |
| KR | 0055794 | 5/1992 |
| WO | WO 00/49659 A1 | 8/2000 |

OTHER PUBLICATIONS

Watanabe et al ("Current-driven insulator-conductor transition and nonvolatile memory in chromium-doped SrTiO3 single crystals" Applied Physics Letters, vol. 78, No. 23, Jun. 2001 p. 3738).*

Rossel et al ("Electrical current distribution across a metal-insulator-metal structure during bistable switching", Journal of Applied Physics, vol. 90, No. 6, Sep. 2001, p. 2892).*

Sze, "Physics of Semiconductor Devices", Jhon Wiley and Sons, Inc., 1981.

Matsuoka, "Applied Physics", vol. 73 No. 9, pp. 1166, 2004, Abstract.

"Development and Application of Ferroelectric Materials", edited by Tadashi Shiosaki, CMC Co., Ltd, Abstract.

Inomata et al., "MRM Technology—from Fundamentals to LSI Applications", SIPEC Abstract.

Amazawa et al., "Ultrathin oxidefilms deposited using electron cyclotron resonance sputter", J. Vac. Sci. Technol., B 17, No. 5.

Matsuoka et al., "Low-temperature epitaxial growth of BaTiO3 films by radio-frequency-mode electron cyclotron re3sonance sputtering", J. Appl. Phys., 76(3), 1768 (1994).

Watazu et al., "Powder and Powder Metallurgy ", No. 44, pp. 86, 1997, Abstract.

Masumoto et al., "Preparation of Bi4Ti3O12 films on a single-crystal sapphire substrate with electron cyclotron resonance plasma sputtering", Appl. Phys. Lett., 58, 243 (1991).

Yamaguchi et al., "Effect of Grain Size on Bi4Ti3O12 Thin Film Properties", Jpn. J. Appl. Phys., vol. 37, (1998) pp. 5166-5170.

Wild et al., "Hafnium and Zirconium silicates for advanced gate dielectrics", J. Appl. Phys., vol. 87, No. 1, Jan. 2000, pp. 484-492.

* cited by examiner

FIG. 7D
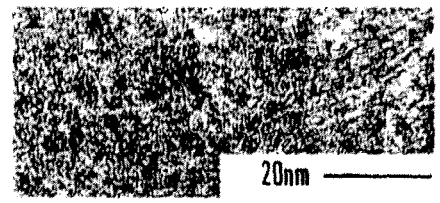
FIG. 7d
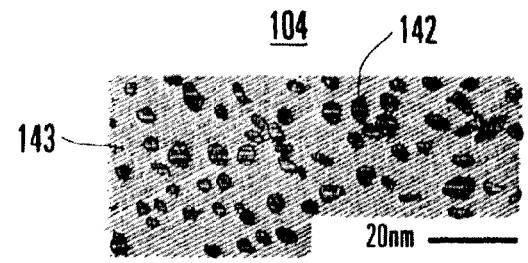
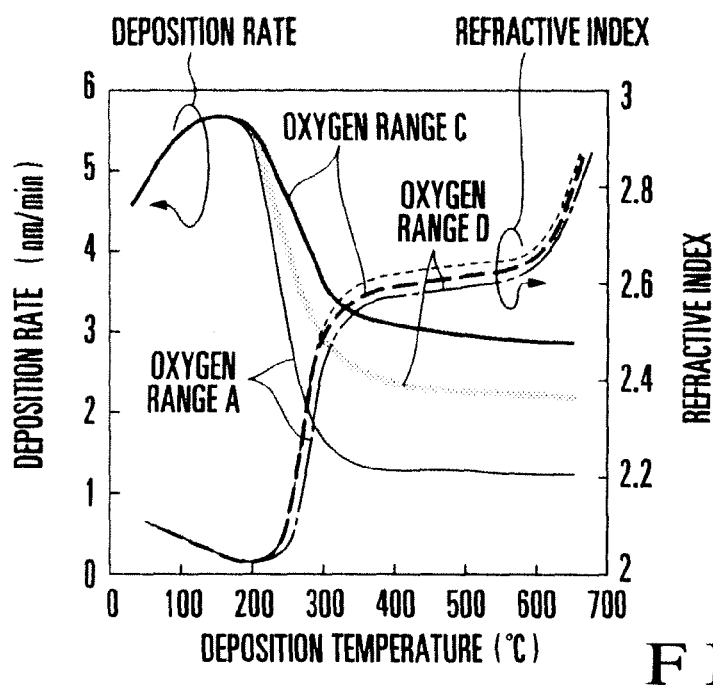
FIG. 8
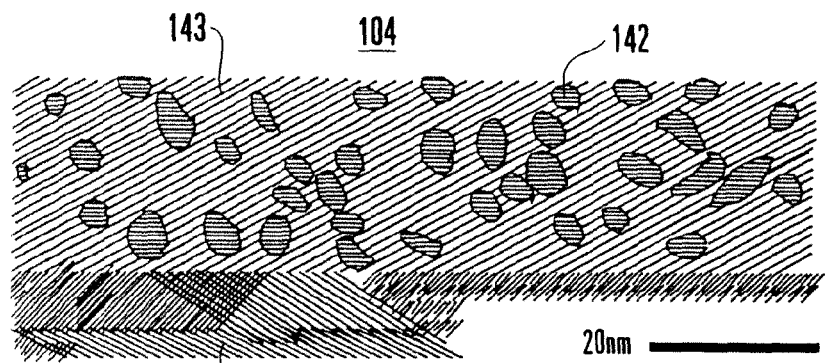
FIG. 9

| NUMBER OF PULSES | 1 | 2 | 3 | 4 | 5 |
|---|---|---|---|---|---|
| PULSE VOLTAGE (V) | +3 | -3 | +3 | +1.5 | +3 |
| PULSE WIDTH (μsec) | 10 | 10 | 10 | 10 | 10 |
| STATE | 「1」 | 「0」 | 「2」 | 「1」 | 「2」 |

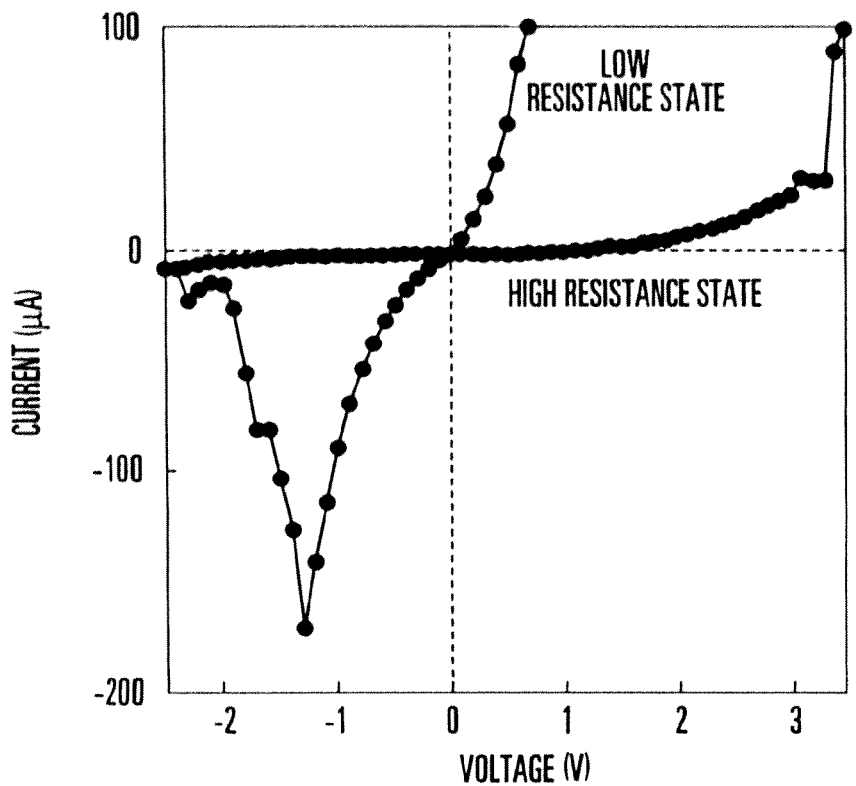
F I G. 23
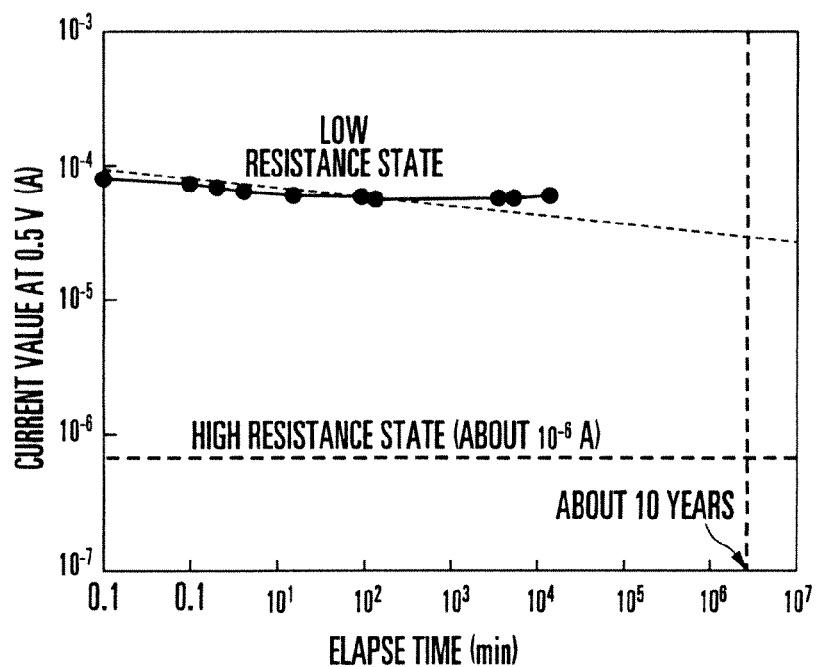
F I G. 24

| NUMBER OF PULSES | 1 | 2 | 3 | 4 | 5 |
|---|---|---|---|---|---|
| PULSE VOLTAGE (V) | -3 | +3 | -3 | -1.5 | -3 |
| PULSE WIDTH (μsec) | 10 | 10 | 10 | 10 | 10 |
| STATE | 「1」 | 「0」 | 「2」 | 「1」 | 「2」 |
FIG. 95
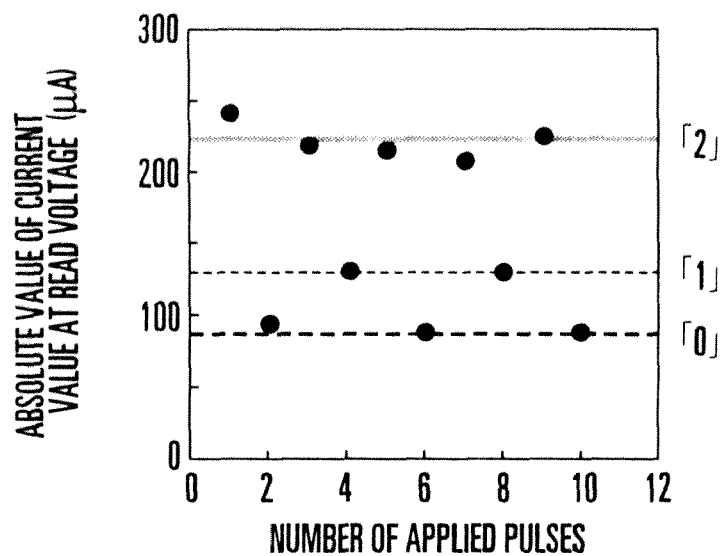
FIG. 96
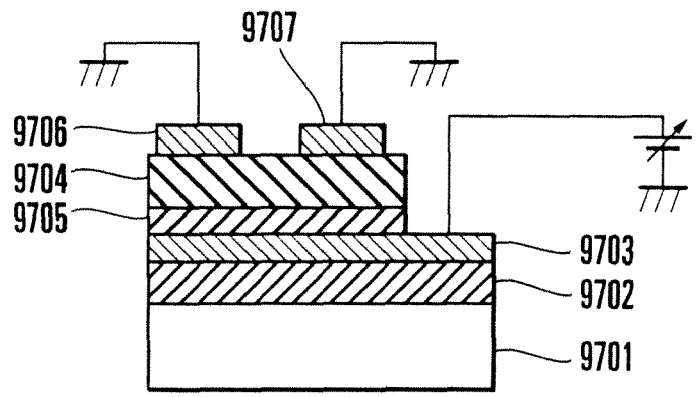
FIG. 97A

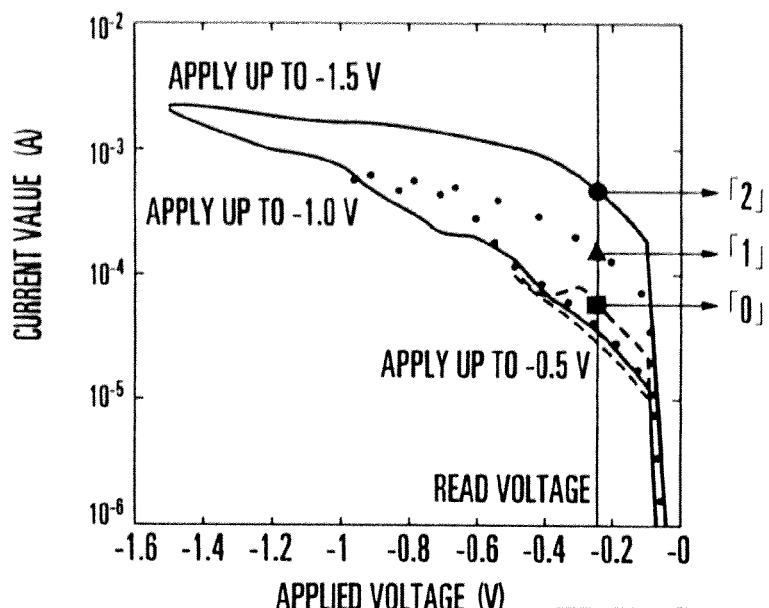
FIG. 116
| NUMBER OF PULSES | 1 | 2 | 3 | 4 | 5 |
|---|---|---|---|---|---|
| PULSE VOLTAGE (V) | -3 | +3 | -3 | -1.5 | -3 |
| PULSE WIDTH (μsec) | 10 | 10 | 10 | 10 | 10 |
| STATE | 「1」 | 「0」 | 「2」 | 「1」 | 「2」 |
FIG. 117
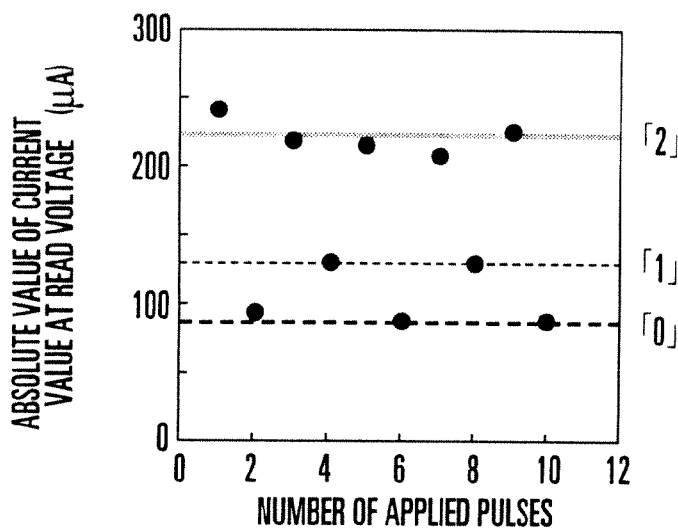
FIG. 118

BISTABLE RESISTANCE VALUE ACQUISITION DEVICE, MANUFACTURING METHOD THEREOF, METAL OXIDE THIN FILM, AND MANUFACTURING METHOD THEREOF

CROSS-REFERENCE TO RELATED APPLICATION

The present patent application is a Divisional application claiming the benefit of application Ser. No. 10/566,522, filed Jan. 27, 2006 now U.S. Pat. No. 7,696,502.

TECHNICAL FIELD

The present invention relates to a bistable resistance value acquisition device and manufacturing method thereof and a metal oxide thin film and manufacturing method thereof.

BACKGROUND ART

Research and development aimed at a wider multimedia information society, and more particularly, realization of a ubiquitous service are flourishing. Especially, a device (to be referred to as a memory hereinafter) which is mounted in a network equipment or information terminal to record information is an important key device. The memory mounted in a ubiquitous terminal is required to implement a high-speed operation, long-term holding, environmental resistance, and low power consumption. In addition, a function of inhibiting any erase of stored information even in a power-off state, i.e., nonvolatility is indispensable.

Conventionally, semiconductor devices are widely used as memories. One of the widely used memories is a DRAM (Dynamic Random Access Memory). The unit storage element (to be referred to as a memory cell hereinafter) of a DRAM includes one storage capacitor and one MOSFET (Metal-Oxide-Semiconductor Field Effect Transistor). A voltage corresponding to the state of charges stored in the storage capacity of a selected memory cell is extracted from a bit line as "on" or "off" of an electrical digital signal, thereby reading out stored data (S. M. Sze, "Physics of Semiconductor Devices", John Wiley and Sons, Inc., 1981, and Fujio Masuoka, "Applied Physics", Vol. 73, No. 9, p. 1166, 2004).

In the power-off state, however, the DRAM cannot maintain the state of the storage capacitor, and the stored information is erased. In other words, the DRAM is a volatile memory device. Additionally, since the DRAM requires a refresh operation to rewrite data, as is well known, the operation speed is low.

As a nonvolatile memory having the function of inhibiting volatilization of data even in the power-off state, a ROM (Read Only Memory) is well known. However, this memory cannot erase or change recorded data. As a rewritable nonvolatile memory, a flash memory using an EEPROM (Electrically Erasable Programmable Read Only Memory) has been developed (Japanese Patent Laid-Open No. 8-031960, and Fujio Masuoka, "Applied Physics", Vol. 73, No. 9, p. 1166, 2004). The flash memory is used in various fields as a practical nonvolatile memory.

In a memory cell of a typical flash memory, the gate electrode portion of the MOSFET has a stacked gate structure including a plurality of layers with a control gate electrode and floating gate electrode. The flash memory enables data recording by using a phenomenon that the threshold value of the MOSFET changes depending on the amount of charges stored in the floating gate.

The data write of the flash memory is done on the basis of a phenomenon that hot carriers generated by applying a high voltage to the drain region move over the energy barrier of the gate insulating film. When charges (generally, electrons) are injected from the semiconductor substrate to the floating gate by applying a high field to the gate insulating film and supplying an F-N (Fowler-Nordheim) tunnel current, data is written. The data is erased by removing charges from the floating gate by applying a high field in a reverse direction to the gate insulating film.

The flash memory requires no refresh operation, unlike the DRAM. However, since the F-N tunnel phenomenon is used, the time necessary for the data write and erase is much longer as compared to the DRAM. In addition, when the data write/erase is repeated, the gate insulating film degrades. Hence, the number of times of writes is limited to some extent.

As a new nonvolatile memory different from the above-described flash memory, a ferroelectric memory (to be referred to as an FeRAM (Ferroelectric RAM) hereinafter) using polarization of a ferroelectric or a ferromagnetic memory (to be referred to as an MRAM (Magnetoresist RAM) hereinafter) using the magnetoresistance of a ferromagnetic has received a great deal of attention and been studied extensively. The FeRAM is already put into practical use and therefore expected to replace not only a portable memory but also a logic DRAM if various problems can be solved.

Examples of the ferromagnetic are an oxide ferroelectric (also called a ferroelectric ceramic), a polymer ferroelectric represented by polyvinylidene fluoride (PVDF), and a fluoride ferroelectric such as $BaMgF_4$. In the oxide ferroelectric and fluoride ferroelectric, polarization reverses due to a slight displacement of atoms which are causing the polarization. On the other hand, in the polymer ferroelectric, polarization reverses as individual molecular chains rotate, whose elementary process is a change in conformation (bonding form) of molecular chains which are bonded long by covalent bond.

Oxide ferroelectrics are classified into perovskite ferroelectrics such as $BaTiO_3$ and $PbTiO_3$, pseudo-ilmenite ferroelectrics such as $LiNbO_3$ and $LiTaO_3$, tungsten-bronze (TB) ferroelectrics such as $PbNb_3O_6$ and $Ba_2NaNb_5O_{15}$, bismuth layer-structured ferroelectrics (BLSF) such as $SrBi_2Ta_2O_9$ and $Bi_4Ti_3O_{12}$, and pyrochlore ferroelectrics such as $La_2Ti_2O_7$.

Polymer ferroelectrics represented by polyvinylidene fluoride (PVDF) also includes P(VDF/TrFF), i.e., a copolymer of vinylidene fluoride (PDV) and ethylene trifluoride and is prepared by polymerization of a polymer. For further information about ferroelectrics, see "Development and Application of Ferroelectric Materials" edited by Tadashi Shiosaki, CMC Co. Ltd.

Of the above-described ferroelectric materials, the oxide ferroelectrics are mainly used for an FeRAM. Of the oxide ferroelectrics, ferroelectrics having a perovskite structure (to be referred to as perovskite ferroelectrics hereinafter) and, more particularly, lead-based ferroelectrics represented by $Pb(Zr,Ti)O_3(PZT)$ are widely used. However, use of lead-containing substances and lead oxides is restricted by the Industrial Safety and Health Law because of concerns about influence on the ecological system and an increase in environmental load. They are therefore being restricted in Europe and U.S.A. from the viewpoint of ecology and pollution control.

Non-lead (lead-free) ferroelectric materials equivalent to the performance of lead-based ferroelectrics have received a great deal of attention on a worldwide basis under the recent necessity for reducing the environmental load. Especially, lead-free perovskite ferroelectrics and bismuth layer-structured ferroelectrics (BLSF) are thought to be most promising. In fact, polarization amounts in these materials are smaller than in the lead-based ferroelectrics, and many unsolved problems still remain in both film formation and process.

FeRAMs that are expected to replace flash memories are mainly classified into stacked memories and FET memories. Stacked FeRAMs are also called 1-transistor/1-capacitor FeRAMs which are categorized in accordance with the structure into FeRAMs with a stacked capacitor as shown in FIG. 127, FeRAMs with a planar capacitor, and FeRAMs with a solid capacitor. The stacked FeRAMs include 1-transistor/1-capacitor FeRAMs and 2-transistor/2-capacitor FeRAMs formed by stacking two 1-transistor/1-capacitor FeRAMs to stabilize the operation.

The stacked FeRAM shown in FIG. 127 comprises, on a semiconductor substrate 12701, a MOS transistor including a source 12702, a drain 12703, and a gate electrode 12705 provided on a gate insulating film 12704. A capacitor including a lower electrode 12711, a dielectric layer 12712 made of a ferroelectric, and an upper electrode 12713 is connected to the source 12702 of the MOS transistor. In the example shown in FIG. 127, the capacitor is connected to the source 12702 by a source electrode 12706. A drain electrode 12707 is connected to the drain 12703. An ammeter is connected to the drain electrode 12707.

This structure has a function of extracting "on" or "off" data by detecting the direction of polarization of the dielectric layer 12712 made of a ferroelectric as a current flowing between the source and drain (channel 12721). The structure has nonvolatility because the polarization of the ferroelectric can be held even without voltage application. In this structure, however, since data is destroyed in the data read, the data must be rewritten, and the speed is therefore low. Additionally, since the area occupied by one element is large, the structure is unsuitable for increasing integration.

In addition to the above-described stacked FeRAMs, FET FeRAMs are expected as FeRAMs of next generation. FET FeRAMs are also called 1-transistor FeRAMs which are categorized in accordance with the structure into MFS (Metal-Ferroelectric-Semiconductor) FeRAMs in which ferroelectric films are arranged in place of the gate electrode of a MOSFET and the gate insulating film in the channel region, MFMIS (Metal-Ferroelectric-Metal-Insulator-Semiconductor) FeRAMs in which a ferroelectric film is arranged on the gate electrode of a MOSFET, and MFIS (Metal-Ferroelectric-Insulator-Semiconductor) FeRAMs as shown in FIG. 128 in which a ferroelectric film is arranged between the gate electrode of a MOSFET and the gate insulating film (Koichiro Inomata, Shuichi Tahara, & Yoshihiro Arimoto, "MRAM Technology—from Fundamentals to LSI Applications", SIPEC).

In the MFIS shown in FIG. 128, a source 12802 and drain 12803 are provided on a semiconductor substrate 12801. A dielectric layer 12805 made of a ferroelectric is provided on a gate insulating film 12804 arranged between the source and drain. A gate electrode 12806 is provided on the dielectric layer 12805. A source voltage is applied to the source 12802 through a source electrode 12807. An ammeter is connected to the drain 12803 through a drain electrode 12808.

In this FeRAM, polarization of a ferroelectric is applied to the operation of a MOSFET. The FeRAM has a function of creating, by the polarization state, a state wherein a channel 12821 is formed in the semiconductor surface immediately under the gate insulating film 12804 and a state wherein no channel is formed, reading the current value between the source and drain, and extracting the state as "on" or "off" of an electrical digital signal.

In the FET FeRAM, nondestructive read is possible owing to the operation principle because the polarization amount of the ferroelectric does not change even when data is read out. Hence, a high-speed operation is expected. Since the occupation area can be reduced as compared to the 1-transistor/1-capacitor FeRAM, the FET FeRAM is advantageous in increasing integration. Actually, of the 1-transistor FeRAMs, the MFIS FeRAM (FIG. 128) has the gate insulating film between the ferroelectric film and the semiconductor, and for this reason, a polarization reducing field to cancel the polarization amount of the ferroelectric is generated.

To implement the above-described structure, a high-quality high-K dielectric film having a polarization characteristic and orientation is formed on an insulating film generally made of an amorphous material. It is however difficult to form a ferroelectric with a high orientation on an insulating film by using an existing film formation method to be described later. For this reason, in the MFIS FeRAM manufactured by the conventional technique, polarization cannot hold because of the polarization reducing field, and data cannot be held for a long time. If the quality of the insulating film formed on the semiconductor is poor, the polarization amount of the ferroelectric further decreases due to a leakage current generated by the electric field. For these reasons, the data holding period (data life) of the operation of the current MFIS FeRAM serving as a memory remains about 10 days. It is far from commercialization.

In the MFMIS FeRAM, a ferroelectric can be formed on a crystal metal electrode (generally Pt or $SrRuO_2$). Hence, a high-quality film can be formed because the ferroelectric need not be formed on an insulating film, unlike the MFIS FeRAM structure. However, no method to stably form a ferroelectric on a metal has been proposed yet. Since the decrease in polarization by the polarization reducing field generated by the insulating film on the semiconductor poses a problem even in this case, long-term data holding cannot be implemented.

In the MFS FeRAM, since no insulating film is necessary on the semiconductor, the decrease in polarization by the polarization reducing field can be avoided in principle. However, since a ferroelectric film formation method such as a sol-gel process or MOCVD requires a high film formation temperature, the surface of the semiconductor such as Si is oxidized or deteriorated, resulting in an oxide film or many defects on the interface. If an oxide film (interface oxide film) is consequently formed in the interface between the semiconductor and ferroelectric, a polarization reducing field is generated, like the MFIS FeRAM.

If no interface oxide film but a number of defect levels are formed on the interface, the influence of stored charges becomes large, and no accurate memory operation is performed. If the formed ferroelectric film has a poor quality, the leakage current flows in the film, and the polarization characteristic cannot be held for a long time, as is pointed out in many reports.

In the above-described FeRAMs, formation of an oxide ferroelectric on a substrate is important. Various formation apparatuses and various thin film formation methods have been tested until now. Examples are CSD (Chemical Solution Deposition) including a sol-gel process and MOD (Metal-Organic Deposition), MOCVD (Metal-Organic Chemical Vapor Deposition) or MOVPE, PLD (Pulse Laser Deposition), LSMCD (Liquid Source Misted Chemical Deposition), EPD (Electro-Phoretic Deposition), RF-sputtering (also called RF sputtering or magnetron sputtering), and ECR sputtering (Electron Cyclotron Resonance sputtering).

The mainstream of these film formation methods is the CSD called a sol-gel process or MOD. In the CSD, a film is formed by dissolving the matrix of a ferroelectric in an organic solvent and repeatedly applying and sintering the resultant solution on a substrate. As a characteristic feature, a ferroelectric film with a relatively large area can be formed by a simple method. As is reported from many institutions, the CSD can form a ferroelectric film having an arbitrary composition by controlling the composition of the solution to be applied.

There are however problems that it may be impossible to form a film because of poor wettability of the substrate to which the solution is applied and that the solvent used to prepare the solution may remain in the formed film so no high film quality can be obtained. Additionally, in the CSD, the sintering temperature must be higher than the Curie temperature of the ferroelectric film. If the temperature or atmosphere cannot be controlled well, no high-quality film is obtained at all.

Ferroelectric film formation by methods except the CDS have also been tested. For example, the PLD has attracted attention, in which a ferroelectric film having high quality can be formed by sputtering a target of a ferroelectric material with a strong laser source such as an excimer laser. In this method, however, the area of the laser irradiated portion in the target plane is very small, and the material sputtered and supplied from the small irradiated plane has a large distribution. For this reason, in the PLD, a large in-plane distribution is formed in the thickness or quality of the ferroelectric formed on the substrate. There is also a serious problem in reproducibility because the properties change even under the same formation conditions.

However, these properties are suitable for specifically examining conditions. A combinatorial method has received attention as a method of examining the film formation properties by using the above-described properties. However, from the industrial viewpoint, a method capable of forming a large-area film with good reproducibility is essential. It is difficult to industrially use the current PLD.

In addition to the above-described various film formation methods, a sputtering method (to be also simply referred to as sputtering) has received a great deal of attention as a ferroelectric film formation method. Sputtering is a promising film formation apparatus/method because neither dangerous gas nor toxic gas need be used, and a deposited film can have a relatively good surface roughness (surface morphology). In sputtering, a reactive sputtering apparatus/method is considered as a promising apparatus/method for obtaining a ferroelectric film with a stoichiometric composition, in which any oxygen or nitrogen defect is prevented by supplying oxygen gas or nitrogen gas.

In the conventionally used RF sputtering method (conventional sputtering), a compound (sintered body) target is used to deposit an oxide ferroelectric. In the conventional sputtering, however, when an oxide ferroelectric is formed by using argon as an inert gas and oxygen as a reactive gas, oxygen in the ferroelectric film formed on the substrate is not sufficiently captured so no ferroelectric with high quality can be obtained.

For this reason, after the ferroelectric is deposited, the quality of the ferroelectric film formed on the substrate must be improved by executing a heat treatment called annealing in oxygen by using a furnace. In the conventional sputtering, hence, a process called annealing is added, and the manufacturing process becomes complex. In the annealing process, since control is done to obtain a predetermined quality, the conditions such as the temperature must be controlled strictly. Furthermore, annealing may be impossible depending on the material of the formed film.

An example of the method of improving the quality of a sputter film is ECR (Electron Cyclotron Resonance) sputtering. In this method, plasma is produced by ECR. The substrate is irradiated with a plasma flow generated by using the divergent magnetic field of the plasma. Simultaneously, a high frequency or negative DC voltage is applied between the target and ground. Ions in the plasma flow generated by ECR are introduced and made to collide against the target to execute sputtering, thereby depositing a film on the substrate.

In the conventional sputtering, no stable plasma can be obtained without a gas pressure of about 0.1 Pa or more. In the ECR sputtering, stable plasma is obtained at a pressure on the order of 0.01 Pa. In the ECR sputtering, since particles generated by ECR by using a high frequency or high negative DC voltage are caused to strike the target to execute sputtering, sputtering can be done at a low pressure.

In the ECR sputtering, the substrate is irradiated with the ECR plasma flow and sputtered particles. Ions in the ECR plasma flow have an energy of 10 to several ten eV by the divergent magnetic field. In addition, since the plasma is produced and transported at such a low pressure that a gas behaves as a molecular flow, the ion current density of the ions that arrive at the substrate can also be ensured high. Hence, the ions in the ECR plasma give an energy to the material particles which are sputtered and come onto the substrate and also promote the bonding reaction between the material particles and oxygen. Hence, the quality of the deposited film is improved.

As a characteristic feature of ECR sputtering, a high-quality film can be formed at a low substrate temperature. For further information about how to deposit a high-quality thin film by ECR sputtering, see, e.g., Japanese Patent Nos. 2814416 and 2779997 and Amazawa et al., "J. Vac. Sci. Technol.", B 17, No. 5, 2222 (1999). The ECR sputtering is suitable for forming a very thin film such as a gate insulating film while controlling the thickness well because of the relatively stable film deposition rate. The surface morphology of the film deposited by ECR sputtering is flat on the order of atomic scale. Hence, the ECR sputtering can be regarded as a promising method not only for forming a gate insulating film with high permittivity but also for forming a ferroelectric film necessary for the above-described FeRAM or a metal electrode film.

In some reports, a ferroelectric film using ECR sputtering is also examined. For example, Japanese Patent Laid-Open Nos. 10-152397 and 10-152398 and Matsuoka et al., "J. Appl. Phys.", 76 (3), 1768 (1994) include reports of a ferroelectric containing barium or strontium. Watazu et al., "Powder and Powder Metallurgy", No. 44, p. 86, 1997 reports the manufacture of $Ba_2NaNi_5O_{15}$. Masumoto et al., "Appl. Phys. Lett.", 58, 243 (1991).

Predecessors tried to select conditions to form a film made of a ferroelectric material by regarding the ECR sputtering as similar to the conventional sputtering. Hence, even when a ferroelectric film is formed by using the ECR sputtering, no satisfactory ferroelectricity applicable to the FeRAM cannot be obtained so far.

Under the above-described circumstances surrounding the memories, a technique has been proposed (Japanese Patent Laid-Open No. 7-263646), in which the resistance value of a ferroelectric layer 12902 directly formed on a semiconductor substrate 12901 is changed, thereby implementing the memory function, as shown in FIG. 129, instead of implementing a memory by changing the state of a semiconductor (forming a channel) by the polarization amount of a ferroelectric. The resistance value of the ferroelectric layer 12902 is controlled by applying a voltage between electrodes 12903 and 12904.

DISCLOSURE OF INVENTION

Problems to be Solved by the Invention

The structure proposed in patent reference 6 shown in FIG. 129 has a ferroelectric layer on the semiconductor, like the structure immediately under the gate electrode of the above-described MFS FeRAM. Hence, in the element shown in FIG. 129, it is difficult to form a high-quality ferroelectric layer on the semiconductor, like the largest challenge in the manufacturing process of the MFS FeRAM. In addition, a semiconductor oxide is formed between the semiconductor and the ferroelectric layer. It is conceivable that a polarization reducing field or a number of defects will greatly influence the properties and make it impossible to hold data for a long time. In fact, the element shown in FIG. 129 can achieve a holding period of only about 2 min. That is, a data rewrite must be done in about 1 min.

The current-voltage hysteresis observed in the element shown in FIG. 129 is supposed to occur because defects generated in the interface between the semiconductor substrate 12901 and the ferroelectric layer 12902 capture (trap) electrons or holes. In patent reference 6, a material with a small number of carriers related to electrical conduction is preferable, and the semiconductor substrate 12901 is suitable. However, since the carrier trap phenomenon of interface defects is used, an increase in the number of traps to capture carriers generates a leakage current and shortens the data holding period accordingly. When the ferroelectric layer 12902 is formed on the semiconductor substrate 12901 without any interface to reduce the leakage current, no carrier capture occurs, and the memory effect is lost. Because of this contradiction, the element shown in FIG. 129 is unsuitable for long-term data holding in principle.

The present invention has been made to solve the above-described problems, and has as its object to provide an element capable of obtaining a stable operation by using a metal oxide and, e.g., forming a memory device capable of holding data more stably.

Means of Solution to the Problems

A bistable resistance value acquisition device according to the present invention comprises at least a first metal oxide layer which is made of a metal oxide containing at least two metals, is formed on a substrate, and has a predetermined thickness, a first electrode which is formed on one surface of the first metal oxide layer, and a second electrode which is formed on the other surface of the first metal oxide layer.

In the bistable resistance value acquisition device, a third electrode spaced apart from the second electrode may be provided on the other surface of the first metal oxide layer. In this case, a 3-terminal element can be constructed by a gate electrode formed from the first electrode, a source electrode formed from the second electrode, and a drain electrode formed from the third electrode.

The bistable resistance value acquisition device may further comprise at least a second metal oxide layer which is made of the metal oxide, is formed on the substrate, and has a predetermined thickness, and a fourth electrode which is provided on the second metal oxide layer, wherein the first electrode, the first metal oxide layer, the second metal oxide layer, and the fourth electrode may be connected in series in an order named.

The bistable resistance value acquisition device may further comprise an insulating layer which is formed in contact with at least one of one surface and the other surface of the first metal oxide layer. The bistable resistance value acquisition device may further comprise an insulating layer which is formed in contact with at least one of one surface and the other surface of the second metal oxide layer. The bistable resistance value acquisition device may further comprise at least an amorphous layer in an amorphous state which is formed on the substrate, a plurality of elements each of which includes the first electrode made of a conductive material in a crystalline state and formed on the amorphous layer, the first metal oxide layer formed on the first electrode, and the second electrode formed on the first metal oxide layer, and an isolation layer which is made of the metal oxide and formed on the amorphous layer between the elements, wherein the plurality of elements may be isolated by the isolation layer. In this case, the first metal oxide layer and the isolation layer may be formed integrally.

In the bistable resistance value acquisition device, a resistance value of the metal oxide changes depending on an electrical signal supplied between the first electrode and the second electrode. For example, the metal oxide changes to a first state having a first resistance value upon application of a voltage having not less than a first voltage value and a second state having a second resistance value different from the first resistance value upon application of a voltage having not more than a second voltage value with a polarity different from the first voltage value. Alternatively, the metal oxide changes to a first state having a first resistance value upon application of a voltage more than a first voltage value and a second state having a second resistance value larger than the first resistance value upon application of a voltage more than a second voltage value in a range not more than the first voltage.

In the bistable resistance value acquisition device, the metal oxide comprises at least a base layer made of at least a first metal and oxygen, and a plurality of fine particles made of the first metal, a second metal, and oxygen and dispersed in the base layer. At this time, the base layer need only be made of the first metal, the second metal, and oxygen in which a content of the second metal is smaller in comparison with a stoichiometric composition. The base layer may contain the first metal, the second metal, and a column crystal of oxygen. The metal oxide may comprise a metal oxide monolayer in at least one of a column-crystal state and an amorphous state, which is arranged in contact with the base layer and made of at least the first metal and oxygen. In the metal oxide monolayer, a content of the second metal is smaller in comparison with a stoichiometric composition of the first metal, the second metal, and oxygen. The metal oxide monolayer does not contain the fine particles. The first metal is titanium, the second metal is bismuth, and the base layer need only be in amorphous state and be formed from a layer containing titanium in an excessive amount relative to a stoichiometric composition. In the bistable resistance value acquisition device, the metal oxide may be a ferroelectric.

In the bistable resistance value acquisition device, the first electrode need only be made of at least one of ruthenium and platinum and have at least one of a single-layer structure made of a single material and a layered structure made of a plurality of materials. The substrate may be made of a conductive material. The first electrode may be identical to the substrate.

A bistable resistance value acquisition device manufacturing method according to the present invention is a method of manufacturing a bistable resistance value acquisition device including at least a first metal oxide layer which is made of a metal oxide containing at least two metals, is formed on a substrate, and has a predetermined thickness, a first electrode which is formed on one surface of the first metal oxide layer, and a second electrode which is formed on the other surface of the first metal oxide layer, which comprises the first step of producing a first plasma made of an inert gas and oxygen gas which are supplied at a predetermined composition ratio, applying a negative bias to a target made of at least a first metal and a second metal and causing particles generated from the first plasma to collide against the target to cause a sputtering phenomenon, and depositing a material of the target, thereby forming the first metal oxide layer made of a metal oxide containing the first metal, the second metal, and oxygen, wherein the first plasma is an electron cyclotron resonance plasma which is produced by electron cyclotron resonance and receives kinetic energy from a divergent magnetic field, and the substrate is heated to a predetermined temperature.

The bistable resistance value acquisition device manufacturing method further comprises the second step of irradiating a surface of a layer made of the metal oxide with a second plasma made of an inert gas and a reactive gas which are supplied at a predetermined composition ratio, wherein the second plasma need only be an electron cyclotron resonance plasma which is produced by electron cyclotron resonance and receives kinetic energy from a divergent magnetic field. The reactive gas need only be oxygen gas. In the first step, the substrate is preferably heated to a temperature not more than a Curie temperature of the metal oxide. A voltage to control ion energy generated by the plasma may be applied to the substrate. The first metal only need be titanium, and the second metal only need be bismuth. The target need only be made of at least the first metal, the second metal, and oxygen.

A metal oxide thin film according to the present invention comprises at least a base layer which is made of at least a first metal and oxygen, and a plurality of microcrystalline grains (e.g., microcrystalline grains having a stoichiometric composition) which are made of the first metal, a second metal, and oxygen and dispersed in the base layer.

A metal oxide thin film forming method according to the present invention comprises the step of producing a first plasma made of an inert gas and oxygen gas which are supplied at a predetermined composition ratio, applying a negative bias to a target made of at least a first metal and a second metal and causing particles generated from the first plasma to collide against the target to cause a sputtering phenomenon, and depositing a material of the target on a substrate, thereby forming, on the substrate, a metal oxide thin film including at least a base layer which is made of at least the first metal and oxygen, and a plurality of fine particles which are made of the first metal, a second metal, and oxygen and dispersed in the base layer, wherein the first plasma is an electron cyclotron resonance plasma which is produced by electron cyclotron resonance and receives kinetic energy from a divergent magnetic field, and the substrate is heated to a predetermined temperature. The first metal is titanium, and the second metal is bismuth.

Effect of the Invention

As described above, according to the present invention, an element is formed by preparing a first electrode on one surface of a first metal oxide layer made of a metal oxide containing at least two metals and having a predetermined thickness, and a second electrode on the other surface. Hence, an element capable of obtaining a stable operation by using a metal oxide can be provided so that, e.g., a memory device capable of holding data more stably can be formed.

BRIEF DESCRIPTION OF DRAWINGS

FIGS. 7A to 7d show results obtained by observing, with a transmission electron microscope, the sections of thin films formed as structure examples of a ferroelectric layer 104, in which FIGS. 7A to 7D are microphotographs, and FIGS. 7a to 7d are schematic views showing the respective states;

FIG. 8 is a graph showing changes in deposition rate and refractive index with respect to the substrate temperature condition in forming a film;

FIG. 9 is a schematic sectional view showing another structure example of the ferroelectric layer 104;

FIG. 23 is a graph showing the current-voltage characteristic when the electrode is made of another metal material;

FIG. 24 is a graph showing data holding when the electrode is made of another metal material;

FIG. 95 is a view for explaining the state of a predetermined pulse voltage having a predetermined pulse width and applied to the 3-terminal element shown in FIGS. 86A and 86B;

FIG. 96 is a graph showing a change in current value read from the source-to-drain path every time a predetermined pulse voltage with a predetermined pulse width is applied a predetermined number of times;

FIGS. 97A and 97B are schematic sectional views showing structure examples of a 3-terminal element according to an embodiment of the present invention;

FIG. 116 is a graph showing the current-voltage characteristic of a memory layer 11006 when a DC voltage is applied to a bit electrode 11005;

FIG. 117 is a view for explaining the state of a predetermined pulse voltage having a predetermined pulse width and applied to the memory element shown in FIG. 110;

FIG. 118 is a graph showing a change in current value read from the electrode-to-electrode path every time a predetermined pulse voltage with a predetermined pulse width is applied a predetermined number of times;

FIGS. 119A to 119F are views showing steps in manufacturing an element isolation structure;

FIG. 120 is a sectional view showing a structure example of the element isolation structure according to an embodiment of the present invention;

FIGS. 121A to 121E are views for explaining steps in manufacturing the element isolation structure according to an embodiment of the present invention;

FIG. 122 is an explanatory view showing the relationship between a substrate temperature and the state of a formed metal oxide layer;

FIG. 123 is a graph showing a result obtained when a voltage from a power supply is applied between a lower electrode layer 103 and an upper electrode 136, and a current flowing when the voltage is applied is measured by an ammeter;

FIG. 124 is a graph showing a result obtained when a voltage from the power supply is applied between the lower electrode layer 103 and the upper electrode 136, and a current flowing when the voltage is applied is measured by an ammeter;

FIG. 125 is a sectional view showing a structure example of another element isolation structure according to an embodiment of the present invention;

FIGS. 126A to 126E are views for explaining steps in manufacturing another element isolation structure according to an embodiment of the present invention;

FIG. 127 is a view showing a structure example of a conventional element;

FIG. 128 is a view showing a structure example of a conventional element; and

FIG. 129 is a view showing a structure example of a conventional element.

BEST MODE FOR CARRYING OUT THE INVENTION

Figure 1:
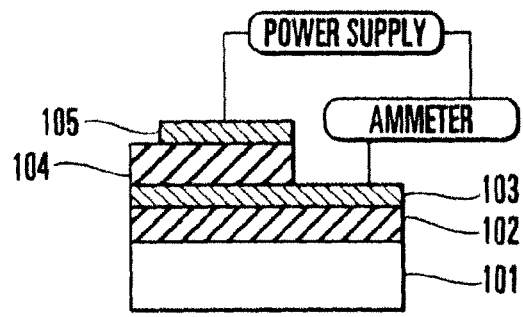
FIG. 1A is a sectional view showing a structure example of a bistable resistance value acquisition device (ferroelectric element) according to an embodiment of the present invention.
FIG. 1B is a sectional view showing a portion of the element shown in FIG. 1A.
Figure 1:
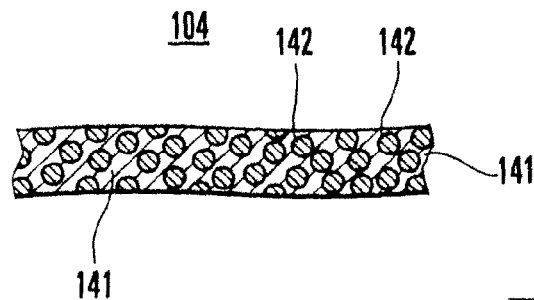

An embodiment of the present invention will be described below with reference to the accompanying drawings. FIG. 1A is a schematic sectional view showing a structure example of a bistable resistance value acquisition device according to an embodiment of the present invention. FIG. 1B is a partial sectional view. Application to a ferroelectric element which uses a metal oxide layer (ferroelectric layer 104) exhibiting ferroelectric properties will be described below. The element shown in FIG. 1A comprises, on a substrate 101 made of, e.g., single-crystal silicon, an insulating layer 102, a lower electrode layer 103, the ferroelectric layer 104 containing, e.g., Bi and Ti and having a thickness of about 30 to 200 nm, and an upper electrode 105.

The substrate 101 can be made of any one of a semiconductor, insulator, and conductive material such as a metal. When the substrate 101 is made of an insulating material, the insulating layer 102 can be omitted. When the substrate 101 is made of a conductive material, the insulating layer 102 and lower electrode layer 103 can be omitted. In this case, the substrate 101 made of the conductive material serves as a lower electrode.

The lower electrode layer 103 and upper electrode 105 need only be made of a transition metal including noble metals such as platinum (Pt), ruthenium (Ru), gold (Au), and silver (Ag). The lower electrode layer 103 and upper electrode 105 may be made of a compound such as a nitride, oxide, or fluoride of a transition metal, such as titanium nitride (TiN), hafnium nitride (HfN), strontium ruthenate (SrRuO$_2$), zinc oxide (ZnO), indium tin oxide (ITO), or lanthanum fluoride (LaF$_3$), or a composite film formed by stacking them.

The ferroelectric layer 104 is made of an oxide ferroelectric. The ferroelectric layer 104 need only be made of, e.g., a material having a perovskite structure, a material having a pseudo-ilmenite structure, a material having a tungsten-bronze structure, a material having a bismuth layer-structure, or a material having a pyrochlore structure. Examples are BaTiO$_3$, Pb(Zr,Ti)O$_3$, (Pb,La)(Zr,Ti)O$_3$, LiNbO$_3$, LiTaO$_3$, PbNb$_3$O$_6$, PbNaNb$_5$O$_{15}$, Cd$_2$Nb$_2$O$_7$, Pb$_2$Nb$_2$O$_7$, Bi$_4$Ti$_3$O$_{12}$, (Bi,La)$_4$Ti$_3$O$_{12}$, and SrBi$_2$Ta$_2$O$_9$.

The ferroelectric layer 104 is made of a material such as an oxide, nitride, or fluoride which contains at least two metals and generally exhibits ferroelectric properties. A state wherein no ferroelectric properties are exhibited depending on the film thickness condition is also included. A "ferroelectric" to be described below also indicates a metal compound which contains at least two metals and generally exhibits ferroelectric properties.

A detailed example of the ferroelectric element shown in FIGS. 1A and 1B will be described. For example, the lower electrode layer 103 is a ruthenium film having a thickness of 10 nm. The ferroelectric layer 104 is a Bi$_4$Ti$_3$O$_{12}$ film having a thickness of 40 nm. The upper electrode 105 is made of gold. The structures of the substrate 101 and insulating layer 102 are not limited to those described above, and any other material can also be selected appropriately if it has no effect on the electrical characteristics.

The ferroelectric layer 104 will be described next in more detail. As shown in the enlarged view of FIG. 1B, the ferroelectric layer 104 is formed by dispersing a plurality of microcrystalline grains 142 of Bi$_4$Ti$_3$O$_{12}$ crystal with a grain size of about 3 to 15 nm in a base layer 141, i.e., a layer containing titanium in an excessive amount relative to the stoichiometric composition of Bi$_4$Ti$_3$O$_{12}$. This is confirmed by observation using a transmission electron microscope. The base layer 141 may be TiO$_x$ with a bismuth content of almost 0. In other words, the base layer 141 is made of a metal oxide which contains two metals and in which the content of one metal is smaller in comparison with the stoichiometric composition. FIG. 1B is a sectional view schematically showing the approximate state of the ferroelectric layer 104.

According to the ferroelectric element using the ferroelectric layer 104, a functional element that holds two states can be implemented, as will be described later. The characteristics of the ferroelectric element shown in FIGS. 1A and 1B will be described. The characteristics were investigated by applying a voltage between the lower electrode layer 103 and the upper electrode 105. When a voltage from a power supply was applied between the lower electrode layer 103 and the upper electrode 105, and a current flowing when the voltage was applied was measured by an ammeter, a result shown in FIG. 2 was obtained. Referring to FIG. 2, the ordinate represents the current density obtained by dividing the current value by the area.

FIG. 2 and the operation principle of the ferroelectric element shown in FIGS. 1A and 1B will be described below. The voltage values and current values to be described here are mere examples measured in an actual element. Hence, the phenomenon is not limited to the following numerical values. Other numerical values can also be measured depending on the material and thickness of each film actually used in the element and other conditions.

FIG. 2 shows the hysteresis characteristics of the values of currents which flow in the ferroelectric layer 104 when the voltage applied to the upper electrode 105 is increased from 0 in the positive direction, returned to 0, decreased in the negative direction, and finally returned to 0 again. When the voltage applied to the upper electrode 105 is gradually increased from 0 V in the positive direction, the positive current flowing in the ferroelectric layer 104 is relatively small (about 0.014 A/cm$^2$ at 0.1 V).

When the voltage exceeds 0.5 V, the positive current value starts abruptly increasing. After the voltage is increased up to about 1 V, the positive voltage is decreased. Even when the voltage decreases from 1 V to about 0.7 V, the positive current value further increases. When the voltage is lower than about 0.7 V, the current value also starts decreasing. At this time, the positive current readily flows as compared to the previous state. The current value is about 1.3 A/cm$^2$ at 0.1 V (100 times the previous current value). When the applied voltage is returned to 0, the current value also becomes 0.

Next, a negative voltage is applied to the upper electrode 105. In this state, when the negative voltage is low, a relatively large negative current flows according to the previous hysteresis. When the applied negative voltage is changed up to about −0.5 V, the negative current suddenly starts decreasing. Even when the applied negative voltage is changed up to about −1 V, the negative current value continuously decreases. Finally, the applied negative voltage is decreased from −1 V to 0 V, the negative current value further decreases together and returns to 0. In this case, the negative current hardly flows and about −0.035 A/cm$^2$ at −0.1 V.

The above-described hysteresis of the current flowing in the ferroelectric layer 104 can be regarded as being generated because the resistance value of the ferroelectric layer 104 changes depending on the voltage applied to the upper electrode 105. When a positive voltage $V_{W1}$ with a predetermined magnitude or more is applied, the ferroelectric layer 104 changes to a "low resistance state" (data "1") wherein the current easily flows. When a negative voltage $V_{W0}$ with a predetermined magnitude is applied, the ferroelectric layer 104 changes to a "high resistance state" (data "0") wherein the current hardly flows.

The ferroelectric layer 104 has the two stable states, i.e., low resistance state and high resistance state. Each state remains unless the above-described positive or negative voltage with a predetermined magnitude or more is applied. The value of $V_{W1}$ is about +1 V. The value of $V_{W0}$ is about −1 V. The resistance ratio of the high resistance state to the low resistance state is about 10 to 100. When the above-described phenomenon that the resistance of the ferroelectric layer 104 is switched by the voltage is used, a nonvolatile functional element capable of a nondestructive read operation can be implemented by the ferroelectric element shown in FIGS. 1A and 1B.

When a DC voltage is used, the memory operation of the ferroelectric element shown in FIG. 1A is executed in the following way. First, a positive voltage with the magnitude $V_{W1}$ or more is applied to change the ferroelectric layer 104 to the low resistance state. This sequence corresponds to writing data "1" in the memory. The data "1" can be read out by measuring a current value $J_{R1}$ at a read voltage $V_R$. It is important to select, as $V_R$, such a small value to obtain a sufficient resistance ratio and not to cause state transition (about 0.1 V in the above example). Hence, the read can be done many times without destroying the low resistance state, i.e., data "1".

On the other hand, when a negative voltage with the magnitude $V_{W0}$ or more is applied, the ferroelectric layer 104 changes to the high resistance state so that data "0" can be written. This state can be read out by measuring a current value $J_{R0}$ at the read voltage $V_R$ ($J_{R1}/J_{R0} \approx 10$ to 100). When the electrodes are not energized, the ferroelectric layer 104 has nonvolatility to hold each state. Except in the write and read, no voltage need be applied. This element can also be used as a switching element to control the current.

Figure 2:
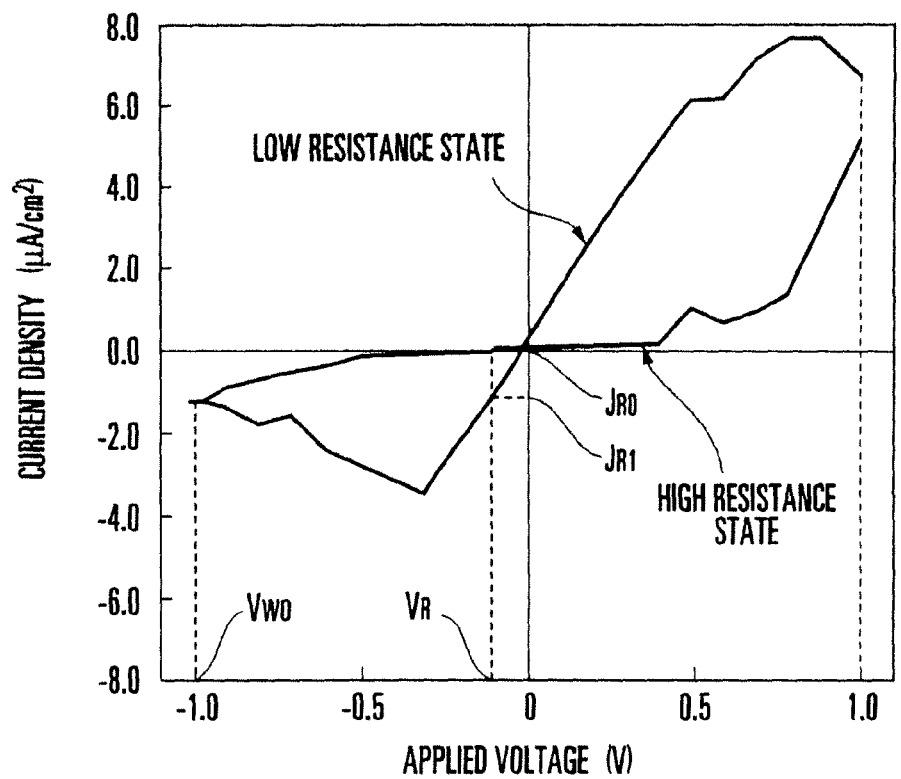
FIG. 2 is a graph showing a current-voltage characteristic of the element shown in FIG. 1A.
Figure 3:
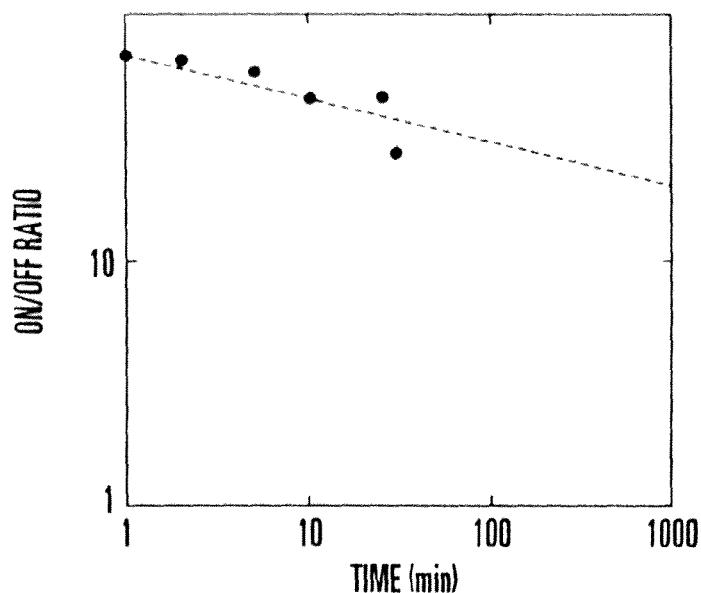
FIG. 3 is a graph showing data holding of the element shown in FIG. 1A.

FIG. 3 shows the data holding characteristic of the ferroelectric element shown in FIG. 1A. For example, the positive voltage $V_{W1}$ is applied to the upper electrode 105 to change the ferroelectric layer to the low resistance state (data "1") shown in FIG. 2. Then, the read voltage $V_R$ is applied, and the current value $J_{R1}$ is measured. Next, the negative voltage $V_{W0}$ is applied to the upper electrode 105 to change the ferroelectric layer to the high resistance state to write data "0". After that, the read voltage $V_R$ is applied to the upper electrode 105 for every predetermined time, and the current value $J_{R0}$ is measured. The ON/OFF ratio of the ferroelectric element can be represented by the value $J_{R1}/J_{R0}$. FIG. 3 plots the value $J_{R1}/J_{R0}$ along the ordinate and shows a time-rate change in value $J_{R1}/J_{R0}$ obtained by the above-described measurement.

The calculated ON/OFF ratio tends to gradually decrease over time but falls within a range where data discrimination is sufficiently possible. The ON/OFF ratio 1,000 min after, which is predicted from the extrapolated line (broken line) by the calculation result indicated by dots in FIG. 3, is about 21. Discrimination is possible even at this point. As is apparent, the ferroelectric element shown in FIG. 1A has a holding time of at least 1,000 min. In the above-described embodiment, a DC voltage is applied. However, the same effect can be obtained even by applying a pulse voltage having appropriate width and magnitude.

An example of a method of manufacturing the ferroelectric element shown in FIG. 1A will be described next. A method of forming each thin film by using ECR plasma sputtering will be described below. However, the present invention is not limited to this, and any other film formation technique or method can be used, as a matter of course.

Figure 4A:
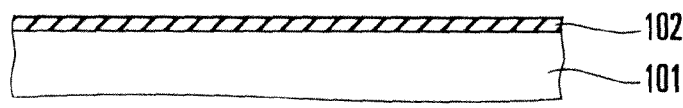
FIGS. 4A to 4D are views for explaining steps in manufacturing the element shown in FIG. 1A.

As shown in FIG. 4A, the p-type silicon substrate 101 having a plane orientation of (100) on the principal plane and a resistivity of 1 to 2 Ωcm is prepared. The surface of the substrate 101 is cleaned by a solution mixture of sulfuric acid and a hydrogen peroxide solution, pure water, and a hydrogen fluoride solution and dried. The insulating layer 102 is formed on the cleaned and dried substrate 101. In forming the insulating layer 102, the above-described ECR sputtering apparatus and pure silicon (Si) as a target are used. The insulating layer 102 in a metal mode by Si—O molecules is formed on the substrate 101 to a thickness to just cover its surface by ECR sputtering using argon (Ar) as a plasma gas and oxygen gas.

For example, Ar gas is supplied at a flow rate of 20 sccm into a plasma production chamber whose internal pressure is set on the order of $10^{-5}$ Pa. The internal pressure is set to about $10^{-3}$ to $10^{-2}$ Pa. A microwave of 2.45 GHz (about 500 W) and a magnetic field of 0.0875 T are supplied to set the electron cyclotron resonance condition, thereby producing Ar plasma in the plasma production chamber. Note that sccm is the unit of flow rate and indicates that a fluid at 0° C. and 1 atmospheric pressure flows 1 $cm^3$ in 1 min. T (tesla) is the unit of magnetic flux density, and 1 T=10,000 gauss.

The plasma produced by the above-described method is output from the plasma production chamber to the process chamber side by the divergent magnetic field of the magnetic coil. In addition, a high-frequency power of 13.56 MHz (e.g., 500 W) is supplied from a high-frequency power supply to the silicon target placed at the outlet of the plasma production chamber. When Ar ions collide against the silicon target, a sputtering phenomenon occurs to sputter Si particles. The Si particles sputtered from the silicon target reach the surface of the substrate 101 together with the plasma output from the plasma production chamber and the oxygen gas which is supplied and activated by the plasma and are oxidized to silicon dioxide by the activated oxygen. With the above process, the insulating layer 102 made of silicon dioxide and having a thickness of, e.g., about 100 nm can be formed on the substrate 101 (FIG. 4A).

The insulating layer 102 ensures insulation to prevent a voltage from leaking to the substrate 101 and influencing desired electrical characteristics when a voltage is applied between the lower electrode layer 103 and upper electrode 105 to be formed later. For example, a silicon oxide film formed by oxidizing the surface of the silicon substrate by thermal oxidation may be used as the insulating layer 102. The insulating layer 102 may be made of any other insulating material except silicon oxide if the insulating properties can be ensured. The thickness of the insulating layer 102 need not always be 100 nm and may be smaller or larger. In the above-described formation of the insulating layer 102 by ECR sputtering, the substrate 101 is not heated. However, the film may be formed while heating the substrate 101.

Figure 4B:
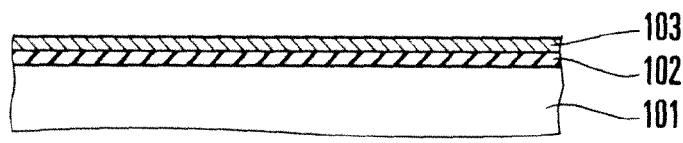

After the insulating layer 102 is formed in the above-described manner, a ruthenium film is formed on the insulating layer 102 by similar ECR sputtering using pure ruthenium (Ru) as a target, thereby forming the lower electrode layer 103, as shown in FIG. 4B. Formation of the Ru film will be described in detail. In an ECR sputtering apparatus using a Ru target, for example, the silicon substrate with the insulating layer formed on it is heated to 400° C. Ar gas as a rare gas is supplied into the plasma production chamber at a flow rate of, e.g., 7 sccm. In addition, Xe gas is supplied at a flow rate of, e.g., 5 sccm to set the internal pressure of the plasma production chamber on the order of, e.g., $10^{-2}$ to $10^{-3}$ Pa.

The magnetic field of the electron cyclotron resonance condition is given to the plasma production chamber. Then, a microwave of 2.45 GHz (about 500 W) is supplied into the plasma production chamber to produce ECR plasma of Ar and Xe in it. The produced ECR plasma is output from the plasma production chamber to the process chamber side by the divergent magnetic field of the magnetic coil. In addition, a high-frequency power of 13.56 MHz (e.g., 500 W) is supplied to the ruthenium target placed at the outlet of the plasma production chamber. The sputtering phenomenon occurs to sputter Ru particles from the ruthenium target. The Ru particles sputtered from the ruthenium target reach the surface of the insulating layer 102 on the substrate 101 and are deposited.

With the above process, the lower electrode layer 103 having a thickness of, e.g., about 10 nm can be formed on the insulating layer 102 (FIG. 4B). The lower electrode layer 103 enables voltage application to the ferroelectric layer 104 when a voltage is applied between the lower electrode layer 103 and the upper electrode 105 to be formed later. The lower electrode layer 103 may be made of any other material except ruthenium if the conductivity can be ensured. The lower electrode layer 103 may be made of, e.g., platinum. A platinum film formed on silicon dioxide readily peels off, as is known. To prevent this, a layered structure is formed by inserting a titanium layer, titanium nitride layer, or ruthenium layer under the platinum layer. The thickness of the lower electrode layer 103 need not always be 10 nm and may be smaller or larger.

As described above, in forming the Ru film by ECR sputtering, the substrate 101 is heated to 400° C. However, the substrate need not always be heated. However, if the substrate is not heated, the adhesion of ruthenium to silicon dioxide becomes low, and the film may peel off. To prevent peeling, the film is formed preferably while heating the substrate.

Figure 4C:
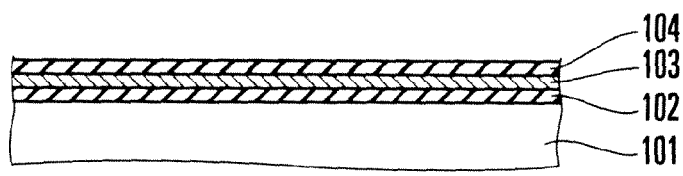

After the lower electrode layer 103 is formed in the above-described manner, the ferroelectric layer 104 is formed on the lower electrode layer 103 to a thickness to just cover its surface, as shown in FIG. 4C, by ECR sputtering using argon (Ar) as a plasma gas and oxygen gas and a target formed from an oxide sintered body (Bi—Ti—O) in which the ratio of Bi to Ti is 4:3.

Formation of the ferroelectric layer 104 will be described in detail. The substrate 101 is heated to 300° C. to 700° C. Ar gas as a rare gas is supplied into the plasma production chamber at a flow rate of, e.g., 20 sccm to set the pressure on the order of, e.g., $10^{-3}$ to $10^{-2}$ Pa. In this state, the magnetic field of the electron cyclotron resonance condition is given to the plasma production chamber. Then, a microwave of 2.45 GHz (about 500 W) is supplied into the plasma production chamber to produce ECR plasma in it.

The produced ECR plasma is output from the plasma production chamber to the process chamber side by the divergent magnetic field of the magnetic coil. In addition, a high-frequency power of 13.56 MHz (e.g., 500 W) is supplied to the sintered body target placed at the outlet of the plasma production chamber. When Ar particles collide against the sintered body target, the sputtering phenomenon occurs to sputter Bi particles and Ti particles.

The Bi particles and Ti particles sputtered from the sintered body target reach the surface of the heated lower electrode layer 103 together with the ECR plasma output from the plasma production chamber and the oxygen gas activated by the output ECR plasma and are oxidized by the activated oxygen. The oxygen ($O_2$) gas serving as a reactive gas is supplied at a flow rate of, e.g., 1 sccm separately from the Ar gas, as will be described later. Although the sintered body target contains oxygen, any shortage of oxygen in the deposited film can be prevented by supplying oxygen. With the above-described film formation by ECR sputtering, the ferroelectric layer 104 having a thickness of, e.g., about 40 nm can be formed (FIG. 4C).

The film quality may be improved by irradiating the formed ferroelectric layer 104 with ECR plasma of an inert gas and a reactive gas. As the reactive gas, not oxygen gas but nitrogen gas, fluorine gas, or hydrogen gas can be used. The film quality improvement can also be applied to formation of the insulating layer 102. The ferroelectric layer 104 may be formed at a low substrate temperature of 300° C. or less and then annealed (heat-treated) in an appropriate gas atmosphere such as oxygen atmosphere to greatly improve the properties of the film.

Figure 4D:
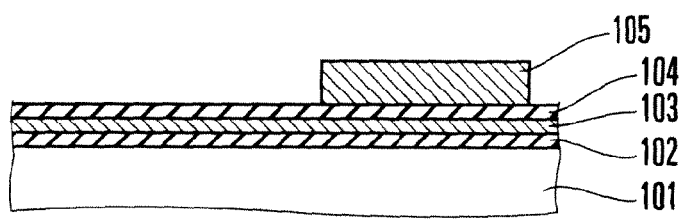

After the ferroelectric layer 104 is formed in the above-described way, the upper electrode 105 made of Au and having a predetermined area is formed on the ferroelectric layer 104, as shown in FIG. 4D, thereby obtaining the element using a layer formed from a metal oxide thin film according to this embodiment. The upper electrode 105 can be formed by a well-known lift-off method and gold deposition by resistance heating vacuum deposition. The upper electrode 105 may be made of another metal material or conductive material such as Ru, Pt, or TiN. When Pt is used, the adhesion is poor, and the film may peel off. Hence, the upper electrode 105 must be formed as an electrode with a predetermined area by using a structure such as Ti—Pt—Au that hardly peels off and executing a patterning process such as photolithography or lift-off on that structure.

Figure 5:
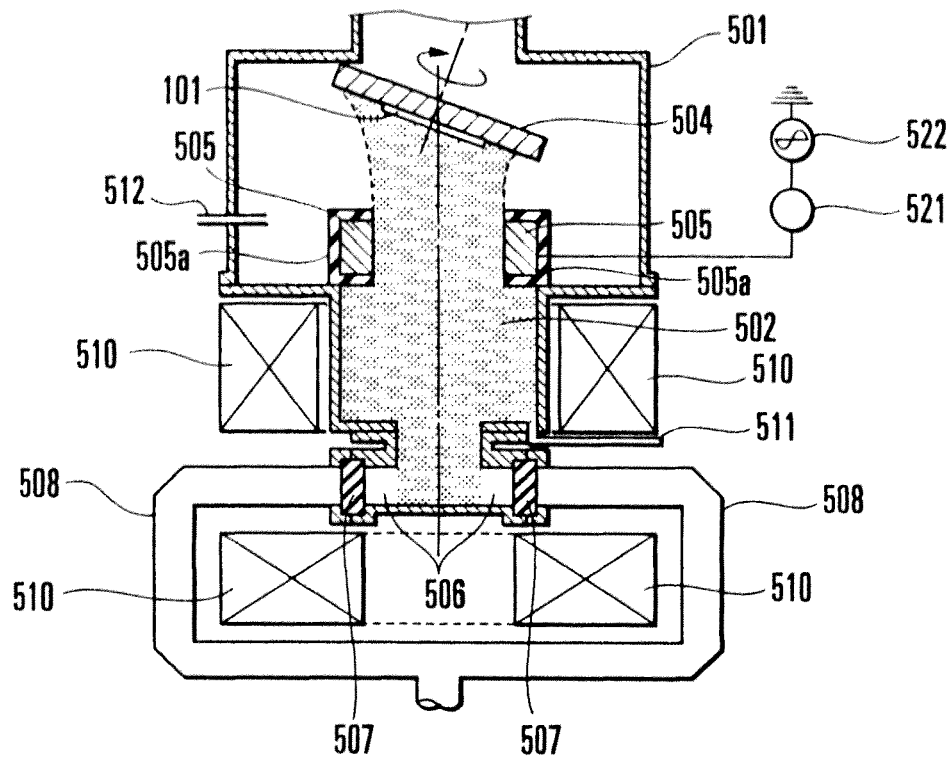
FIG. 5 is a schematic sectional view showing an arrangement example of an ECR sputtering apparatus.

The above-described layer formation by ECR sputtering is done by using an ECR sputtering apparatus shown in FIG. 5. The ECR sputtering apparatus shown in FIG. 5 will be described. The ECR sputtering apparatus comprises a process chamber 501 and a plasma production chamber 502 communicating with the process chamber 501. The process chamber 501 communicates with a vacuum pumping apparatus (not shown). The vacuum pumping apparatus evacuates the process chamber 501 and plasma production chamber 502. A substrate holder 504 to fix the substrate 101 as the film formation target is provided in the process chamber 501. The substrate holder 504 can be tilted at a desired angle and rotated by a tilting/rotating mechanism (not shown). When the substrate holder 504 is tilted and rotated, the film in-plane uniformity and step coverage of a deposited material can be improved.

A ring-shaped target 505 surrounds the opening region of the process chamber 501 to which plasma is supplied from the plasma production chamber 502. The target 505 is placed in a container 505a made of an insulator. The inner surface of the target 505 is exposed to the interior of the process chamber 501. A high-frequency power supply 522 is connected to the target 505 through a matching unit 521 so that a high frequency of, e.g., 13.56 MHz can be applied. If the target 505 is made of a conductive material, a negative DC voltage may be applied. The target 505 may have not the circular shape but a polygonal shape when viewed from the upper side.

The plasma production chamber 502 communicates with a vacuum waveguide 506. The vacuum waveguide 506 is connected to a waveguide 508 through a quartz window 507. A magnetic coil (magnetic field formation means) 510 is provided around the plasma production chamber 502 and at the upper portion of the plasma production chamber 502. The microwave generation unit, waveguide 508, quartz window 507, and vacuum waveguide 506 form a microwave supply means. A mode converter may be provided midway in the waveguide 508.

An operation example of the ECR sputtering apparatus shown in FIG. 5 will be described. The process chamber 501 and plasma production chamber 502 are evacuated to $10^{-5}$ to $10^{-4}$ Pa. Argon gas as an inert gas is supplied from an inert gas supply unit 511, and a reactive gas such as oxygen gas is supplied from a reactive gas supply unit 512 to set the internal pressure of the plasma production chamber 502 to about $10^{-3}$ to $10^{-2}$ Pa. In this state, a magnetic field of 0.0875 T is generated in the plasma production chamber 502 by the magnetic coil 510. Then, a microwave of 2.45 GHz is supplied into the plasma production chamber 502 through the waveguide 508 and quartz window 507 to produce electron cyclotron resonance (ECR) plasma.

The ECR plasma forms a plasma flow in the direction of the substrate holder 504 by the divergent magnetic field from the magnetic coil 510. Of the produced plasma, electrons are passed through the target 505 and attracted to the side of the substrate 101 by the divergent magnetic field formed by the magnetic coil 510 so that the surface of the substrate 101 is irradiated with the electrons. Simultaneously, positive ions in the ECR plasma are attracted to the side of the substrate 101 to neutralize negative charges by the electrons, i.e., weaken the electric field so that the formed layer is irradiated with the positive ions. During irradiation of the particles, some of the positive ions are bonded to the electrons to form neutral particles.

In the thin film formation apparatus shown in FIG. 5, the microwave supplied from the microwave generation unit (not shown) is temporarily branched by the waveguide 508 and connected to the vacuum waveguide 506 at the upper portion of the from the side of the plasma production chamber 502 through the quartz window 507. With this structure, an adhesion of scattering particles from the target 505 to the quartz window 507 can be prevented, and the running time can largely be prolonged.

Figure 6:
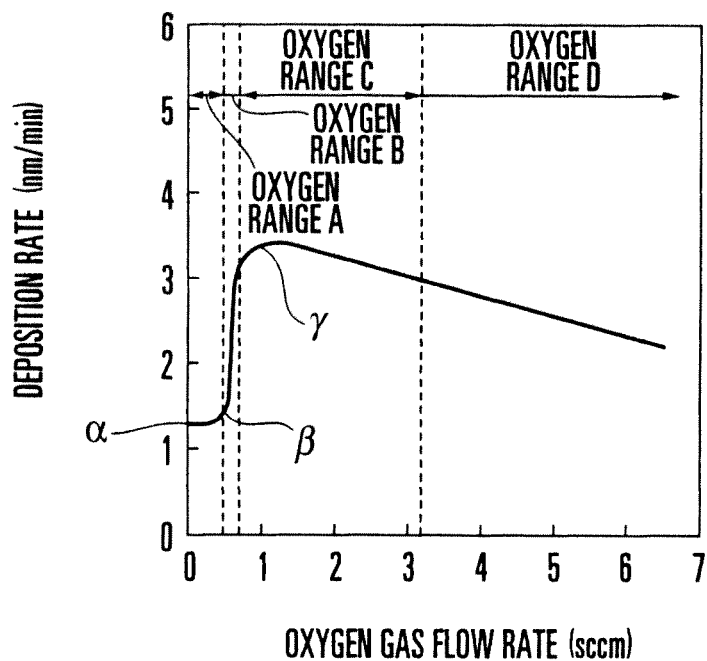
FIG. 6 is a graph showing a change in deposition rate with respect to the flow rate of supplied oxygen when a $Bi_4Ti_3O_{12}$ film is formed by using ECR sputtering.

The properties of the $Bi_4Ti_3O_{12}$ film as the ferroelectric layer 104 formed by the ECR sputtering will be described next in more detail. The present inventors carefully and repeatedly observed $Bi_4Ti_3O_{12}$ film formation using ECR sputtering and found that the composition of the $Bi_4Ti_3O_{12}$ film to be formed can be controlled by the temperature and the flow rate of supplied oxygen. In this sputtering film formation, an oxide sintered body target ($Bi_4Ti_3O_X$) whose composition ratio of bismuth and titanium is 4:3 is used. FIG. 6 is a graph showing a change in deposition rate with respect to the flow rate of supplied oxygen when a $Bi_4Ti_3O_{12}$ film is formed by using ECR sputtering. FIG. 6 shows a result when single-crystal silicon is used as the substrate, and the substrate temperature is set to 420° C.

As is apparent from FIG. 6, there are a range corresponding to a low oxygen flow rate of 0 to 0.5 sccm, a range corresponding to an oxygen flow rate of 0.5 to 0.8 sccm, and a range corresponding to an oxygen flow rate of 0.8 sccm or more. For this characteristic, inductively coupled plasma (ICP) atomic emission spectrochemical analysis and section observation by a transmission electron microscope were executed to specifically examine formed films. As a result of examination, when the oxygen flow rate was as low as 0 to 0.5 sccm, a crystal film few Bi but mainly Ti—O was formed, although the Bi—Ti—O sintered target was used as the target 205. This oxygen range will be defined as an oxygen range A.

When the oxygen flow rate was as low as 0.8 to 3 sccm, a film of microcrystal or column crystal with the stoichiometric composition of $Bi_4Ti_3O_{12}$ was formed. This oxygen range will be defined as an oxygen range C. When the oxygen flow rate was 3 sccm or more, a film with a large proportion of Bi was formed, and the composition deviated from the stoichiometric composition of $Bi_4Ti_3O_{12}$. This oxygen range will be defined as an oxygen range D. When the oxygen flow rate was 0.5 to 0.8 sccm, a film with an intermediate characteristic between the oxygen range A and the oxygen range C was formed. This oxygen range will be defined as an oxygen range B.

It has not been known so far that the composition changes between the four ranges of the flow rate of supplied oxygen. This is a characteristic feature in forming a $Bi_4Ti_3O_{12}$ film by using a Bi—Ti—O sintered target by ECR sputtering. When film formation is controlled in consideration of these ranges, a film having a desired composition and quality can be obtained. It was also confirmed from another strict measurement result that the film formation condition to make an obtained film certainly exhibit ferroelectricity was the oxygen range C where the stoichiometric composition was realized.

Figure 7A:
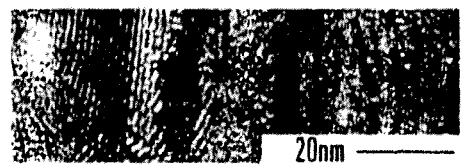
Figure 7A:
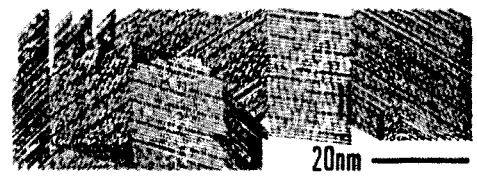

The states of $Bi_4Ti_3O_{12}$ thin films formed under various oxygen flow rate conditions, i.e., α in the oxygen range A, β in the oxygen range B, and γ in the oxygen range C shown in FIG. 6 will be described next with reference to FIGS. 7A to 7d. FIGS. 7A to 7d show results obtained by observing the sections of the formed thin films with a transmission electron microscope. FIGS. 7A to 7D are microphotographs, and FIGS. 7a to 7d are schematic views showing the respective states. Under the condition α corresponding to an oxygen flow rate of 0, the entire film is formed from a column crystal, as shown in FIGS. 7A and 7a. When the composition of the elements of the thin film formed under the condition α is analyzed by EDS (Energy Dispersive X-ray Spectroscopy), this film is made of titanium oxide and contains no bismuth.

Figure 7B:
Figure 7B:
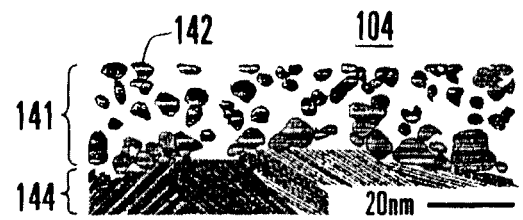

Under the condition β corresponding to an oxygen flow rate of 0.5 sccm, the formed thin film includes two layers, i.e., a metal oxide monolayer 144 containing titanium in an excessive amount relative to the stoichiometric composition of $Bi_4Ti_3O_{12}$ and the base layer 141 containing titanium in an excessive amount relative to the stoichiometric composition of $Bi_4Ti_3O_{12}$, as shown in FIGS. 7B and 7b. The plurality of microcrystalline grains 142 of $Bi_4Ti_3O_{12}$ crystal with a grain size of about 3 to 15 nm are dispersed in the base layer 141. The base layer 141 is amorphous.

Figure 7C:
Figure 7C:
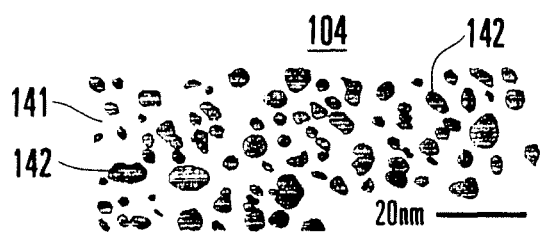

Under the condition γ corresponding to an oxygen flow rate of 1 sccm, the microcrystalline grains 142 are dispersed in the base layer 141, as shown in FIGS. 7C and 7c. Both the base layer 141 and the metal oxide monolayer 144 rarely contain bismuth. The microphotograph shown in FIG. 7C indicates the same state as in FIG. 1B. The above-described states are obtained when the temperature in film formation is 420° C. FIGS. 7D and 7d show an observation result of a film formed when the oxygen flow rate is 1 sccm but the temperature condition in film formation is different, as will be described later.

The properties of the $Bi_4Ti_3O_{12}$ film formed by ECR sputtering also depend on the film formation temperature. FIG. 8 shows changes in deposition rate and refractive index with respect to the substrate temperature. FIG. 8 shows changes in deposition rate and refractive index for the oxygen flow rates corresponding to the oxygen range A, oxygen range C and oxygen range D shown in FIG. 6. As shown in FIG. 8, both the deposition rate and refractive index change with respect to the temperature.

The refractive index behaves similarly in all the oxygen range A, oxygen range C, and oxygen range D. More specifically, in a low temperature range up to about 250° C., the refractive index is as small as about 2, and the characteristic of an amorphous state is indicated. In an intermediate temperature range from 300° C. to 600° C., the refractive index is about 2.6, i.e., close to a bulk reported in papers. It is apparent that crystallization of $Bi_4Ti_3O_{12}$ progresses. For further information about these numerical values, see, e.g., Yamaguchi et al., "Jpn. J. Appl. Phys.", No. 37, p. 5166 (1988).

In a temperature range more than about 600° C., however, the refractive index is high, and the surface morphology (surface roughness) is large. It seems that the crystallinity changes. The temperature is lower than the Curie temperature (675° C.) of $Bi_4Ti_3O_{12}$. However, if ECR plasma irradiation on the substrate surface during film formation supplies an energy to increase the substrate temperature and cause deterioration of crystallinity such as oxygen defects, the above-described result has no contradiction. As for the dependence of deposition rate on the temperature, the oxygen ranges exhibit a behavior with same tendency. More specifically, up to about 200° C., the deposition rate increases together with the temperature. However, in the range from about 200° C. to 300° C., the deposition rate abruptly decreases.

When the temperature reaches about 300° C., the deposition rate is constant up to 600° C. The deposition rate was about 1.5 nm/min in the oxygen range A, about 3 nm/min in the oxygen range C, and about 2.5 nm/min in the oxygen range D. From the above-described result, the temperature suitable for forming a $Bi_4Ti_3O_{12}$ crystal film falls in the range where the refractive index is close to the bulk, and the deposition rate is constant, i.e., 300° C. to 600° C.

The state of the ferroelectric layer 104 changes depending on the above-described temperature condition in film formation. When the film formation temperature is set as high as 450° C. under the oxygen flow rate condition to obtain the state shown in FIG. 7C, the microcrystalline grains 142 with a size of about 3 to 15 nm are observed in a plurality of column crystal portions 143 of $Bi_4Ti_3O_{12}$ column crystal with a size (grain size) of about 20 to 40 nm, as shown in FIGS. 7D and 7d. In this state, the column crystal portion 143 corresponds to the base layer 141 shown in FIGS. 7C and 7c. In all the films shown in FIG. 7, a peak of a (117) axis of $Bi_4Ti_3O_{12}$ is measured by XRD (X-Ray Diffraction). In the above-described observation by a transmission electron microscope, it was confirmed by electron diffraction of the microcrystalline grains 142 that they have the (117) plane of $Bi_4Ti_3O_{12}$.

Generally, a material which exhibits ferroelectricity cannot maintain the crystallinity at the Curie temperature or more so no ferroelectricity appears. For example, the Curie temperature of a ferroelectric material such as $Bi_4Ti_3O_{12}$ containing Bi, Ti, and oxygen is about 675° C. For this reason, at a temperature of about 600° C. or more, the energy given from ECR plasma is also added, and oxygen defects are readily generated. Hence, the crystallinity deteriorates, and the ferroelectricity hardly appears.

It was found by X-ray diffusion analysis that the $Bi_4Ti_3O_{12}$ film formed at the oxygen flow rate C in the above-described temperature range (450° C.) is a (117)-oriented film. The $Bi_4Ti_3O_{12}$ film formed under these conditions has a thickness of about 100 nm, a sufficient breakdown voltage exceeding 2 MV/cm is obtained. As described above, when a $Bi_4Ti_3O_{12}$ film is formed in the range shown in FIG. 6 or 8 by ECR sputtering, the composition and properties of the film can be controlled.

In the ferroelectric layer 104, the state shown in FIG. 9 is also observed. The ferroelectric layer 104 shown in FIG. 9 has a layered structure including the metal oxide monolayer 144 containing titanium in an excessive amount relative to the stoichiometric composition of $Bi_4Ti_3O_{12}$ and the base layer 141 in which the plurality of microcrystalline grains 142 are dispersed. The state shown in FIG. 9 is also confirmed by observation with a transmission electron microscope, like the states shown in FIGS. 1B and 7. The above-described states of the ferroelectric layer 104 change depending on the state of the underlayer on which the ferroelectric layer 104 is to be formed, the film formation temperature, and the oxygen flow rate in film formation. For example, when a film is formed on an underlayer made of a metal material at an oxygen flow rate corresponding to β shown in FIG. 8, the state shown in FIG. 7B or 9 is obtained.

As described above, in the film formation condition range where microcrystalline grains are observed, the base layer has an amorphous state or contains a column crystal. In either case, the state of microcrystalline grains is the same, and the observed microcrystalline grains have a size of about 3 to 15 nm. The ferroelectric layer 104 in which microcrystalline grains are observed has two stable states, i.e., low resistance state and high resistance state. In a thin film with the state shown in FIGS. 7A and 7a, the two states are considerably poor.

According to the metal oxide thin film having the states shown in FIGS. 1B, 7B to 7d, and 9, a ferroelectric element having a function of holding the state can be implemented, as described with reference to FIG. 2. When a film is formed by the above-described ECR sputtering, this characteristic is obtained by a film formed in the oxygen range B or C in FIG. 6. As for the film formation temperature condition shown in FIG. 8, a thin film having the above above-described characteristic can be formed in a temperature range where the deposition rate decreases and stabilizes, and the refractive index increases and stabilizes at about 2.6.

An oxide containing a binary metal, i.e., bismuth and titanium has been exemplified above. The characteristic to hold two states can be obtained by any other metal oxide thin film containing at least two metals and oxygen. The characteristic described with reference to FIG. 2 can appear when a plurality of microcrystalline grains with a stoichiometric composition are dispersed in a layer which contains at least two metals and oxygen and in which the content of one metal is smaller in comparison with the stoichiometric composition.

For example, even a metal oxide thin film made of $BaTiO_3$, $Pb(Zr,Ti)O_3$, $(Pb,La)(Zr,Ti)O_3$, $LiNbO_3$, $LiTaO_3$, $PbNb_3O_6$, $PbNaNb_5O_{15}$, $Cd_2Nb_2O_7$, $Pb_2Nb_2O_7$, $(Bi,La)_4Ti_3O_{12}$, or $SrBi_2Ta_2O_9$ can obtain the same function and effect as in the above-described embodiment if a plurality of microcrystalline grains with a stoichiometric composition are dispersed in a layer in which the content of one metal is smaller in comparison with the stoichiometric composition. In addition, for an oxide containing a binary metal such as bismuth and titanium, when (La,Bi)TiO or (Sr,Bi)TiO is formed by doping lanthanum (La) or strontium (strontium) in the metal oxide thin film, the state of each resistance value can variably be controlled.

In the above-described example, each of the insulating layer on the silicon substrate, the lower electrode layer on the insulating layer, and the ferroelectric layer on the lower electrode layer is formed by ECR sputtering. However, the method of forming each layer is not limited to ECR sputtering. For example, the insulating layer to be formed on the silicon substrate may be formed by thermal oxidation or CVD (Chemical Vapor Deposition) or a conventional sputtering method.

The lower electrode layer may be formed by any other film formation method such as EB deposition, CVD, MBE, IBD, or hot deposition. The ferroelectric layer can also be formed by the above-described MOD, conventional sputtering method, or PLD. However, when ECR sputtering is used, flat and excellent insulating film, metal film, and ferroelectric film can easily be obtained.

The layers may be formed by a continuous process without unloading the structure into the atmospheric by using an apparatus which connects, through vacuum transfer chambers, the process chambers to realize ECR sputtering to form the respective layers. With this arrangement, the substrate to be processed can be transported in vacuum and is therefore prevented from being influenced by disturbance such as water adhesion. Hence, the film quality and interface properties can be improved.

Arraying elements and storing a plurality of data simultaneously in a memory is called "integration". The degree of integrating elements is called a degree of integration. The structure shown in FIG. 1A is very simple and can greatly increase the degree of integration as compared to a conventional memory cell. For DRAMs, SRAMs, or flash memories based on MOSFETs which must ensure gate, source, and drain regions, limitation on integration has been pointed out recently. However, the element shown in FIG. 1A uses the simple structure and can therefore increase the degree of integration without being affected by the current limitation on integration.

The basic idea of the present invention is sandwiching the ferroelectric layer 104 by two electrodes, as shown in FIG. 1A. With this structure, when a predetermined voltage (DC or pulse) is applied between the two electrodes to change the resistance value of the ferroelectric layer and switch the stable high resistance state and low resistance state, a memory function can be implemented consequently.

Figure 10A:
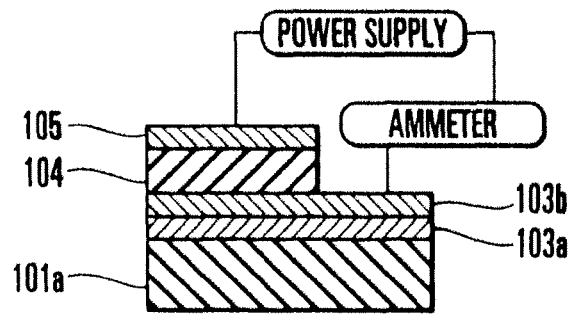
FIGS. 10A to 10D are schematic sectional views showing structure examples of another ferroelectric element according to an embodiment of the present invention.
Figure 10B:
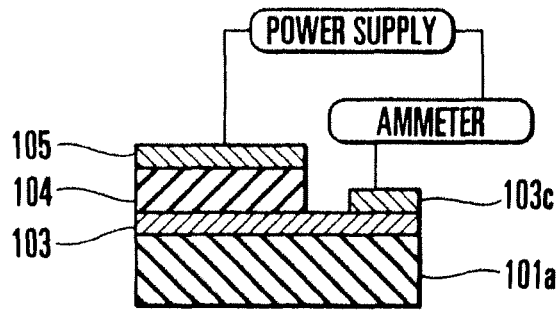
Figure 10C:
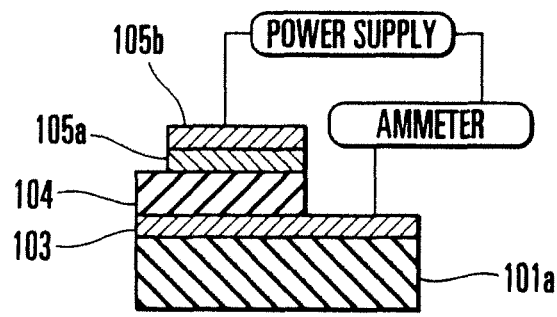
Figure 10D:
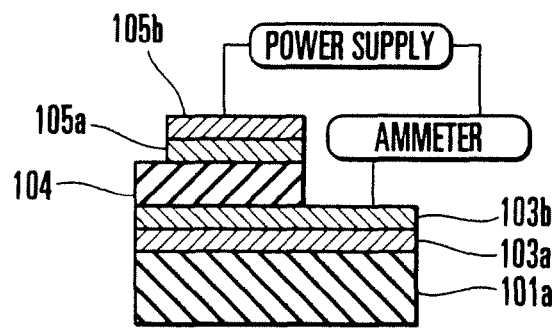

For example, as shown in FIG. 10A, an insulating substrate 101a may be used, and stacked lower electrode layers 103a and 103b may be used. As shown in FIG. 10B, the insulating substrate 101a may be used, and a contact electrode 103c may be provided on the lower electrode layer 103. As shown in FIG. 10C, the insulating substrate 101a may be used, and stacked upper electrodes 105a and 105b may be used. As shown in FIG. 10D, the stacked lower electrode layers 103a and 103b and the stacked upper electrodes 105a and 105b may be used.

Figure 11A:
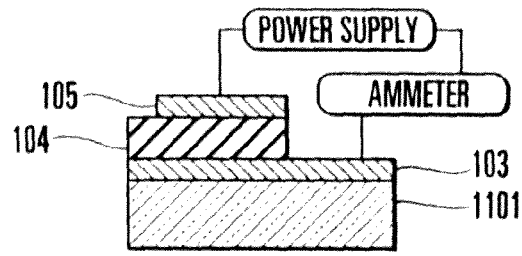
FIGS. 11A to 11E are schematic sectional views showing structure examples of still another ferroelectric element according to the embodiment.
Figure 11B:
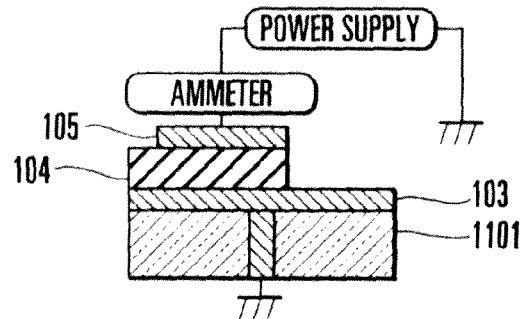

As shown in FIG. 11A, an insulating substrate 1101 made of glass or quartz may be used. With this structure, the present invention can be applied to, e.g. a glass substrate easy to process. In this case, as shown in FIG. 11B, a through hole may be formed in the substrate 1101 to form a plug, and an electrical contact may be formed on the lower surface of the substrate 1101 (the side opposite to the surface where the lower electrode layer 103 is formed). Since the ferroelectric layer 104 which has a refractive index of about 2.6 measured at a wavelength of 632.8 nm is optically transparent, the structures shown in FIGS. 11A and 11B can be applied to a display. When the ferroelectric layer 104 is formed so thick in the range of 10 to 200 nm that an interference color is generated, the visual effect of a colored state can be obtained.

Figure 11C:
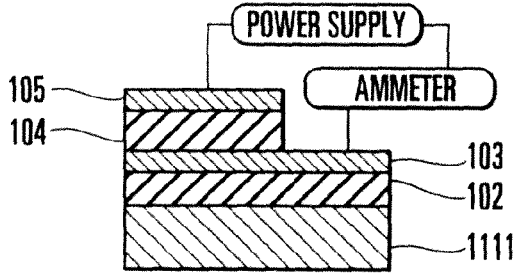
Figure 11D:
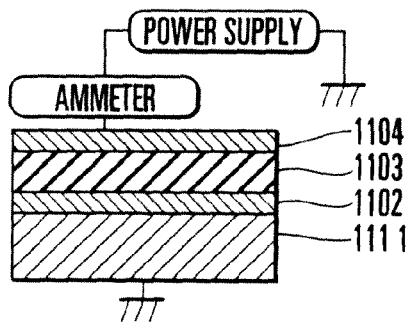

As shown in FIG. 11C, a conductive substrate 1111 made of, e.g., a metal may be used. As shown in FIG. 11D, a lower electrode 1102 contacting the substrate 1111 may be formed, and a ferroelectric layer 1103 and upper electrode 1104 may be provided on it. In the structure shown in FIG. 11D, a predetermined electrical signal can be applied between the substrate 1111 and the upper electrode 1104.

Figure 11E:
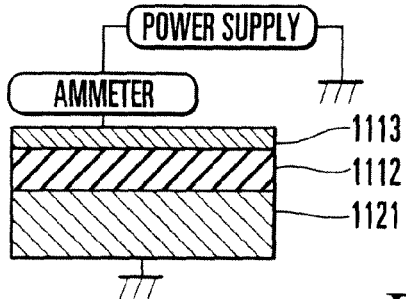

As shown in FIG. 11E, a ferroelectric layer 1112 and upper electrode 1113 may be provided on a metal plate 1121. In this structure, the metal plate 1121 serves as a lower electrode layer. With the structure shown in FIG. 11E in which the constituent elements are formed on the metal plate 1121 with high thermal conductivity, a higher cooling effect can be obtained, and a stable element operation can be expected.

As the ferroelectric layer 104, 1103, or 1112 becomes thick, the current flows more hardly, and the resistance increases. When a memory is implemented by using a change in resistance value, the resistance value of in each of the low resistance state and high resistance state is important. For example, when the ferroelectric layer 104, 1103, or 1112 becomes thick, the resistance value in the low resistance state increases. Since it is difficult to ensure a high S/N ratio, the state of the memory is hard to determine. On the other hand, when the ferroelectric layer 104, 1103, or 1112 becomes thin, and the leakage current is dominant, memory information can hardly be held, and the resistance value in the high resistance state decreases. It is therefore difficult to ensure a high S/N ratio.

Hence, the ferroelectric layer 104, 1103, or 1112 preferably has an optimum thickness. For example, when the problem of leakage current is taken into consideration, the ferroelectric layer 104, 1103, or 1112 need only have a thickness of at least 10 nm. When the resistance value in the low resistance state is taken into consideration, the ferroelectric layer 104, 1103, or 1112 is preferably thinner than 300 nm. In experiments conducted by the present inventors, a memory operation was confirmed when the thickness of the ferroelectric layer 104, 1103, or 1112 was 30 to 200 nm.

Figure 12A:
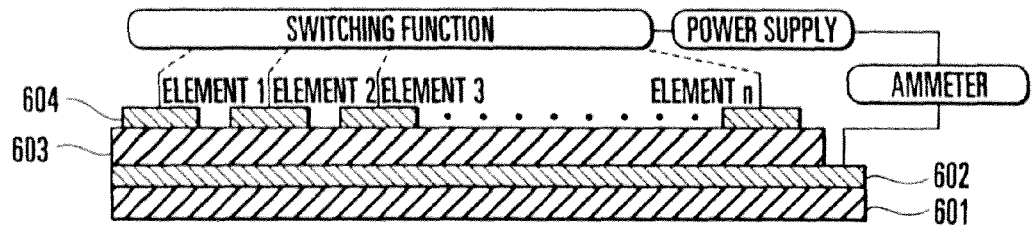
FIGS. 12A to 12D are schematic sectional views showing structure examples of still another ferroelectric element according to the embodiment.

In the above description, one ferroelectric element has been exemplified. However, a plurality of ferroelectric elements may be arrayed and integrated, as will be described later. For example, as shown in FIG. 12A, a common lower electrode layer 602 and ferroelectric layer 603 are formed on an insulating substrate 601. A plurality of upper electrodes 604 spaced apart from each other by a predetermined distance are formed on the ferroelectric layer 603. That is, a plurality of ferroelectric elements are arrayed in correspondence with the plurality of upper electrodes 604. When the distance between the elements corresponding to the upper electrodes 604 is set in consideration of, e.g., the conductivity, a stable operation can be expected.

Figure 12B:
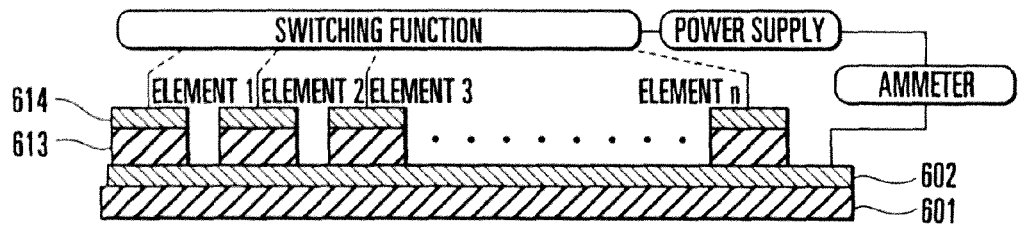

As shown in FIG. 12B, the common lower electrode layer 602 may be formed on the insulating substrate 601, and a plurality of elements each including a ferroelectric layer 613 and upper electrode 614 may be arrayed on the lower electrode layer 602. For example, when a metal oxide thin film is formed and processed by using a method such as RIE, ICP etching, or ECR etching, the individual ferroelectric layers 613 can be formed. When the elements are separated in this way, the distance between them can further be shortened, and the degree of integration can be made higher.

Figure 12C:
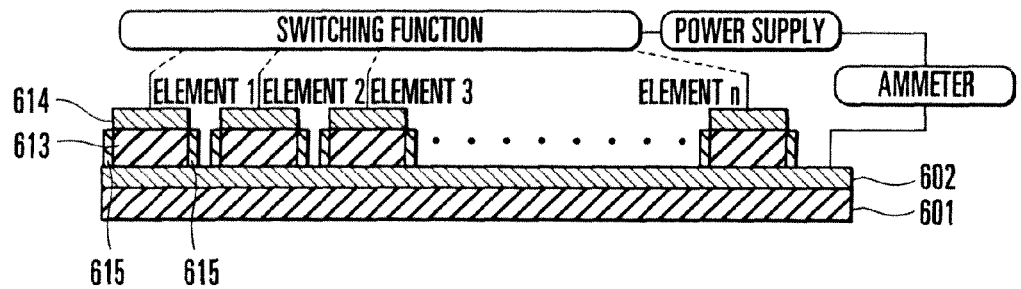
Figure 12D:
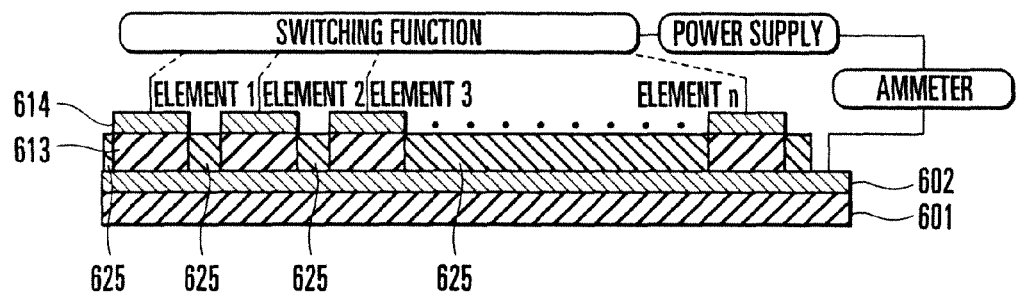

As shown in FIG. 12C, the side surface of the ferroelectric layer 613 of each element may be covered with an insulating sidewall 615. As shown in FIG. 12D, the plurality of ferroelectric layers 613 may be formed in correspondence with the elements, and an insulating layer 625 may be formed to fill spaces on the sides of the plurality of ferroelectric layers 613 that are spaced apart from each other. When the portions between the plurality of ferroelectric layers 613 formed separately in correspondence with the elements are covered with an insulator, the leakage current between the elements can be reduced, and their stability can be increased.

Figure 13:
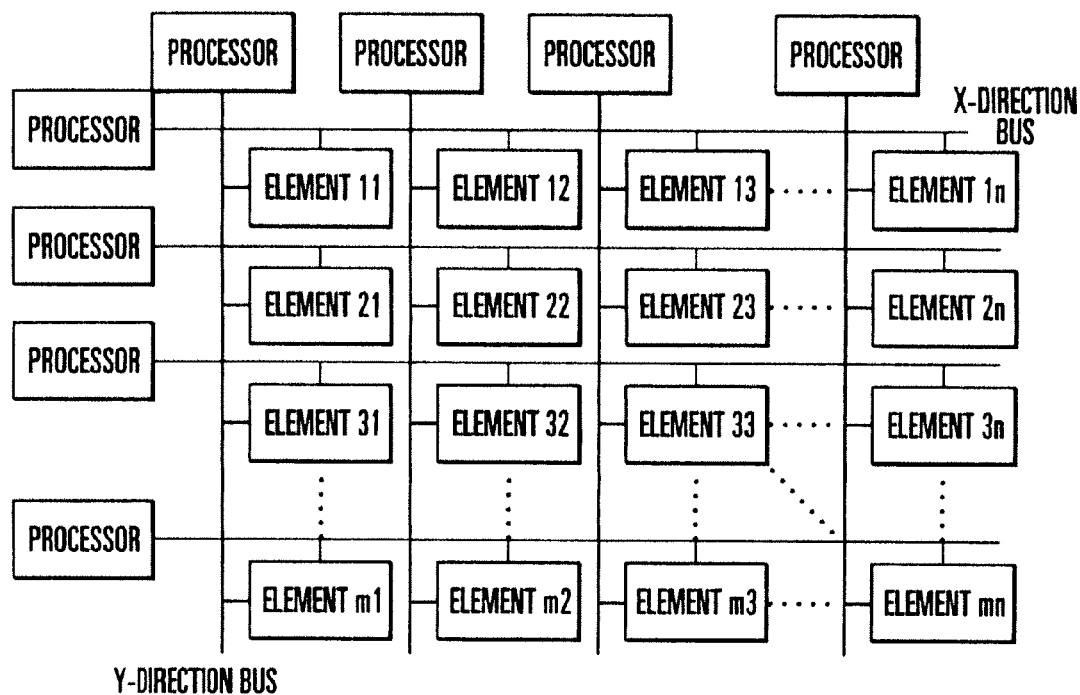
FIG. 13 is a schematic sectional view showing a structure example of still another ferroelectric element according to the embodiment.

As shown in FIG. 13, a plurality of elements according to the embodiment of the present invention are arrayed. More specifically, n elements are arrayed in the X direction, and m elements are arrayed in the Y direction. X-direction buses are connected to the lower electrode layers, and Y-direction buses are connected to the upper electrodes. A processor unit having a selection signal switching function is connected to each of the X- and Y-direction buses. With this structure, a memory capable of accessing each element at random can be implemented.

Figure 14:
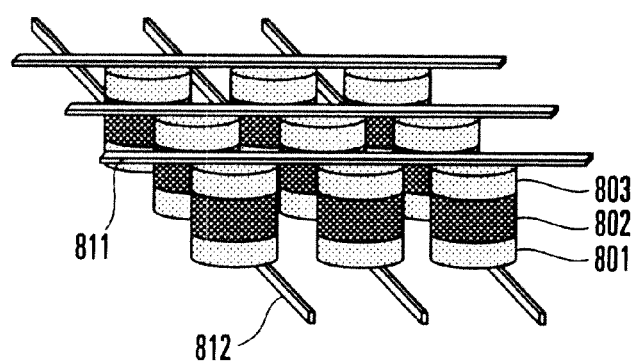
FIG. 14 is a schematic sectional view showing a structure example of still another ferroelectric element according to the embodiment.

For example, as shown in the perspective view of FIG. 14, elements each including a lower electrode 801, ferroelectric layer 802, and upper electrode 803 are arrayed. A Y-direction bus 812 is commonly connected to the lower electrodes 801 of each column, and an X-direction bus 811 is commonly connected to the lower electrodes 803 of each row. When a predetermined voltage is applied to the X-direction bus 811 and Y-direction bus 812 which cross in a selected element, as described above, data can be written or read out. In this structure, the memory cell can be formed by only the ferroelectric element with the above-described structure without using any memory cell select transistor. Hence, the degree of integration can be increased.

Figure 15:
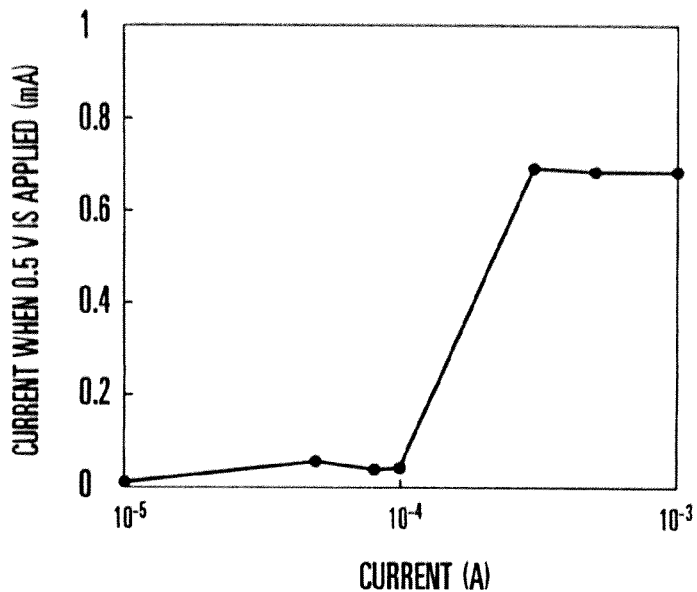
FIG. 15 is a graph showing a result obtained by observing the value of a current which flows when a predetermined voltage is applied to the ferroelectric layer 104 of the element shown in FIG. 1 to flow a predetermined current, and then, a voltage of +0.5 V is applied.

The change in resistance value of the ferroelectric layer 104 can also be controlled by a current. The value of a current which flows when a predetermined voltage is applied to the ferroelectric layer 104 to flow a predetermined current, and then, a voltage of +0.5 V is applied is observed. As shown in FIG. 15, a current value observed after a current of $1 \times 10^{-5}$ A is supplied to the ferroelectric layer 104 is almost 0 A. A current value observed after a current up to $1 \times 10^{-4}$ A is supplied to the ferroelectric layer 104 is about 0.02 A or less.

To the contrary, a current value observed after a current of $1 \times 10^{-4}$ A or more is supplied to the ferroelectric layer 104 abruptly changes to 0.7 A. As is apparent from this, the resistance of the ferroelectric layer 104 also changes depending on the current flowing to it. That is, two resistance values representing a high resistance state and low resistance state are present. Hence, the ferroelectric element shown in FIG. 1, 10, 11, or 12 can be driven by both a voltage and a current.

Figure 16:
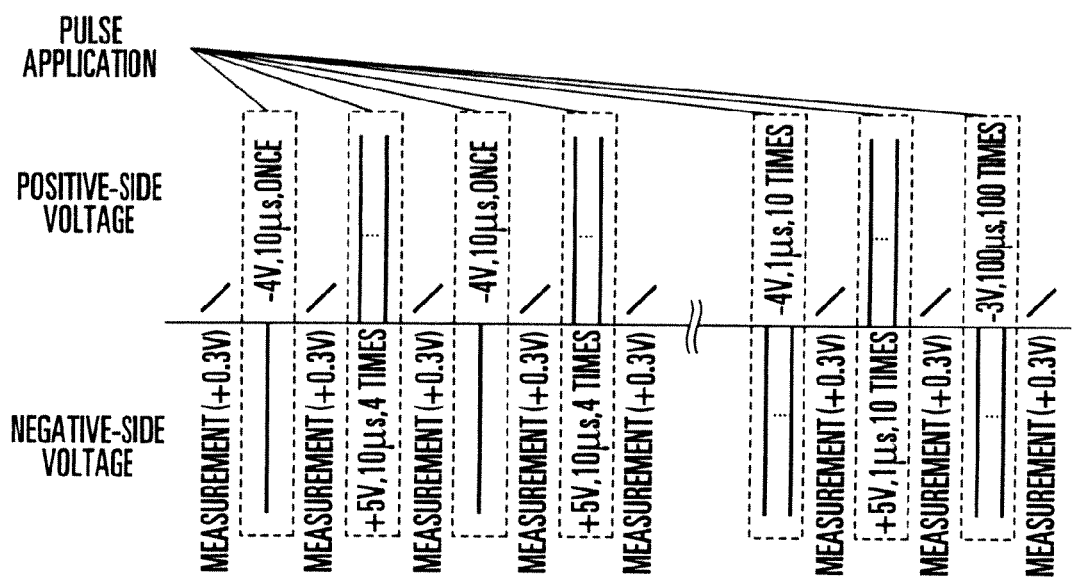
FIG. 16 is a timing chart showing an operation example in which the element shown in FIG. 1 is driven by a pulse voltage.

The resistance change in the ferroelectric layer 104 can also be controlled by a pulse voltage. For example, the value of a current which flows when a DC voltage of +0.3 V is applied to the above-described element in the early stage is measured, as shown in FIG. 16. A voltage or current is applied between the lower electrode layer 103 and the upper electrode 105. Next, the value of a current which flows when a pulse voltage of −4 V having a width of 10 μs is applied between the upper electrode 105 and the lower electrode layer 103 once, and then a DC voltage of +0.3 V is applied is measured. The value of a current which flows when a pulse voltage of +5 V having a width of 10 μs is applied between the upper electrode 105 and the lower electrode layer 103 four times, and then a DC voltage of +0.3 V is applied is measured.

The value of a current which flows when a pulse voltage of −4 V having a width of 10 μs is applied between the upper electrode 105 and the lower electrode layer 103 once, and then a DC voltage of +0.3 V is applied is measured. Then, the value of a current which flows when a pulse voltage of +5 V having a width of 10 μs is applied between the upper electrode 105 and the lower electrode layer 103 four times, and a DC voltage of +0.3 V is applied is measured. These measurements are repeated a predetermined number of times. After that, the value of a current which flows when a pulse voltage of −4 V having a width of 1 μs is applied between the upper electrode 105 and the lower electrode layer 103 10 times, and then a DC voltage of +0.3 V is applied is measured. The value of a current which flows when a pulse voltage of +5 V having a width of 1 μs is applied between the upper electrode 105 and the lower electrode layer 103 100 times, and then a DC voltage of +0.3 V is applied is measured. Finally, the value of a current which flows when a pulse voltage of −3 V having a width of 100 μs is applied between the upper electrode 105 and the lower electrode layer 103 100 times, and then a DC voltage of +0.3 V is applied is measured.

Figure 17:
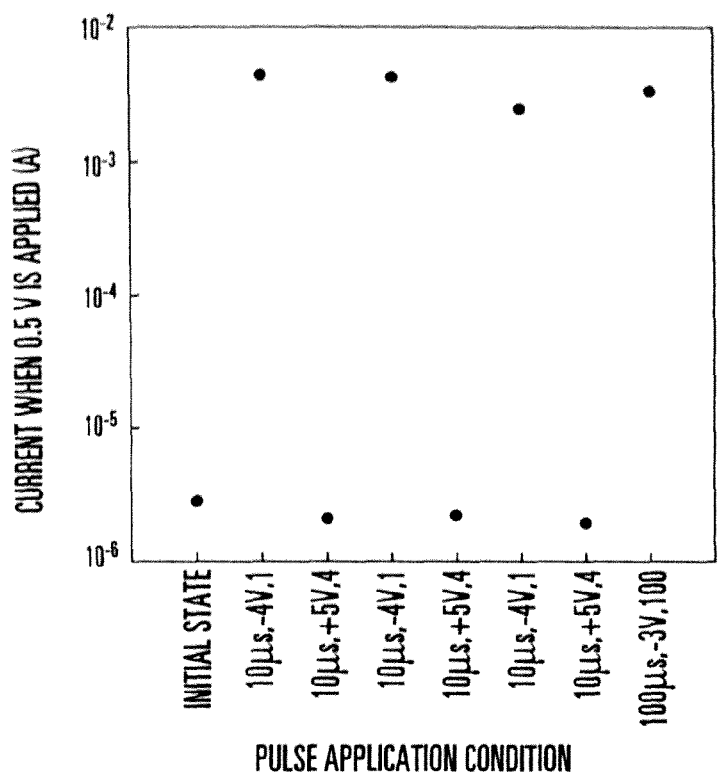
FIG. 17 is a graph showing a change in current value by drive control shown in FIG. 16.

The current value measured after the above-described pulse voltage application changes as shown in FIG. 17. As shown in FIG. 17, in the initial state, a high resistance state representing a current value of $10^{-5}$ A or less is obtained. When a pulse voltage of −4 V having a width of 10 μs is applied once, the state changes to a low resistance state representing a current value of $10^{-5}$ A or more. In addition, when a pulse voltage of +5 V having a width of 10 μs is applied four times in this state, the high resistance state representing a current value of $10^{-5}$ A or less is obtained. This indicates that the resistance value of the ferroelectric layer 104 changes when a positive voltage pulse or negative voltage pulse is applied. Hence, for example, when a positive voltage pulse or negative voltage pulse is applied, a memory operation can be executed so that the memory state of the element changes from an "on" state to an "off" state or from an "off" state to an "on" state.

The voltage and time of the voltage pulse capable of changing the resistance state of the ferroelectric layer 104 can be changed in accordance with the situation. For example, when a voltage pulse of +5 V having a width of 10 as is applied four times to set the high resistance state, and a short pulse of −4 V having a width of 1 µs is applied 10 times, the state can be changed to the low resistance state. When a short pulse of +5 V having a width of 1 µs is applied 100 times in this state, the state can be changed to the high resistance state. When a low voltage pulse of −3 V having a width of 100 µs is applied 100 times in this state, the state can be changed to the low resistance state.

Figure 18:
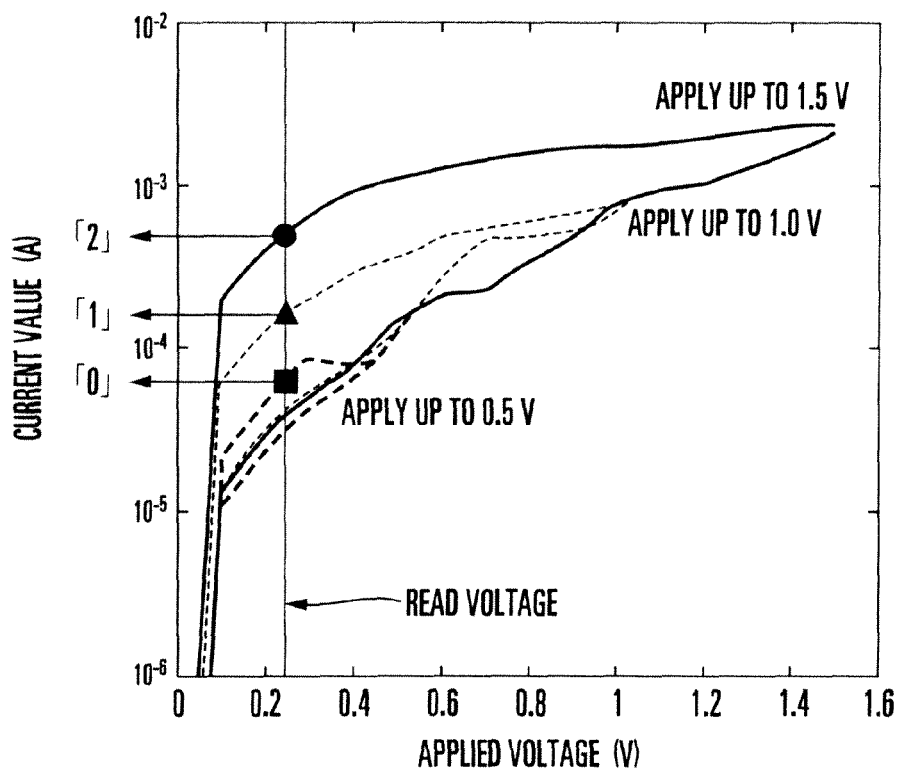
FIG. 18 is a view for explaining the multilevel operation of the element shown in FIG. 1.

According to the ferroelectric element shown in FIG. 1, a multilevel memory operation is also possible. For example, in the current-voltage characteristic when a DC voltage is applied between the upper electrode 105 and the lower electrode layer 103, when the positive-side applied voltage is changed, the low resistance state changes to a different low resistance state, as shown in FIG. 18. In FIG. 18, the current value at the read voltage shown in FIG. 18 changes between the low resistance state after a voltage up to 0.5 V is applied, the low resistance state after a voltage up to 1.0 V is applied, and the low resistance state after a voltage up to 1.5 V is applied. A memory which can have three states (three values) "0", "1", and "2" in correspondence with the current values at the read voltage in the respective states can be implemented.

Figures 19, 20:
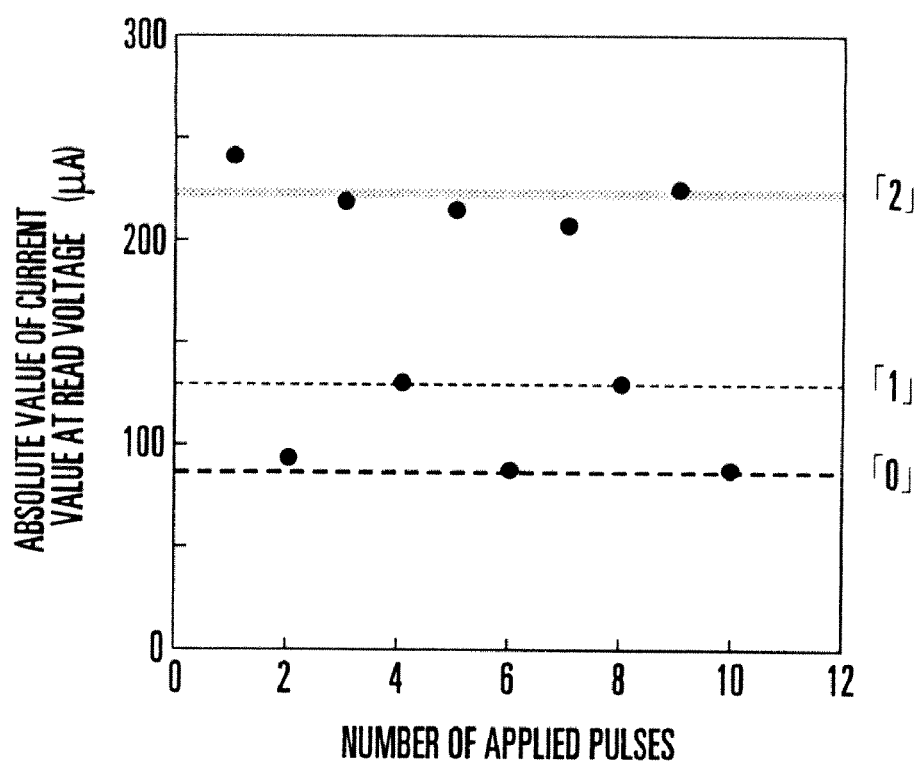
FIG. 19 is a view for explaining the multilevel operation of the element shown in FIG. 1.
FIG. 20 is a view for explaining the multilevel operation of the element shown in FIG. 1.

According to the element shown in FIG. 1, a multilevel memory can be implemented by the difference in pulse voltage value. As shown in FIG. 19, every time a predetermined pulse voltage with a predetermined pulse width is applied a predetermined number of times, the current value is read out at a read voltage of −0.2 V at a point indicated by a triangle. Then, as shown in FIG. 20, three states (three values) "0", "1", and "2" are obtained. In this example, the memory is reset by the state "2".

Other metal materials usable for each electrode of the element shown in FIG. 1 will be described next. A case wherein the lower electrode layer 103 which the ferroelectric layer 104 contacts in the ferroelectric element shown in FIG. 1 is made of platinum will be described first. In this case, the lower electrode layer 103 is a multilayered film formed by stacking ruthenium and platinum in this order from the side of the insulating layer 102. The lower electrode layer 103 may be a multilayered film formed by stacking titanium and platinum in this order from the side of the insulating layer 102. When a ruthenium or titanium layer is provided on the side of the insulating layer 102, the adhesion to the insulating layer 102 increases.

Figure 21:
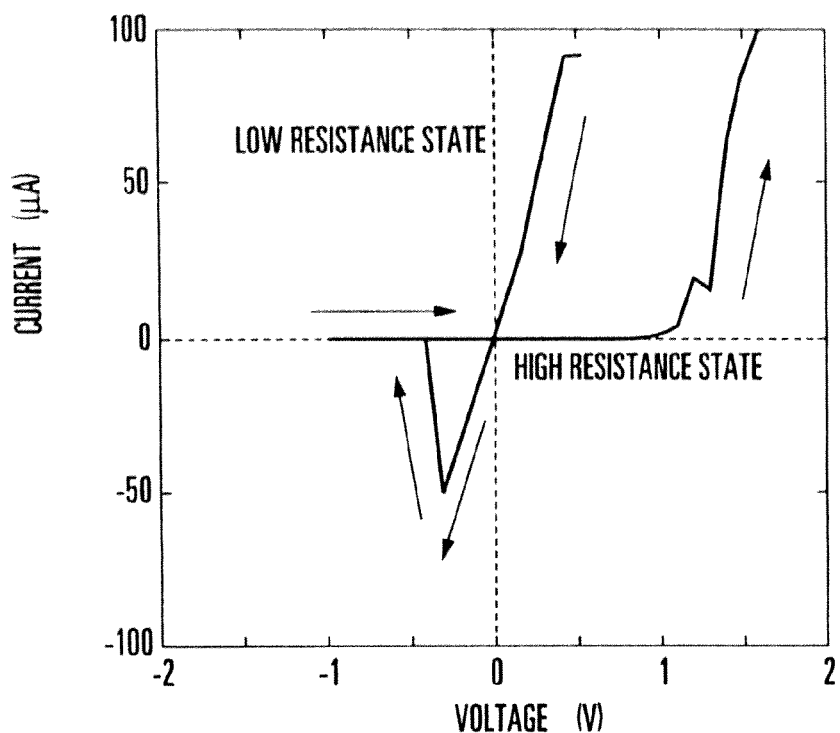
FIG. 21 is a graph showing the current-voltage characteristic when the electrode is made of another metal material.

The ferroelectric element in which the ferroelectric layer 104 is formed in contact with the lower electrode layer 103 made of platinum has a current-voltage characteristic shown in FIG. 21. FIG. 21 shows the hysteresis characteristics of the values of currents which flow in the ferroelectric layer 104 when the voltage applied to the upper electrode 105 is increased from 0 in the positive direction, returned to 0, decreased in the negative direction, and finally returned to 0 again. When the voltage applied to the upper electrode 105 is gradually increased from 0 V in the positive direction, the positive current flowing in the ferroelectric layer 104 is relatively small (high resistance state).

When the voltage exceeds 1 V, the positive current value starts abruptly increasing. After the voltage is increased up to about 1.6 V, the positive voltage is decreased to a voltage value of about 0.5 or less. Then, the current value starts decreasing (low resistance state). At this time, the positive current readily flows as compared to the above-described high resistance state. The current value is about 50 µA at 0.2 V. When the applied voltage is returned to 0, the current value also becomes 0.

Next, a negative voltage is applied to the upper electrode 105. In this state, when the negative voltage is low, a relatively large negative current flows according to the previous hysteresis. When the applied negative voltage is changed up to about −0.3 V, the negative current suddenly starts decreasing. When the applied negative voltage is changed up to about −0.4 V, the negative current value continuously decreases and returns to 0. After that, even when the voltage applied to the upper electrode 105 is changed up to about −0.1 V and then to 0 V, the current rarely flows.

As described above, even when the lower electrode layer 103 made of platinum is used, the ferroelectric layer 104 has the two stable states, i.e., low resistance state and high resistance state. Each state remains unless the above-described positive or negative voltage with a predetermined magnitude or more is applied. Hence, even when the lower electrode layer 103 of the ferroelectric element shown in FIG. 1 is made of platinum, a nonvolatile functional element capable of a nondestructive read operation can be implemented by the ferroelectric element shown in FIG. 1.

A case wherein the lower electrode layer 103 which the ferroelectric layer 104 contacts in the ferroelectric element shown in FIG. 1 is made of titanium nitride will be described next. In this case, the lower electrode layer 103 is formed from a titanium nitride monolayer film. The ferroelectric element in which the ferroelectric layer 104 is formed in contact with the lower electrode layer 103 made of titanium nitride has a current-voltage characteristic shown in FIG. 22.

Figure 22:
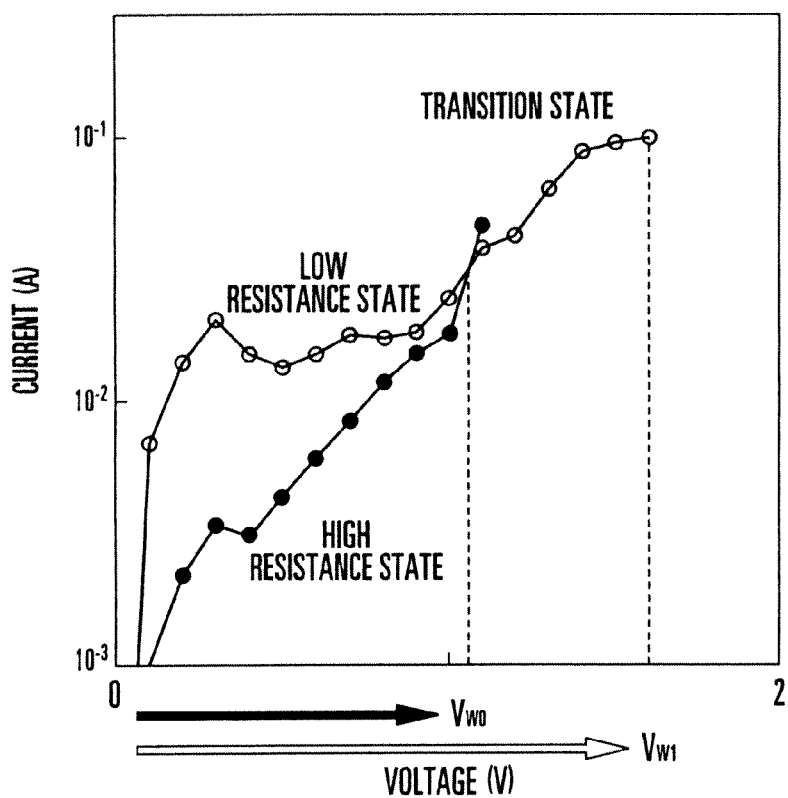
FIG. 22 is a graph showing the current-voltage characteristic when the electrode is made of another metal material.

When the lower electrode layer 103 is made of titanium nitride, and the positive voltage applied to the upper electrode 105 is swept from 0 V to $V_{W0}$, the high resistance state is held, as indicated by filled circles in FIG. 22. When the positive voltage applied to the upper electrode 105 is increased to $V_{W1}$ higher than $V_{W0}$, the state changes to the low resistance state indicated by open circles in FIG. 22. When the voltage $V_{W0}$ is applied to the upper electrode 105, the state changes to the high resistance state.

As described above, even when the lower electrode layer 103 made of titanium nitride is used, the ferroelectric layer 104 has the two stable states, i.e., low resistance state and high resistance state. Each state remains unless the above-described positive or negative voltage with a predetermined magnitude or more is applied. Hence, even when the lower electrode layer 103 of the ferroelectric element shown in FIG. 1 is made of titanium nitride, a nonvolatile functional element capable of a nondestructive read operation can be implemented by the ferroelectric element shown in FIG. 1.

A case wherein the lower electrode layer 103 formed on the insulating substrate 1101 made of quartz in the ferroelectric element shown in FIG. 11 is made of ruthenium, and the upper electrode 105 is made of titanium nitride will be described. When the upper electrode 105 made of titanium nitride is formed on the ferroelectric layer 104, a current-voltage characteristic shown in FIG. 23 is obtained, which exhibits the same tendency as in FIG. 21. Hence, even when the upper electrode 105 is made of titanium nitride, the ferroelectric layer 104 has the two stable states, i.e., low resistance state and high resistance state. Each state remains unless the above-described positive or negative voltage with a predetermined magnitude or more is applied.

Hence, even when the upper electrode 105 of the ferroelectric element shown in FIG. 11A is made of titanium nitride, a nonvolatile functional element capable of a nondestructive read operation can be implemented by the ferroelectric element shown in FIG. 11A. Even in the ferroelectric element with the above-described structure, each state is held for a long time, as is apparent from FIG. 24.

Generally, a $Bi_4Ti_3O_{12}$ crystal is a bismuth layer-structured ferroelectric having a pseudo-perovskite structure. When the film thickness is decreased to 40 nm or less, no clear ferroelectricity is observed because a large leakage current flows, as is known. Even in the ferroelectric layer (metal oxide thin film) of this embodiment, which is made of $Bi_4Ti_3O_{12}$ and has the structure shown in FIG. 1B, when the film thickness is 40 nm or less, a large current flows (measured value), and no clear ferroelectricity is observed. To the contrary, when the thickness of the metal oxide thin film exceeds 40 nm, the flowing current (measured value) becomes small in a state immediately after film formation, and ferroelectricity is slightly observed.

Figure 25A:
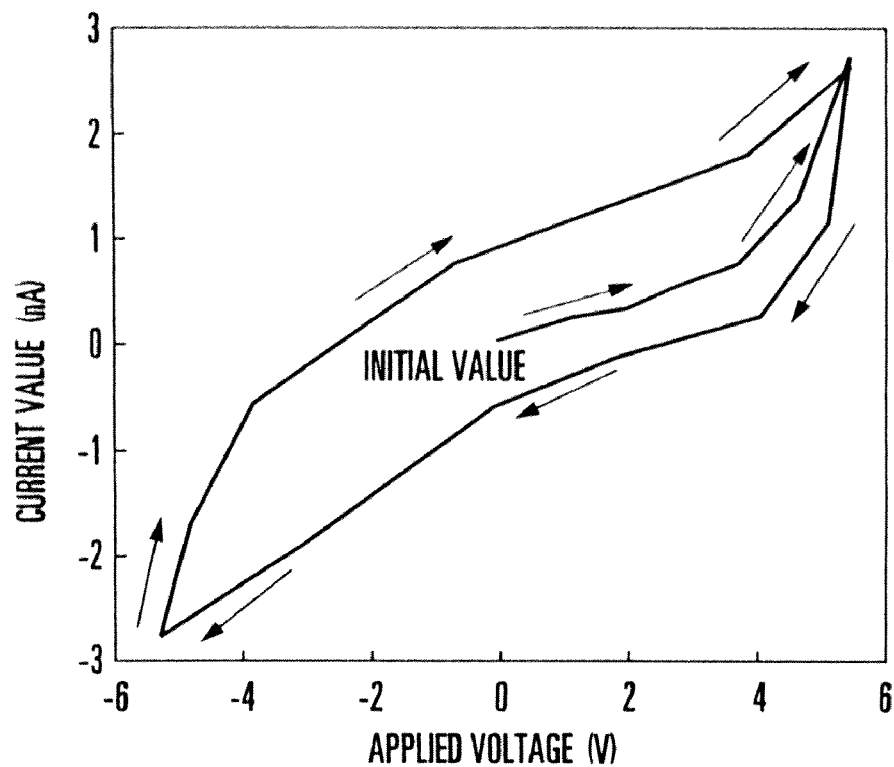
FIGS. 25A and 25B are graphs each showing the general current-voltage characteristic of a ferroelectric (thin film) made of an oxide containing at least two metals.

When the leakage current (measured value) is so small that ferroelectricity is observed, the metal oxide thin film of the ferroelectric layer 104 shown in FIG. 1 exhibits a current-voltage characteristic shown in FIG. 25A. The state shown in FIG. 25A will be described. When a positive DC voltage is applied in the initial state wherein the voltage is 0 V at 0 A, a positive current starts flowing. The value of the flowing current moderately increases first. When a voltage of +4 V or more is applied, the current value becomes large. A current of +2.5 nA flows at +5.3 V.

The applied voltage is sequentially decreased from this state. Unlike the current-voltage characteristic from the initial value, the characteristic shows a tendency not to flow the current. This is because since the voltage is swept and decreased, the amount of charges stored between capacitors decreases over time, and this decrease appears as a negative displacement current. Hence, the leakage current measured here equals a value obtained by adding the above-described displacement current to the leakage current actually flowing in the film. For example, when the voltage is decreased up to +4 V, a current of only about +0.1 nA flows, unlike when the voltage is increased (+1 nA). When the applied voltage is decreased to 0 V, a current of −0.5 nA flows.

When a negative voltage is applied further, for example, a negative current of about −2.3 nA flows at −4 V, and a negative current of about −2.8 nA flows at −5.3 V. When the negative voltage is swept in the positive direction to make it closer to 0, a displacement current opposite to the previous case flows. Since the above-described positive displacement current is observed as a leakage current in addition to the leakage current actually flowing through the film, a current-voltage characteristic different from that observed when the voltage is swept in the negative direction is obtained. For example, a current of only about −0.5 nA flows at −4 V. Even when the applied voltage is set to 0 V, a positive current of +1 nA flows.

Figure 25B:
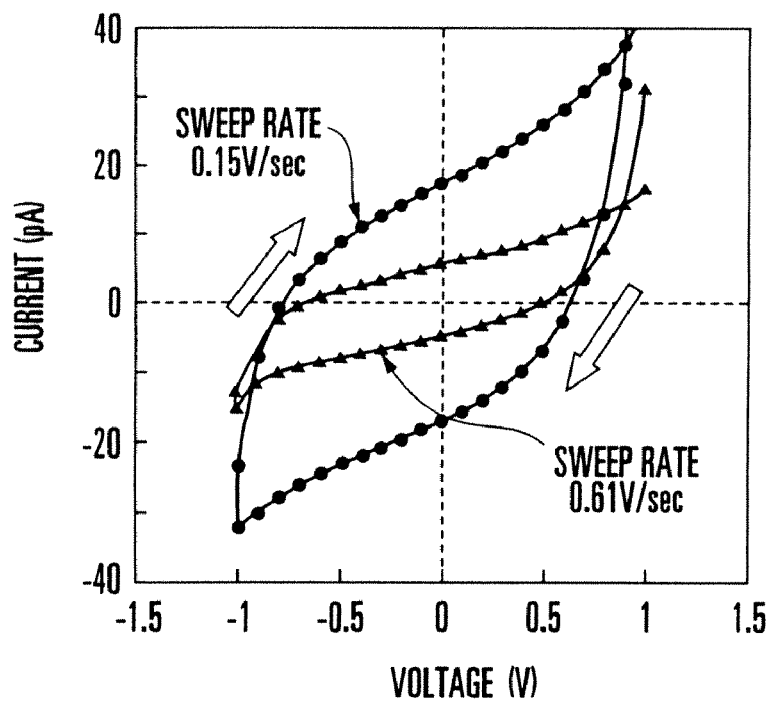

As described above, when the leakage current is small, the behavior of the displacement current is dominant. For this reason, a change in current-voltage characteristic caused by the difference in voltage sweep direction (increase or decrease in voltage) is conspicuously observed. However, such a phenomenon occurs because the time-rate change in charge amount between capacitors appears as a positive or negative displacement current which changes depending on the sweep direction. Hence, the phenomenon disappears when the voltage sweep is slowed down. For example, when the current-voltage characteristic is measured at different sweep rates in the same element as described above, the characteristic changes, as shown in FIG. 25B. As is apparent from FIG. 25B, when the sweep rate is low, the current-voltage characteristic largely changes due to the difference in sweep direction. When quasi-static sweep is executed by further decreasing the sweep rate, the same current-voltage characteristic is obtained independently of the sweep direction, and only the characteristic of the leakage current actually flowing in the film is observed.

The phenomenon similar to the hysteresis of the current-voltage characteristic shown in FIG. 25A is observed only because the positive or negative displacement current which changes depending on voltage sweep is superimposed on the leakage current actually flowing in the film. This phenomenon occurs independently of the change in resistance of the element (the change in value of the leakage current actually flowing in the film) and can be observed in dielectric capacitors including general ferroelectrics. Such a change in current-voltage characteristic cannot be used as a memory operation in principle, as a matter of course.

Figure 26:
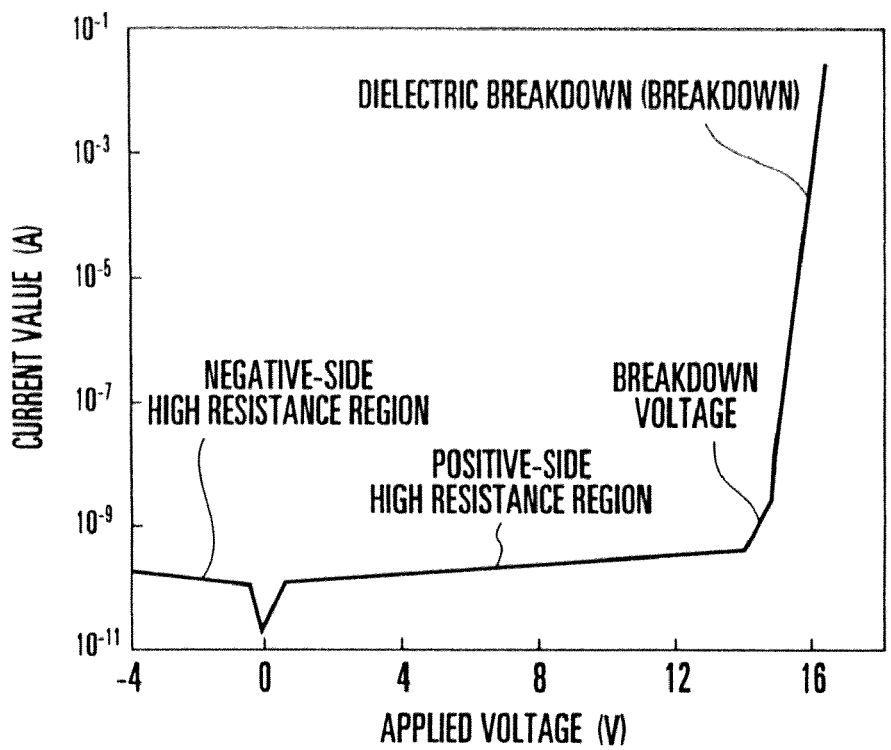
FIG. 26 is a graph showing the process of dielectric breakdown (breakdown)

As is generally known, an insulating film or ferroelectric film with a high breakdown voltage causes dielectric breakdown upon application of a high voltage more than 5 V. For example, a case wherein a high voltage is applied to a ferroelectric thin film made of a ferroelectric with a high breakdown voltage and having a thickness of, e.g., 200 nm or more will be described below. As shown in FIG. 26, even when the applied voltage is increased up to +15 V, only a very small current of about $10^{-9}$ A flows. However, when a higher voltage is applied, the current abruptly flows to cause dielectric breakdown (breakdown) so that the thin film itself is damaged. From then, a large current always flows in the thin film that has caused dielectric breakdown so no state with two or more resistance values can be obtained.

Figure 27:
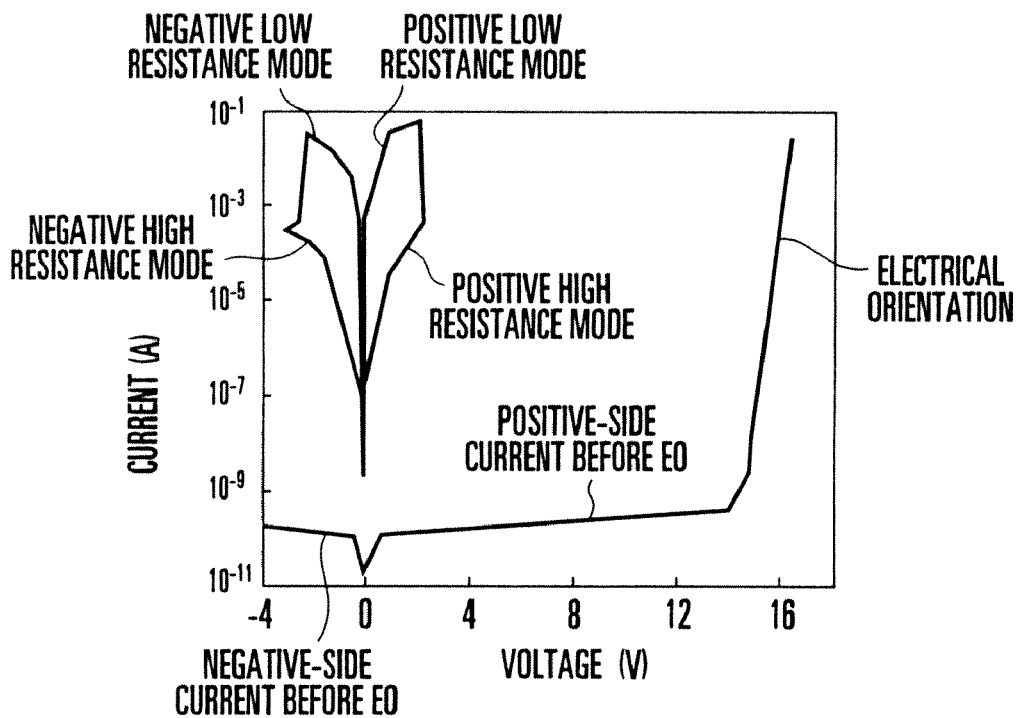
FIG. 27 is a graph showing the current-voltage characteristic of the ferroelectric layer 104 having a predetermined thickness or more.

Contrary to the above-described characteristic of ferroelectrics, the "metal oxide thin film (ferroelectric layer 104) formed by dispersing the plurality of microcrystalline grains of $Bi_4Ti_3O_{12}$ with a grain size of about 3 to 15 nm in the base layer containing titanium in an excessive amount relative to the stoichiometric composition of $Bi_4Ti_3O_{12}$" as shown in FIGS. 1B, 7 and 9 exhibits a current-voltage characteristic shown in FIG. 27 when the thickness is about 40 nm. In the initial stage after the ferroelectric layer 104 is formed by ECR sputtering, and the element shown in FIG. 4D is formed, as described with reference to FIGS. 4A to 4D and 5, the element exhibits a high breakdown voltage so that only a very small current of about $10^{-9}$ A flows even when a voltage up to 14 V is applied.

When a voltage more than 15 V is applied, the current abruptly flows, like the characteristic shown in FIG. 26. When a negative voltage is applied to the ferroelectric layer 104 after the high voltage is applied to readily flow the current, a current of about $-10^{-2}$ A flows. However, if the applied negative voltage is about −2 V, a high resistance state without flowing a current is abruptly set. When a positive voltage is applied from this state, a current-voltage characteristic in a positive high resistance state is obtained. The current value abruptly increases at about +2.5 V to set a positive high resistance state. This is the same as the characteristic shown in FIG. 21.

As described above, when a high voltage of about +15 V is applied to the ferroelectric layer 104 with a thickness of about 40 nm or more in the film formation initial state with a high breakdown voltage, a characteristic current-voltage characteristic as shown in FIG. 2 is obtained. The initial process for changing the film formation initial state to a state to exhibit a resistance change characteristic will be referred to as an EO (Electrical Orientation) process. When the metal oxide thin film according to this embodiment, which is formed thick and ensures a high breakdown voltage, undergoes the EO process, the above-described characteristic is obtained, and a ferroelectric element can be implemented.

In the above-described EO process, a voltage more than 10 V is applied to the element. For this reason, when elements shown in FIG. 1 are formed in integration with semiconductor elements and subjected to the EO process, the semiconductor elements may be broken. To suppress this, the EO process may be done by using ECR plasma. In, e.g., an ECR plasma apparatus, a plasma flow can be generated by a divergent magnetic field, and a substrate to be processed can be irradiated with the plasma flow with an energy of 20 to 30 eV. In a section perpendicular to the plasma flow divergent direction, the plasma flow has an energy distribution from the center to the periphery because the distribution of the magnetic field is reflected.

This energy distribution can be controlled between several eV and several ten eV by the degree of divergence of the divergent magnetic field so that a potential difference from several V to several ten V can be generated between the center and the periphery. Hence, when one end of the interconnection connected to the lower electrode layer 103 of the element shown in FIG. 1 is exposed to the peripheral portion of the plasma flow, and the upper electrode 105 is exposed to the central portion of the plasma flow, a voltage necessary for the EO process can be applied between the two electrodes by the potential difference generated from the distribution in the plasma flow. For example, when the element is irradiated with a plasma mainly containing Ar, the EO process can be done in a short time of 1 sec to several ten sec.

Figure 28:
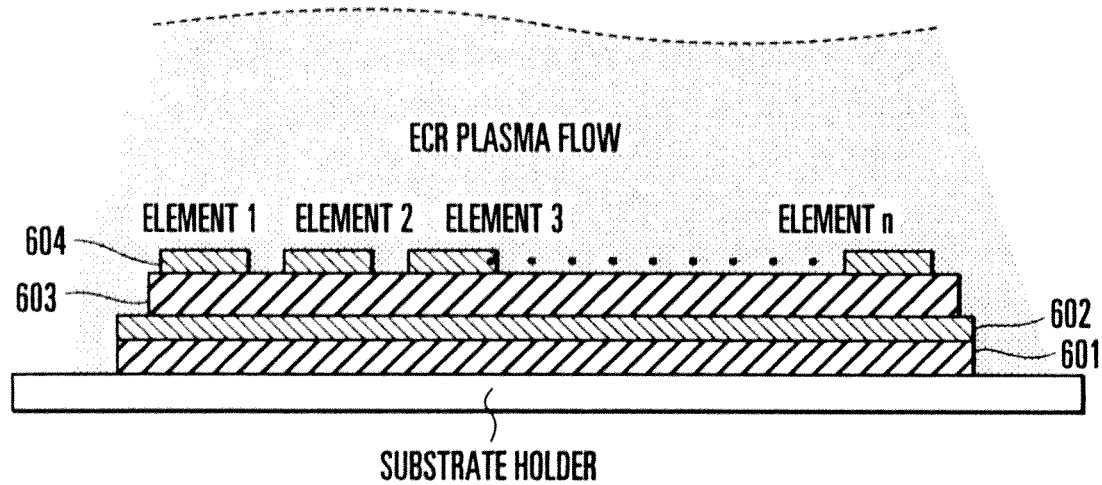
FIG. 28 is a view for explaining a state wherein an EO process is executed by irradiating a plurality of elements with ECR plasma.

When a plasma is used as described above, a plurality of elements can be subjected to the EO process, as shown in FIG. 28. FIG. 28 shows a state wherein a device on which a plurality of elements are integrated by the plurality of upper electrodes 604 on the common ferroelectric layer 603 shown in FIG. 12A is irradiated with an ECR plasma flow to execute the EO process. When the potential difference generated from the distribution of the ECR plasma flow is controlled to a value exceeding the potential difference necessary for the EO process of the plurality of elements, the plurality of elements integrated on the device can undergo the EO process.

Figure 29:
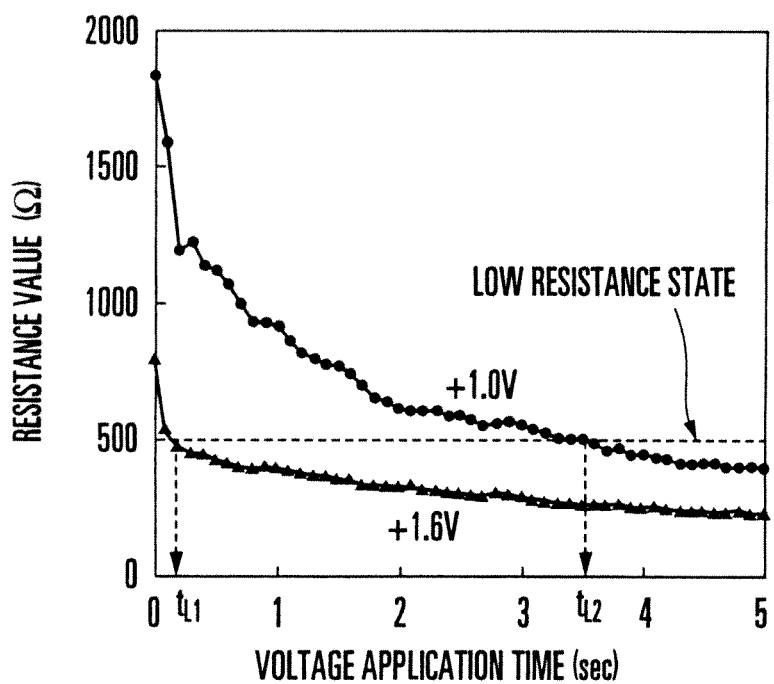
FIG. 29 is an explanatory view showing a change in resistance value of the element when a voltage of +1 V is applied to the element which moderately changes to a low resistance state at +1.6 V.

The voltage value to switch (change) the resistance value of the ferroelectric layer 104 can be controlled by changing the voltage application time, as shown in FIG. 29. FIG. 29 is an explanatory view showing a change in resistance value of the element when a voltage of +1 V is applied to the element which moderately changes to the low resistance state at +1.6 V. Referring to FIG. 29, the abscissa represents the voltage application time, and the ordinate represents the resistance value of the element. When a normal operation voltage of 1.6 V is applied, the element can be changed to the low resistance state in a short time $t_{L1}$ (about 150 ms). Even when a voltage of 1 V slightly lower than the normal operation voltage is applied, the element can be changed to the low resistance state by prolonging the application time to $t_{L2}$ (about 3.7 sec). As described above, when operation voltage is changed by controlling the voltage application time, the element can be driven as a memory.

Figure 30:
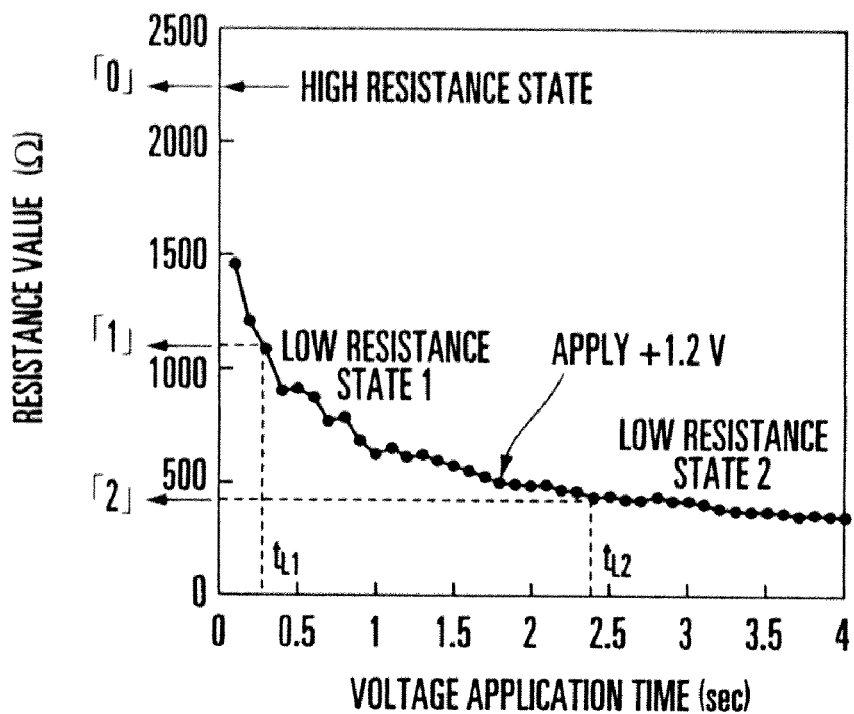
FIG. 30 is a graph showing a time-rate change in resistance value of the element when a predetermined voltage (e.g., 1.2 V) is applied between the upper electrode and the lower electrode layer.

A multilevel operation can be implemented in the following way. A multilevel memory (ternary) operation will be described below with reference to FIG. 30. FIG. 30 shows a time-rate change in resistance value of the element when a predetermined voltage (e.g., 1.2 V) is applied between the upper electrode and the lower electrode layer. For example, when the time of continuously applying a predetermined voltage between the upper electrode and the lower electrode layer is changed, two low resistance states can be obtained. As shown in FIG. 30, when a voltage is applied for $t_1$ sec (e.g., 250 ms) from the high resistance state, the state can be changed to a low resistance state 1 (data "1"). When the voltage is applied for a longer time $t_2$, the state can be changed to a low resistance state 2 (data "2"). The state can be changed to the high resistance state (data "0") at about −1.2 V to reset the element. A ternary memory can be implemented by changing the voltage application time from the reset state to $t_1$ and $t_2$.

Figure 31:
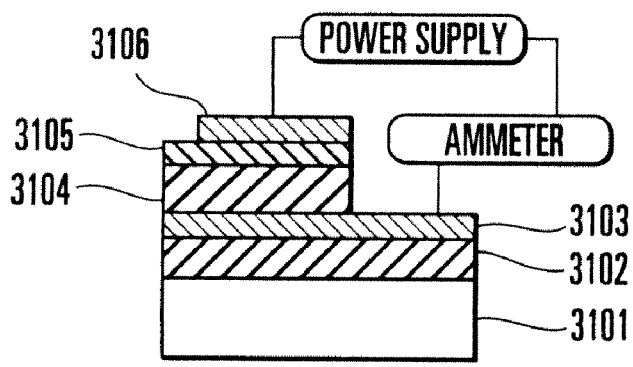
FIG. 31 is a sectional view schematically showing a structure example of still another element according to an embodiment of the present invention.

Another embodiment of the present invention will be described below with reference to the accompanying drawings. FIG. 31 is a sectional view schematically showing a structure example of a bistable resistance value acquisition device according to another embodiment of the present invention. Application to a ferroelectric element which uses a metal oxide layer (ferroelectric layer 3104) exhibiting ferroelectric properties will be described below. The element shown in FIG. 31 comprises, on a substrate 3101 made of, e.g., single-crystal silicon, an insulating layer 3102, a lower electrode layer 3103, the ferroelectric layer 3104, an insulating layer 3105, and an upper electrode 3106. The substrate 3101 can be made of any one of a semiconductor, insulator, and conductive material such as a metal. When the substrate 3101 is made of an insulating material, the insulating layer 3102 can be omitted. When the substrate 3101 is made of a conductive material, the insulating layer 3102 and lower electrode layer 3103 can be omitted. In this case, the substrate 3101 made of the conductive material serves as a lower electrode.

The lower electrode layer 3103 and upper electrode 3106 need only be made of a transition metal including noble metals such as platinum (Pt), ruthenium (Ru), gold (Au), and silver (Ag). The lower electrode layer 3103 and upper electrode 3106 may be made of a compound such as a nitride, oxide, or fluoride of a transition metal, such as titanium nitride (TiN), hafnium nitride (HfN), strontium ruthenate (SrRuO$_2$), zinc oxide (ZnO), indium tin oxide (ITO), or lanthanum fluoride (LaF$_3$), or a composite film formed by stacking them.

The insulating layer 3105 need only be made of silicon dioxide, silicon oxynitride, alumina, an oxide such as LiNbO$_3$ containing a light metal such as lithium, beryllium, magnesium, or calcium, or a fluoride such as LiCaAlF$_6$, LiSrAlF$_6$, LiYF$_4$, LiLuF$_4$, or KMgF$_3$. Alternatively, the insulating layer 3105 need only be made of an oxide or nitride of a transition metal such as scandium, titanium, strontium, yttrium, zirconium, hafnium, tantalum, or lanthanum series, a silicate (ternary compound of a metal, silicon, and oxygen) containing the above-described elements, an aluminate (ternary compound of a metal, aluminum, and oxygen) containing these elements, or an oxide or nitride containing at least two of the above elements.

The ferroelectric layer 3104 is made of, e.g., an oxide ferroelectric, like the above-described ferroelectric layer 104. The ferroelectric layer 3104 is made of a material such as an oxide, nitride, or fluoride which contains at least two metals and generally exhibits ferroelectric properties. A state wherein no ferroelectric properties are exhibited depending on the film thickness condition is also included, as described above.

A detailed example of the ferroelectric element shown in FIG. 31 will be described. For example, the lower electrode layer 3103 is a ruthenium film having a thickness of 10 nm. The ferroelectric layer 3104 is a Bi$_4$Ti$_3$O$_{12}$ film having a thickness of 40 nm. The insulating layer 3105 is a multilayered film made of tantalum pentoxide and silicon dioxide and having a thickness of 5 nm. The upper electrode 3106 is made of gold. The upper electrode 3106 may have a multilayered structure formed by stacking a titanium layer, titanium nitride layer, and gold layer in this order sequentially from the side of the insulating layer 3105. When the contact surface to the insulating layer 3105 is formed from a titanium layer, the adhesion can be increased. As described above, the structures of the substrate 3101 and insulating layer 3102 are not limited to those described above, and any other material can also be selected appropriately if it has no effect on the electrical characteristics.

A detailed method of forming the above-described insulating layer 3102, lower electrode layer 3103, ferroelectric layer 3104, insulating layer 3105, and upper electrode 3106 will be described later. They can be formed by sputtering a metal target or sintered target in ECR plasma made of argon gas, oxygen gas, or nitrogen gas by using an ECR sputtering apparatus shown in FIG. 5, as in FIG. 1A.

Figure 32A:
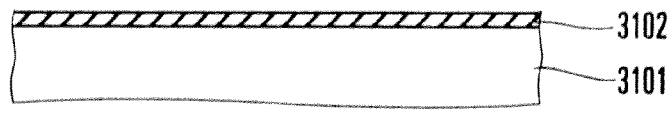
FIGS. 32A to 32E are views showing steps in manufacturing the element shown in FIG. 31.

An example of a method of manufacturing the ferroelectric element shown in FIG. 31 will be described next with reference to FIGS. 32A to 32E. As shown in FIG. 32A, the p-type silicon substrate 3101 having a plane orientation of (100) on the principal plane and a resistivity of 1 to 2 Ωcm is prepared. The surface of the substrate 3101 is cleaned by a solution mixture of sulfuric acid and a hydrogen peroxide solution, pure water, and a hydrogen fluoride solution and dried.

The insulating layer 3102 is formed on the cleaned and dried substrate 3101. In forming the insulating layer 3102, the ECR sputtering apparatus shown in FIG. 5 is used. The substrate 3101 is fixed on a substrate holder 504 in a process chamber 501. Pure silicon (Si) is used as a target 505. The insulating layer 3102 in a metal mode by Si—O molecules is formed on the substrate 3101 to a thickness to just cover its surface by ECR sputtering using argon (Ar) as a plasma gas and oxygen gas.

In ECR sputtering shown in FIG. 5, a plasma production chamber 502 is evacuated to a high vacuum state on the order of $10^{-5}$ Pa. For example, Ar gas as a rare gas is supplied at a flow rate of about 20 sccm from an inert gas supply unit 511 into the plasma production chamber 502 to set the internal pressure of the plasma production chamber 502 on the order of, e.g., $10^{-2}$ to $10^{-3}$ Pa. A coil current of, e.g., 28 A is supplied to a magnetic coil 510 to give the magnetic field of the electron cyclotron resonance condition to the plasma production chamber 502. The magnetic flux density in the plasma production chamber 502 is set to, e.g., about 87.5 mT (tesla).

A microwave of, e.g., 2.45 GHz (e.g., 500 W) is supplied from a microwave generation unit (not shown) into the plasma production chamber 502 through a waveguide 508, quartz window 507, and vacuum waveguide 506. With this supply of the microwave, Ar plasma is produced in the plasma production chamber 502. Note that sccm is the unit of flow rate and indicates that a fluid at 0° C. and 1 atmospheric pressure flows 1 cm³ in 1 min.

The plasma produced by the above-described method is output from the plasma production chamber 502 to the side of the process chamber 501 by the divergent magnetic field of the magnetic coil 510. In addition, a high-frequency power (e.g., 13.56 MHz or 500 W) is supplied from a high-frequency power supply 522 to the target 505 placed at the outlet of the plasma production chamber 502. When Ar particles collide against the target 505, a sputtering phenomenon occurs to sputter Si particles from the target 505.

After this state is obtained, a shutter (not shown) between the process chamber 501 and the substrate 3101 is opened. The Si particles sputtered from the target 505 reach the surface of the substrate 3101 together with the plasma output from the plasma production chamber 502 and the oxygen gas which is supplied from a reactive gas supply unit 512 and activated by the plasma and are oxidized to silicon dioxide by the activated oxygen.

With the above process, the insulating layer 3102 made of silicon dioxide and having a thickness of, e.g., about 100 nm can be formed on the substrate 3101 (FIG. 32A). When the insulating layer is formed to a predetermined thickness, the above-described shutter is closed not to make the sputtered material reach the substrate 3101, thereby stopping film formation. After that, plasma irradiation is stopped by, e.g., stopping supplying the microwave power. Supply of the gases is stopped. When the substrate temperature decreases to a predetermined value, and the internal pressure of the process chamber 501 is increased to the atmospheric pressure, the substrate 3101 which has undergone film formation is unloaded from the process chamber 501.

The insulating layer 3102 ensures insulation to prevent a voltage from leaking to the substrate 3101 and influencing desired electrical characteristics when a voltage is applied between the lower electrode layer 3103 and upper electrode 3106 to be formed later. For example, a silicon oxide film formed by oxidizing the surface of the silicon substrate by thermal oxidation may be used as the insulating layer 3102. The insulating layer 3102 may be made of any other insulating material except silicon oxide if the insulating properties can be ensured. The thickness of the insulating layer 3102 need not always be 100 nm and may be smaller or larger. In the above-described formation of the insulating layer 3102 by ECR sputtering, the substrate 3101 is not heated. However, the film may be formed while heating the substrate 3101.

After the insulating layer 3102 is formed in the above-described manner, the substrate 3101 is unloaded from the apparatus to the atmosphere. The substrate 3101 is fixed on the substrate holder 504 of the same ECR sputtering apparatus as in FIG. 5 in which pure ruthenium (Ru) is used as the target 505. ECR sputtering using argon (Ar) as a plasma gas and xenon (Xe) is executed to form an Ru film on the insulating layer 3102 to a thickness to just cover its surface, thereby forming the lower electrode layer 3103, as shown in FIG. 32B.

Formation of the Ru film will be described in detail. In the ECR sputtering apparatus shown in FIG. 5, the substrate 3101 is heated to, e.g., about 400° C. Next, Ar gas as a rare gas is supplied at a flow rate of, e.g., 7 sccm from the inert gas supply unit 511 into the plasma production chamber 502, and Xe gas is supplied at a flow rate of, e.g., 5 sccm to set the internal pressure of the plasma production chamber 502 on the order of, e.g., $10^{-2}$ to $10^{-3}$ Pa. A coil current of, e.g., 26 A is supplied to the magnetic coil 510 to give the magnetic field of the electron cyclotron resonance condition to the plasma production chamber 502.

A microwave of, e.g., 2.45 GHz (e.g., 500 W) is supplied from the microwave generation unit (not shown) into the plasma production chamber 502 through the waveguide 508, quartz window 507, and vacuum waveguide 506. With this supply of the microwave, a plasma of Ar and Xe is produced in the plasma production chamber 502. The produced plasma is output from the plasma production chamber 502 to the side of the process chamber 501 by the divergent magnetic field of the magnetic coil 510. In addition, a high-frequency power (e.g., 500 W) is supplied from the high-frequency electrode supply unit to the target 505 placed at the outlet of the plasma production chamber 502. When Ar particles collide against the target 505, a sputtering phenomenon occurs to sputter Ru particles from the target 505. The Ru particles sputtered from the target 505 reach the surface of the insulating layer 3102 on the substrate 3101 and are deposited.

Figure 32B:
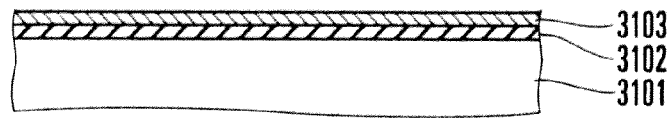

With the above process, the lower electrode layer 3103 having a thickness of, e.g., about 10 nm can be formed on the insulating layer 3102 (FIG. 32B). The lower electrode layer 3103 enables voltage application to the ferroelectric layer 3104 and insulating layer 3105 when a voltage is applied between the lower electrode layer 3103 and the upper electrode 3106 to be formed later. The lower electrode layer 3103 may be made of any other material except ruthenium if the conductivity can be ensured. The thickness of the lower electrode layer 3103 need not always be 10 nm and may be smaller or larger.

As described above, in forming the Ru film by ECR sputtering, the substrate 3101 is heated to 400° C. However, the substrate need not always be heated. However, if the substrate is not heated, the adhesion of ruthenium to silicon dioxide becomes low, and the film may peel off. To prevent peeling, the film is formed preferably while heating the substrate. After Ru is deposited to a desired thickness in the above-described way, an end process is executed by stopping film formation by, e.g., closing the shutter and stopping plasma irradiation by stopping supply of the microwave power. Then, the substrate 3101 can be unloaded.

Figure 32C:
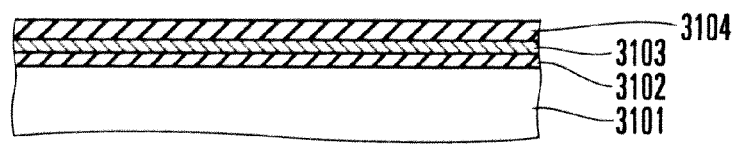

After the lower electrode layer 3103 is formed in the above-described manner, the substrate 3101 is unloaded from the apparatus to the atmosphere. The substrate 3101 is fixed on the substrate holder 504 of the same ECR sputtering apparatus as in FIG. 5 in which a sintered body (Bi—Ti—O) with an Bi—Ti ratio of 4:3 is used as the target 505. ECR sputtering using argon (Ar) as a plasma gas and oxygen gas is executed to form the ferroelectric layer 3104 on the lower electrode layer 3103 to a thickness to just cover its surface, as shown in FIG. 32C.

Formation of the ferroelectric layer 3104 will be described in detail. In the ECR sputtering apparatus shown in FIG. 5 in which the target 505 made of Bi—Ti—O is used, the substrate 3101 is heated to, e.g., 300° C. to 700° C. Next, Ar gas as a rare gas is supplied at a flow rate of, e.g., 20 sccm from the inert gas supply unit 511 into the plasma production chamber 502, and $O_2$ gas serving as a reactive gas is supplied at a flow rate of, e.g., 1 sccm to set the pressure on the order of, e.g., $10^{-2}$ to $10^{-3}$ Pa. A coil current of, e.g., 27 A is supplied to the magnetic coil 510 to give the magnetic field of the electron cyclotron resonance condition to the plasma production chamber 502.

A microwave of, e.g., 2.45 GHz (e.g., 500 W) is supplied from the microwave generation unit (not shown) into the plasma production chamber 502 through the waveguide 508, quartz window 507, and vacuum waveguide 506. With this supply of the microwave, an Ar plasma is produced in the plasma production chamber 502. The produced ECR plasma is output from the plasma production chamber 502 to the side of the process chamber 501 by the divergent magnetic field of the magnetic coil 510. In addition, a high-frequency power (e.g., 500 W) is supplied from the high-frequency electrode supply unit to the target 505 placed at the outlet of the plasma production chamber 502. When Ar particles collide against the target 505, a sputtering phenomenon occurs to sputter Bi particles and Ti particles from the target 505.

The Bi particles and Ti particles sputtered from the target 505 reach the surface of the lower electrode layer 3103 together with the plasma output from the plasma production chamber 502 and the oxygen gas which is supplied from the reactive gas supply unit 512 and activated by the plasma and are oxidized by the activated oxygen. Although the target 505 is a sintered body and contains oxygen, any shortage of oxygen in the film can be prevented by supplying oxygen.

With the above-described film formation by ECR sputtering, the ferroelectric layer 3104 having a thickness of, e.g., about 40 nm can be formed (FIG. 32C). After that, the same end process as described above is executed to make it possible to unload the substrate. The film quality may be improved by irradiating the formed ferroelectric layer 3104 with ECR plasma of an inert gas and a reactive gas. As the reactive gas, not oxygen gas but nitrogen gas, fluorine gas, or hydrogen gas can be used. The film quality improvement can also be applied to formation of the insulating layer 3102 or formation of the insulating layer 3105 to be described later.

Figure 32D:
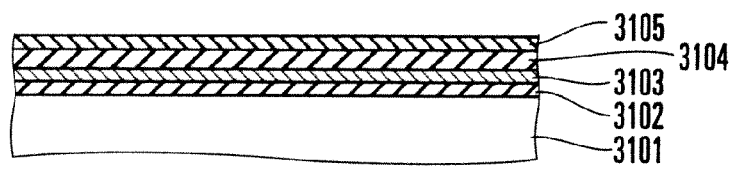

After the ferroelectric layer 3104 is formed in the above-described manner, the substrate 3101 is unloaded from the apparatus to the atmosphere. The substrate 3101 is fixed on the substrate holder 504 of the same ECR sputtering apparatus as in FIG. 5 in which pure tantalum (Ta) is used as the target 505. The insulating layer 3105 is formed on the ferroelectric layer 3104 to a thickness to just cover its surface, as shown in FIG. 32D, by ECR sputtering using argon (Ar) as a plasma gas and oxygen gas. A metal mode film by Ta—O molecules is formed as the insulating layer 3105, as will be described below.

Formation of a metal mode film by Ta—O molecules will be described in detail. In the ECR sputtering apparatus shown in FIG. 5 in which the target 505 made of tantalum is used, Ar gas as a rare gas is supplied at a flow rate of, e.g., 25 sccm from the inert gas supply unit 511 into the plasma production chamber 502 to set the internal pressure of the plasma production chamber 502 on the order of, e.g., $10^{-3}$ Pa. A coil current of, e.g., 28 A is supplied to the magnetic coil 510 to give the magnetic field of the electron cyclotron resonance condition to the plasma production chamber 502.

A microwave of, e.g., 2.45 GHz (e.g., 500 W) is supplied from the microwave generation unit (not shown) into the plasma production chamber 502 through the waveguide 508, quartz window 507, and vacuum waveguide 506. With this supply of the microwave, Ar plasma is produced in the plasma production chamber 502. The produced plasma is output from the plasma production chamber 502 to the side of the process chamber 501 by the divergent magnetic field of the magnetic coil 510. In addition, a high-frequency power (e.g., 500 W) is supplied from the high-frequency electrode supply unit to the target 505 placed at the outlet of the plasma production chamber 502.

When Ar particles collide against the target 505, a sputtering phenomenon occurs to sputter Ta particles from the target 505. The Ta particles sputtered from the target 505 reach the surface of the ferroelectric layer 3104 on the substrate 3101 together with the plasma output from the plasma production chamber 502 and the oxygen gas which is supplied from the reactive gas supply unit 512 and activated by the plasma and are oxidized to tantalum pentoxide by the activated oxygen.

With the above process, a tantalum pentoxide film is formed on the ferroelectric layer 3104. Subsequently, a silicon dioxide film is formed on the tantalum pentoxide film by ECR sputtering using the target 505 made of pure silicon, like silicon dioxide deposition described with reference to FIG. 32A. The above-described formation of a tantalum pentoxide film and silicon dioxide film is repeated to form a multilayered film including the tantalum pentoxide films and silicon dioxide films to, e.g., about 5 nm, thereby obtaining the insulating layer 3105 (FIG. 32D).

The insulating layer 3105 including the tantalum pentoxide films and silicon dioxide films is used to control the voltage to be applied to the ferroelectric film upon voltage application to the ferroelectric layer 3104. The insulating layer 3105 may have any other structure except the multilayered structure of tantalum pentoxide films and silicon dioxide films if it can control the voltage applied to the ferroelectric layer 3104. The insulating layer 3105 may be a single layer. The thickness is not limited to 5 nm, either. In the above-described ECR sputtering, the substrate 3101 is not heated but may be heated.

Figure 32E:
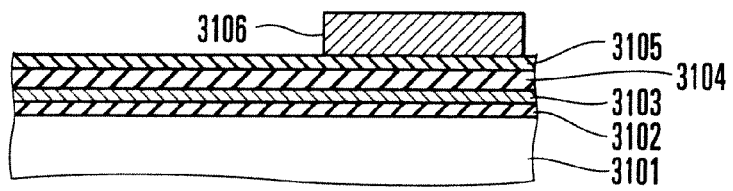

When the upper electrode 3106 made of Au and having a predetermined area is formed on the insulating layer 3105, as shown in FIG. 32E, an element using a layer formed from a ferroelectric can be obtained. The upper electrode 3106 can be formed by a well-known lift-off method and gold deposition by resistance heating vacuum deposition. The upper electrode 3106 may be made of another metal material or conductive material such as Ru, Pt, or TiN. When Pt is used, the adhesion is poor, and the film may peel off. Hence, the upper electrode 3106 must be formed as an electrode with a predetermined area by executing film formation by heating or using a structure such as Ti—Pt—Au that hardly peels off and executing a patterning process such as photolithography or lift-off on that structure.

As described above, when a high-quality $Bi_4Ti_3O_{12}$ film formed by, e.g., ECR sputtering is thinned to about 50 nm or less, the ferroelectricity tends to be small. In addition, when the $Bi_4Ti_3O_{12}$ film is made so thick as to flow a certain leakage current, a unique hysteresis appears in the measured current-voltage characteristic. Based on these findings, when these phenomena are notably used, an element to hold two states can be implemented by the element shown in FIG. 31, like the element shown in FIG. 1A.

The characteristics of the ferroelectric element shown in FIG. 31 will be described next. The characteristics were investigated by applying a voltage between the lower electrode layer 3103 and the upper electrode 3106. When a voltage from a power supply was applied between the lower electrode layer 3103 and the upper electrode 3106, and a current flowing when the voltage was applied was measured by an ammeter, a result shown in FIG. 33 was obtained. The memory operation principle of the present invention will be described below with reference to FIG. 33. The voltage values and current values to be described here are mere examples measured in an actual element. Hence, the phenomenon is not limited to the following numerical values. Other numerical values can also be measured depending on the material and thickness of each film actually used in the element and other conditions.

Figure 33:
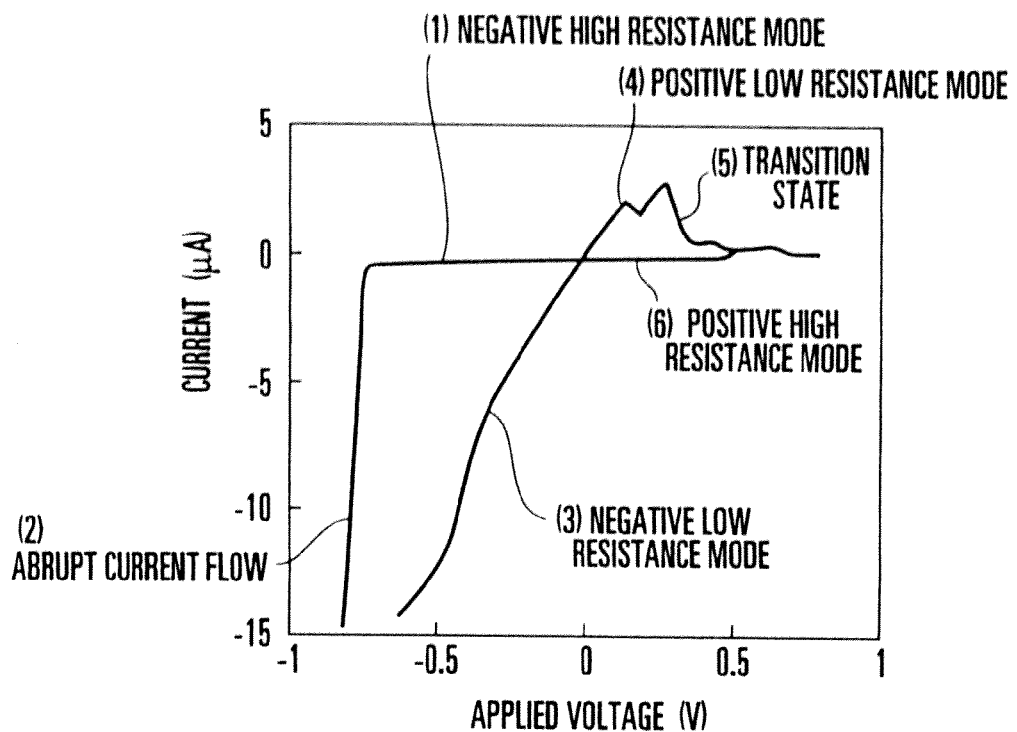
FIG. 33 is a graph showing a change in current density when a voltage is applied between a lower electrode layer 3103 and an upper electrode 3106 of the element shown in FIG. 31.

When a negative voltage is applied to the upper electrode 3106, the flowing current is very small up to −0.8 V, as indicated by (1) in FIG. 33. However, as indicated by (2), when the voltage exceeds −0.8 V, a negative current flows abruptly. Actually, a current larger than −15 μA also flows. However, since flowing of a larger current is inhibited to protect the measurement device, the current is not measured. In the range from 0 V to −0.8 V indicated by (1), a high resistance state is held (maintained) by inhibiting flowing of a large current as indicated by (2).

When a negative voltage is applied again to the upper electrode 3106, a locus to flow a negative current of −10 μA or more is obtained at −0.5 V, as indicated by (3). When the negative voltage is further applied to the upper electrode 3106, a current of −10 μA or more flows at about −0.5 V, as indicated by (3). When a positive voltage is applied to the upper electrode 3106, a positive current flows up to about +0.2 V, as indicated by (4). The current increases to 3 μA at maximum. When the absolute value of the voltage is decreased, the current traces a locus indicated by (4).

When the positive voltage is applied up to 0.2 V, the current traces the locus indicated by (4). After that, as indicated by (5), the value of the flowing current decreases, and no positive current flows. When the positive voltage is further applied to the upper electrode 3106, a locus to rarely flow a current is obtained, as indicated by (6). Even when the absolute value of the voltage is decreased then, the current rarely flows, as indicated by (6). When a negative voltage is applied to the upper electrode 3106, the current rarely flows up to about 0 to −0.8 V, as indicated by (1). Hence, the high resistance state wherein no current flows as in (1) is maintained unless a voltage of −0.8 V or more is applied to the upper electrode 3106 to prevent any sudden current flow as in (2). The state (1) will be referred to as a "negative high resistance mode".

For example, as indicated by (2), when a voltage of −0.8 V or more is applied to abruptly flow a current, a low resistance state in which the current readily flows is obtained, as indicated by (3). This state is also maintained while a negative voltage is applied to the upper electrode 3106. The state (3) will be referred to as a "negative low resistance mode".

However, when a positive voltage is applied to the upper electrode 3106, a low resistance state in which the current flows in a positive voltage range from 0 to 0.2 V is obtained, as indicated by (4). This state is also maintained while a positive voltage in the range of 0 to 0.2 V is applied. The state (4) will be referred to as a "positive low resistance mode".

When a positive voltage of 0.2 V or more is applied, no current flows, and the state changes to a high resistance state, as indicated by (5). In this state, the state wherein the current value has a high resistance is maintained while a positive voltage in the range of 0 to 2 V is applied, as indicated by (6). The state (6) will be referred to as a "positive high resistance mode".

As described above, the element using a ferroelectric layer shown in FIG. 31 apparently has four stable modes: "positive high resistance mode", "positive low resistance mode", "negative high resistance mode", and "negative low resistance mode". More specifically, the "positive high resistance mode" and "negative high resistance mode" are "high resistance modes" which exhibit the same high resistance state. The "positive low resistance mode" and "negative low resistance mode" are "low resistance modes" which exhibit the same low resistance state. That is, two modes are present. In the state of the "high resistance mode", the "high resistance mode" is maintained in the voltage range of −0.8 V to +0.8 V. When a voltage of −0.8 V or more is applied to change the state to the "low resistance mode", the "low resistance mode" is maintained in the voltage range of −0.5 V to +2.0 V. Switching between the two, "high resistance mode" and "low resistance mode" occurs. This also applied to the negative resistance modes, i.e., "negative high resistance mode" and "negative low resistance mode".

As for the actual current value in each "negative mode" when a voltage of −0.5 V is applied, the current value in the "negative high resistance mode" is $-5 \times 10^{-8}$ A, and that in the "negative low resistance mode" is $-1 \times 10^{-5}$ A. The ratio is as high as 200 times. This facilitates each mode identification. The present inventors estimate that the above-described phenomenon occurs when the resistance value of the ferroelectric film dramatically changes depending on the direction and magnitude of the applied voltage.

Since the insulating layer 3105 is provided between the ferroelectric layer 3104 and the upper electrode 3106, carriers can be controlled by the band structure of the insulating layer 3105. More specifically, for example, tantalum pentoxide has a band gap of about 4.5 eV. The energy difference viewed from the Fermi level is about 1.2 eV in the conduction band and 2.3 eV in the valence band. That is, the barrier is higher on the valence band side. Hence, the barrier effect is high for holes in the valence band but low for electrons in the conduction band. For further information, see Wilk et al., "J. Appl. Phys.", No. 87, p. 484 (2000).

From the above-described characteristic, when, e.g., a tantalum pentoxide film is used as the insulating layer between the electrode and the ferroelectric layer, a phenomenon that electrons readily flow but holes hardly flow can be expected. Actually, as shown in FIG. 33, the value of the flowing current largely changes between a case wherein a positive voltage is applied to the upper electrode 3106 and a case wherein a negative voltage is applied. In discriminating a memory, this has a large effect to increase the signal-to-noise ratio (S/N ratio) and facilitate data discrimination. This is the effect of use of the insulating layer 3105.

It was found that when the above-described "low resistance mode" and "high resistance mode" shown in FIG. 33 are applied as a memory operation, the element shown in FIG. 31 can be used as a nonvolatile nondestructive memory. More specifically, initialization of the element and data erase, i.e., the write of data "off" is done by changing the mode from the "low resistance mode" to the "high resistance mode" by applying a negative voltage of the upper electrode 3106, as indicated by (4) or (5) in FIG. 33.

The write of data "on" is done by abruptly flowing a current by applying a negative voltage of −0.8 V or more to the upper electrode 3106, as indicated by (2) in FIG. 33. With this operation, the mode is changed from the "high resistance mode" to the "low resistance mode", and data "on" is written. As described above, when a voltage is applied to the upper electrode 3106 to set the "high resistance mode" or "low resistance mode", "off" or "on" data (state) can be written.

The read of data written in the above-described way can easily be done by reading a current value when an appropriate voltage of −0.8 V to +0.8 V is applied to the upper electrode 3106. For example, when the mode state of the element shown in FIG. 31 is "off", i.e., "high resistance mode", it can be determined because a current hardly flows when an appropriate voltage of −0.8 V to +0.8 V is applied, as indicated by (1) in FIG. 33.

When the mode state of the element shown in FIG. 31 is "on", i.e., "low resistance mode", it can be determined because a current abruptly flows when an appropriate voltage of −0.5 V to +0.2 V is applied, as indicated by (2) in FIG. 33. Since the difference in current value between the "negative high resistance mode" and the "negative low resistance mode", i.e., "off" and "on" is 200 times or more, "off" and "on" can easily be determined. Even in the positive voltage range, "off" and "on" can be determined in the voltage range of 0 to +0.2 V.

The above-described read operation of the memory can easily be done only by checking whether the element shown in FIG. 31 is in the "high resistance mode" or "low resistance mode". In other words, while the element shown in FIG. 31 can hold the two modes, data is held. Even when a positive voltage is applied to the electrode to check the mode, the held mode does not change, and data is not destroyed. Hence, according to the ferroelectric element shown in FIG. 31, nondestructive read is possible. The element shown in FIG. 31 functions as a nonvolatile memory element since the resistance value of the ferroelectric layer 3105 changes depending on the voltage applied between the lower electrode layer 3103 and the upper electrode 3106. This element can also be used as a switching element to control the current.

The voltage to operate the element shown in FIG. 31 is maximized in the write to set the "negative low resistance mode". However, the voltage is about −0.8 V, and the power consumption is very low, as shown in FIG. 33. The low power consumption is very advantageous for devices. Devices using a memory, e.g., not only mobile communication devices, digital general-purpose devices, digital image sensing devices, notebook personal computers, and PDAs (Personal Digital Appliances) but also all computers, personal computers, workstations, office computers, mainframes, communication units, and multifunction apparatuses can reduce the power consumption.

Figure 34:
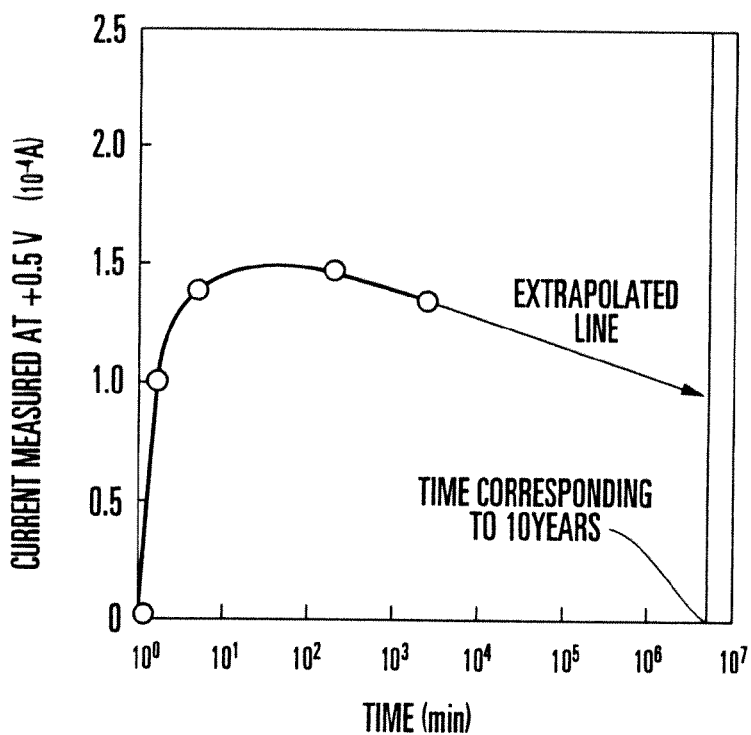
FIG. 34 is a view for explaining the data holding time of the element shown in FIG. 31.

FIG. 34 shows the data holding time of the element shown in FIG. 31. After a positive voltage is applied to the upper electrode 3106 to set the "positive high resistance state" shown in FIG. 33, i.e., "high resistance mode", a voltage of −0.8 V or more is applied to the upper electrode 3106 to set the "negative low resistance state" ("low resistance mode"), i.e., data "on" written state. A voltage of −0.3 V is applied to the upper electrode 3106 every predetermined time, and the value of a current flowing upon voltage application is measured. FIG. 34 shows the observation result.

The measured current is maximized about 10 min after and then moderately decreases up to 1,000 min. However, since the current value at this time is 86% of the maximum value, the data can be discriminated without any problem. As is predicted from the extrapolated line of 10,000,000 min corresponding to 10 years shown in FIG. 34, the current value after 10 years corresponding to 66% (⅔) of the maximum value, and the data can discriminated. As is apparent from the above description, the memory using the element shown in FIG. 31 has a data holding period of 10 years.

In the above-described example of the present invention, each of the insulating layer on the silicon substrate, the lower electrode layer on the insulating layer, and the ferroelectric layer on the lower electrode layer is formed by ECR sputtering. However, the method of forming each layer is not limited to ECR sputtering. For example, the insulating layer to be formed on the silicon substrate may be formed by thermal oxidation or CVD (Chemical Vapor Deposition) or a conventional sputtering method.

The lower electrode layer may be formed by any other film formation method such as EB deposition, CVD, MBE, or IBD. The ferroelectric layer can also be formed by the above-described MOD, conventional sputtering method, or PLD. However, when ECR sputtering is used, flat and excellent insulating film, metal film, and ferroelectric film can easily be obtained.

In the above-described embodiment, after each layer is formed, the substrate is temporarily unloaded into the atmosphere. However, the layers may be formed by a continuous process without unloading the structure into the atmospheric by using an apparatus which connects, through vacuum transfer chambers, the process chambers to realize ECR sputtering to form the respective layers. With this arrangement, the substrate to be processed can be transported in vacuum and is therefore prevented from being influenced by disturbance such as water adhesion. Hence, the film quality and interface properties can be improved.

As shown in Japanese Patent Laid-Open No. 2003-77911, after each layer is formed, the surface of the formed layer may be irradiated with ECR plasma to improve the properties. After each layer is formed, the formed layer may be annealed (heat-treated) in an appropriate gas atmosphere such as hydrogen atmosphere to greatly improve the properties of each layer.

Arraying elements and storing a plurality of data simultaneously in a memory is called "integration". The degree of integrating elements is called a degree of integration. The structure shown in FIG. 31 is very simple and can greatly increase the degree of integration as compared to a conventional memory cell. For DRAMs, SRAMs, or flash memories based on MOSFETs which must ensure gate, source, and drain regions, limitation on integration has been pointed out recently. However, the element shown in FIG. 31 uses the simple structure and can therefore increase the degree of integration without being affected by the current limitation on integration.

In the above-described embodiment, a DC voltage is applied. However, even when a pulse voltage having an appropriate width and magnitude is applied, the same effect as described above can be obtained. The basic idea of the present invention is arranging an insulating layer in contact with the ferroelectric layer and sandwiching these layers by two electrodes, as shown in FIG. 31. With this structure, when a predetermined voltage (DC or pulse) is applied between the two electrodes to change the resistance value of the ferroelectric layer and switch the stable high resistance mode and low resistance mode, a memory function can be implemented consequently.

Figure 35A:
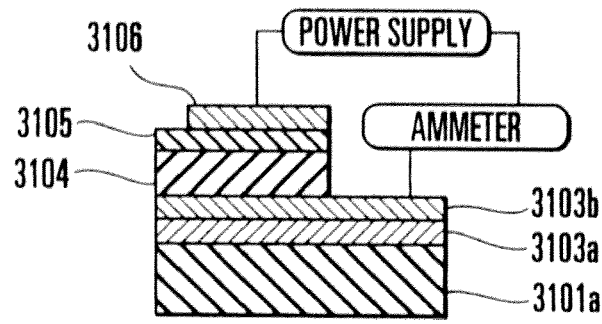
FIGS. 35A to 35D are sectional views schematically showing structure examples of still another element according to an embodiment of the present invention.
Figure 35B:
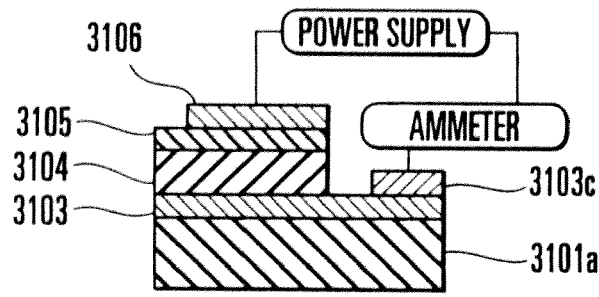
Figure 35C:
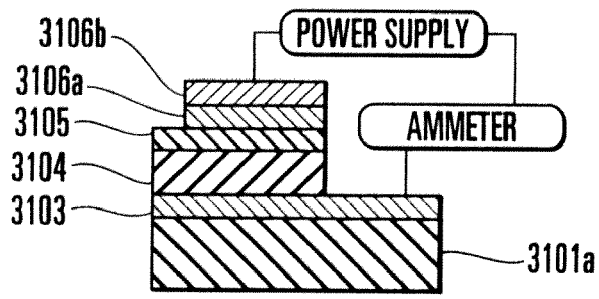
Figure 35D:
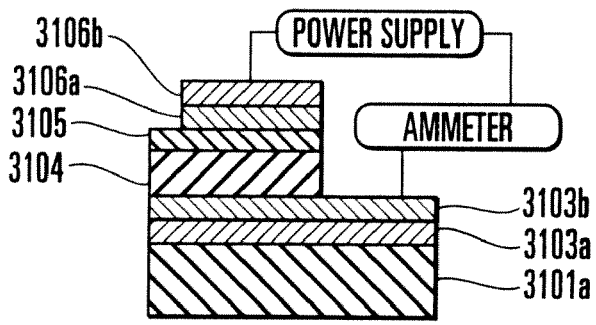

For example, as shown in FIG. 35A, an insulating substrate 3101a may be used, and stacked lower electrode layers 3103a and 3103b may be used. As shown in FIG. 35B, the insulating substrate 3101a may be used, and a contact electrode 3103c may be provided on the lower electrode layer 3103. As shown in FIG. 35C, the insulating substrate 3101a may be used, and stacked upper electrodes 3106a and 3106b may be used. As shown in FIG. 35D, the stacked lower electrode layers 3103a and 3103b and the stacked upper electrodes 3106a and 3106b may be used.

Figure 36:
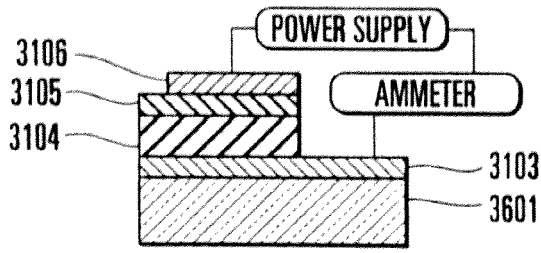
FIG. 36 is a sectional view schematically showing a structure example of still another element according to an embodiment of the present invention.
Figure 37:
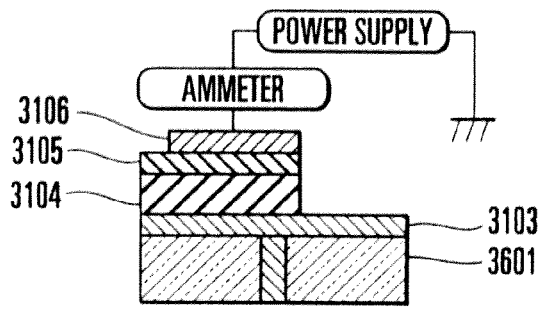
FIG. 37 is a sectional view schematically showing a structure example of still another element according to an embodiment of the present invention.

As shown in FIG. 36A, an insulating substrate 3601 made of glass or quartz may be used. In this case, as shown in FIG. 37, a through hole may be formed in the substrate 3601 to form a plug, and an electrical contact may be formed on the lower surface of the substrate 3601 (the side opposite to the surface where the lower electrode layer 3103 is formed). With this structure, the present invention can be applied to, e.g. a glass substrate easy to process. When an optically transparent substrate is used, the structure can be applied to a display.

Figure 38A:
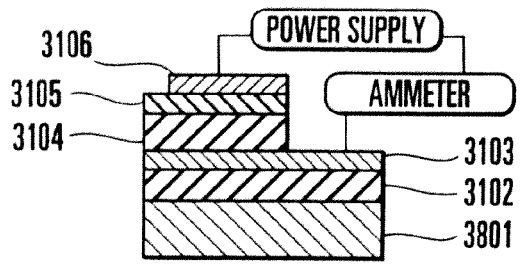
FIGS. 38A to 38C are sectional views schematically showing structure examples of still another element according to an embodiment of the present invention.
Figure 38B:
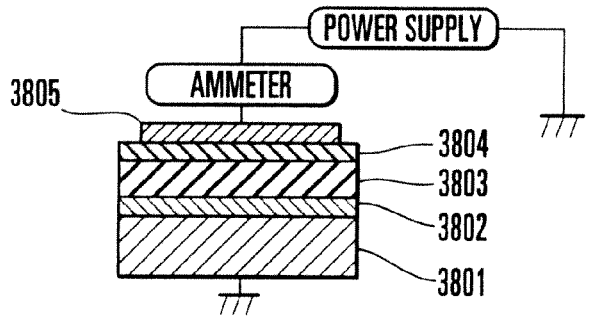

As shown in FIG. 38A, a conductive substrate 3801 made of, e.g., a metal may be used. As shown in FIG. 38B, a lower electrode layer 3802 contacting the substrate 3801 may be formed, and a ferroelectric layer 3803, insulating layer 3804, and upper electrode 3805 may be provided on it. In the structure shown in FIG. 38B, a predetermined electrical signal can be applied between the substrate 3801 and the upper electrode 3805.

Figure 38C:
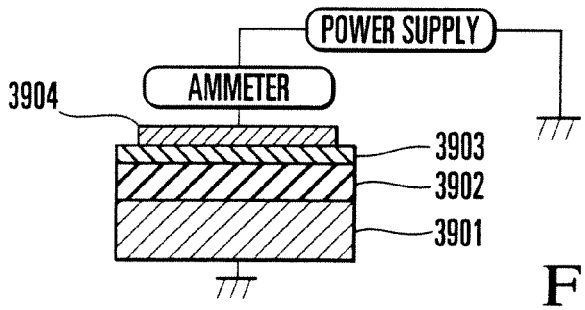

As shown in FIG. 38C, a ferroelectric layer 3902, insulating layer 1203, and upper electrode 3904 may be provided on a metal plate 3901. In this structure, the metal plate 3901 serves as a lower electrode layer. With the structure shown in FIG. 38C in which the constituent elements are formed on the metal plate 3901 with high thermal conductivity, a higher cooling effect can be obtained, and a stable element operation can be expected.

As the ferroelectric layer becomes thick, the current flows more hardly, and the resistance increases. When a memory is implemented by using a change in resistance value, the resistance value of in each of the ON state and OFF state is important. For example, when the ferroelectric layer becomes thick, the resistance value in the ON state increases. Since it is difficult to ensure a high S/N ratio, the state of the memory is hard to determine. On the other hand, when the ferroelectric layer becomes thin, and the leakage current is dominant, memory information can hardly be held, and the resistance value in the OFF state increases. It is therefore difficult to ensure a high S/N ratio.

Hence, the ferroelectric layer preferably has an optimum thickness. For example, when the problem of leakage current is taken into consideration, the ferroelectric layer need only have a thickness of at least 10 nm. When the resistance value in the ON state is taken into consideration, the ferroelectric layer is preferably thinner than 200 nm. In experiments conducted by the present inventors, a memory operation was confirmed when the thickness of the ferroelectric layer was 30 to 100 nm. The most satisfactory state was obtained when the thickness of the ferroelectric layer was 50 nm.

Figure 39:
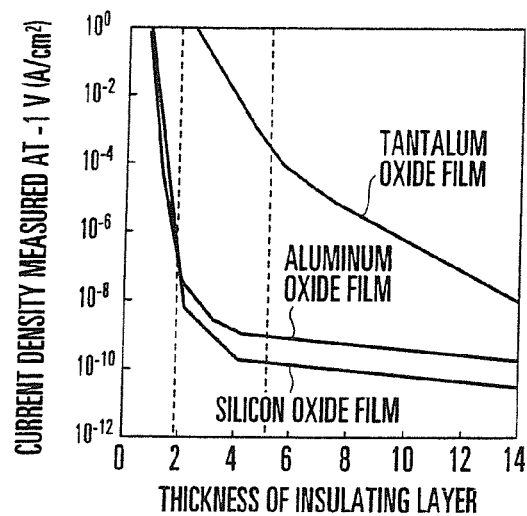
FIG. 39 is a graph showing the relationship between the current density and the material and thickness of an insulating layer 3105 on a ferroelectric layer 3104.

A more preferable thickness is present even in the insulating layer on the ferroelectric layer. The thickness will be described by using an example in which an $Al_2O_3$ film, $SiO_2$ film, and $Ta_2O_3$ film are formed on silicon substrates by ECR sputtering using an Al target, Si target, and Ta target. Each film is formed to a predetermined thickness. An upper electrode made of Al is formed on each film. A current-voltage characteristic is measured by applying a voltage between the silicon substrate and the upper electrode. The current density observed in each thin film at −1 V is observed. FIG. 39 shows the result of the current densities.

As shown in FIG. 39, the current density changes depending on the material of the insulating layer. The smaller the thickness becomes, the more the leakage current flows to increase the current density. On the other hand, when the thickness increases, the current density decreases. This indicates that if the thickness of too small, the characteristic of an insulating layer cannot be obtained. If the thickness is large, the voltage applied to the ferroelectric film is small so it is difficult to ensure a high S/N ratio, and the memory state is hard to determine. Hence, the insulating layer preferably has an optimum thickness in combination with the ferroelectric layer.

For example, when the problem of leakage current is taken into consideration, and an $Al_2O_3$ film or $SiO_2$ film is used, the thickness is preferably about 1 to 3 nm. A $Ta_2O_3$ film need only have a thickness of at least 3 nm. When the problem of magnitude of the resistance value is taken into consideration, the insulating layer is preferably thicker than 20 nm. In experiments conducted by the present inventors, the above-described memory operation was confirmed when an insulating layer made of $SiO_2$ and $Ta_2O_3$ had a thickness of 3 to 5 nm.

Figure 40A:
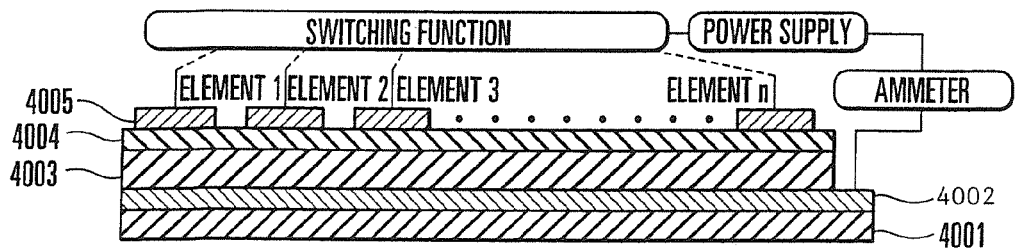
FIGS. 40A to 40E are sectional views schematically showing structure examples of still another element according to an embodiment of the present invention.

In the above description, one ferroelectric element has been exemplified. However, a plurality of ferroelectric elements may be arrayed and integrated, as will be described later. For example, as shown in FIG. 40A, a common lower electrode layer 4002, ferroelectric layer 4003, and insulating layer 4004 are formed on an insulating substrate 4001. A plurality of upper electrodes 4005 spaced apart from each other by a predetermined distance are formed on the insulating layer 4004. That is, a plurality of ferroelectric elements are arrayed in correspondence with the plurality of upper electrodes 4005.

A ferroelectric or insulating film has a much lower conductivity than a conductor such as a metal and can therefore be used commonly. In this case, since the working process can be omitted, the productivity can be increased, resulting in large advantage from the industrial viewpoint. When the distance between the ferroelectric elements corresponding to the plurality of upper electrodes 4005 is set in consideration of, e.g., the conductivity, a stable operation can be expected.

Figure 40B:
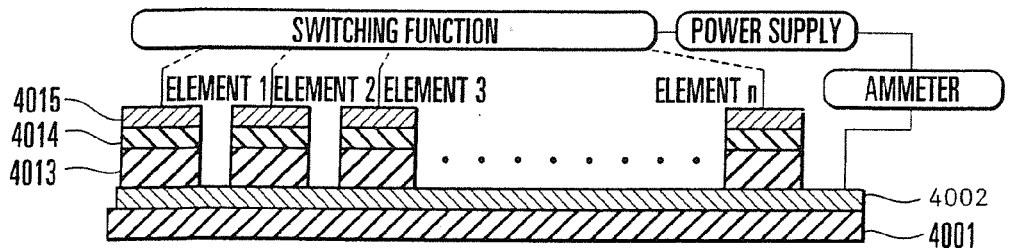

As shown in FIG. 40B, the common lower electrode layer 4002 may be formed on the insulating substrate 4001, and a plurality of elements each including a ferroelectric layer 4013, insulating layer 4014, and upper electrode 4015 may be arrayed on the lower electrode layer 4002. For example, when a ferroelectric film is formed and processed by using a method such as RIE, ICP etching, or ECR etching, the individual ferroelectric layers 4013 can be formed. When the elements are separated in this way, the distance between them can further be shortened, and the degree of integration can be made higher.

Figure 40C:
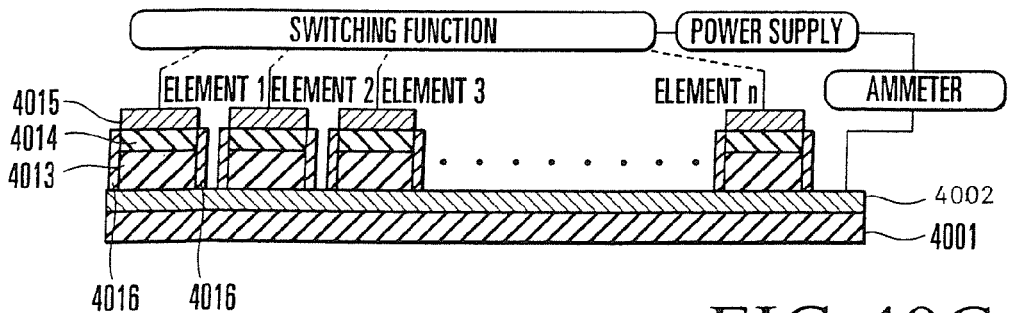
Figure 40D:
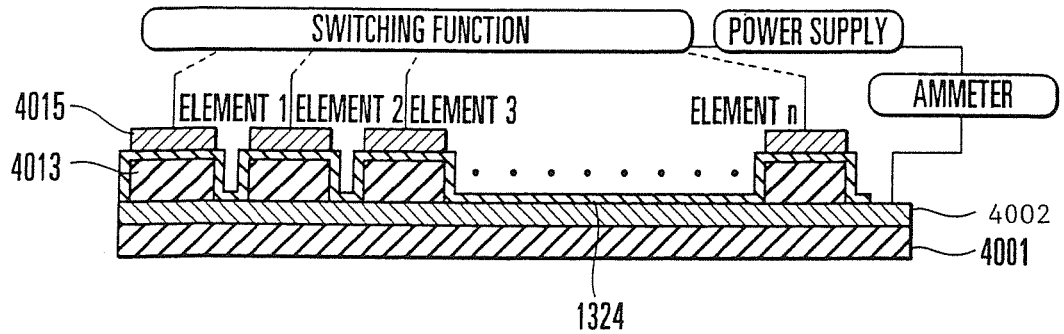

As shown in FIG. 40C, the side surfaces of the ferroelectric layer 4013 and insulating layer 4014 of each element may be covered with an insulating sidewall 4016. As shown in FIG. 40D, an insulating layer 4024 common to the elements may be formed to cover the side surface of the ferroelectric layer 4013. In this case, the insulating layer 4014 shown in FIG. 40B is formed by part of the insulating layer 4024.

Figure 40E:
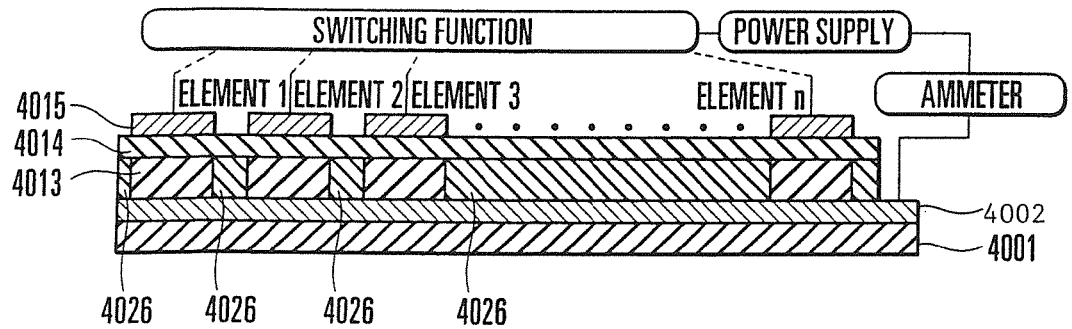

As shown in FIG. 40(e), the plurality of ferroelectric layers 4013 may be formed in correspondence with the elements, the common insulating layer 4014 may be formed, and an insulating layer 4026 may be formed to fill spaces on the sides of the plurality of ferroelectric layers 4013 that are spaced apart from each other. When the portions between the plurality of ferroelectric layers 4013 formed separately in correspondence with the elements are covered with an insulator, the leakage current between the ferroelectric elements can be reduced, and their stability can be increased.

Even in the element shown in FIG. 31, as shown in FIG. 13, a plurality of elements are arrayed. More specifically, n elements are arrayed in the X direction, and m elements are arrayed in the Y direction. X-direction buses are connected to the lower electrode layers, and Y-direction buses are connected to the upper electrodes. A processor unit having a selection signal switching function is connected to each of the X- and Y-direction buses. With this structure, a memory capable of accessing each element at random can be implemented.

Figure 41:
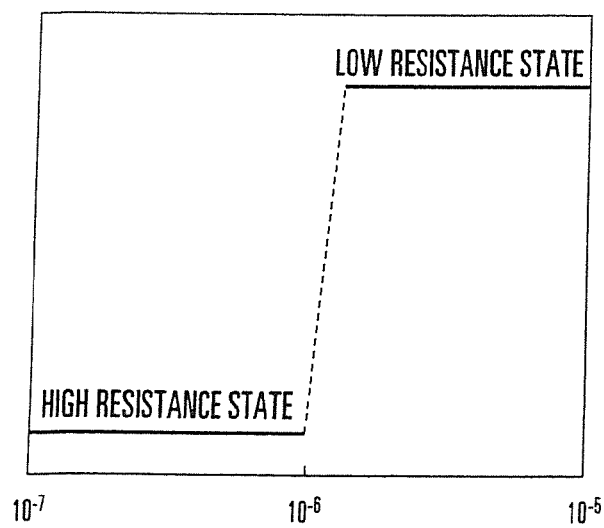
FIG. 41 is a graph showing the relationship between the value of a current flowing between a lower electrode layer 3103 and an upper electrode 3106 and a current measured when a voltage for current detection is applied between the electrodes.

The change in resistance value of the ferroelectric layer 3104 can also be controlled by a current. A predetermined voltage is applied to the ferroelectric layer 3104 to flow a predetermined current. Immediately after that, a predetermined voltage (e.g., −0.8 V) is applied between the upper electrode 3106 and the lower electrode layer 3103. The current value then changes as shown in FIG. 41. The ordinate in FIG. 41 represents the current measured when a current detection voltage is applied between the electrodes.

For example, after a current from $1 \times 10^{-9}$ A (inclusive) to $1 \times 10^{-6}$ A (exclusive) is supplied between the electrodes, the current value is small, and a high resistance state is obtained. After a current of $1 \times 10^{-6}$ A or more is supplied between the electrodes, the value of the flowing current becomes large (e.g., 10 μA), and the state changes to a low resistance state. As is apparent from this, the resistance of the ferroelectric layer 3104 also changes depending on the current flowing to it. That is, two resistance values representing a high resistance state and low resistance state are present. Hence, the element shown in FIG. 31 can be driven by both a voltage and a current.

Figure 42:
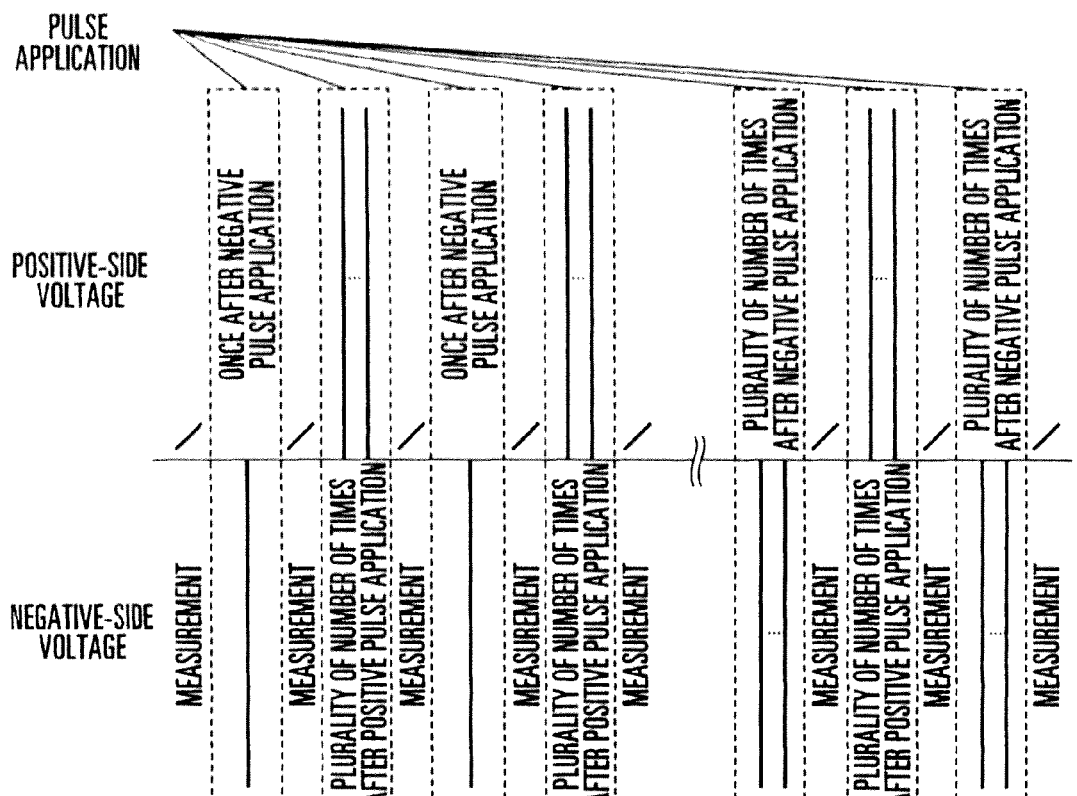
FIG. 42 is a timing chart showing an operation example in which the element shown in FIG. 31 is driven by a pulse voltage.

The resistance change in the ferroelectric layer 3104 can also be controlled by a pulse voltage. For example, as shown in FIG. 42, a negative pulse voltage (e.g., −4 V and 10 μs) is applied once between the upper electrode 3106 and the lower electrode layer 3103 of the element shown in FIG. 31 whose ferroelectric layer 3104 is in the high resistance state in the initial state. Then, the state changes to the low resistance state. After that, when a positive pulse voltage (e.g., +5 V and 10 μs) is applied between the electrodes a plurality of number of times (e.g., four times), the state changes to the high resistance state.

Figure 43:
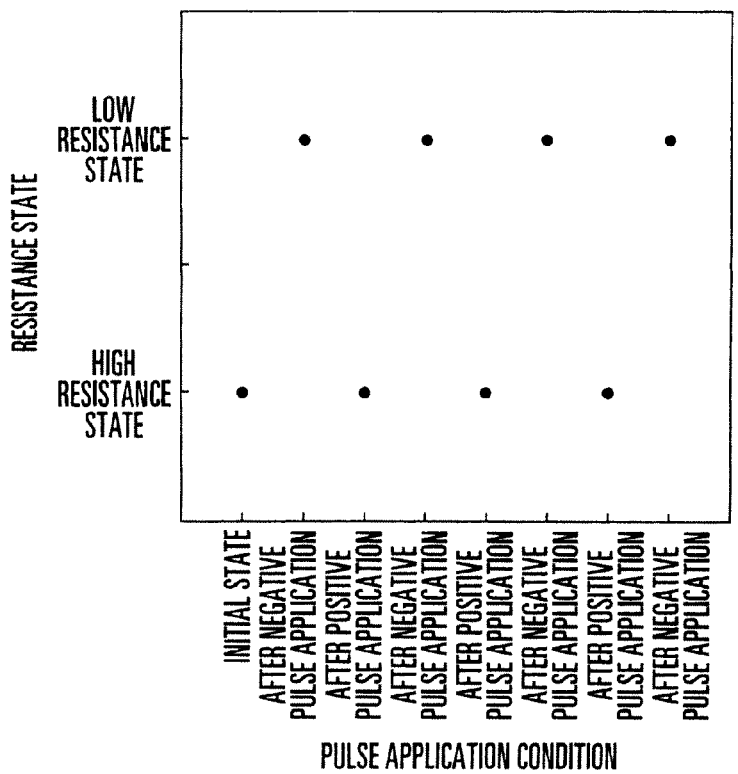
FIG. 43 is a graph showing a change in current value by drive control shown in FIG. 42.

The above-described pulse voltage application is repeated. The current measured after each pulse voltage application changes as shown in FIG. 43. As shown in FIG. 43, the high resistance state is set in the initial state. After a negative pulse voltage is applied, the state changes to the low resistance state. When a positive pulse voltage is applied in this state a plurality of number of times, the state changes to the high resistance state. The resistance value of the ferroelectric layer 3104 changes when a positive voltage pulse or negative voltage pulse is applied. Hence, for example, when a positive voltage pulse or negative voltage pulse is applied, a memory operation can be executed so that the memory state of the element changes from an "on" state to an "off" state or from an "off" state to an "on" state.

The voltage and time of the voltage pulse capable of changing the resistance state of the ferroelectric layer 3104 can be changed in accordance with the situation. For example, when a voltage pulse of +5 V having a width of 10 μs is applied four times to set the high resistance state, and a short pulse of −4 V having a width of 1 μs is applied 10 times, the state can be changed to the low resistance state. When a short pulse of +5 V having a width of 1 μs is applied 100 times in this state, the state can be changed to the high resistance state. When a low voltage pulse of −3 V having a width of 100 μs is applied 100 times in this state, the state can be changed to the low resistance state.

Figure 44A:
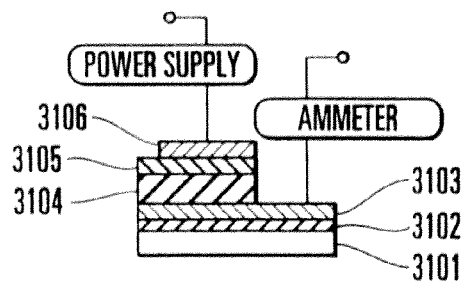
FIGS. 44A and 44B are views for explaining a case wherein the element shown in FIG. 31 is used as a switching element to control a current.
Figure 44B:
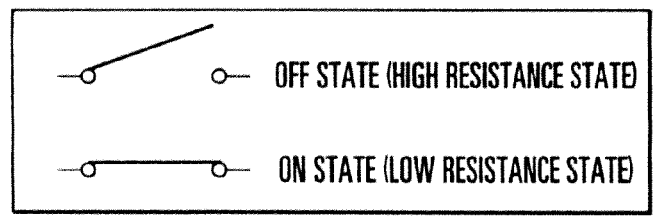
Figure 45:
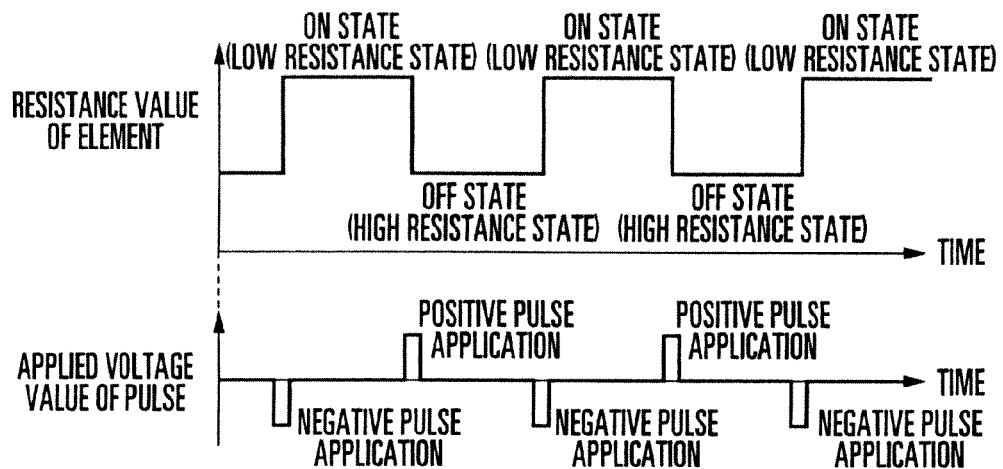
FIG. 45 is a timing chart showing a control sequence when the element shown in FIG. 31 is used as a switching element to control a current.

A case wherein the element shown in FIG. 31 is used as a switching element to control a current will be described next. In an element shown in FIG. 44A, the current flowing between the upper electrode 3106 and the lower electrode layer 3103 is set in an OFF state when the ferroelectric layer 3104 is in the high resistance state or in an ON state when the ferroelectric layer 3104 is in the low resistance state, as shown in FIG. 44B. For example, as shown in the sequence of FIG. 45, when a negative pulse and positive pulse are alternately applied between the upper electrode 3106 and the lower electrode layer 3103, the ON state and OFF state of the current flowing between the upper electrode 3106 and the lower electrode layer 3103 can alternately be switched.

Figure 46:
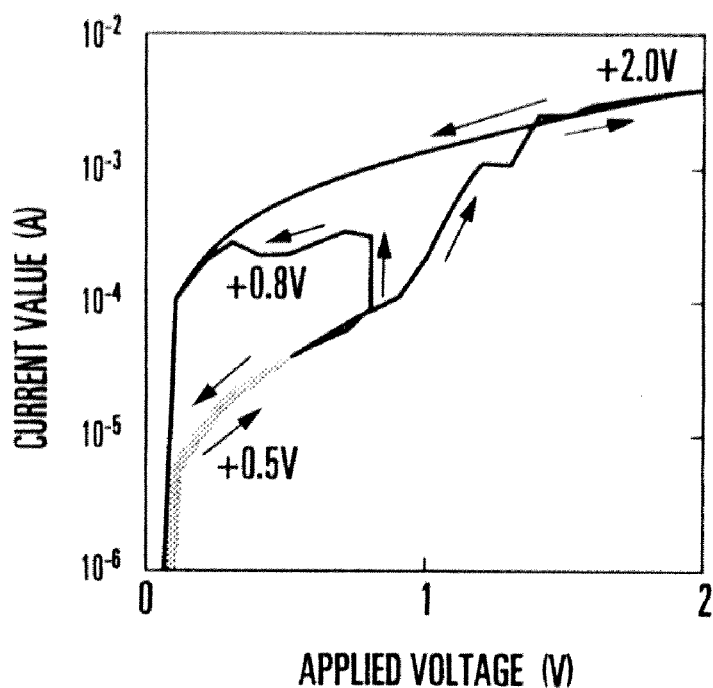
FIG. 46 is a view for explaining the multilevel operation of the element shown in FIG. 31.

According to the element shown in FIG. 31 which uses the ferroelectric layer 3104 of this embodiment, the current-voltage characteristic when a DC voltage is applied between the lower electrode layer 3103 and the upper electrode 3106 is changed to different low resistance states by changing the positive-side applied voltage, as shown in FIG. 46. These correspond to the current values at the read voltage in the respective states. Hence, a memory with three states (three values) can be implemented. For example, when the read voltage is about 0.5 V, a ternary memory can be implemented. Before change to each state, a voltage of −2 V is applied to the lower electrode layer 3103 to return the state to the high resistance state (reset).

Even in the element shown in FIG. 31, when a high voltage of about +15 V is applied, a characteristic current-voltage characteristic as shown in FIG. 33 is obtained, as in the element shown in FIG. 1. Even in the element shown in FIG. 31, with the EO (Electrical Orientation) process, the above-described characteristic is obtained, and a memory element can be implemented.

In the above-described EO process, a voltage more than 10 V is applied to the element. For this reason, when a plurality of elements are formed in integration with semiconductor elements as shown in FIG. 40 and subjected to the EO process, the semiconductor elements may be broken. Even in this case, to suppress destruction of the semiconductor elements, the EO process may be done by using ECR plasma, as described above. For example, when one end of the interconnection connected to the lower electrode layer 4002 of the element shown in FIG. 15 is exposed to the peripheral portion of the plasma flow, and the upper electrode 4005 is exposed to the central portion of the plasma flow, a voltage necessary for the EO process can be applied between the two electrodes by the potential difference generated from the distribution in the plasma flow. For example, when the element is irradiated with a plasma mainly containing Ar, the EO process can be done in a short time of 1 sec to several ten sec.

Figure 47:
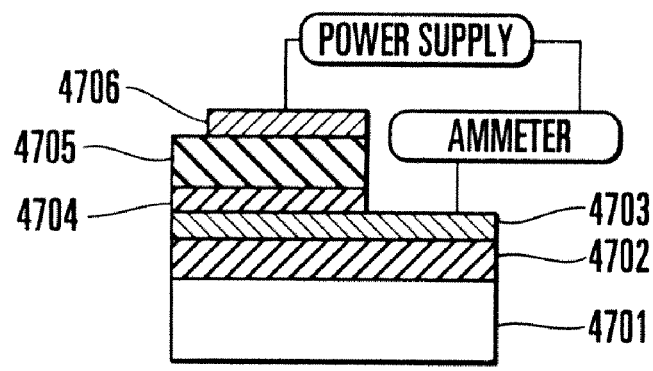
FIG. 47 is a sectional view schematically showing a structure example of still another element according to an embodiment of the present invention.

Still another embodiment of the present invention will be described below with reference to the accompanying drawings. FIG. 47 is a sectional view schematically showing a structure example of a bistable resistance value acquisition device according to another embodiment of the present invention. A ferroelectric element including a ferroelectric layer 4705 made of a metal oxide exhibiting ferroelectric properties will be described below. The element shown in FIG. 47 comprises, on a substrate 4701 made of, e.g., single-crystal silicon, an insulating layer 4702, a lower electrode layer 4703, an insulating layer 4704, the ferroelectric layer 4705, and an upper electrode 4706. The substrate 4701 can be made of any one of a semiconductor, insulator, and conductive material such as a metal. When the substrate 4701 is made of an insulating material, the insulating layer 4702 can be omitted. When the substrate 4701 is made of a conductive material, the insulating layer 4702 and lower electrode layer 4703 can be omitted. In this case, the substrate 4701 made of the conductive material serves as a lower electrode.

The lower electrode layer 4703 and upper electrode 4706 need only be made of a transition metal including noble metals such as platinum (Pt), ruthenium (Ru), gold (Au), and silver (Ag). The lower electrode layer 4703 and upper electrode 4706 may be made of a compound such as a nitride, oxide, or fluoride of a transition metal, such as titanium nitride (TiN), hafnium nitride (HfN), strontium ruthenate (SrRuO$_2$), zinc oxide (ZnO), indium tin oxide (ITO), or lanthanum fluoride (LaF$_3$), or a composite film formed by stacking them.

The insulating layer 4704 need only be made of silicon dioxide, silicon oxynitride, alumina, an oxide such as LiNbO$_3$ containing a light metal such as lithium, beryllium, magnesium, or calcium, or a fluoride such as LiCaAlF$_6$, LiSrAlF$_6$, LiYF$_4$, LiLuF$_4$, or KMgF$_3$. Alternatively, the insulating layer 4704 need only be made of an oxide or nitride of a transition metal such as scandium, titanium, strontium, yttrium, zirconium, hafnium, tantalum, or lanthanum series, a silicate (ternary compound of a metal, silicon, and oxygen) containing the above-described elements, an aluminate (ternary compound of a metal, aluminum, and oxygen) containing these elements, or an oxide or nitride containing at least two of the above elements.

The ferroelectric layer 4705 is the same as the above-described ferroelectric layer 104 and ferroelectric layer 3104. The ferroelectric layer 4705 is made of a material such as a metal oxide which contains at least two metals and generally exhibits ferroelectric properties. A state wherein no ferroelectric properties are exhibited depending on the film thickness condition is also included, as described above.

A detailed example of the element shown in FIG. 47 will be described. For example, the lower electrode layer 4703 is a ruthenium film having a thickness of 10 nm. The insulating layer 4704 is a multilayered film made of tantalum pentoxide and silicon dioxide and having a thickness of about 5 nm. The ferroelectric layer 4705 is a Bi$_4$Ti$_3$O$_{12}$ film having a thickness of 40 nm. The upper electrode 4706 is made of gold. As described above, the structures of the substrate 4701 and insulating layer 4702 are not limited to those described above, and any other material can also be selected appropriately if it has no effect on the electrical characteristics.

A detailed method of forming the above-described insulating layer 4702, lower electrode layer 4703, insulating layer 4704, ferroelectric layer 4705, and upper electrode 4706 will be described later. They can be formed by sputtering a metal target or sintered target in ECR plasma made of argon gas, oxygen gas, or nitrogen gas by using an ECR sputtering apparatus shown in FIG. 5.

Figure 48A:
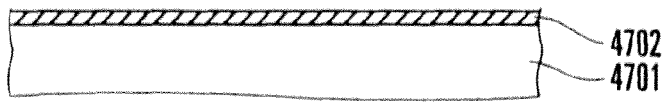
FIGS. 48A to 48E are views showing steps in manufacturing the element according to an embodiment of the present invention.

An example of a method of manufacturing the element shown in FIG. 47 will be described next with reference to FIG. 48. As shown in FIG. 48A, the p-type silicon substrate 4701 having a plane orientation of (100) on the principal plane and a resistivity of 1 to 2 Ωcm is prepared. The surface of the substrate 4701 is cleaned by a solution mixture of sulfuric acid and a hydrogen peroxide solution, pure water, and a hydrogen fluoride solution and dried.

The insulating layer 4702 is formed on the cleaned and dried substrate 4701. In forming the insulating layer 4702, the above-described ECR sputtering apparatus is used. The substrate 4701 is fixed on a substrate holder 504 in a process chamber 501. Pure silicon (Si) is used as a target 505. The insulating layer 4702 in a metal mode by Si—O molecules is formed on the substrate 4701 to a thickness to just cover its surface by ECR sputtering using argon (Ar) as a plasma gas and oxygen gas.

In ECR sputtering shown in FIG. 5, a plasma production chamber 502 is evacuated to a high vacuum state on the order of $10^{-5}$ Pa. For example, Ar gas as a rare gas is supplied at a flow rate of about 20 sccm from an inert gas supply unit 511 into the plasma production chamber 502 to set the internal pressure of the plasma production chamber 502 to on the order of, e.g., $10^{-2}$ to $10^{-3}$ Pa. A coil current of, e.g., 28 A is supplied to a magnetic coil 510 to give the magnetic field of the electron cyclotron resonance condition to the plasma production chamber 502. The magnetic flux density in the plasma production chamber 502 is set to, e.g., about 87.5 mT (tesla).

A microwave of, e.g., 2.45 GHz (e.g., 500 W) is supplied from a microwave generation unit (not shown) into the plasma production chamber 502 through a waveguide 508, quartz window 507, and vacuum waveguide 506. With this supply of the microwave, Ar plasma is produced in the plasma production chamber 502. Note that sccm is the unit of flow rate and indicates that a fluid at 0° C. and 1 atmospheric pressure flows 1 cm$^3$ in 1 min.

The plasma produced by the above-described method is output from the plasma production chamber 502 to the side of the process chamber 501 by the divergent magnetic field of the magnetic coil 510. In addition, a high-frequency power (e.g., 500 W) is supplied from a high-frequency power supply 522 to the target 505 placed at the outlet of the plasma production chamber 502. When Ar particles collide against the target 505, a sputtering phenomenon occurs to sputter Si particles from the target 505.

After this state is obtained, a shutter (not shown) between the process chamber 501 and the substrate 4701 is opened. The Si particles sputtered from the target 505 reach the surface of the substrate 4701 together with the plasma output from the plasma production chamber 502 and the oxygen gas which is supplied from a reactive gas supply unit 512 and activated by the plasma and are oxidized to silicon dioxide by the activated oxygen.

With the above process, the insulating layer 4702 made of silicon dioxide and having a thickness of, e.g., about 100 nm can be formed on the substrate 4701 (FIG. 48A). When the insulating layer is formed to a predetermined thickness, the above-described shutter is closed not to make the sputtered material reach the substrate 4701, thereby stopping film formation. After that, plasma irradiation is stopped by, e.g., stopping supplying the microwave power. Supply of the gases is stopped. When the substrate temperature decreases to a predetermined value, and the internal pressure of the process chamber 501 is increased to the atmospheric pressure, the substrate 4701 which has undergone film formation is unloaded from the process chamber 501.

The insulating layer 4702 ensures insulation to prevent a voltage from leaking to the substrate 4701 and influencing desired electrical characteristics when a voltage is applied between the lower electrode layer 4703 and upper electrode 4706 to be formed later. For example, a silicon oxide film formed by oxidizing the surface of the silicon substrate by thermal oxidation may be used as the insulating layer 4702. The insulating layer 4702 may be made of any other insulating material except silicon oxide if the insulating properties can be ensured. The thickness of the insulating layer 4702 need not always be 100 nm and may be smaller or larger. In the above-described formation of the insulating layer 4702 by ECR sputtering, the substrate 4701 is not heated. However, the film may be formed while heating the substrate 4701.

After the insulating layer 4702 is formed in the above-described manner, the substrate 4701 is unloaded from the apparatus to the atmosphere. The substrate 4701 is fixed on the substrate holder 504 of the same ECR sputtering apparatus as in FIG. 5 in which pure ruthenium (Ru) is used as the target 505. ECR sputtering using argon (Ar) as a plasma gas and xenon (Xe) is executed to form an Ru film on the insulating layer 4702 to a thickness to just cover its surface, thereby forming the lower electrode layer 4703, as shown in FIG. 48B.

Formation of the Ru film will be described in detail. In the ECR sputtering apparatus shown in FIG. 5, the substrate 4701 is heated to, e.g., about 400° C. Next, Ar gas as a rare gas is supplied at a flow rate of, e.g., 7 sccm from the inert gas supply unit 511 into the plasma production chamber 502, and Xe gas is supplied at a flow rate of, e.g., 5 sccm to set the internal pressure of the plasma production chamber 502 to on the order of, e.g., $10^{-2}$ to $10^{-3}$ Pa. A coil current of, e.g., 26 A is supplied to the magnetic coil 510 to give the magnetic field of the electron cyclotron resonance condition to the plasma production chamber 502.

A microwave of, e.g., 2.45 GHz (e.g., 500 W) is supplied from the microwave generation unit (not shown) into the plasma production chamber 502 through the waveguide 508, quartz window 507, and vacuum waveguide 506. With this supply of the microwave, a plasma of Ar and Xe is produced in the plasma production chamber 502. The produced plasma is output from the plasma production chamber 502 to the side of the process chamber 501 by the divergent magnetic field of the magnetic coil 510. In addition, a high-frequency power (e.g., 500 W) is supplied from the high-frequency electrode supply unit to the target 505 placed at the outlet of the plasma production chamber 502. When Ar particles collide against the target 505, a sputtering phenomenon occurs to sputter Ru particles from the target 505. The Ru particles sputtered from the target 505 reach the surface of the insulating layer 4702 on the substrate 4701 and are deposited.

Figure 48B:
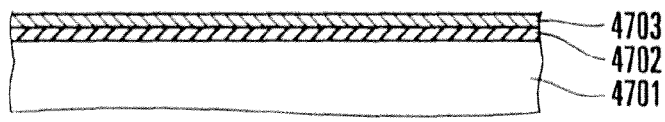

With the above process, the lower electrode layer 4703 having a thickness of, e.g., about 10 nm can be formed on the insulating layer 4702 (FIG. 48B). The lower electrode layer 4703 enables voltage application to the ferroelectric layer 4705 and insulating layer 4704 when a voltage is applied between the lower electrode layer 4703 and the upper electrode 4706 to be formed later. The lower electrode layer 4703 may be made of any other material except ruthenium if the conductivity can be ensured. The thickness of the lower electrode layer 4703 need not always be 10 nm and may be smaller or larger.

As described above, in forming the Ru film by ECR sputtering, the substrate 4701 is heated to 400° C. However, the substrate need not always be heated. However, if the substrate is not heated, the adhesion of ruthenium to silicon dioxide becomes low, and the film may peel off. To prevent peeling, the film is formed preferably while heating the substrate. After Ru is deposited to a desired thickness in the above-described way, an end process is executed by stopping film formation by, e.g., closing the shutter and stopping plasma irradiation by stopping supply of the microwave power. Then, the substrate 4701 can be unloaded.

Figure 48C:
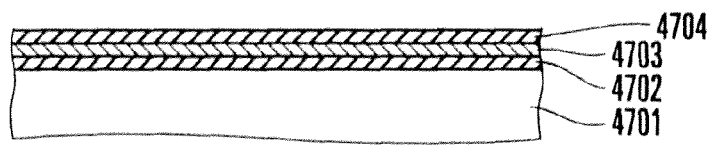

After the lower electrode layer 4703 is formed in the above-described manner, the substrate 4701 is unloaded from the apparatus to the atmosphere. The substrate 4701 is fixed on the substrate holder 504 of the same ECR sputtering apparatus as in FIG. 5 in which pure tantalum (Ta) is used as the target 505. The insulating layer 4704 is formed on the lower electrode layer 4703 to a thickness to just cover its surface, as shown in FIG. 48C, by ECR sputtering using argon (Ar) as a plasma gas and oxygen gas. A metal mode film by Ta—O molecules is formed as the insulating layer 4704, as will be described below.

Formation of a metal mode film by Ta—O molecules will be described in detail. In the ECR sputtering apparatus shown in FIG. 5 in which the target 505 made of tantalum is used, Ar gas as a rare gas is supplied at a flow rate of, e.g., 25 sccm from the inert gas supply unit 511 into the plasma production chamber 502 to set the internal pressure of the plasma production chamber 502 on the order of, e.g., $10^{-2}$ to $10^{-3}$ Pa. A coil current of, e.g., 27 A is supplied to the magnetic coil 510 to give the magnetic field of the electron cyclotron resonance condition to the plasma production chamber 502.

A microwave of, e.g., 2.45 GHz (e.g., 500 W) is supplied from the microwave generation unit (not shown) into the plasma production chamber 502 through the waveguide 508, quartz window 507, and vacuum waveguide 506. With this supply of the microwave, Ar plasma is produced in the plasma production chamber 502. The produced plasma is output from the plasma production chamber 502 to the side of the process chamber 501 by the divergent magnetic field of the magnetic coil 510. In addition, a high-frequency power (e.g., 500 W) is supplied from the high-frequency electrode supply unit to the target 505 placed at the outlet of the plasma production chamber 502. When Ar particles collide against the target 505, a sputtering phenomenon occurs to sputter Ta particles from the target 505.

The Ta particles sputtered from the target 505 reach the surface of the lower electrode layer 4703 on the substrate 4701 together with the plasma output from the plasma production chamber 502 and the oxygen gas which is supplied from the reactive gas supply unit 512 and activated by the plasma and are oxidized to tantalum pentoxide by the activated oxygen.

Figure 48D:
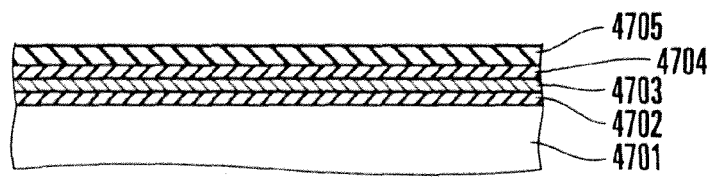

With the above process, a tantalum pentoxide film is formed on the lower electrode layer 4703. Subsequently, a silicon dioxide film is formed on the tantalum pentoxide film by ECR sputtering using the target 505 made of pure silicon, like silicon dioxide deposition described with reference to FIG. 48A. The above-described formation of a tantalum pentoxide film and silicon dioxide film is repeated to form a multilayered film including the tantalum pentoxide films and silicon dioxide films to, e.g., about 5 nm, thereby obtaining the insulating layer 4704 (FIG. 48D).

The insulating layer 4704 including the tantalum pentoxide films and silicon dioxide films is used to control the voltage to be applied to the ferroelectric film upon voltage application to the ferroelectric layer 4705. The insulating layer 4704 may have any other structure except the multilayered structure of tantalum pentoxide films and silicon dioxide films if it can control the voltage applied to the ferroelectric layer 4705. The insulating layer 4704 may be a single layer. The thickness is not limited to 5 nm, either. In the above-described ECR sputtering, the substrate 4701 is not heated but may be heated.

After the insulating layer 4704 is formed in the above-described manner, the substrate 4701 is unloaded from the apparatus to the atmosphere. The substrate 4701 is fixed on the substrate holder 504 of the same ECR sputtering apparatus as in FIG. 5 in which a sintered body (Bi—Ti—O) with an Bi—Ti ratio of 4:3 is used as the target 505. ECR sputtering using argon (Ar) as a plasma gas and oxygen gas is executed to form the ferroelectric layer 4705 on the insulating layer 4704 to a thickness to just cover its surface, as shown in FIG. 48D.

Formation of the ferroelectric layer 4705 will be described in detail. In the ECR sputtering apparatus shown in FIG. 5 in which the target 505 made of Bi—Ti—O is used, the substrate 4701 is heated to, e.g., 300° C. to 700° C. Next, Ar gas as a rare gas is supplied at a flow rate of, e.g., 20 sccm from the inert gas supply unit 511 into the plasma production chamber 502 to set the pressure to on the order of, e.g., $10^{-2}$ to $10^{-3}$ Pa. A coil current of, e.g., 27 A is supplied to the magnetic coil 510 to give the magnetic field of the electron cyclotron resonance condition to the plasma production chamber 502.

A microwave of, e.g., 2.45 GHz (e.g., 500 W) is supplied from the microwave generation unit (not shown) into the plasma production chamber 502 through the waveguide 508, quartz window 507, and vacuum waveguide 506. With this supply of the microwave, a plasma is produced in the plasma production chamber 502. The produced plasma is output from the plasma production chamber 502 to the side of the process chamber 501 by the divergent magnetic field of the magnetic coil 510. In addition, a high-frequency power (e.g., 500 W) is supplied from the high-frequency electrode supply unit to the target 505 placed at the outlet of the plasma production chamber 502. When Ar particles collide against the target 505, a sputtering phenomenon occurs to sputter Bi particles and Ti particles from the target 505.

The Bi particles and Ti particles sputtered from the target 505 reach the surface of the insulating layer 4704 together with the plasma output from the plasma production chamber 502 and the oxygen gas which is supplied from the reactive gas supply unit 512 and activated by the plasma and are oxidized by the activated oxygen. The oxygen ($O_2$) gas need only be supplied from the matching unit 521 at a flow rate of, e.g., about 1 sccm. Although the target 505 is a sintered body and contains oxygen, any shortage of oxygen in the film can be prevented by supplying oxygen.

With the above-described film formation by ECR sputtering, the ferroelectric layer 4705 having a thickness of, e.g., about 40 nm can be formed (FIG. 48D). After that, the same end process as described above is executed to make it possible to unload the substrate. The film quality may be improved by irradiating the formed ferroelectric layer 4705 with ECR plasma of an inert gas and a reactive gas. As the reactive gas, not oxygen gas but nitrogen gas, fluorine gas, or hydrogen gas can be used. The film quality improvement can also be applied to formation of the insulating layer 4702 or insulating layer 4704.

Figure 48E:
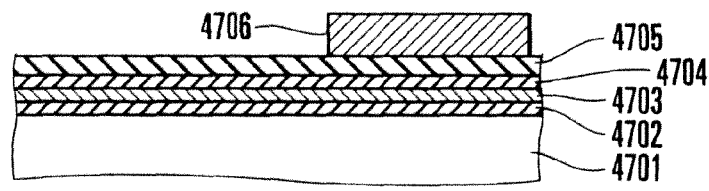

When the upper electrode 4706 made of Au and having a predetermined area is formed on the ferroelectric layer 4705, as shown in FIG. 48E, an element using a layer formed from a ferroelectric can be obtained. The upper electrode 4706 can be formed by a well-known lift-off method and gold deposition by resistance heating vacuum deposition. The upper electrode 4706 may be made of another metal material or conductive material such as Ru, Pt, or TiN. When Pt is used, the adhesion is poor, and the film may peel off. Hence, the upper electrode 4706 must be formed as an electrode with a predetermined area by executing film formation by heating or using a structure such as Ti—Pt—Au that hardly peels off and executing a patterning process such as photolithography or lift-off on that structure.

According to this embodiment, the insulating layer 4704 is formed, and in this state, the ferroelectric layer 4705 is formed on it. As a result, in forming the ferroelectric layer 4705 by the above-described ECR sputtering, the ferroelectric film can be formed without degrading the morphology of the surface of the underlying metal film or the surface of the ferroelectric film. For example, if the underlying layer is made of a metal material which is readily oxidized, the surface of the underlying layer may be partially oxidized in the above-described formation of the ferroelectric layer 4705, resulting in degradation in morphology. However, according to this embodiment, the ferroelectric layer 4705 can be formed while keeping the good surface morphology of the underlying layer. Hence, the ferroelectric layer 4705 with higher quality can be obtained.

Figure 49:
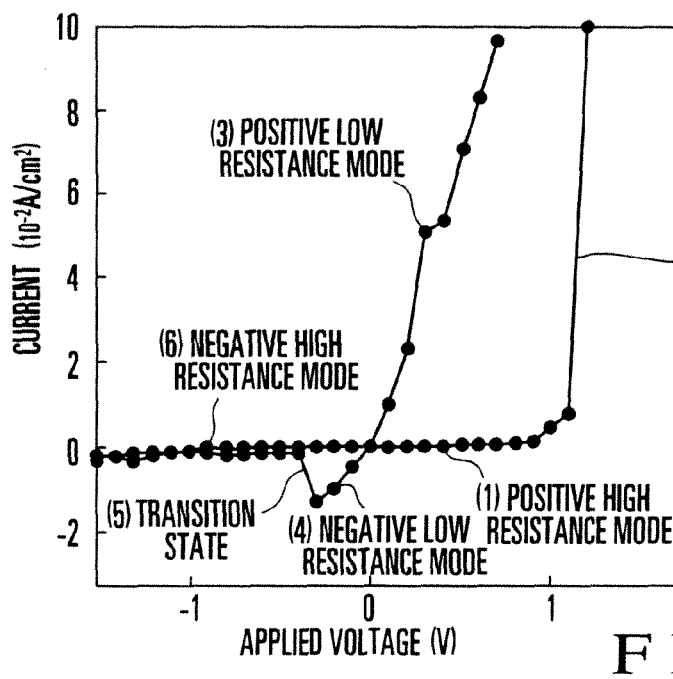
FIG. 49 is a graph showing a change in current when a voltage is applied between a lower electrode layer 4703 and an upper electrode 4706 of the element shown in FIG. 47.

The characteristics of the element shown in FIG. 47 will be described next. The characteristics were investigated by applying a voltage between the lower electrode layer 4703 and the upper electrode 4706. When a voltage from a power supply was applied between the lower electrode layer 4703 and the upper electrode 4706, and a current flowing when the voltage was applied was measured by an ammeter, a result shown in FIG. 49 was obtained. In FIG. 49, the ordinate represents the current density obtained by dividing the current value by the area. FIG. 49 and the memory operation principle of the present invention will be described below. The voltage values and current values to be described here are mere examples measured in an actual element. Hence, the phenomenon is not limited to the following numerical values. Other numerical values can also be measured depending on the material and thickness of each film actually used in the element and other conditions.

When a positive voltage is applied to the upper electrode 4706, the flowing current is very small in the range of 0 to 1.0 V, as indicated by (1) in FIG. 49. However, as indicated by (2), when the voltage exceeds 1.1 V, a positive current flows abruptly. Actually, a current larger than 0.1 $A/cm^2$ also flows. However, since flowing of a larger current is inhibited to protect the measurement device, the current is not measured. In the range of 0 to 1.0 V indicated by (1), a high resistance state is held (maintained) by inhibiting flowing of a large current as indicated by (2).

When a positive voltage is applied again to the upper electrode 4706, a locus to flow a positive current of 0.1 $A/cm^2$ or more is obtained at about 0.8 V, as indicated by (3). When the positive voltage is further applied to the upper electrode 4706, a current of 0.1 $A/cm^2$ or more flows at about 0.8 V, as indicated by (3).

When a negative voltage is applied to the upper electrode 4706, a negative current flows up to about −0.2 V, as indicated by (4). The current increases to $-1.5 \times 10^{-2}$ $A/cm^2$ at maximum. When the absolute value of the voltage is decreased, the current traces a locus indicated by (4).

When the negative voltage is applied up to −0.2 V, the current traces the locus indicated by (4). After that, as indicated by (5), the value of the flowing current decreases, and no negative current flows. When the negative voltage is further applied to the upper electrode 4706, a locus to rarely flow a current is obtained, as indicated by (6). Even when the absolute value of the voltage is decreased then, the current rarely flows, as indicated by (6). When a positive voltage is applied to the upper electrode 4706, the current rarely flows up to 0 to 1.0 V, as indicated by (1).

Hence, the high resistance state wherein no current flows as in (1) is maintained unless a voltage of 1.1 V or more is applied to the upper electrode 4706 to prevent any sudden current flow as in (2). The state (1) will be referred to as a "positive high resistance mode".

For example, as indicated by (2), when a voltage of 1.1 V or more is applied to abruptly flow a current, a low resistance state in which the current readily flows is obtained, as indicated by (3). This state is also maintained while a positive voltage is applied to the upper electrode 4706. The state (3) will be referred to as a "positive low resistance mode".

However, when a negative voltage is applied to the upper electrode 4706, a low resistance state in which a small current flows in the early stage in a negative voltage range from 0 to −0.2 V is obtained, as indicated by (4). This state is also maintained while a negative voltage in the range of 0 to −0.2 V is applied. The state (4) will be referred to as a "negative low resistance mode".

When a negative voltage of −0.2 V or more is applied, no current flows, and the state changes to a high resistance state, as indicated by (5). In this state, the state wherein the current value has a high resistance is maintained while a negative voltage in the range of 0 to −1.0 V is applied, as indicated by (6). The state (6) will be referred to as a "negative high resistance mode".

As described above, the element using a ferroelectric layer shown in FIG. 47 apparently has four stable modes: "positive high resistance mode", "positive low resistance mode", "negative high resistance mode", and "negative low resistance mode". More specifically, the "positive high resistance mode" and "negative high resistance mode" are "high resistance modes" which exhibit the same high resistance state. The "positive low resistance mode" and "negative low resistance mode" are "low resistance modes" which exhibit the same low resistance state. That is, two modes are present. In the state of the "high resistance mode", the "high resistance mode" is maintained in the voltage range of −1.5 V to +1.0 V. When a voltage of +1.0 V or more is applied to change the state to the "low resistance mode", the "low resistance mode" is maintained in the voltage range of −0.2 V to +0.8 V. Switching between the two, "high resistance mode" and "low resistance mode" occurs. This also applied to the negative resistance modes, i.e., "negative high resistance mode" and "negative low resistance mode".

As for the actual current value in each "positive mode" when a voltage of 0.5 V is applied, the current value in the "positive high resistance mode" is $1.0 \times 10^{-5}$ A/cm$^2$, and that in the "positive low resistance mode" is $5 \times 10^{-2}$ A/cm$^2$. The ratio is as high as 5,000 times. This facilitates each mode identification. The present inventors estimate that the above-described phenomenon occurs when the resistance value of the ferroelectric film dramatically changes depending on the direction and magnitude of the applied voltage.

Since the insulating layer 4704 is provided between the ferroelectric layer 4705 and the upper electrode 4706, carriers can be controlled by the band structure of the insulating layer 4704. More specifically, for example, tantalum pentoxide has a band gap of about 4.5 eV. The energy difference viewed from the Fermi level is about 1.2 eV in the conduction band and 2.3 eV in the valence band. That is, the barrier is higher on the valence band side. Hence, the barrier effect is high for holes in the valence band but low for electrons in the conduction band. For further information, see Wilk et al., "J. Appl. Phys.", No. 87, p. 484 (2000).

From the above-described characteristic, when, e.g., a tantalum pentoxide film is used as the insulating layer between the electrode and the ferroelectric layer, a phenomenon that electrons readily flow but holes hardly flow can be expected. Actually, as shown in FIG. 49, the value of the flowing current largely changes between a case wherein a positive voltage is applied to the upper electrode 4706 and a case wherein a negative voltage is applied. In discriminating a memory, this has a large effect to increase the signal-to-noise ratio (S/N ratio) and facilitate data discrimination. This is the effect of use of the insulating layer 4704.

It was found that when the above-described "low resistance mode" and "high resistance mode" shown in FIG. 49 are applied as a memory operation, the element shown in FIG. 47 can be used as a nonvolatile nondestructive memory. More specifically, initialization of the element and data erase, i.e., the write of data "off" is done by changing the mode from the "low resistance mode" to the "high resistance mode" by applying a negative voltage of the upper electrode 4706, as indicated by (4) or (5) in FIG. 49.

The write of data "on" is done by abruptly flowing a current by applying a positive voltage of 1.1 V or more to the upper electrode 4706, as indicated by (2) in FIG. 49. With this operation, the mode is changed from the "high resistance mode" to the "low resistance mode", and data "on" is written. As described above, when a voltage is applied to the upper electrode 4706 to set the "high resistance mode" or "low resistance mode", "off" or "on" data (state) can be written.

The read of data written in the above-described way can easily be done by reading a current value when an appropriate voltage of 0 to 1.0 V is applied to the upper electrode 4706. For example, when the mode state of the element shown in FIG. 47 is "off", i.e., "high resistance mode", it can be determined because a current hardly flows when an appropriate voltage of 0 to 1.0 V is applied, as indicated by (1) in FIG. 49.

When the mode state of the element shown in FIG. 47 is "on", i.e., "low resistance mode", it can be determined because a current abruptly flows when an appropriate voltage of 0 to 0.8 V is applied, as indicated by (2) in FIG. 49. Since the difference in current value between the "positive high resistance mode" and the "positive low resistance mode", i.e., "off" and "on" is 5,000 times or more, "off" and "on" can easily be determined. Even in the negative voltage range, "off" and "on" can be determined in the voltage range of 0 to −0.2 V.

The above-described read operation of the memory can easily be done only by checking whether the element shown in FIG. 47 is in the "high resistance mode" or "low resistance mode". In other words, while the element shown in FIG. 47 can hold the two modes, data is held. Even when a positive voltage is applied to the electrode to check the mode, the held mode does not change, and data is not destroyed. Hence, according to the element shown in FIG. 47, nondestructive read is possible. The element shown in FIG. 47 functions as a nonvolatile memory element since the resistance value of the ferroelectric layer 4705 changes depending on the voltage applied between the lower electrode layer 4703 and the upper electrode 4706. This element can also be used as a switching element to control the current.

The voltage to operate the element shown in FIG. 47 is maximized in the write to set the "positive low resistance mode". However, the voltage is about 1.1 V, and the power consumption is very low, as shown in FIG. 49. The low power consumption is very advantageous for devices. Devices using a memory, e.g., not only mobile communication devices, digital general-purpose devices, digital image sensing devices, notebook personal computers, and PDAs (Personal Digital Appliances) but also all computers, personal computers, workstations, office computers, mainframes, communication units, and multifunction apparatuses can reduce the power consumption. The memory using the element shown in FIG. 47 also has a holding period of 10 years, like the above-described element.

In the above-described example of the present invention, each of the insulating layer on the silicon substrate, the lower electrode layer on the insulating layer, the insulating layer on the lower electrode layer, and the ferroelectric layer on the insulating layer is formed by ECR sputtering. However, the method of forming each layer is not limited to ECR sputtering. For example, the insulating layer to be formed on the silicon substrate may be formed by thermal oxidation or CVD (Chemical Vapor Deposition) or a conventional sputtering method.

The lower electrode layer may be formed by any other film formation method such as EB deposition, CVD, MBE, or IBD. The insulating layer on the lower electrode layer may be formed by ALD, MOCVD, or conventional sputtering. The ferroelectric layer can also be formed by the above-described MOD, conventional sputtering method, PLD, or MOCVD. However, when ECR sputtering is used, flat and excellent insulating film, metal film, and ferroelectric film can easily be obtained.

In the above-described embodiment, after each layer is formed, the substrate is temporarily unloaded into the atmosphere. However, the layers may be formed by a continuous process without unloading the structure into the atmospheric by using an apparatus which connects, through vacuum transfer chambers, the process chambers to realize ECR sputtering to form the respective layers. With this arrangement, the substrate to be processed can be transported in vacuum and is therefore prevented from being influenced by disturbance such as water adhesion. Hence, the film quality and interface properties can be improved.

As shown in patent reference 7, after each layer is formed, the surface of the formed layer may be irradiated with ECR plasma to improve the properties. After each layer is formed, the formed layer may be annealed (heat-treated) in an appropriate gas atmosphere such as hydrogen atmosphere to greatly improve the properties of each layer.

Arraying elements and storing a plurality of data simultaneously in a memory is called "integration". The degree of integrating elements is called a degree of integration. The structure shown in FIG. 47 is very simple and can greatly increase the degree of integration as compared to a conventional memory cell. For DRAMs, SRAMs, or flash memories based on MOSFETs which must ensure gate, source, and drain regions, limitation on integration has been pointed out recently. However, the element shown in FIG. 47 uses the simple structure and can therefore increase the degree of integration without being affected by the current limitation on integration.

In the above-described embodiment, a DC voltage is applied. However, even when a pulse voltage having an appropriate width and magnitude is applied, the same effect as described above can be obtained. The basic idea of the present invention is arranging a ferroelectric layer in contact with an insulating layer and sandwiching these layers by two electrodes, as shown in FIG. 47. With this structure, when a predetermined voltage (DC or pulse) is applied between the two electrodes to change the resistance value of the ferroelectric layer and switch the stable high resistance mode and low resistance mode, a memory function can be implemented consequently.

Figure 50A:
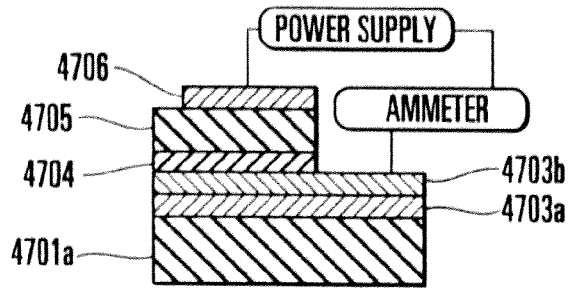
FIGS. 50A to 50D are sectional views schematically showing structure examples of still another element according to an embodiment of the present invention.
Figure 50B:
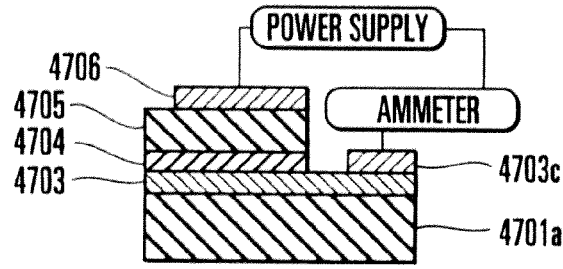
Figure 50C:
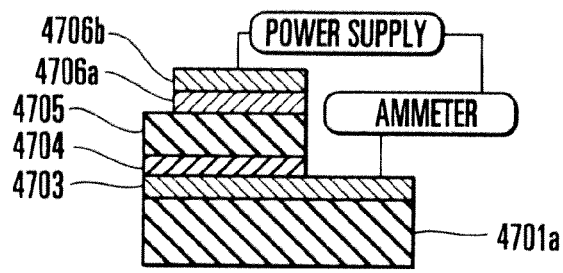
Figure 50D:
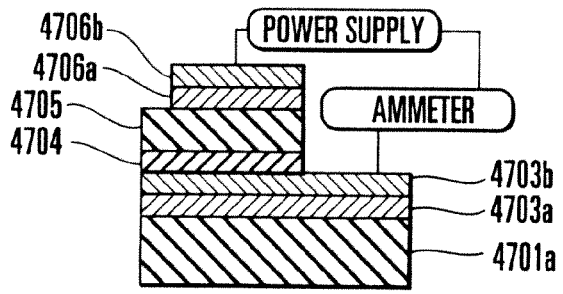

For example, as shown in FIG. 50A, an insulating substrate 4701a may be used, and stacked lower electrode layers 4703a and 4703b may be used. As shown in FIG. 50B, the insulating substrate 4701a may be used, and a contact electrode 4703c may be provided on the lower electrode layer 4703. As shown in FIG. 50C, the insulating substrate 4701a may be used, and stacked upper electrodes 4706a and 4706b may be used. As shown in FIG. 50D, the stacked lower electrode layers 4703a and 4703b and the stacked upper electrodes 4706a and 4706b may be used.

Figure 51:
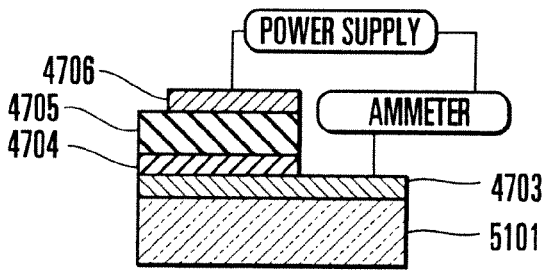
FIG. 51 is a sectional view schematically showing a structure example of still another element according to an embodiment of the present invention.
Figure 52:
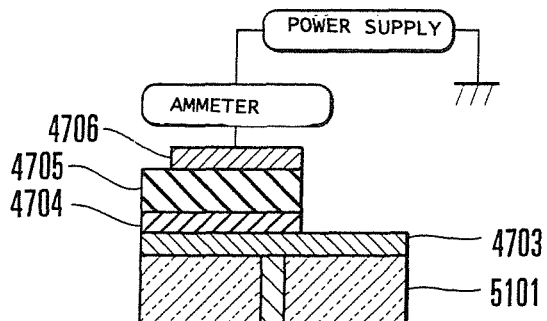
FIG. 52 is a sectional view schematically showing a structure example of still another element according to an embodiment of the present invention.

As shown in FIG. 51, an insulating substrate 5101 made of glass or quartz may be used. In this case, as shown in FIG. 52, a through hole may be formed in the substrate 5101 to form a plug, and an electrical contact may be formed on the lower surface of the substrate 5101 (the side opposite to the surface where the lower electrode layer 4703 is formed). With this structure, the present invention can be applied to, e.g. a glass substrate easy to process. Since the ferroelectric layer 4705 which has a refractive index of about 2.6 measured at a wavelength of 632.8 nm is optically transparent, the structure shown in FIG. 51 can be applied to a display. When the ferroelectric layer 4705 is formed so thick in the range of 10 to 200 nm that an interference color is generated, the visual effect of a colored state can be obtained.

Figure 53A:
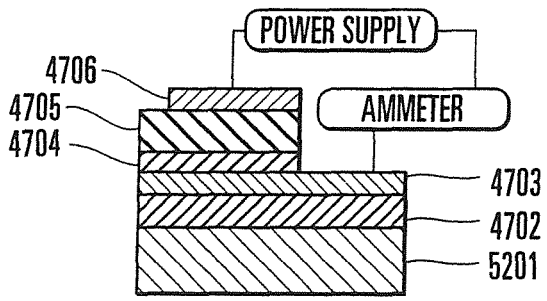
FIGS. 53A to 53C are sectional views schematically showing structure examples of still another element according to an embodiment of the present invention.
Figure 53B:
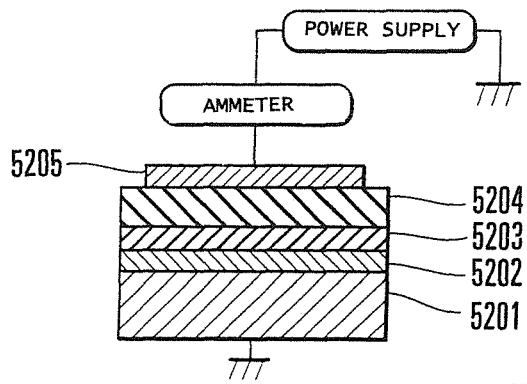

As shown in FIG. 53A, a conductive substrate 5201 made of, e.g., a metal may be used. As shown in FIG. 53B, a lower electrode layer 5202 contacting the substrate 5201 may be formed, and an insulating layer 5203, ferroelectric layer 5204, and upper electrode 5205 may be provided on it. In the structure shown in FIG. 53B, a predetermined electrical signal can be applied between the substrate 5201 and the upper electrode 5205.

Figure 53C:
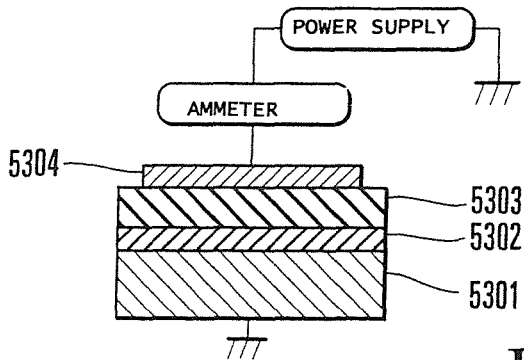

As shown in FIG. 53C, an insulating layer 5302, ferroelectric layer 5303, and upper electrode 5304 may be provided on a metal plate 5301. In this structure, the metal plate 5301 serves as a lower electrode layer. With the structure shown in FIG. 53C in which the constituent elements are formed on the metal plate 5301 with high thermal conductivity, a higher cooling effect can be obtained, and a stable element operation can be expected.

As the ferroelectric layer becomes thick, the current flows more hardly, and the resistance increases. When a memory is implemented by using a change in resistance value, the resistance value of in each of the ON state and OFF state is important. For example, when the ferroelectric layer becomes thick, the resistance value in the ON state increases. Since it is difficult to ensure a high S/N ratio, the state of the memory is hard to determine. On the other hand, when the ferroelectric layer becomes thin, and the leakage current is dominant, memory information can hardly be held, and the resistance value in the OFF state increases. It is therefore difficult to ensure a high S/N ratio.

Hence, the ferroelectric layer preferably has an optimum thickness. For example, when the problem of leakage current is taken into consideration, the ferroelectric layer need only have a thickness of at least 10 nm. When the resistance value in the ON state is taken into consideration, the ferroelectric layer is preferably thinner than 200 nm. In experiments conducted by the present inventors, a memory operation was confirmed when the thickness of the ferroelectric layer was 30 to 100 nm. The most satisfactory state was obtained when the thickness of the ferroelectric layer was 50 nm.

A more preferable thickness is present even in the insulating layer on the lower electrode layer. The thickness will be described by using an example in which an $Al_2O_3$ film, $SiO_2$ film, and $Ta_2O_3$ film are formed on silicon substrates by ECR sputtering using an Al target, Si target, and Ta target. Each film is formed to a predetermined thickness. An upper electrode made of Al is formed on each film. A current-voltage characteristic is measured by applying a voltage between the silicon substrate and the upper electrode. The current density observed in each thin film at −1 V is observed. The result of the current densities is the same as in FIG. 39.

As shown in FIG. 39, the current density changes depending on the material of the insulating layer. The smaller the thickness becomes, the more the leakage current flows to increase the current density. On the other hand, when the thickness increases, the current density decreases. This indicates that if the thickness of too small, the characteristic of an insulating layer cannot be obtained. If the thickness is large, the voltage applied to the ferroelectric film is small so it is difficult to ensure a high S/N ratio, and the memory state is hard to determine. Hence, the insulating layer preferably has an optimum thickness in combination with the ferroelectric layer.

For example, when the problem of leakage current is taken into consideration, and an $Al_2O_3$ film or $SiO_2$ film is used, the thickness is preferably about 1 to 3 nm. A $Ta_2O_3$ film need only have a thickness of at least 3 nm. When the problem of magnitude of the resistance value is taken into consideration, the insulating layer is preferably thicker than 20 nm. In experiments conducted by the present inventors, the above-described memory operation was confirmed when an insulating layer made of $SiO_2$ and $Ta_2O_3$ had a thickness of 3 to 5 nm.

Figure 54A:
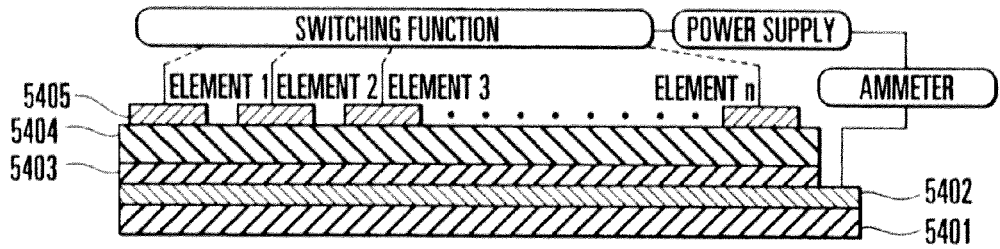
FIGS. 54A to 54E are sectional views schematically showing structure examples of still another element according to an embodiment of the present invention.

In the above description, one element has been exemplified. However, a plurality of elements may be arrayed and integrated, as will be described later. For example, as shown in FIG. 54A, a common lower electrode layer 5402, insulating layer 5403, and ferroelectric layer 5404 are formed on an insulating substrate 5401. A plurality of upper electrodes 5405 spaced apart from each other by a predetermined distance are formed on the ferroelectric layer 5404. That is, a plurality of ferroelectric elements are arrayed in correspondence with the plurality of upper electrodes 5405.

A ferroelectric or insulating film has a much lower conductivity than a conductor such as a metal and can therefore be used commonly. In this case, since the working process can be omitted, the productivity can be increased, resulting in large advantage from the industrial viewpoint. When the distance between the ferroelectric elements corresponding to the plurality of upper electrodes 5405 is set in consideration of, e.g., the conductivity, a stable operation can be expected.

Figure 54B:
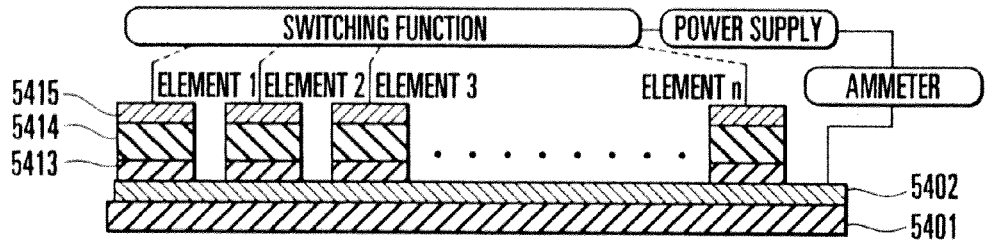

As shown in FIG. 54B, the common lower electrode layer 5402 may be formed on the insulating substrate 5401, and a plurality of elements each including an insulating layer 5413, ferroelectric layer 5414, and upper electrode 5415 may be arrayed on the lower electrode layer 5402. For example, when a ferroelectric film is formed and processed by using a method such as RIE, ICP etching, or ECR etching, the individual ferroelectric layers 5414 can be formed. When the elements are separated in this way, the distance between them can further be shortened, and the degree of integration can be made higher.

Figure 54C:
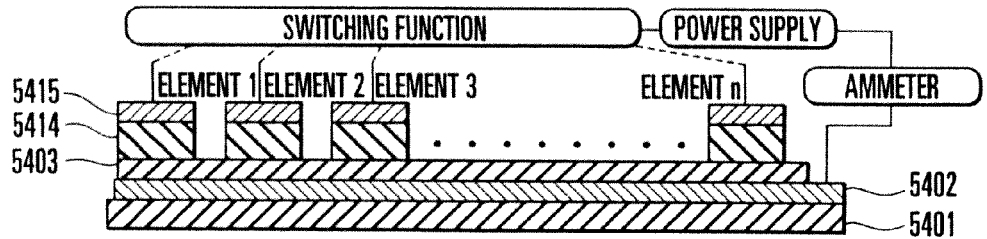
Figure 54D:
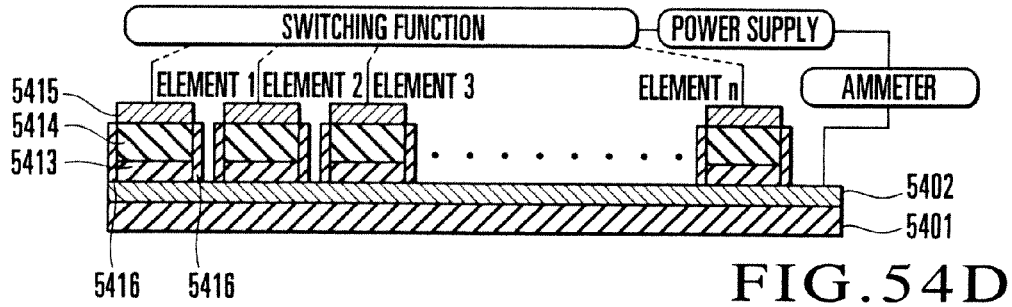
Figure 54E:
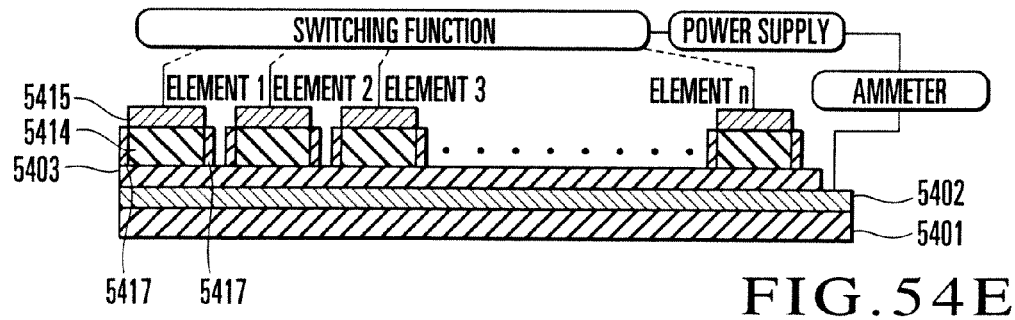

As shown in FIG. 54C, the common lower electrode layer 5402 and insulating layer 5403 may be formed on the insulating substrate 5401, and a plurality of elements each including the ferroelectric layer 5414 and upper electrode 5415 may be arrayed on the insulating layer 5403. As shown in FIG. 54D, the side surfaces of the insulating layer 5413 and ferroelectric layer 5414 of each element may be covered with an insulating sidewall 5416. As shown in FIG. 54E, the common lower electrode layer 5402 and insulating layer 5403 may be formed on the insulating substrate 5401, a plurality of elements each including the ferroelectric layer 5414 and upper electrode 5415 may be arrayed on the insulating layer 5403, and the side surface of the ferroelectric layer 5414 of each element may be covered with an insulating sidewall 5417.

Figure 55:
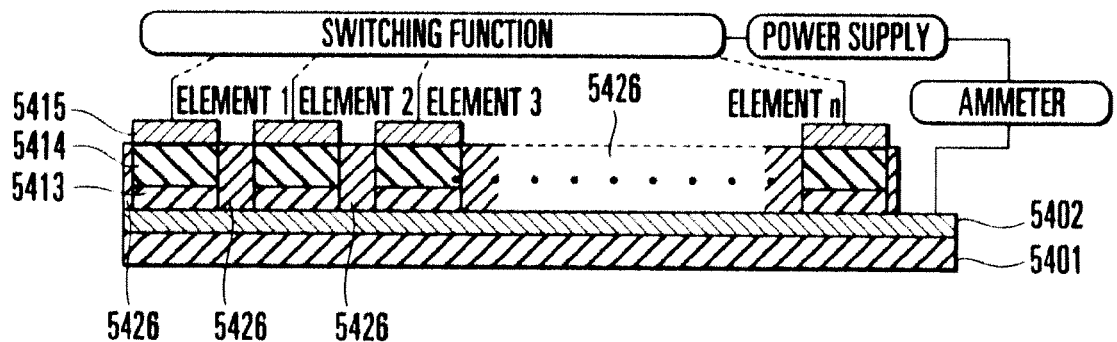
FIG. 55 is a sectional view schematically showing a structure example of still another element according to an embodiment of the present invention.

As shown in FIG. 55, the common lower electrode layer 5402 may be formed on the insulating substrate 5401, a plurality of elements each including the insulating layer 5413, ferroelectric layer 5414, and upper electrode 5415 may be arrayed on the lower electrode layer 5402, and an insulating layer 5426 may be formed to fill spaces on the sides of the plurality of ferroelectric layers 5414 that are spaced apart from each other. When the portions between the plurality of ferroelectric layers 5414 formed separately in correspondence with the elements are covered with an insulator, the leakage current between the elements can be reduced, and their stability can be increased.

As shown in FIG. 13, a plurality of elements according to the embodiment of the present invention are arrayed. More specifically, n elements are arrayed in the X direction, and m elements are arrayed in the Y direction. X-direction buses are connected to the lower electrode layers, and Y-direction buses are connected to the upper electrodes. A processor unit having a selection signal switching function is connected to each of the X- and Y-direction buses. With this structure, a memory capable of accessing each element at random can be implemented.

The change in resistance value of the ferroelectric layer 4705 can also be controlled by a current. A predetermined voltage is applied to the ferroelectric layer 4705 in the "high resistance mode" to flow a predetermined current. Immediately after that, a predetermined voltage (e.g., +0.5 V) is applied between the upper electrode 4706 and the lower electrode layer 4703. The current value then changes as shown in FIG. 41.

For example, after a current from $1\times10^{-5}$ A (inclusive) to $1\times10^{-4}$ A (exclusive) is supplied between the electrodes, the current value is small, and a high resistance state is obtained. After a current of $1\times10^{-4}$ A or more is supplied between the electrodes, the value of the flowing current becomes large (e.g., 0.7 mA), and the state changes to a low resistance state. As is apparent from this, the resistance of the ferroelectric layer 4705 also changes depending on the current flowing to it. That is, two resistance values representing a high resistance state and low resistance state are present. Hence, the element shown in FIG. 1 can be driven by both a voltage and a current.

Even in the element shown in FIG. 47, the resistance change in the ferroelectric layer 4705 can be controlled by a pulse voltage, as in the above-described element. The element can also be used as a switching element to control a current. Even the element shown in FIG. 47 can implement a ternary memory, like the above-described element.

Forming the insulating layer 4705 from a ferroelectric layer containing tantalum pentoxide and silicon dioxide and having a thickness of 5 nm will be described next. A case wherein the insulating layer 4704 has a three-layered structure formed by stacking a tantalum pentoxide film, silicon dioxide film, and tantalum pentoxide film in this order will be described below. In early experiments, the present inventors formed a metal oxide layer serving as the ferroelectric layer 4705 on a cleaned silicon substrate. As a result of specific examination of the experiment result, formation of an interface layer between the silicon substrate and the metal oxide layer was observed.

Figure 56:
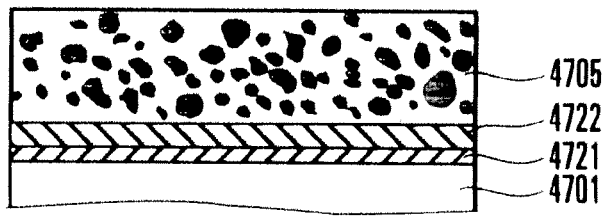
FIG. 56 is a sectional view schematically showing a result obtained by observing, with a transmission electron microscope, the section state of a metal oxide layer containing bismuth and titanium and formed on a silicon substrate.

The observation result will be described. The substrate temperature was set to 420° C., and a metal oxide layer containing bismuth and titanium was formed on a silicon substrate. When the state of a section was observed by a transmission electron microscope, the state schematically shown in FIG. 56 was observed. As shown in FIG. 56, the ferroelectric layer 4705 is formed on the substrate 4701 made of silicon via an interface layer which includes a silicon oxide layer 4721 and an oxide layer 4722 made of an oxide containing Bi, Ti, and Si.

When the ferroelectric layer 4705 is thus formed on the silicon substrate, the above-described two kinds of oxide layers are formed in the interface between them. Even when the ferroelectric layer 4705 is formed on an intentionally formed silicon oxide layer, an oxide layer containing Bi, Ti, and Si is also observed in the interface. Of the layers formed in the interface, the silicon oxide layer 4721 is estimated to have a relative dielectric constant as small as 3.8. When a voltage is applied to the ferroelectric layer 4705, the voltage may be applied mostly to the silicon oxide layer 4721, and no voltage may be distributed to the ferroelectric layer 4705. The oxide layer 4722 poses a problem when interface controllability is required. Hence, when the ferroelectric layer 4705 is to be formed, a more desirable state can be obtained by suppressing reaction with silicon and preventing formation of silicon oxide with a small relative dielectric constant.

A case wherein the ferroelectric layer 4705 is formed directly on an underlying metal layer made of, e.g., ruthenium will be examined. As is well known, ruthenium forms an oxide. Hence, when a ferroelectric layer is formed on a metal layer made of ruthenium, the surface of the metal layer is expected to be oxidized to degrade the morphology.

Figure 57:
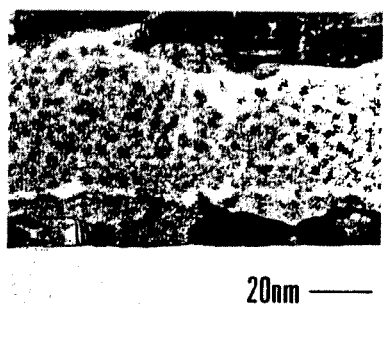
FIG. 57 is a microphotograph showing a result obtained by observing, with a transmission electron microscope, the section state of a metal oxide layer containing bismuth and titanium and formed on a ruthenium electrode layer.
Figure 58:
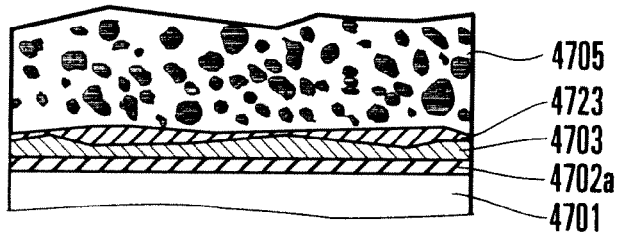
FIG. 58 is a sectional view schematically showing a result obtained by observing, with a transmission electron microscope, the section state of a metal oxide layer containing bismuth and titanium and formed on a ruthenium electrode layer.

For example, a silicon dioxide layer was formed on a silicon substrate by thermal oxidation. A ruthenium electrode layer having a thickness of about 20 nm was formed on it by the above-described ECR sputtering. The substrate temperature was set to 450° C., and a metal oxide layer containing bismuth and titanium was formed on the ruthenium layer. When the state of a section was observed by a transmission electron microscope, the state shown in FIG. 57 was observed. FIG. 58 schematically shows the state of the electron micrograph of FIG. 57.

As shown in FIG. 58, the lower electrode layer 4703 made of ruthenium is formed on a silicon dioxide layer 4702a. The ferroelectric layer 4705 is formed on the lower electrode layer 4703 via an interface layer 4723 made of an oxide containing Bi, Ti, and Ru. The interface layer 4723 is confirmed by EDS (Energy Dispersive X-ray Spectroscopy) to be an oxide containing Ru, Ti, and Bi. The surface of the ferroelectric layer 4705 has a morphology of 10 to 20 nm due to the influence of the interface layer 4723. As is apparent from this, a more desirable state can be obtained when the ferroelectric layer 4705 is not directly formed on the metal layer.

From the above experiment and observation results, the present inventors directed attention to an insulating layer having a multilayered structure formed by sandwiching a silicon dioxide layer between tantalum pentoxide layers. When the tantalum pentoxide layers contact the lower electrode layer 4703 and ferroelectric layer 4705, oxidation in the interface of the lower electrode layer 4703 can be prevented. In addition, formation of an interface layer due to reaction in the interface to the ferroelectric layer 4705 can be suppressed. When a silicon dioxide layer is formed, insulating properties can be ensured. Hence, any other material capable of preventing formation of an interface layer in the interface between the lower electrode layer 4703 and the ferroelectric layer 4705 can be used in place of tantalum pentoxide. The silicon dioxide layer need not always be formed. Only a tantalum pentoxide layer suffices depending on the state of necessary insulating properties.

The characteristic of the element using the insulating layer (insulating layer 4702) formed from a tantalum pentoxide layer will be described next. A silicon dioxide layer is formed on a silicon substrate by thermal oxidation. A ruthenium electrode layer having a thickness of about 20 nm is formed on the silicon dioxide layer by the above-described ECR sputtering. A tantalum pentoxide layer, silicon dioxide layer, and tantalum pentoxide layer are stacked in this order on the formed ruthenium electrode layer to form an insulating layer having a thickness of about 5 nm. These layers are formed by the ECR sputtering described with reference to FIG. 48C.

The state of a section of the insulating layer formed on the above-described ruthenium electrode layer was observed by a transmission electron microscope. The tantalum pentoxide layer, silicon dioxide layer, and tantalum pentoxide layer in an amorphous state were observed as a very thin film having a thickness of 5 nm on the ruthenium electrode layer in a crystalline state. No interface layers were observed on the interfaces between the layers, and it was confirmed that the layers were formed very flat.

An investigation result of the electrical characteristics of the insulating layer of the above-described layered structure will be described next. The electrical characteristics were investigated by preparing four samples A, B, C, and D. In the sample A, an insulating layer having a thickness of about 3 nm and including a tantalum pentoxide layer, silicon dioxide layer, and tantalum pentoxide layer stacked in this order is formed on a cleaned p-type silicon substrate. In the sample B, an insulating layer having a thickness of about 3 nm and including a silicon dioxide layer, tantalum pentoxide layer, and silicon dioxide layer stacked in this order is formed on a cleaned p-type silicon substrate. In the sample C, a silicon dioxide insulating layer having a thickness of about 3 nm is formed on a cleaned p-type silicon substrate. In the sample D, a tantalum pentoxide insulating layer having a thickness of about 3 nm is formed on a cleaned p-type silicon substrate.

In each sample, an upper electrode made of aluminum is formed on the insulating layer. A predetermined voltage is applied between the silicon substrate and the upper electrode, thereby measuring the current density. When a negative voltage is applied to the upper electrode to set the silicon substrate in a storage state of the semiconductor, the voltage is applied to only the insulating layer.

Figure 59:
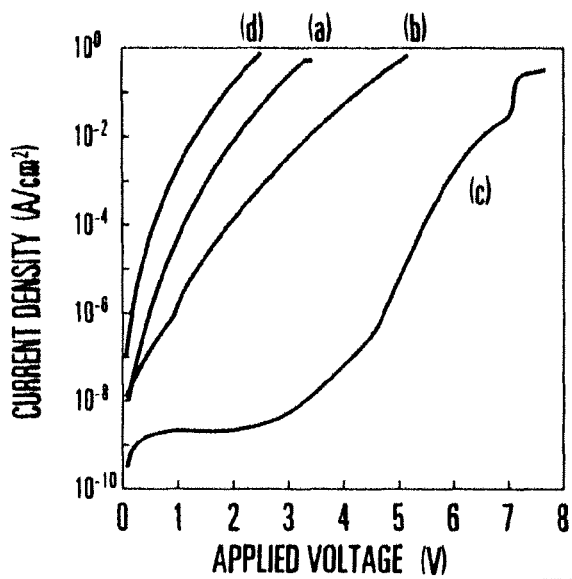
FIG. 59 is a graph showing the electrical characteristics of an insulating layer having a layered structure.

FIG. 59 shows the measurement result obtained by using the above-described samples. As indicated by c in FIG. 59, the silicon dioxide insulating layer has high insulating properties. To the contrary, as indicated by d, the tantalum pentoxide insulating layer has low insulating properties and a high current density at a very low applied voltage. The samples a and b have intermediate characteristics between the samples c and d. As is apparent from this result, the insulating layer having a multilayered structure formed by sandwiching a silicon dioxide layer between tantalum pentoxide layers can obtain higher insulating properties as compared to the insulating layer including a single tantalum pentoxide layer.

An observation result of an element having the same structure as in FIG. 47, i.e., an element using an insulating layer having a multilayered structure including a silicon dioxide layer sandwiched between tantalum pentoxide layers will be described next. Formation of the element used for observation will briefly be described. A silicon dioxide layer is formed on a silicon substrate by thermal oxidation. A ruthenium electrode layer having a thickness of about 20 nm is formed on the silicon dioxide layer by the above-described ECR sputtering.

An insulating layer having a thickness of about 5 nm is formed on the ruthenium electrode layer by stacking a tantalum pentoxide layer, silicon dioxide layer, and tantalum pentoxide layer in this order, as described above. A metal oxide layer having a thickness of about 40 nm and containing bismuth and titanium is formed on the insulating layer at a substrate temperature of 420° C. and an oxygen flow rate of 1 sccm.

Figure 60:
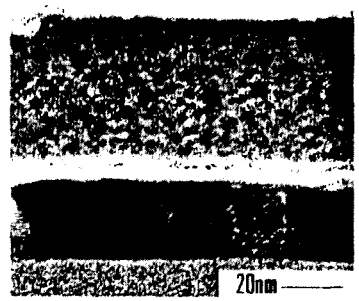
FIG. 60 is a microphotograph showing a result obtained by observing, with a transmission electron microscope, the section state of a metal oxide layer containing bismuth and titanium and formed on a ruthenium electrode layer via an insulating layer which is formed by stacking a tantalum pentoxide layer, silicon dioxide layer, and tantalum pentoxide layer in this order.
Figure 61:
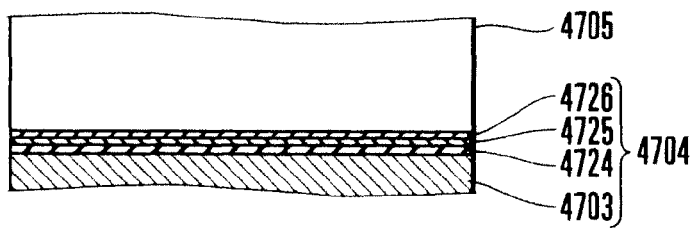
FIG. 61 is a sectional view schematically showing a result obtained by observing, with a transmission electron microscope, the section state of a metal oxide layer containing bismuth and titanium and formed on a ruthenium electrode layer via an insulating layer which is formed by stacking a tantalum pentoxide layer, silicon dioxide layer, and tantalum pentoxide layer in this order.

FIG. 60 shows a result obtained by observing a section of the element formed in the above-described way by using a transmission electron microscope. FIG. 61 schematically shows this state. As a result of observation, the insulating layer 4704 including a tantalum pentoxide layer 4724, silicon dioxide layer 4725, and tantalum pentoxide layer 4726 stacked in this order was formed on the lower electrode layer 4703. The ferroelectric layer 4705 was formed on the insulating layer 4704. No interface layers were observed on the interfaces between the layers. The interfaces between the layers were flat on the order of nm. As described above, when an insulating layer including a silicon dioxide layer sandwiched between tantalum pentoxide layers is used in forming the element shown in FIG. 47, formation of an interface layer by predicted reaction after oxidation is suppressed, and the surface morphology of the ferroelectric layer is improved.

Figure 62:
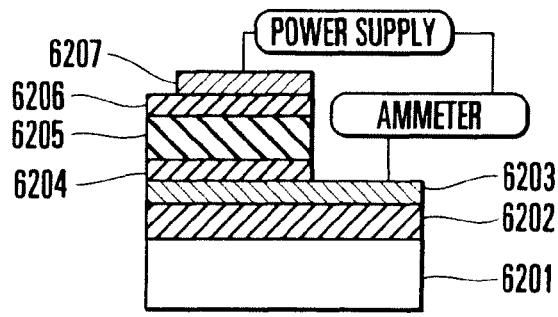
FIG. 62 is a sectional view schematically showing a structure example of an element using a metal oxide layer according to an embodiment of the present invention.

Still another embodiment of the present invention will be described below with reference to the accompanying drawings. FIG. 62 is a sectional view schematically showing a structure example of a bistable resistance value acquisition device according to another embodiment of the present invention. An element (functional element) using a metal oxide layer will be described below. The element shown in FIG. 62 comprises, on a substrate 6201 made of, e.g., single-crystal silicon, an insulating layer 6202, a lower electrode layer 6203, an insulating layer (first insulating layer) 6204, a metal oxide layer 6205, an insulating layer (second insulating layer) 6206, and an upper electrode 6207. The substrate 6201 can be made of any one of a semiconductor, insulator, and conductive material such as a metal. When the substrate 6201 is made of a conductive material, the insulating layer 6202 can be omitted. In this case, the substrate 6201 made of the conductive material serves as a lower electrode layer.

The lower electrode layer 6203 and upper electrode 6207 need only be made of a transition metal including noble metals such as platinum (Pt), ruthenium (Ru), gold (Au), and silver (Ag). The lower electrode layer 6203 and upper electrode 6207 may be made of a compound such as a nitride, oxide, or fluoride of a transition metal, such as titanium nitride (TiN), hafnium nitride (HfN), strontium ruthenate (SrRuO$_2$), zinc oxide (ZnO), indium tin oxide (ITO), or lanthanum fluoride (LaF$_3$), or a composite film formed by stacking them.

The insulating layer 6204 and insulating layer 6202 need only be made of silicon dioxide, silicon oxynitride, alumina, an oxide such as LiNbO$_3$ containing a light metal such as lithium, beryllium, magnesium, or calcium, or a fluoride such as LiCaAlF$_6$, LiSrAlF$_6$, LiYF$_4$, LiLuF$_4$, or KMgF$_3$. Alternatively, the insulating layer 6204 and insulating layer 6202 need only be made of an oxide or nitride of a transition metal such as scandium, titanium, strontium, yttrium, zirconium, hafnium, tantalum, or lanthanum series, a silicate (ternary compound of a metal, silicon, and oxygen) containing the above-described elements, an aluminate (ternary compound of a metal, aluminum, and oxygen) containing these elements, or an oxide or nitride containing at least two of the above elements.

The metal oxide layer 6205 is the same as the ferroelectric layer 104 shown in FIG. 1 and is made of a metal oxide containing at least two metals. For example, the metal oxide layer 6205 is formed by dispersing a plurality of microcrystalline grains or fine particles of Bi$_4$Ti$_3$O$_{12}$ crystal with a grain size of about 3 to 15 nm in a base layer, i.e., a layer containing titanium in an excessive amount relative to the stoichiometric composition of Bi$_4$Ti$_3$O$_{12}$. The base layer may be TiO$_x$ with a bismuth content of almost 0. In other words, the base layer is made of a metal oxide which contains two metals and in which the content of one metal is smaller in comparison with the stoichiometric composition. The metal oxide layer 6205 need only be made of, e.g., a material having a perovskite structure, a material having a pseudo-ilmenite structure, a material having a tungsten-bronze structure, a material having a bismuth layer-structure, or a material having a pyrochlore structure.

More specifically, Bi$_4$Ti$_3$O$_{12}$, La$_2$Ti$_2$O$_7$, BaTiO$_3$, PbTiO$_3$, Pb(Zr$_{1-x}$Ti$_x$)O$_3$, (Pb$_{1-y}$La$_y$)(Zr$_{1-x}$Ti$_x$)O$_3$, LiNbO$_3$, LiTaO$_3$, KNbO$_3$, YMnO$_3$, PbNb$_3$O$_6$, Ba$_2$NaNb$_5$O$_{15}$, (Ba$_{1-x}$Sr$_x$)$_2$NaNb$_5$O$_{15}$, Ba$_2$Na$_{1-x}$Bi$_{x/3}$Nb$_5$O$_{15}$, or a metal oxide (e.g., a ferroelectric) having a bismuth layer structure represented by (Bi$_2$O$_2$)$^{2+}$(A$_{m-1}$B$_m$O$_{3m+1}$)$^{2-}$ wherein A indicates at least one of monovalent, divalent, and trivalent ions and a combination thereof, B indicates at least one of tetravalent, pentavalent, and sexivalent ions and a combination thereof, O indicates oxygen, Bi indicates bismuth, and m indicates 1 to 5.

Examples of a metal oxide having a bismuth layer-structure represented by (Bi$_2$O$_2$)$^{2+}$(A$_{m-1}$B$_m$O$_{3m+1}$)$^{2-}$ are SrBi$_2$Ta$_2$O$_9$, SrBi$_2$Nb$_2$O$_9$, BaBi$_2$Nb$_2$O$_9$, BaBi$_2$Ta$_2$O$_9$, PbBi$_2$Nb$_2$O$_9$, PbBi$_2$Ta$_2$O$_9$, BiO$_4$Ta$_3$O$_{12}$, CaBi$_4$Ti$_4$O$_{15}$, SrBi$_4$Ti$_4$O$_{15}$, BaBi$_4$Ti$_4$O$_{15}$, Na$_{0.5}$Bi$_{4.5}$Ti$_4$O$_{15}$, K$_{0.5}$Bi$_{4.5}$Ti$_4$O$_{15}$, Sr$_2$Bi$_4$Ta$_5$O$_{18}$, Ba$_2$Bi$_4$Ta$_5$O$_{18}$, and Pb2Bi$_4$Ta$_5$O$_{18}$.

The metal oxide layer 6205 may be made of a material represented by Ln$_{1-x}$Ae$_x$TrO$_3$ or LnAe$_{1-x}$Tr$_x$O$_3$ wherein Ln indicates at least one rare-earth metal element selected from the lanthanum series, Ae indicates at least one material selected from light metals of group II (Be, Mg, and Ca, Sr, Ba, and Ra of alkaline earth metals), Tr indicates at least one material selected from heavy metals (transition metals) of group III, group IV, group V, group VI, group VII, group VIII, group I, and group II, and O indicates oxygen. Note that x is a number effective in the solubility limit range.

The metal oxide layer 6205 is made of a metal oxide containing at least two metals and often exhibits ferroelectric properties. In some cases, however, no ferroelectric properties are exhibited depending on the film thickness condition.

A detailed example of the functional element shown in FIG. 62 will be described. For example, the lower electrode layer 6203 is a ruthenium film having a thickness of 10 nm. The insulating layer 6204 is a multilayered film made of tantalum pentoxide and silicon dioxide and having a thickness of about 5 nm. The metal oxide layer 6205 is a Bi$_4$Ti$_3$O$_{12}$ film having a thickness of 40 nm. The insulating layer 6206 is a tantalum pentoxide layer having a thickness of 3 nm. The upper electrode 6207 is made of gold. As described above, the structures of the substrate 6201 and insulating layer 6202 are not limited to those described above, and any other material can also be selected appropriately if it has no effect on the electrical characteristics.

A detailed method of forming the above-described insulating layer 6202, lower electrode layer 6203, insulating layer 6204, metal oxide layer 6205, insulating layer 6206, and upper electrode 6207 will be described later. They can be formed by sputtering a metal target or sintered target in ECR plasma made of argon gas, oxygen gas, or nitrogen gas by using an ECR sputtering apparatus shown in FIG. 5.

Figure 63A:
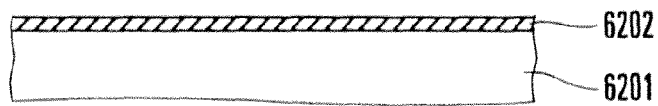
FIGS. 63A to 63F are views showing steps in manufacturing the functional element shown in FIG. 62.

An example of a method of manufacturing the functional element shown in FIG. 62 will be described next with reference to FIG. 63. As shown in FIG. 63A, the p-type silicon substrate 6201 having a plane orientation of (100) on the principal plane and a resistivity of 1 to 2 Ωcm is prepared. The surface of the substrate 6201 is cleaned by a solution mixture of sulfuric acid and a hydrogen peroxide solution, pure water, and a hydrogen fluoride solution and dried.

The insulating layer 6202 is formed on the cleaned and dried substrate 6201. In forming the insulating layer 6202, the above-described ECR sputtering apparatus is used. The substrate 6201 is fixed on a substrate holder 504 in a process chamber 501. Pure silicon (Si) is used as a target 505. The insulating layer 6202 in a metal mode by Si—O molecules is formed on the substrate 6201 to a thickness to just cover its surface by ECR sputtering using argon (Ar) as a plasma gas and oxygen gas.

In ECR sputtering shown in FIG. 5, a plasma production chamber 502 is evacuated to a high vacuum state on the order of $10^{-5}$ to $10^{-4}$ Pa. For example, Ar gas as a rare gas is supplied at a flow rate of about 20 sccm from an inert gas supply unit 511 into the plasma production chamber 502 to set the internal pressure of the plasma production chamber 502 on the order of, e.g., $10^{-3}$- to $10^{-2}$ Pa. Note that sccm is the unit of flow rate and indicates that a fluid at 0° C. and 1 atmospheric pressure flows 1 cm$^3$ in 1 min.

A coil current of, e.g., 28 A is supplied to a magnetic coil 510 to give the magnetic field of the electron cyclotron resonance condition to the plasma production chamber 502. The magnetic flux density in the plasma production chamber 502 is set to, e.g., about 87.5 mT (tesla).

A microwave of, e.g., 2.45 GHz (e.g., 500 W) is supplied from a microwave generation unit (not shown) into the plasma production chamber 502 through a waveguide 508, quartz window 507, and vacuum waveguide 506. With this supply of the microwave, Ar plasma is produced in the plasma production chamber 502.

The plasma produced by the above-described method is output from the plasma production chamber 502 to the side of the process chamber 501 by the divergent magnetic field of the magnetic coil 510. In addition, a high-frequency power (e.g., 500 W) is supplied from a high-frequency power supply 522 to the target 505 placed at the outlet of the plasma production chamber 502. When Ar particles collide against the target 505, a sputtering phenomenon occurs to sputter Si particles from the target 505.

After this state is obtained, a shutter (not shown) between the process chamber 501 and the substrate 6201 is opened. The Si particles sputtered from the target 505 reach the surface of the substrate 6201 together with the plasma output from the plasma production chamber 502 and the oxygen gas which is supplied from a reactive gas supply unit 512 and activated by the plasma and are oxidized to silicon dioxide by the activated oxygen.

With the above process, the insulating layer 6202 made of silicon dioxide and having a thickness of, e.g., about 100 nm can be formed on the substrate 6201 (FIG. 63A). When the insulating layer is formed to a predetermined thickness, the above-described shutter is closed not to make the sputtered material reach the substrate 6201, thereby stopping film formation. After that, plasma irradiation is stopped by, e.g., stopping supplying the microwave power. Supply of the gases is stopped. When the substrate temperature decreases to a predetermined value, and the internal pressure of the process chamber 501 is increased to the atmospheric pressure, the substrate 6201 which has undergone film formation is unloaded from the process chamber 501.

The insulating layer 6202 ensures insulation to prevent a voltage from leaking to the substrate 6201 and influencing desired electrical characteristics when a voltage is applied between the lower electrode layer 6203 and upper electrode 6207 to be formed later. For example, a silicon oxide film formed by oxidizing the surface of the silicon substrate by thermal oxidation may be used as the insulating layer 6202. The insulating layer 6202 may be made of any other insulating material except silicon oxide if the insulating properties can be ensured. The thickness of the insulating layer 6202 need not always be 100 nm and may be smaller or larger. In the above-described formation of the insulating layer 6202 by ECR sputtering, the substrate 6201 is not heated. However, the film may be formed while heating the substrate 6201. Alternatively, the surface of the substrate 6201 made of silicon may be oxidized by thermal oxidation to form the insulating layer 6202 made of silicon oxide.

After the insulating layer 6202 is formed in the above-described manner, the substrate 6201 is unloaded from the apparatus to the atmosphere. The substrate 6201 is fixed on the substrate holder 504 of the same ECR sputtering apparatus as in FIG. 5 in which pure ruthenium (Ru) is used as the target 505. ECR sputtering using argon (Ar) as a plasma gas and xenon (Xe) is executed to form an Ru film on the insulating layer 6202 to a thickness to just cover its surface, thereby forming the lower electrode layer 6203, as shown in FIG. 63B.

Formation of the Ru film will be described in detail. In the ECR sputtering apparatus shown in FIG. 5, the substrate 6201 is heated to, e.g., about 400° C. Next, Ar gas as a rare gas is supplied at a flow rate of, e.g., 7 sccm from the inert gas supply unit 511 into the plasma production chamber 502, and Xe gas is supplied at a flow rate of, e.g., 5 sccm to set the internal pressure of the plasma production chamber 502 to on the order of, e.g., $10^{-3}$ to $10^{-2}$ Pa. A coil current of, e.g., 26 A is supplied to the magnetic coil 510 to give the magnetic field of the electron cyclotron resonance condition to the plasma production chamber 502.

A microwave of, e.g., 2.45 GHz (e.g., 500 W) is supplied from the microwave generation unit (not shown) into the plasma production chamber 502 through the waveguide 508, quartz window 507, and vacuum waveguide. With this supply of the microwave, a plasma of Ar and Xe is produced in the plasma production chamber 502. The produced plasma is output from the plasma production chamber 502 to the side of the process chamber 501 by the divergent magnetic field of the magnetic coil 510. In addition, a high-frequency power (e.g., 500 W) is supplied from the high-frequency electrode supply unit to the target 505 placed at the outlet of the plasma production chamber 502. When Ar particles collide against the target 505, a sputtering phenomenon occurs to sputter Ru particles from the target 505. The Ru particles sputtered from the target 505 reach the surface of the insulating layer 6202 on the substrate 6201 and are deposited.

Figure 63B:
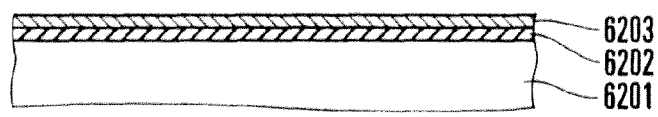

With the above process, the lower electrode layer 6203 having a thickness of, e.g., about 10 nm can be formed on the insulating layer 6202 (FIG. 63B). The lower electrode layer 6203 enables voltage application to the metal oxide layer 6205 and insulating layer 6204 when a voltage is applied between the lower electrode layer 6203 and the upper electrode 6207 to be formed later. The lower electrode layer 6203 may be made of any other material except ruthenium if the conductivity can be ensured. The thickness of the lower electrode layer 6203 need not always be 10 nm and may be smaller or larger.

As described above, in forming the Ru film by ECR sputtering, the substrate 6201 is heated to 400° C. However, the substrate need not always be heated. However, if the substrate is not heated, the adhesion of ruthenium to silicon dioxide becomes low, and the film may peel off. To prevent peeling, the film is formed preferably while heating the substrate. After Ru is deposited to a desired thickness in the above-described way, an end process is executed by stopping film formation by, e.g., closing the shutter and stopping plasma irradiation by stopping supply of the microwave power. Then, the substrate 6201 can be unloaded.

Figure 63C:
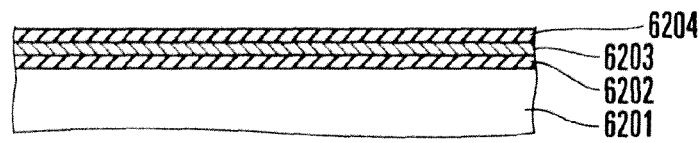

After the lower electrode layer 6203 is formed in the above-described manner, the substrate 6201 is unloaded from the apparatus to the atmosphere. The substrate 6201 is fixed on the substrate holder 504 of the same ECR sputtering apparatus as in FIG. 5 in which pure tantalum (Ta) is used as the target 505. The insulating layer 6204 is formed on the lower electrode layer 6203 to a thickness to just cover its surface, as shown in FIG. 63C, by ECR sputtering using argon (Ar) as a plasma gas and oxygen gas. A metal mode film by Ta—O molecules is formed as the insulating layer 6204, as will be described below.

Formation of a metal mode film by Ta—O molecules will be described in detail. In the ECR sputtering apparatus shown in FIG. 5 in which the target 505 made of tantalum is used, the plasma production chamber 502 is evacuated a high vacuum state on the order of $10^{-5}$ to $10^{-4}$ Pa. Then, Ar gas as a rare gas is supplied at a flow rate of, e.g., 25 sccm from the inert gas supply unit 511 into the plasma production chamber 502 to set the internal pressure of the plasma production chamber 502 on the order of, e.g., $10^{-3}$ to $10^{-2}$ Pa. A coil current of, e.g., 27 A is supplied to the magnetic coil 510 to give the magnetic field of the electron cyclotron resonance condition to the plasma production chamber 502.

A microwave of, e.g., 2.45 GHz (e.g., 500 W) is supplied from the microwave generation unit (not shown) into the plasma production chamber 502 through the waveguide 508, quartz window 507, and vacuum waveguide 506. With this supply of the microwave, Ar plasma is produced in the plasma production chamber 502. The produced plasma is output from the plasma production chamber 502 to the side of the process chamber 501 by the divergent magnetic field of the magnetic coil 510. In addition, a high-frequency power (e.g., 500 W) is supplied from the high-frequency electrode supply unit to the target 505 placed at the outlet of the plasma production chamber 502. When Ar particles collide against the target 505, a sputtering phenomenon occurs to sputter Ta particles from the target 505.

The Ta particles sputtered from the target 505 reach the surface of the lower electrode layer 6203 on the substrate 6201 together with the plasma output from the plasma production chamber 502 and the oxygen gas which is supplied from the reactive gas supply unit 512 and activated by the plasma and are oxidized to tantalum pentoxide by the activated oxygen.

Figure 63D:
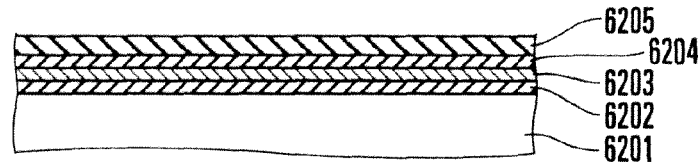

With the above process, a tantalum pentoxide film is formed on the lower electrode layer 6203. Subsequently, a silicon dioxide film is formed on the tantalum pentoxide film by ECR sputtering using the target 505 made of pure silicon, like silicon dioxide deposition described with reference to FIG. 63A. The above-described formation of a tantalum pentoxide film and silicon dioxide film is repeated to form a multilayered film including the tantalum pentoxide films and silicon dioxide films to, e.g., about 5 nm, thereby obtaining the insulating layer 6204 (FIG. 63D).

The insulating layer 6204 including the tantalum pentoxide films and silicon dioxide films is used to control the voltage to be applied to the metal oxide layer 6205 upon voltage application to the metal oxide layer 6205. The insulating layer 6204 may have any other structure except the multilayered structure of tantalum pentoxide films and silicon dioxide films if it can control the voltage applied to the metal oxide layer 6205. The insulating layer 6204 may be a single layer. The thickness is not limited to 5 nm, either. In the above-described ECR sputtering, the substrate 6201 is not heated but may be heated.

After the insulating layer 6204 is formed in the above-described manner, the substrate 6201 is unloaded from the apparatus to the atmosphere. The substrate 6201 is fixed on the substrate holder 504 of the same ECR sputtering apparatus as in FIG. 5 in which a sintered body (Bi—Ti—O) with an Bi—Ti ratio of 4:3 is used as the target 505. ECR sputtering using argon (Ar) as a plasma gas and oxygen gas is executed to form the metal oxide layer 6205 on the insulating layer 6204 to a thickness to just cover its surface, as shown in FIG. 63D.

Formation of the metal oxide layer 6205 will be described in detail. In the ECR sputtering apparatus shown in FIG. 5 in which the target 505 made of Bi—Ti—O is used, the process chamber 501 and plasma production chamber 502 are evacuated to set the internal pressure to $10^{-5}$ to $10^{-4}$ Pa. Then, the substrate 6201 is heated to, e.g., 300° C. to 700° C. Next, Ar gas as a rare gas is supplied at a flow rate of, e.g., 20 sccm from the inert gas supply unit 511 into the plasma production chamber 502 to set the pressure to on the order of, e.g., $10^{-3}$ to $10^{-2}$ Pa. A coil current of, e.g., 27 A is supplied to the magnetic coil 510 to give the magnetic field of the electron cyclotron resonance condition to the plasma production chamber 502.

A microwave of, e.g., 2.45 GHz (e.g., 500 W) is supplied from the microwave generation unit (not shown) into the plasma production chamber 502 through the waveguide 508, quartz window 507, and vacuum waveguide 506. With this supply of the microwave, a plasma is produced in the plasma production chamber 502. The produced plasma is output from the plasma production chamber 502 to the side of the process chamber 501 by the divergent magnetic field of the magnetic coil 510. In addition, a high-frequency power (e.g., 500 W) is supplied from the high-frequency electrode supply unit to the target 505 placed at the outlet of the plasma production chamber 502. When Ar particles collide against the target 505, a sputtering phenomenon occurs to sputter Bi particles and Ti particles from the target 505.

The Bi particles and Ti particles sputtered from the target 505 reach the surface of the insulating layer 6204 together with the plasma output from the plasma production chamber 502 and the oxygen gas which is supplied from the reactive gas supply unit 512 and activated by the plasma and are oxidized by the activated oxygen. The oxygen ($O_2$) gas need only be supplied from the matching unit 521 at a flow rate of, e.g., about 1 sccm. Although the target 505 is a sintered body and contains oxygen, any shortage of oxygen in the film can be prevented by supplying oxygen.

With the above-described film formation by ECR sputtering, the metal oxide layer 6205 having a thickness of, e.g., about 40 nm can be formed (FIG. 63D). After that, the same end process as described above is executed to make it possible to unload the substrate.

Figure 63E:
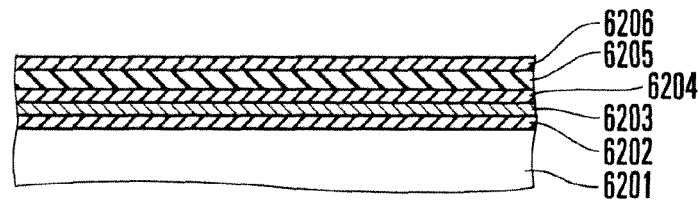
Figure 63F:
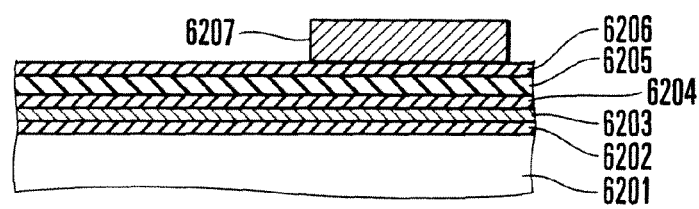

After the metal oxide layer 6205 is formed in the above-described manner, the substrate 6201 is unloaded from the apparatus to the atmosphere. The substrate 6201 is fixed on the substrate holder 504 of the same ECR sputtering apparatus as in FIG. 5 in which pure tantalum (Ta) is used as the target 505. A tantalum pentoxide film is formed on the metal oxide layer 6205 a thickness to just cover its surface, as shown in FIG. 63(e), by ECR sputtering using argon as a plasma gas and oxygen gas as a reactive gas, thereby forming the insulating layer 6206. The tantalum pentoxide film is a metal mode film by Ta—O molecules, as will be described below.

Formation of a metal mode film by Ta—O molecules will be described in detail. In the ECR sputtering apparatus shown in FIG. 5 in which the target 505 made of tantalum is used, the plasma production chamber 502 is evacuated a high vacuum state on the order of $10^{-5}$ to $10^{-4}$ Pa. Then, Ar gas is supplied at a flow rate of, e.g., 25 sccm from the inert gas supply unit 511 into the plasma production chamber 502 to set the internal pressure of the plasma production chamber 502 on the order of, e.g., $10^{-3}$ to $10^{-2}$ Pa. A coil current of, e.g., 27 A is supplied to the magnetic coil 510 to give the magnetic field of the electron cyclotron resonance condition to the plasma production chamber 502.

A microwave of, e.g., 2.45 GHz (e.g., 500 W) is supplied from the microwave generation unit (not shown) into the plasma production chamber 502 through the waveguide 508, quartz window 507, and vacuum waveguide 506. With this supply of the microwave, Ar plasma is produced in the plasma production chamber 502. The produced plasma is output from the plasma production chamber 502 to the side of the process chamber 501 by the divergent magnetic field of the magnetic coil 510. In addition, a high-frequency power (e.g., 500 W) is supplied from the high-frequency electrode supply unit to the target 505 placed at the outlet of the plasma production chamber 502. When Ar particles collide against the target 505, a sputtering phenomenon occurs to sputter Ta particles from the target 505.

The Ta particles sputtered from the target 505 reach the surface of the lower electrode layer 6203 on the substrate 6201 together with the plasma output from the plasma production chamber 502 and the oxygen gas which is supplied from the reactive gas supply unit 512 and activated by the plasma and are oxidized to tantalum pentoxide by the activated oxygen.

With the above process, a tantalum pentoxide film having a thickness of about 3 nm is formed on the metal oxide layer 6205 so that the insulating layer 6206 is formed, as shown in FIG. 63(*e*). The insulating layer 6206 made of tantalum pentoxide is used to control the voltage to be applied to the metal oxide layer 6205 upon voltage application to the metal oxide layer 6205. The insulating layer 6206 may be made of any other material except tantalum pentoxide if it can control the voltage applied to the metal oxide layer 6205. The insulating layer 6206 may be a single layer. The thickness is not limited to 3 nm, either.

In the above-described ECR sputtering, the substrate 6201 is not heated but may be heated. The properties may be improved by irradiating the surface of the formed insulating layer 6206 with ECR plasma of an inert gas and a reactive gas. As the reactive gas, oxygen gas, nitrogen gas, fluorine gas, or hydrogen gas can be used. The film quality improvement can also be applied to the insulating layer 6204 or metal oxide layer 6205.

When the upper electrode 6207 made of Au and having a predetermined area is formed on the insulating layer 6206, as shown in FIG. 63(*f*), an element using a metal oxide layer containing at least two metals can be obtained. The upper electrode 6207 can be formed by a well-known lift-off method and gold deposition by resistance heating vacuum deposition. The upper electrode 6207 may be made of another metal material or conductive material such as Ru, Pt, or TiN. When Pt is used, the adhesion is poor, and the film may peel off. Hence, the upper electrode 6207 must be formed as an electrode with a predetermined area by executing film formation by heating or using a structure such as Ti—Pt—Au that hardly peels off and executing a patterning process such as photolithography or lift-off on that structure.

According to this embodiment, the insulating layer 6204 is formed, and in this state, the metal oxide layer 6205 is formed on it. As a result, in forming the metal oxide layer 6205 by the above-described ECR sputtering, the morphology of the surface of the underlying metal film or the surface of the metal oxide layer 6205 does not degrades. For example, if the underlying layer is made of a metal material which is readily oxidized, the surface of the underlying layer may be partially oxidized in the above-described formation of the metal oxide layer 6205, resulting in degradation in morphology. However, according to this embodiment, the metal oxide layer 6205 can be formed while keeping the good surface morphology of the underlying layer. Hence, the metal oxide layer 6205 with higher quality can be obtained.

Figure 64:
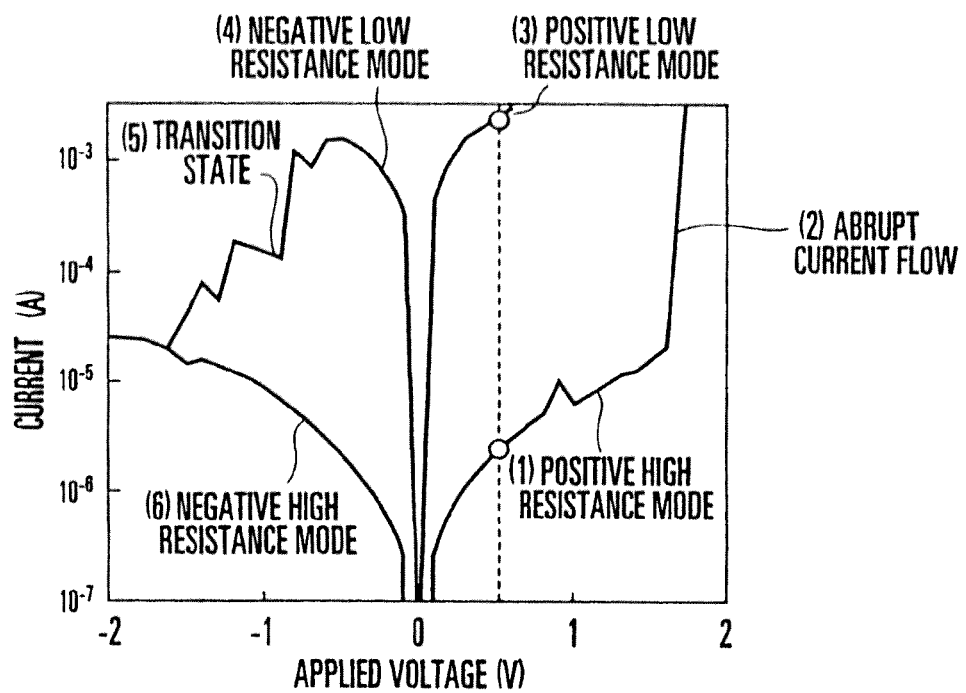
FIG. 64 is a graph showing a change in current when a voltage is applied between a lower electrode layer 6203 and an upper electrode 6207 of the element shown in FIG. 62.

The characteristics of the functional element shown in FIG. 62 will be described next. The characteristics were investigated by applying a voltage between the lower electrode layer 6203 and the upper electrode 6207. When a voltage from a power supply was applied between the lower electrode layer 6203 and the upper electrode 6207, and a current flowing when the voltage was applied was measured by an ammeter, a result shown in FIG. 64 was obtained. In FIG. 64, the ordinate indicates the absolute value of a current value as a logarithm. For this reason, a current value is indicated as a positive current value independently of whether the applied voltage is positive or negative. Actually, when a positive voltage is applied, a positive current value is observed. When a negative voltage is applied, a negative current value is observed. FIG. 64 and the memory operation principle of the present invention will be described below. The voltage values and current values to be described here are mere examples measured in an actual element. Hence, the phenomenon is not limited to the following numerical values. Other numerical values can also be measured depending on the material and thickness of each film actually used in the element and other conditions.

When a positive voltage is applied to the upper electrode 6207, the flowing current is very small in the range of 0 to 1.6 V, as indicated by (1) in FIG. 64. However, as indicated by (2), when the voltage exceeds 1.6 V, a positive current flows abruptly. Actually, a current larger than $5 \times 10^{-3}$ A/cm$^2$ also flows. However, since flowing of a larger current is inhibited to protect the measurement device, the current is not measured. When a voltage of 0 to 1.6 V is applied to inhibit abrupt current flow as indicated by (2), a state wherein the resistance is high, as indicated by (1), is maintained.

When a positive voltage is applied again to the upper electrode 6207, a locus to flow a positive current of $1 \times 10^{-3}$ A/cm$^2$ or more is obtained at about 0.5 V, as indicated by (3). When the positive voltage is further applied to the upper electrode 6207, a current of $1 \times 10^{-3}$ A/cm$^2$ or more flows at about 0.5 V, as indicated by (3). When a voltage of 0 to 0.5 V is applied, a state wherein the resistance is low, as indicated by (3), is maintained.

When a negative voltage is applied to the upper electrode 6207, a negative current flows up to about −0.5 V, as indicated by (4). The current increases to $-1.5 \times 10^{-3}$ A/cm$^2$ at maximum. When a voltage of 0 to −0.5 V is applied, a state wherein the resistance is low is maintained, as indicated by (4).

When a negative voltage is applied from −0.5 V to −1.6 V, the current value decreases, and no negative current flows, as indicated by (5). Even when the absolute value of the voltage from −1.6 V to 0 V is decreased then, the current rarely flows, as indicated by (6). When a negative voltage is applied to the upper electrode 6207, a locus to rarely flow a current is obtained, as indicated by (6).

When a positive voltage is applied to the upper electrode 6207, a locus to rarely flow a current t up 0 to 1.6 V is obtained, as indicated by (1) When a voltage of 1.6 V or more is applied, a state representing a low resistance indicated by (3) is obtained.

Hence, the high resistance state wherein no current flows as in (1) is maintained unless a voltage of 1.6 V or more is applied to the upper electrode 6207 to prevent any sudden current flow as in (2). The state (1) will be referred to as a "positive high resistance mode".

For example, as indicated by (2), when a voltage of 1.6 V or more is applied to abruptly flow a current, a low resistance state in which the current readily flows is obtained, as indicated by (3). This state is also maintained while a positive voltage is applied to the upper electrode 6207. The state (3) will be referred to as a "positive low resistance mode".

However, when a negative voltage is applied to the upper electrode 6207, a low resistance state in which a small current flows in the early stage in a negative voltage range from 0 to −0.5 V is obtained, as indicated by (4). This state is also maintained while a negative voltage in the range of 0 to −0.5 V is applied. The state (4) will be referred to as a "negative low resistance mode".

When a negative voltage exceeding −0.5 V is applied, no current flows, and the state changes to a high resistance state, as indicated by (5). In this state, the state wherein the current value has a high resistance is maintained while a negative voltage in the range of 0 to −1.6 V is applied, as indicated by (6). The state (6) will be referred to as a "negative high resistance mode".

As described above, the element using a metal oxide layer shown in FIG. 62 apparently has four stable modes: "positive high resistance mode", "positive low resistance mode", "negative high resistance mode", and "negative low resistance mode". More specifically, the "positive high resistance mode" and "negative high resistance mode" are "high resistance modes" which exhibit the same high resistance state. The "positive low resistance mode" and "negative low resistance mode" are "low resistance modes" which exhibit the same low resistance state. That is, two modes are present. In the state of the "high resistance mode", the "high resistance mode" is maintained in the voltage range of −1.6 V to +1.6 V. When a voltage of +1.6 V or more is applied to change the state to the "low resistance mode", the "low resistance mode" is maintained in the voltage range of −0.5 V to +0.5 V. Switching between the two, "high resistance mode" and "low resistance mode" occurs. This also applied to the negative resistance modes, i.e., "negative high resistance mode" and "negative low resistance mode".

As for the actual current value in each "positive mode" when a voltage of 0.5 V is applied, the current value in the "positive high resistance mode" is $5.0 \times 10^{-6}$ A/cm$^2$, and that in the "positive low resistance mode" is $5 \times 10^{-3}$ A/cm$^2$. The ratio is as high as 1,000 times. This facilitates each mode identification. The present inventors estimate that the above-described phenomenon occurs when the resistance value of the metal oxide layer 6205 dramatically changes depending on the direction and magnitude of the applied voltage. This also applies to the "negative low resistance mode".

Since the insulating layer 6204 is provided between the metal oxide layer 6205 and the upper electrode 6207, carriers can be controlled by the band structure of the insulating layer 6204. More specifically, for example, tantalum pentoxide has a band gap of about 4.5 eV. The energy difference viewed from the Fermi level is about 1.2 eV in the conduction band and 2.3 eV in the valence band. That is, the barrier is higher on the valence band side. Hence, the barrier effect is high for holes in the valence band but low for electrons in the conduction band. For further information, see Wilk et al., "J. Appl. Phys.", No. 87, p. 484 (2000).

It was found that when the above-described "low resistance mode" and "high resistance mode" shown in FIG. 64 are applied as a memory operation, the element shown in FIG. 62 can be used as a nonvolatile nondestructive memory. More specifically, initialization of the element and data erase, i.e., the write of data "off" is done by changing the mode from the "low resistance mode" to the "high resistance mode" by applying a negative voltage of the upper electrode 6207, as indicated by (4) or (5) in FIG. 64.

The write of data "on" is done by abruptly flowing a current by applying a positive voltage of 1.6 V or more to the upper electrode 6207, as indicated by (2) in FIG. 64. With this operation, the mode is changed from the "high resistance mode" to the "low resistance mode", and data "on" is written. As described above, when a voltage is applied to the upper electrode 6207 to set the "high resistance mode" or "low resistance mode", "off" or "on" data (state) can be written.

The read of data written in the above-described way can easily be done by reading a current value when an appropriate voltage of 0 to 1.6 V is applied to the upper electrode 6207. For example, when the mode state of the element shown in FIG. 62 is "off", i.e., "high resistance mode", it can be determined because a current hardly flows when an appropriate voltage of 0.5 to 1.6 V is applied, as indicated by (1) in FIG. 64.

When the mode state of the element shown in FIG. 62 is "on", i.e., "low resistance mode", it can be determined because a current abruptly flows when an appropriate voltage of 1 to 0.6 V is applied, as indicated by (2) in FIG. 64. Since the difference in current value between the "high resistance mode" and the "low resistance mode", i.e., "off" and "on" is 1,000 times or more, "off" and "on" can easily be determined. Even in the negative voltage range, "off" and "on" can be determined in the voltage range of 0 to −1.6 V.

The above-described read operation of the memory can easily be done only by checking whether the element shown in FIG. 62 is in the "high resistance mode" or "low resistance mode". In other words, while the element shown in FIG. 62 can hold the two modes, data is held. Even when a positive voltage is applied to the electrode to check the mode, the held mode does not change, and data is not destroyed. Hence, according to the functional element shown in FIG. 62, nondestructive read is possible. The element shown in FIG. 62 functions as a nonvolatile memory element since the resistance value of the metal oxide layer 6205 changes depending on the voltage applied between the lower electrode layer 6203 and the upper electrode 6207. This element can also be used as a switching element to control the current.

The voltage to operate the element shown in FIG. 62 is maximized in the write to set the "positive low resistance mode". However, the voltage is about 1.6 V at most, and the power consumption is very low, as shown in FIG. 64. The low power consumption is very advantageous for devices. Devices using a memory, e.g., not only mobile communication devices, digital general-purpose devices, digital image sensing devices, notebook personal computers, and PDAs (Personal Digital Appliances) but also all computers, personal computers, workstations, office computers, mainframes, communication units, and multifunction apparatuses can reduce the power consumption. The memory using the element shown in FIG. 62 also has a holding period of 10 years.

In the above-described example of the present invention, each of the insulating layer on the silicon substrate, the lower electrode layer on the insulating layer, the insulating layer on the lower electrode layer, the metal oxide layer on the insulating layer, and the insulating layer on the metal oxide layer is formed by ECR sputtering. However, the method of forming each layer is not limited to ECR sputtering. For example, the insulating layer to be formed on the silicon substrate may be formed by thermal oxidation or CVD (Chemical Vapor Deposition) or a conventional sputtering method.

The lower electrode layer may be formed by any other film formation method such as EB deposition, CVD, MBE, or IBD. The insulating layer on the lower electrode layer may be formed by ALD, MOCVD, or conventional sputtering. The metal oxide layer can also be formed by the above-described MOD, conventional sputtering method, PLD, or MOCVD. However, when ECR sputtering is used, flat and excellent insulating film, metal film, and metal oxide film of, e.g., a ferroelectric can easily be obtained.

In the above-described embodiment, after each layer is formed, the substrate is temporarily unloaded into the atmosphere. However, the layers may be formed by a continuous process without unloading the structure into the atmospheric by using an apparatus which connects, through vacuum transfer chambers, the process chambers to realize ECR sputtering to form the respective layers. With this arrangement, the substrate to be processed can be transported in vacuum and is therefore prevented from being influenced by disturbance such as water adhesion. Hence, the film quality and interface properties can be improved.

As shown in Japanese Patent Laid-Open No. 2003-77911, after each layer is formed, the surface of the formed layer may be irradiated with ECR plasma to improve the properties. After each layer is formed, the formed layer may be annealed (heat-treated) in an appropriate gas atmosphere such as hydrogen atmosphere to greatly improve the properties of each layer.

Arraying elements and storing a plurality of data simultaneously in a memory is called "integration". The degree of integrating elements is called a degree of integration. The structure shown in FIG. 62 is very simple and can greatly increase the degree of integration as compared to a conventional memory cell. For DRAMs, SRAMs, or flash memories based on MOSFETs which must ensure gate, source, and drain regions, limitation on integration has been pointed out recently. However, the element shown in FIG. 62 uses the simple structure and can therefore increase the degree of integration without being affected by the current limitation on integration.

In the above-described embodiment, a DC voltage is applied. However, even when a pulse voltage having an appropriate width and magnitude is applied, the same effect as described above can be obtained. The basic idea of the present invention is arranging a metal oxide layer in contact with an insulating layer and sandwiching these layers by two electrodes, as shown in FIG. 62. With this structure, when a predetermined voltage (DC or pulse) is applied between the two electrodes to change the resistance value of the metal oxide layer and switch the stable high resistance mode and low resistance mode, a memory function can be implemented consequently.

Figure 65A:
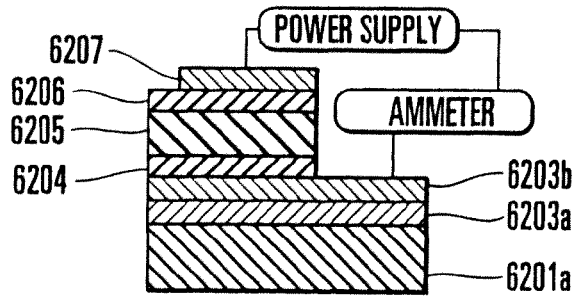
FIGS. 65A and 65B are sectional views schematically showing structure examples of still another element according to an embodiment of the present invention.
Figure 65B:
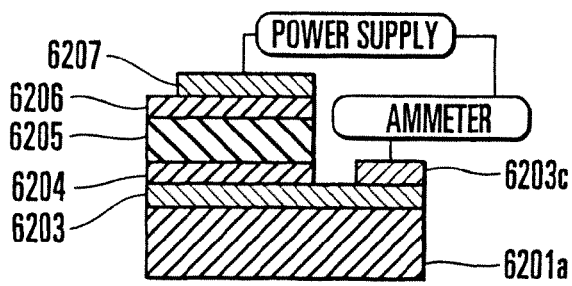
Figure 65C:
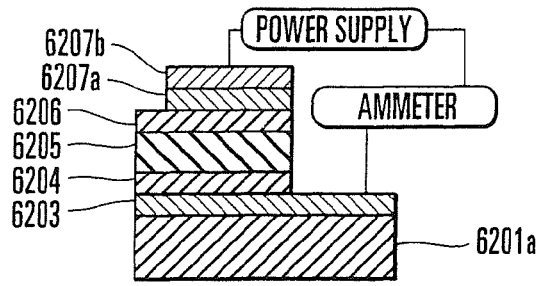
Figure 65D:
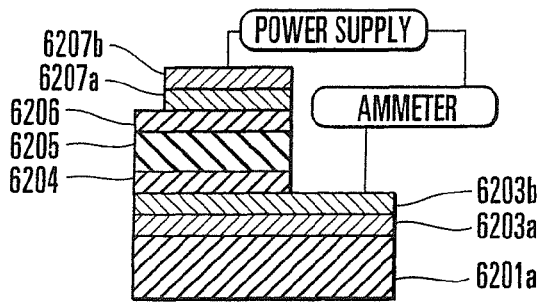

For example, as shown in FIG. 65A, an insulating substrate 6201a may be used, and stacked lower electrode layers 6203a and 6203b may be used. As shown in FIG. 65B, the insulating substrate 6201a may be used, and a contact electrode 6203c may be provided on the lower electrode layer 6203. As shown in FIG. 65C, the insulating substrate 6201a may be used, and stacked upper electrodes 6207a and 6207b may be used. As shown in FIG. 65D, the stacked lower electrode layers 6203a and 6203b and the stacked upper electrodes 6207a and 6207b may be used.

Figure 66A:
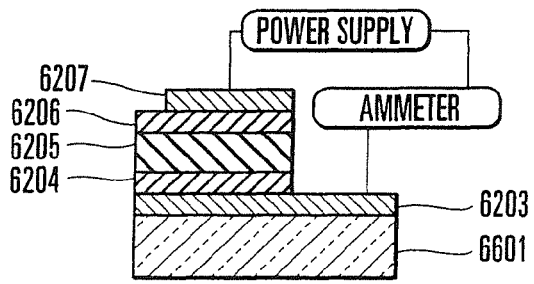
FIGS. 66A and 66B are sectional views schematically showing structure examples of still another element according to an embodiment of the present invention.
Figure 66B:
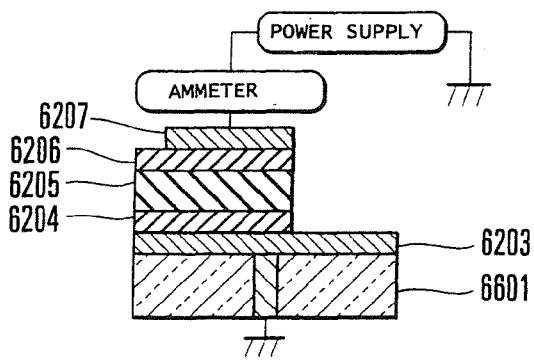

As shown in FIG. 66A, an insulating substrate 6601 made of glass or quartz may be used. In this case, as shown in FIG. 66B, a through hole may be formed in the substrate 6601 to form a plug, and an electrical contact may be formed on the lower surface of the substrate 6601 (the side opposite to the surface where the lower electrode layer 6203 is formed). With this structure, the present invention can be applied to, e.g. a glass substrate easy to process. Since the metal oxide layer 6205 which has a refractive index of about 2.6 measured at a wavelength of 632.8 nm is optically transparent, the structure shown in FIG. 66A or 66B can be applied to a display. When the metal oxide layer 6205 is formed so thick in the range of 10 to 200 nm that an interference color is generated, the visual effect of a colored state can be obtained.

Figure 67A:
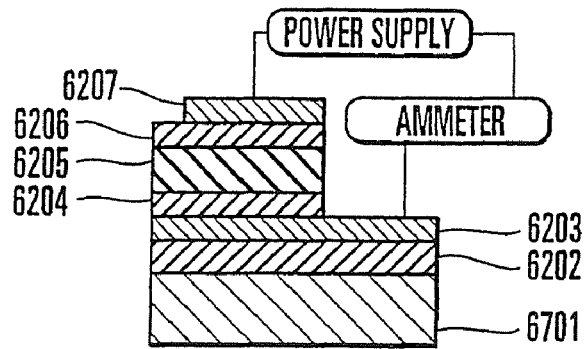
FIGS. 67A and 67B are sectional views schematically showing structure examples of still another element according to an embodiment of the present invention.
Figure 67B:
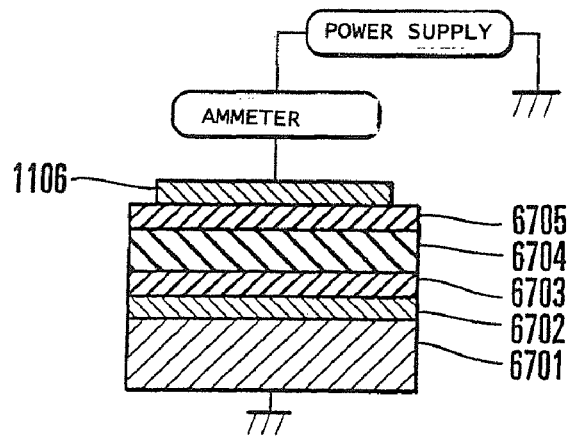

As shown in FIG. 67A, a conductive substrate 6701 made of, e.g., a metal may be used. As shown in FIG. 67B, a lower electrode layer 6702 contacting the substrate 6701 may be formed, and an insulating layer 6703, metal oxide layer 6704, insulating layer 6705, and upper electrode 6706 may be provided on it. In the structure shown in FIG. 67B, a predetermined electrical signal can be applied between the substrate 6701 and the upper electrode 6706.

Figure 68:
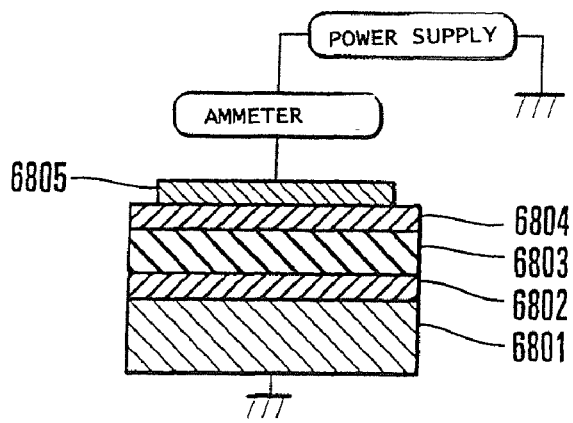
FIG. 68 is a sectional view schematically showing a structure example of still another element according to an embodiment of the present invention.

As shown in FIG. 68, an insulating layer 6802, metal oxide layer 6803, insulating layer 6804, and upper electrode 6805 may be provided on a metal plate 6801. In this structure, the metal plate 6801 serves as a lower electrode layer. With the structure shown in FIG. 68 in which the constituent elements are formed on the metal plate 6801 with high thermal conductivity, a higher cooling effect can be obtained, and a stable element operation can be expected.

As the metal oxide layer becomes thick, the current flows more hardly, and the resistance increases. When a memory is implemented by using a change in resistance value, the resistance value of in each of the ON state and OFF state is important. For example, when the metal oxide layer becomes thick, the resistance value in the ON state increases. Since it is difficult to ensure a high S/N ratio, the state of the memory is hard to determine. On the other hand, when the metal oxide layer becomes thin, and the leakage current is dominant, memory information can hardly be held, and the resistance value in the OFF state increases. It is therefore difficult to ensure a high S/N ratio.

Hence, the metal oxide layer preferably has an optimum thickness. For example, when the problem of leakage current is taken into consideration, the metal oxide layer need only have a thickness of at least 10 nm. When the resistance value in the ON state is taken into consideration, the metal oxide layer is preferably thinner than 200 nm. In experiments conducted by the present inventors, a memory operation was confirmed when the thickness of the metal oxide layer was 30 to 100 nm. The most satisfactory state was obtained when the thickness of the metal oxide layer was 50 nm.

A more preferable thickness is present even in the insulating layer on the lower electrode layer. More specifically, in forming the insulating layer by ECR sputtering, the smaller the thickness becomes, the more the leakage current flows to increase the current density. On the other hand, when the thickness increases, the current density decreases. This indicates that if the thickness of too small, the characteristic of an insulating layer cannot be obtained. If the thickness is large, the voltage applied to the metal oxide layer is small so it is difficult to ensure a high S/N ratio, and the memory state is hard to determine. As described above, the insulating layer preferably has an optimum thickness in combination with the metal oxide layer.

For example, when the problem of leakage current is taken into consideration, and an $SiO_2$ film is used, the thickness is preferably about 1 to 3 nm. A $Ta_2O_3$ film need only have a thickness of 3 to 5 nm. When the problem of magnitude of the resistance value is taken into consideration, the insulating layer is preferably thicker than 20 nm. In experiments conducted by the present inventors, the above-described memory operation was confirmed when an insulating layer made of $SiO_2$ and $Ta_2O_3$ had a thickness of 3 to 5 nm.

Figure 69A:
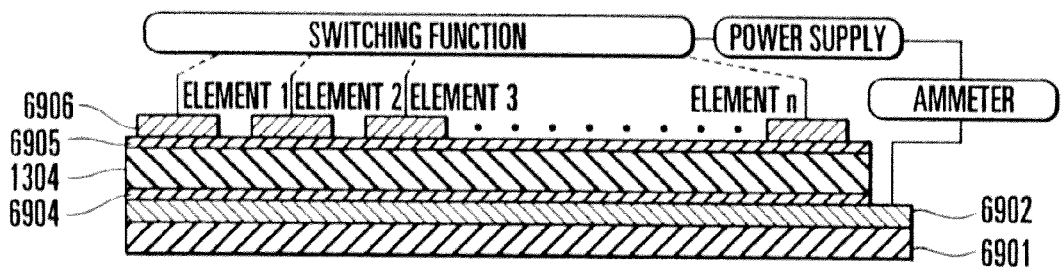
FIGS. 69A to 69E are sectional views schematically showing structure examples of still another element according to an embodiment of the present invention.

In the above description, one functional element has been exemplified. However, a plurality of functional elements may be arrayed and integrated, as will be described later. For example, as shown in FIG. 69A, a common lower electrode layer 6902, insulating layer 6903, metal oxide layer 6904, and insulating layer 6905 are formed on an insulating substrate 6901. A plurality of upper electrodes 6906 spaced apart from each other by a predetermined distance are formed on the insulating layer 6905. That is, a plurality of functional elements are arrayed in correspondence with the plurality of upper electrodes 6906.

The metal oxide layer 6205 or insulating layer 6903 or 6905 has a much lower conductivity than a conductor such as a metal and can therefore be used commonly. In this case, since the working process can be omitted, the productivity can be increased, resulting in large advantage from the industrial viewpoint. When the distance between the functional elements corresponding to the plurality of upper electrodes 6906 is set in consideration of, e.g., the conductivity, a stable operation can be expected.

Figure 69B:
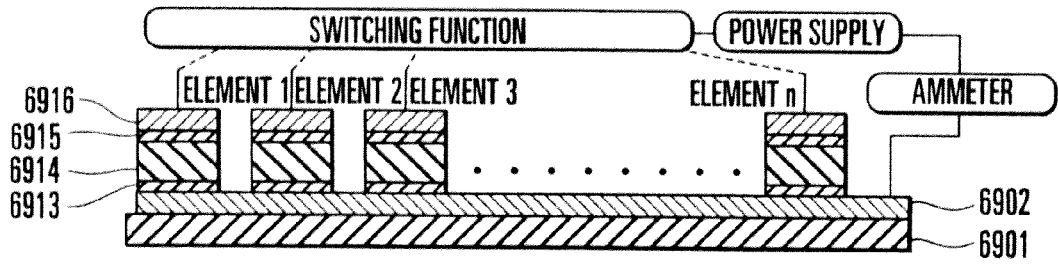

As shown in FIG. 69B, the common lower electrode layer 6902 may be formed on the insulating substrate 6901, and a plurality of elements each including an insulating layer 6913, metal oxide layer 6914, insulating layer 6915, and upper electrode 6916 may be arrayed on the lower electrode layer 6902. For example, when a metal oxide film is formed and processed by using a method such as RIE, ICP etching, or ECR etching, the individual metal oxide layers 6914 can be formed. When the elements are separated in this way, the distance between them can further be shortened, and the degree of integration can be made higher.

Figure 69C:
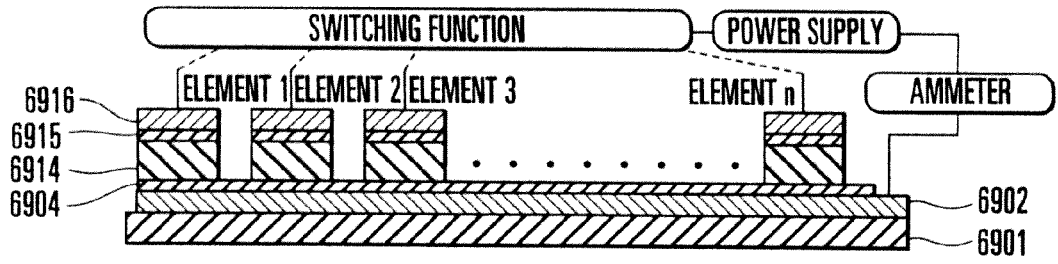
Figure 69D:
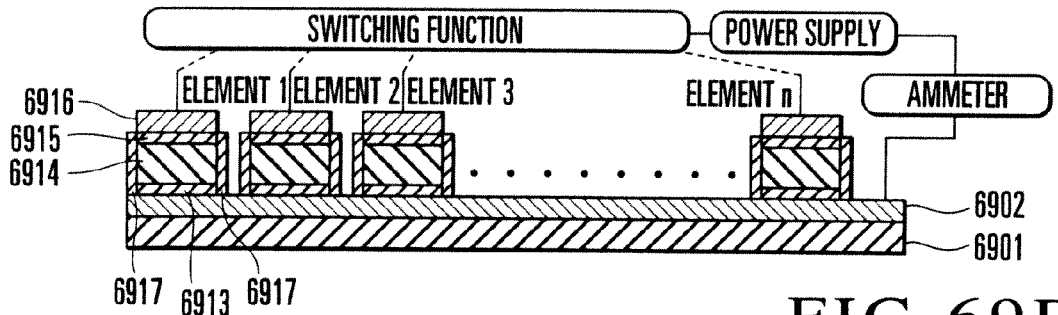
Figure 69E:
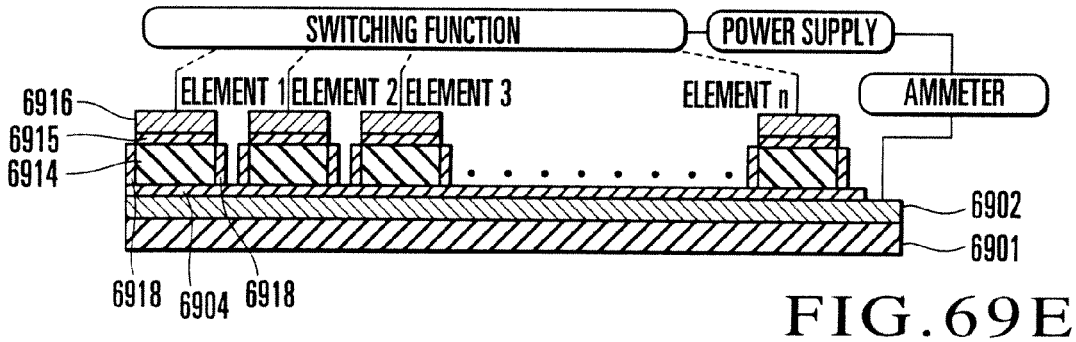

As shown in FIG. 69C, the common lower electrode layer 6902 and insulating layer 6903 may be formed on the insulating substrate 6901, and a plurality of elements each including the metal oxide layer 6914, insulating layer 6915, and upper electrode 6916 may be arrayed on the insulating layer 6903. As shown in FIG. 69D, the side surfaces of the insulating layer 6913, metal oxide layer 6914, and insulating layer 6915 of each element may be covered with an insulating sidewall 6917. As shown in FIG. 69(e), the common lower electrode layer 6902 and insulating layer 6903 may be formed on the insulating substrate 6901, a plurality of elements each including the metal oxide layer 6914, insulating layer 6915, and upper electrode 6916 may be arrayed on the insulating layer 6903, and the side surface of the metal oxide layer 6914 of each element may be covered with an insulating sidewall 6918.

Figure 70:
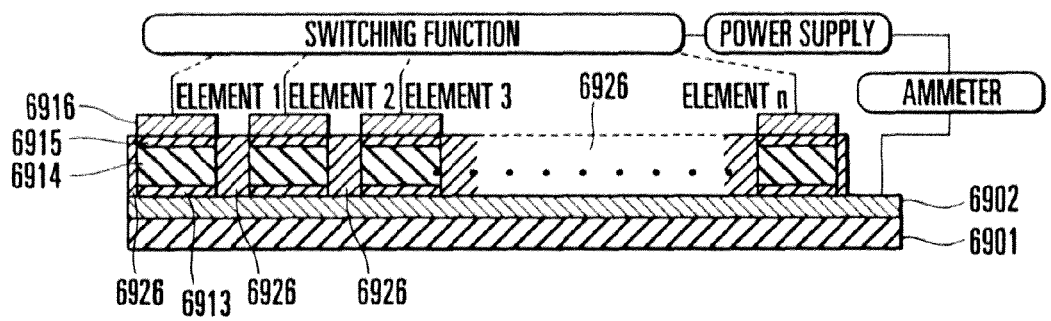
FIG. 70 is a sectional view schematically showing a structure example of still another element according to an embodiment of the present invention.

As shown in FIG. 70, the common lower electrode layer 6902 may be formed on the insulating substrate 6901, a plurality of elements each including the insulating layer 6913, metal oxide layer 6914, insulating layer 6915, and upper electrode 6916 may be arrayed on the lower electrode layer 6902, and an insulating layer 6926 may be formed to fill spaces on the sides of the plurality of metal oxide layers 6914 that are spaced apart from each other. When the portions between the plurality of metal oxide layers 6914 formed separately in correspondence with the elements are covered with an insulator, the leakage current between the functional elements can be reduced, and their stability can be increased.

A plurality of functional elements are arrayed and, more specifically, n elements are arrayed in the X direction, and m elements are arrayed in the Y direction. X-direction buses are connected to the lower electrode layers, and Y-direction buses are connected to the upper electrodes. A processor unit having a selection signal switching function is connected to each of the X- and Y-direction buses. With this structure, a memory capable of accessing each element at random can be implemented.

The change in resistance value of the metal oxide layer 6205 can also be controlled by a current, like the above-described element. The resistance change in the metal oxide layer 6205 can be controlled by a pulse voltage. The element can also be used as a switching element.

Figure 71:
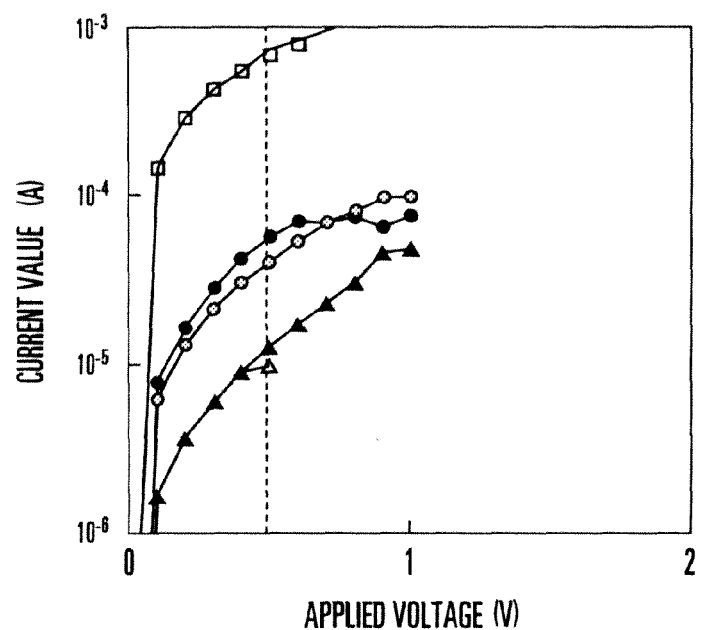
FIG. 71 is a view for explaining the multilevel operation of the element shown in FIG. 62.

According to the element shown in FIG. 62 which uses the metal oxide layer 6205 of this embodiment, the current-voltage characteristic when a DC voltage is applied between the lower electrode layer 6203 and the upper electrode 6207 is changed to different low resistance states by changing the positive-side applied voltage, as shown in FIG. 71. These correspond to the current values at the read voltage in the respective states. Hence, a memory with three states (three values) indicated by a square, circle, and triangle can be implemented. For example, when the read voltage is about 0.5 V, a ternary memory can be implemented. Before change to each state, a voltage of –2 V is applied to the lower electrode layer 6203 to return the state to the high resistance state (reset).

Figure 72:
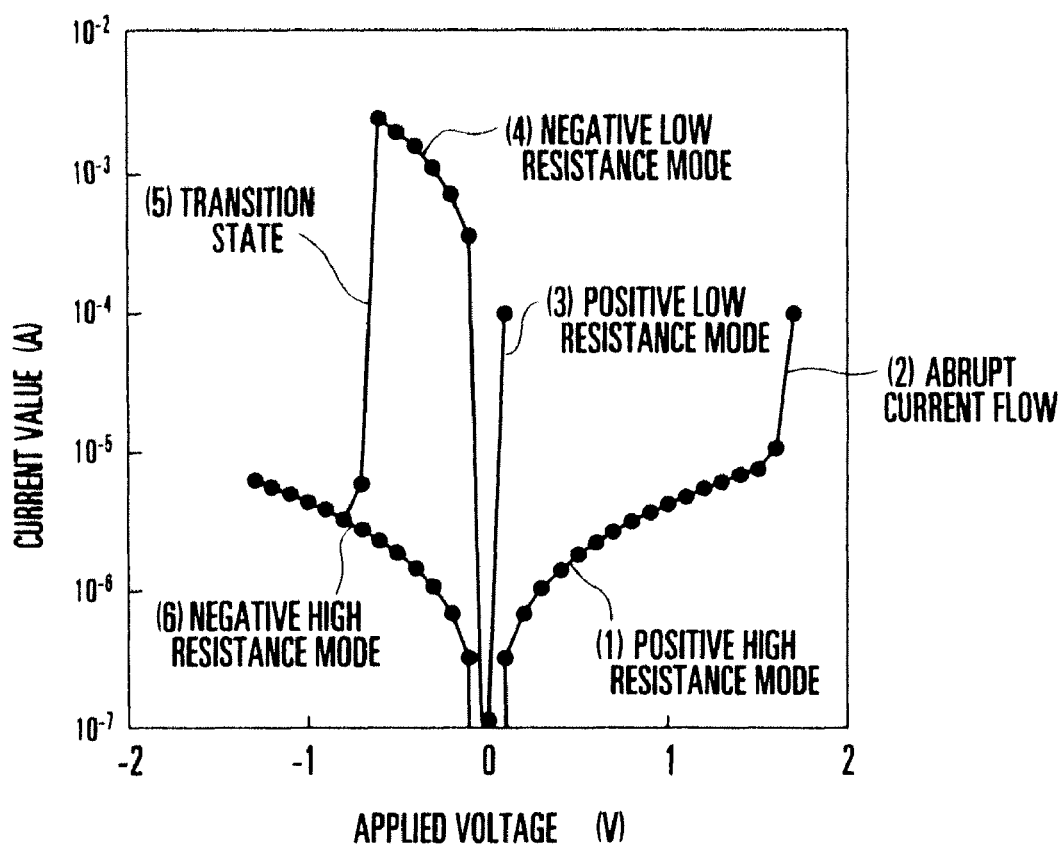
FIG. 72 is a graph showing another current-voltage characteristic of the element shown in FIG. 1A.

A case wherein the ferroelectric layer 104 of the element shown in FIG. 1 is formed at room temperature (about 20° C. to 24° C.) will be described next. The lower electrode layer 103 is made of Pt—Ti. In a thus formed element, when a voltage from a power supply was applied between the lower electrode layer 103 and the upper electrode 105, and a current flowing upon voltage application was measured by an ammeter, a result shown in FIG. 72 was obtained. When the applied voltage is raised from 0 V, a positive high resistance mode is obtained first, as indicated by (1) in FIG. 72. When the applied voltage exceeds 1.6 V, an abrupt current flow is measured, as indicated by (2). Voltage application is temporarily stopped. When a positive voltage is then applied again, a positive low resistance mode is obtained, as indicated by (3).

When a negative voltage is applied to the upper electrode 105 in the positive low resistance mode indicated by (3), a negative low resistance mode indicated by (4) is obtained. A negative voltage is applied to the upper electrode 105. When the applied voltage exceeds –0.8 V, a transition state indicated by (5) is obtained, and the resistance value abruptly increases. After this state, a negative high resistance mode indicated by (6) is obtained. The states (1) to (6) are repeatedly observed.

Figure 73:
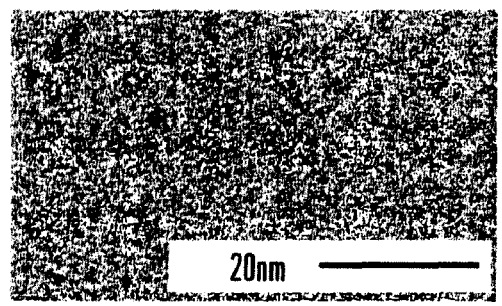
FIG. 73 is a microphotograph showing a result obtained by observing, with a transmission electron microscope, the section of a thin film formed as a structure example of the ferroelectric layer 104.

When the ferroelectric layer 104 formed at a low temperature by the same ECR sputtering as described above is observed by a transmission electron microscope, it is confirmed that the entire film is in an amorphous state, as shown in the observation result in FIG. 73. It is also confirmed that a plurality of fine particles having a grain size of about 3 to 10 nm are dispersed in the entire film. However, a portion with a size of about 10 nm can also be regarded as an aggregate of a plurality of finer particles. It is also confirmed that the content of bismuth of the fine particles is larger than titanium or oxygen. This state is a characteristic feature of a metal oxide thin film formed by ECR sputtering and is supposed to be created because migration of atoms in the film surface is promoted as the thin film in the film formation process is irradiated with ECR plasma.

A case wherein the ferroelectric layer 104 of the element shown in FIG. 1 is formed at about 150° C. will be described next. The lower electrode layer 103 is made of Pt—Ti. The substrate 101 is made of plastic. In a thus formed element, when a voltage from a power supply was applied between the lower electrode layer 103 and the upper electrode 105 (a negative voltage is applied to the upper electrode 105), and a current flowing upon voltage application was measured by an ammeter, a result shown in FIG. 74 was obtained. First, a negative high resistance mode is obtained, as indicated by (1) in FIG. 74. When the applied voltage exceeds −2 V, an abrupt current flow is measured, as indicated by (2). Voltage application is temporarily stopped. When a positive voltage is then applied, a negative low resistance mode is obtained, as indicated by (3).

When a positive voltage is applied to the upper electrode 105 in the negative low resistance mode indicated by (3), a positive low resistance mode indicated by (4) is obtained. A positive voltage is applied to the upper electrode 105. When the applied voltage exceeds 0.8 V, a transition state indicated by (5) is obtained, and the resistance value abruptly increases. After this state, a positive high resistance mode indicated by (6) is obtained. The states (1) to (6) are repeatedly observed. In the above-described conditions, the ferroelectric layer 104 is almost transparent. When a transparent material is used for the substrate, and the electrodes are formed as transparent electrodes made of, e.g., ITO, an optically transparent element can be formed.

Figure 75:
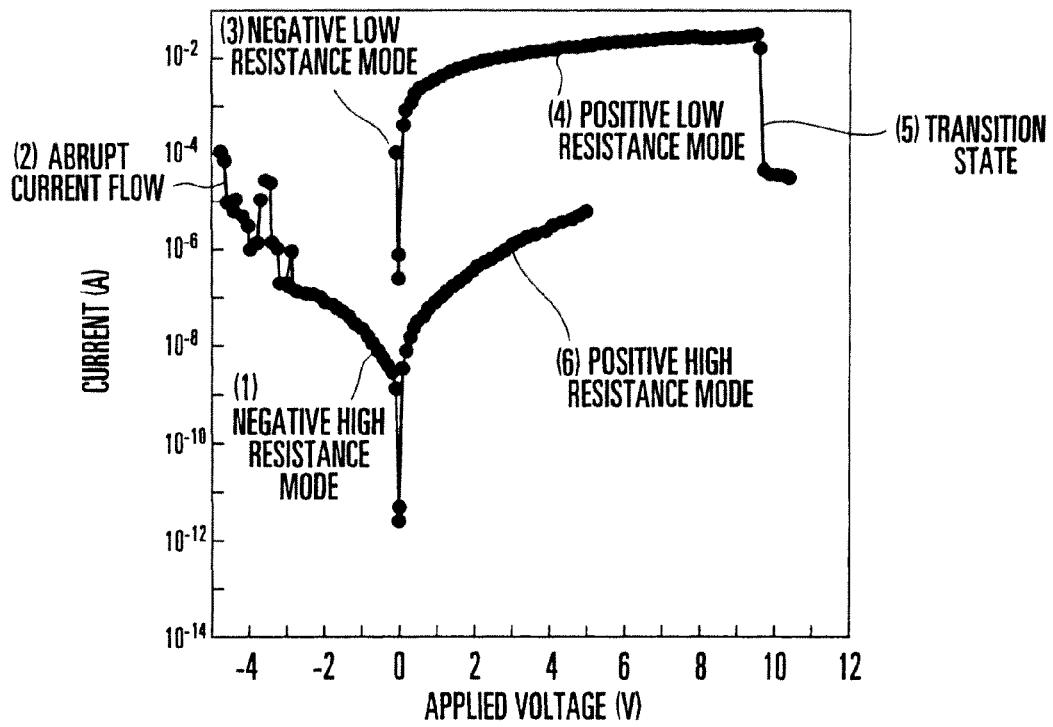
FIG. 75 is a graph showing another current-voltage characteristic of the element shown in FIG. 31.

A case wherein the ferroelectric layer 3104 of the element shown in FIG. 31 is formed at about 450° C. will be described next. The lower electrode layer 3103 is made of Ru. In a thus formed element, when a voltage from a power supply was applied between the lower electrode layer 3103 and the upper electrode 3106 (a negative voltage is applied to the upper electrode 3106), and a current flowing upon voltage application was measured by an ammeter, a result shown in FIG. 75 was obtained. A negative high resistance mode is obtained first, as indicated by (1) in FIG. 75. When the applied voltage exceeds −3 V, an abrupt current flow is measured, as indicated by (2). When a positive voltage is then applied, a negative low resistance mode is obtained, as indicated by (3).

When a positive voltage is applied to the upper electrode 3106 in the negative low resistance mode indicated by (3), a positive low resistance mode indicated by (4) is obtained. A positive voltage is applied to the upper electrode 3106. When the applied voltage exceeds 9 V, a transition state indicated by (5) is obtained, and the resistance value abruptly increases. After this state, a positive high resistance mode indicated by (6) is obtained. The states (1) to (6) are repeatedly observed.

Figure 74:
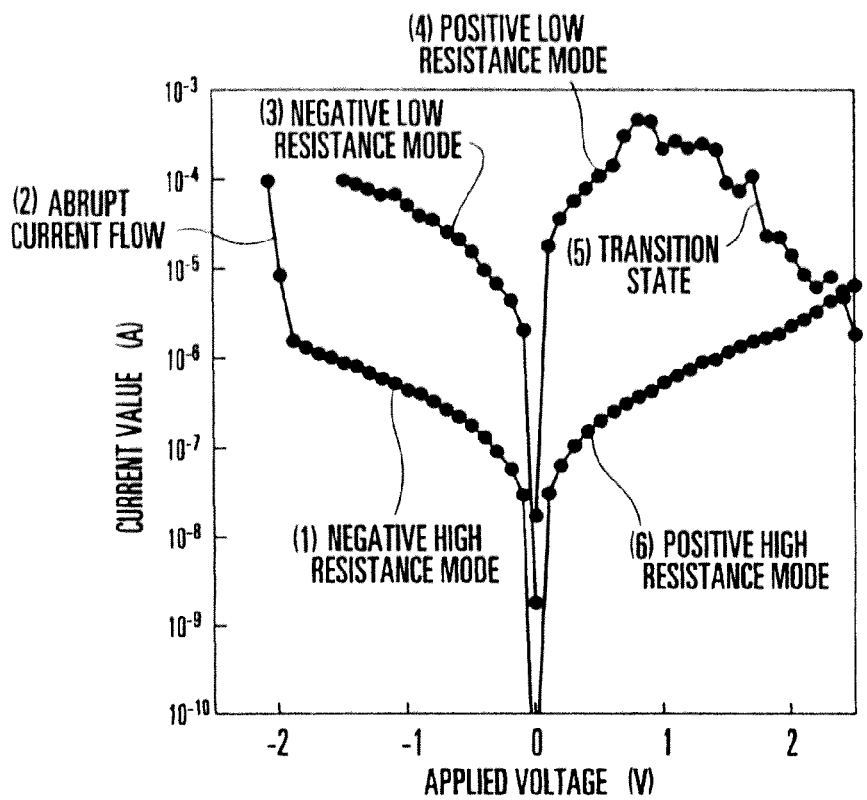
FIG. 74 is a graph showing still another current-voltage characteristic of the element shown in FIG. 1A.
Figure 76:
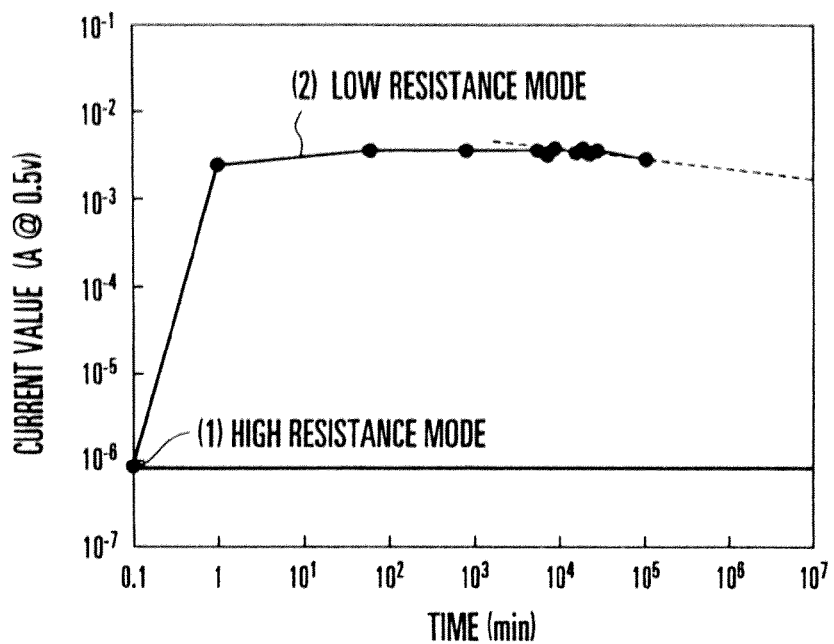
FIG. 76 is a graph showing data holding of the element which exhibits the current-voltage characteristic shown in FIG. 75.

The data holding characteristic of the element which exhibits the characteristic shown in FIG. 74 described above will be described below. As shown in FIG. 76, first, when a positive voltage is applied to the upper electrode 3106 first in the high resistance mode, a current value of about $10^{-6}$ A is measured. In this state, when a negative voltage more than −4 V is applied to the upper electrode 3106, a low resistance mode is set in which a current of about $2 \times 10^{-3}$ A flows. According to the above-described element, this low resistance mode has a stability more than 10 years, as is apparent from the extrapolated line in FIG. 76.

Figure 77:
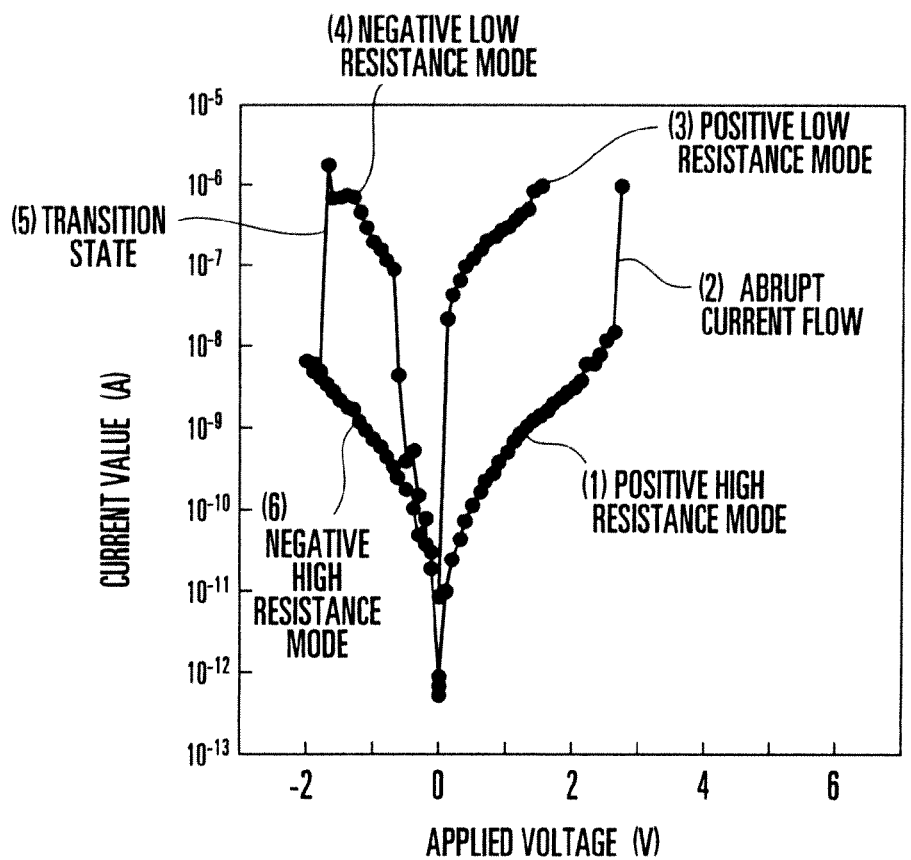
FIG. 77 is a graph showing still another current-voltage characteristic of the element shown in FIG. 1A.

A case wherein the ferroelectric layer 104 of the element shown in FIG. 1 is formed at about 430° C. will be described next. The lower electrode layer 103 is made of Ru. The upper electrode 105 has an upper layer made of titanium and a lower layer made of platinum. In a thus formed element, when a voltage from a power supply was applied between the lower electrode layer 103 and the upper electrode 105, and a current flowing upon voltage application was measured by an ammeter, a result shown in FIG. 77 was obtained. When the applied voltage is raised from 0 V, a positive high resistance mode is obtained first, as indicated by (1) in FIG. 77. When the applied voltage exceeds 2.5 V, an abrupt current flow is measured, as indicated by (2). Voltage application is temporarily stopped. When a positive voltage is then applied again, a positive low resistance mode is obtained, as indicated by (3).

When a negative voltage is applied to the upper electrode 105 in the positive low resistance mode indicated by (3), a negative low resistance mode indicated by (4) is obtained. A negative voltage is applied to the upper electrode 105. When the applied voltage exceeds −1.8 V, a transition state indicated by (5) is obtained, and the resistance value abruptly increases. After this state, a negative high resistance mode indicated by (6) is obtained. The states (1) to (6) are repeatedly observed.

Figure 78:
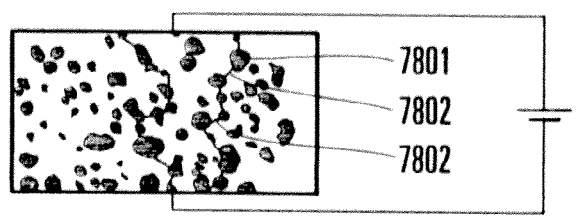
FIG. 78 is a view for explaining a low resistance state.
Figure 79:
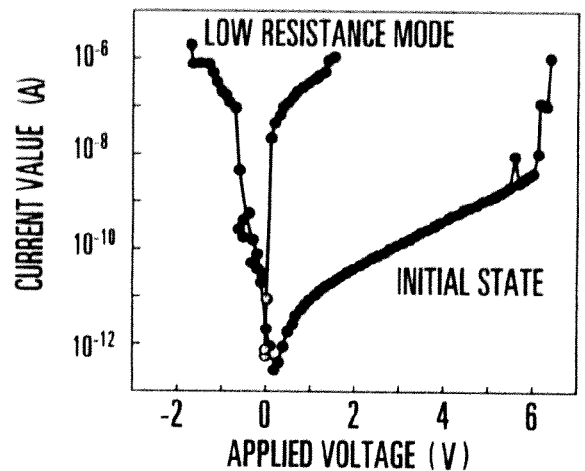
FIG. 79 is a view for explaining a low resistance state.

Holding two states in a metal oxide layer such as the above-described ferroelectric layer 104 or ferroelectric layer 3104 will be examined next. In a metal oxide layer in which the state shown in FIGS. 7C, 7c, and 73 is observed, since conductive paths 7802 schematically indicated by solid lines are formed between a plurality of dispersed fine particles 7801, as shown in FIG. 78, the low resistance mode is supposed to occur. The conductive path 7802 is supposed to be formed by quantum tunneling between the nanosized fine particles 7801, hopping of holes or electrons, or oxygen defects. In many cases, a plurality of conductive paths 7802 are formed although only one conductive path 7802 may also be formed. When a certain number of conductive paths 7802 are formed, the resistance value between the electrodes to which a voltage is applied decreases, and the low resistance mode shown in FIG. 79 is obtained.

Figure 80:
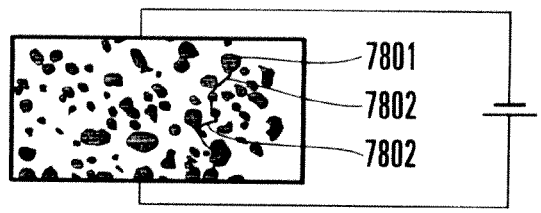
FIG. 80 is a view for explaining a low resistance state.
Figure 81:
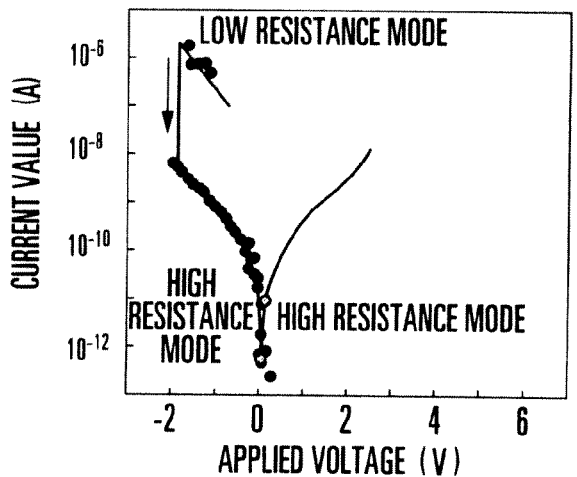
FIG. 81 is a view for explaining a low resistance state.
Figure 82:
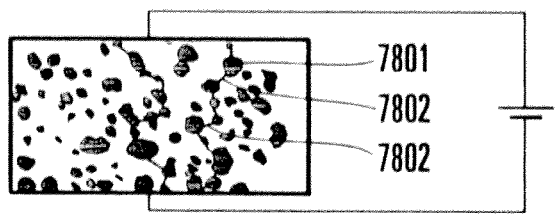
FIG. 82 is a view for explaining a low resistance state.
Figure 83:
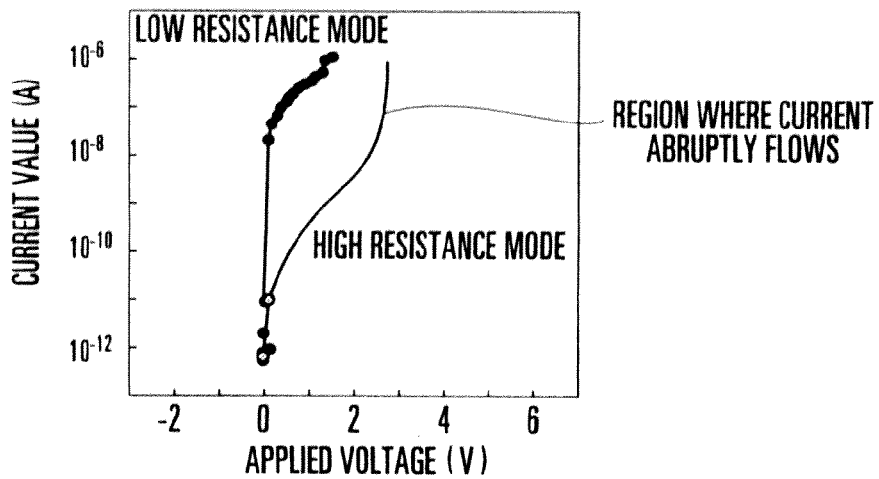
FIG. 83 is a view for explaining a low resistance state.

As shown in FIG. 80, when the polarity of the applied voltage is changed, some or all conductive paths 7802 disappear, and the resistance value between the electrodes abruptly increases. As shown in FIG. 81, the low resistance mode changes to the high resistance mode. When a voltage to just flow a current between the electrodes is applied in this high resistance mode, the plurality of conductive paths 7802 are formed again, as shown in FIG. 82. Hence, a current abruptly flows, and the mode changes to the low resistance mode, as shown in FIG. 83.

Figure 84:
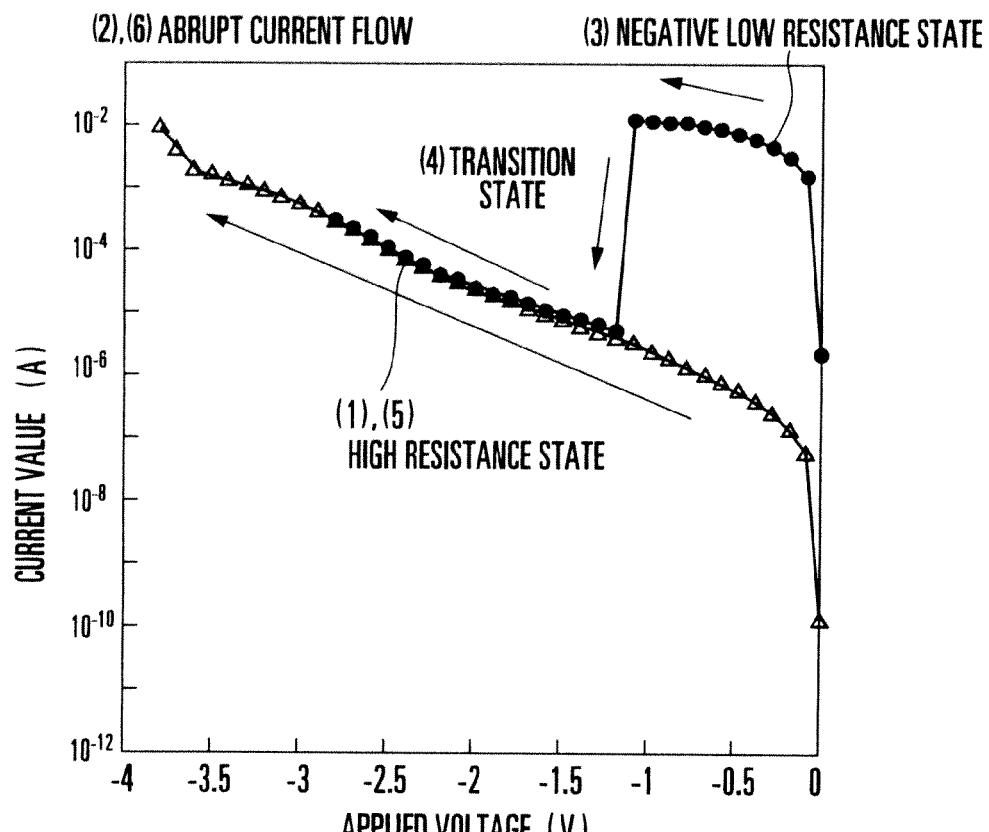
FIG. 84 is a graph showing still another current-voltage characteristic of the element shown in FIG. 1A.

In the above-described example, switching between the high resistance state and the low resistance state is done by applying voltages with different polarities. However, the present invention is not limited to this. Switching between the high resistance state and the low resistance state can also be done by applying different voltages with the same polarity, as will be described below. In the following case, the metal oxide layer is formed at 450° C. For example, as shown in FIG. 84, when a voltage more than −3.5 V is applied to the upper electrode in a negative low resistance state indicated by (1), an abrupt current flow is generated, as indicated by (2). When a negative voltage is then applied again, a negative low resistance state indicated by (3) is obtained and maintained.

When a negative voltage more than −1 V is applied in the negative low resistance state, transition occurs, and the state changes to a negative high resistance state indicated by (5). At a voltage of −3.5 V or less, this state is maintained. When a voltage more than −3.5 V is applied, an abrupt current flow indicated by (6) occurs, and the state changes to a negative low resistance state. If the direction of the applied voltage (the electrode to which the voltage is applied) is changed, the same state as described above can be obtained except that the above-described voltages have positive values.

Figure 85:
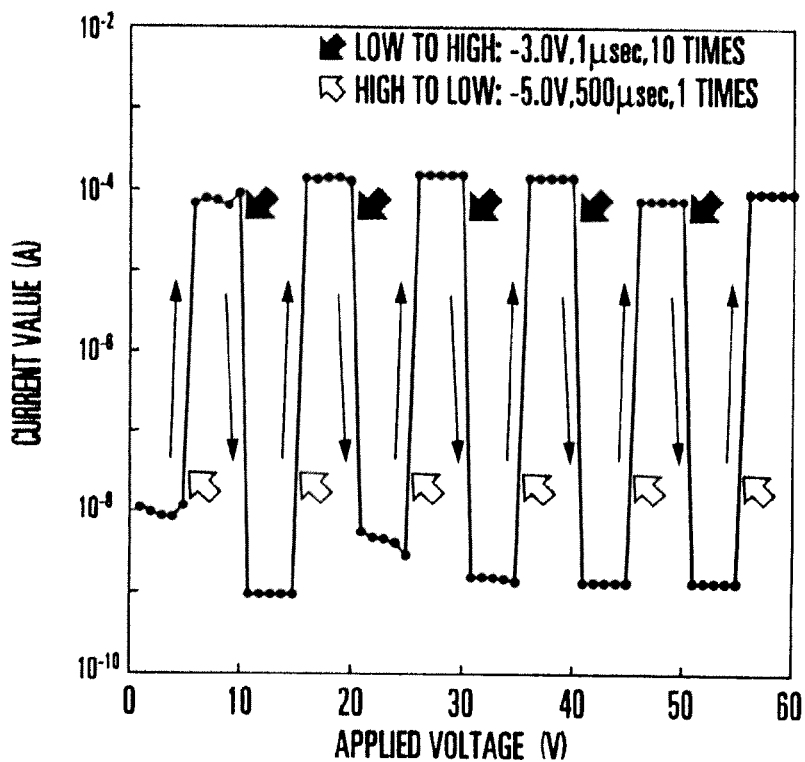
FIG. 85 is a graph showing still another current-voltage characteristic of the element shown in FIG. 1A in pulse driving.

Pulse driving can also be executed by applying voltages with the same polarity. When the state of the element is confirmed at an observation voltage of −0.1 V, the element is in a high resistance state with a current of about $10^{-8}$ A, as shown in FIG. 85. Even when the measurement is executed four times at the observation voltage of −0.1 V, the high resistance state is maintained. In this state, a pulse voltage of −5.0 V having a width of 500 μsec is applied once, as indicated by hollow arrows, and measurement is done at the observation voltage of −0.1 V. A current of about $10^{-4}$ A is measured. That is, a low resistance mode is set. Even when the measurement is executed four times at the observation voltage of −0.1 V, the low resistance state is maintained. In this state, a pulse voltage of 3.0 V having a width of 1 μsec is applied 10 times, as indicated by solid arrows, and measurement is done at the observation voltage of −0.1 V. A current of about $10^{-9}$ A is measured. That is, a high resistance mode is set. When appropriate pulse voltages are applied in a similar way, the high and low resistance states are repeatedly observed.

Figure 86A:
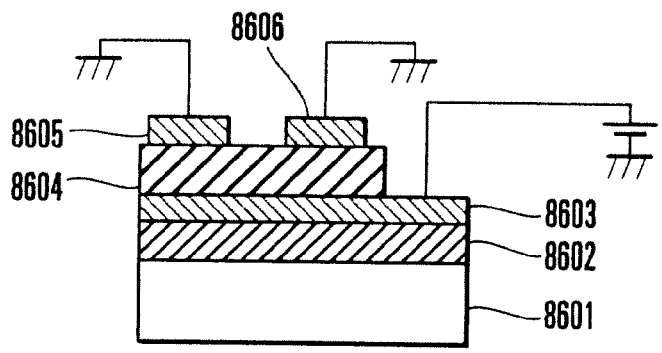
FIGS. 86A to 86C are schematic sectional views and a graph schematically showing a structure example of a 3-terminal element according to an embodiment of the present invention.
Figure 86B:
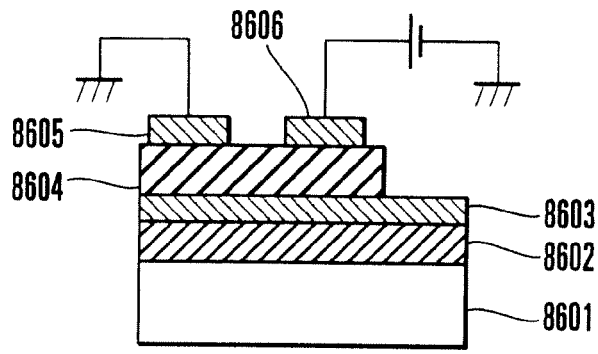

Still another embodiment of the present invention will be described below with reference to the accompanying drawings. FIGS. 86A and 86B are schematic sectional views schematically showing a structure example of a 3-terminal element according to an embodiment of the present invention. The 3-terminal element shown in FIGS. 86A and 86B comprises, on a substrate 8601 made of, e.g., single-crystal silicon, an insulating layer 8602, a gate electrode 8603, a metal oxide layer 8604 containing Bi, Ti, and O and having a thickness of about 10 to 200 nm, a source electrode 8605, and a drain electrode 8606. In the 3-terminal element having the above-described structure, a state wherein a potential is applied as shown in FIG. 86A will be defined as a write state, and a state wherein a potential is applied as shown in FIG. 86B will be defined as a read state.

The substrate 8601 can be made of any one of a semiconductor, insulator, and conductive material such as a metal. When the substrate 8601 is made of an insulating material, the insulating layer 8602 can be omitted. When the substrate 8601 is made of a conductive material, the insulating layer 8602 and gate electrode 8603 can be omitted. In this case, the substrate 8601 made of the conductive material serves as a gate electrode. The gate electrode 8603, source electrode 8605, and drain electrode 8606 need only be made of a transition metal including noble metals such as platinum (Pt), ruthenium (Ru), gold (Au), and silver (Ag). The electrodes may be made of a compound such as a nitride, oxide, or fluoride of a transition metal, such as titanium nitride (TiN), hafnium nitride (HfN), strontium ruthenate ($SrRuO_2$), zinc oxide (ZnO), indium tin oxide (ITO), or lanthanum fluoride ($LaF_3$), or a composite film formed by stacking them.

A detailed example of the structure of the 3-terminal element shown in FIGS. 86A and 86B will be described. For example, the gate electrode 8603 is a ruthenium film having a thickness of 10 nm. The metal oxide layer 8604 is made of a metal oxide containing Bi and Ti and having a thickness of 40 nm. The source electrode 8605 and drain electrode 8606 are made of gold. The metal oxide layer 8604 have the same properties as those of the above-described ferroelectric layer 104, ferroelectric layer 3104, ferroelectric layer 4705, and metal oxide layer 6205, including the state of the layer, the electrical characteristics, and the viewpoint of electrical orientation. The interval between the source electrode 8605 and the drain electrode 8606 is, e.g., 1 mm. As described above, the structures of the substrate 8601 and insulating layer 8602 are not limited to those described above, and any other material can also be selected appropriately if it has no effect on the electrical characteristics.

The metal oxide layer 8604 included in the 3-terminal element according to the present invention will be described next in more detail. Like the above-described ferroelectric layer 104 or metal oxide layer 6205, the metal oxide layer 8604 is formed by dispersing a plurality of microcrystalline grains or fine particles of $Bi_4Ti_3O_{12}$ crystal with a grain size of about 3 to 15 nm in a base layer, i.e., a layer containing titanium in an excessive amount relative to the stoichiometric composition of $Bi_4Ti_3O_{12}$. The base layer may be $TiO_x$ with a bismuth content of almost 0. In other words, the base layer is made of a metal oxide which contains two metals and in which the content of one metal is smaller in comparison with the stoichiometric composition.

Figure 86C:
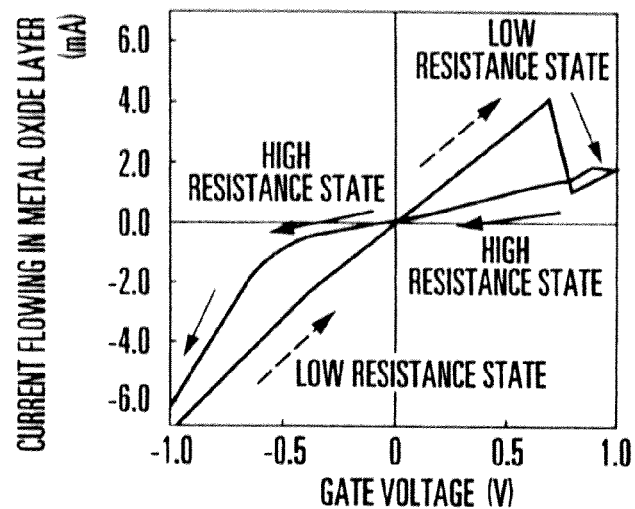

According to the 3-terminal element using the metal oxide layer 8604, two states (ON and OFF) can be held, as will be described below. The characteristics of the 3-terminal element shown in FIGS. 86A and 86B will be described. The characteristics were investigated by applying a voltage between the gate electrode 8603 and the source electrode 8605 and drain electrode 8606. When a voltage from a power supply was applied between the gate electrode 8603 and the source electrode 8605 and drain electrode 8606, and a current flowing from the gate electrode 8603 to the source electrode 8605 and drain electrode 8606 was measured by an ammeter, a result shown in FIG. 86C was obtained. Referring to FIG. 86C, the ordinate represents the value of a current whose positive direction is set to the direction from the gate electrode 8603 to the source electrode 8605 and drain electrode 8606.

FIG. 86C and the operation principle of the 3-terminal element of the present invention will be described below. The voltage values and current values to be described here are mere examples measured in an actual element. Hence, the phenomenon is not limited to the following numerical values. Other numerical values can also be measured depending on the material and thickness of each film actually used in the element and other conditions.

FIG. 86C shows the hysteresis characteristics of the values of currents which flow in the metal oxide layer 8604 when the voltage (gate voltage) applied to the gate electrode 8603 is decreased from 0 in the negative direction, returned to 0, increased in the positive direction, and finally returned to 0 again. When the gate voltage applied to the gate electrode 8603 is gradually decreased from 0 V in the negative direction, the negative current flowing in the metal oxide layer 8604 is relatively small (about −0.12 mA at −0.1 V).

When the voltage exceeds −0.4 V, the negative current value starts increasing. After the voltage is decreased up to about −1 V, the negative voltage is decreased. The negative current value decreases while keeping the state wherein a negative current having a larger absolute value than before flows. At this time, the current value is about −0.63 mA at −0.1 V. The resistance value is lower by about five times than the previous state, and the current readily flows. When the applied gate voltage is returned to 0, the current value also becomes 0.

Next, a positive gate voltage is applied to the gate electrode 8603. In this state, when the positive gate voltage is low, a relatively large positive current flows according to the previous hysteresis (about 0.63 mA at 0.1 V). When the positive gate voltage is applied up to about 0.7 V, the positive current suddenly decreases. Finally, the applied positive gate voltage is decreased from +1 V to 0 V, the positive current value also decreases while keeping the hardly current flowing state and returns to 0. At this time, the positive current is about 0.12 mA at 0.1 V.

The above-described hysteresis of the current flowing in the metal oxide layer 8604 can be regarded as being generated because the resistance value of the metal oxide layer 8604 changes depending on the gate voltage applied to the gate electrode 8603. When a negative gate voltage $V_{W1}$ with a predetermined magnitude or more is applied, the metal oxide layer 8604 changes to a "low resistance state" (ON state) wherein the current easily flows. When a positive gate voltage $V_{W0}$ with a predetermined magnitude is applied, the metal oxide layer 8604 changes to a "high resistance state" (OFF state) wherein the current hardly flows.

The metal oxide layer 8604 has the two stable states, i.e., low resistance state and high resistance state. The ON or OFF state remains unless the above-described positive or negative gate voltage with a predetermined magnitude or more is applied. The value of $V_{W0}$ described above is about +1 V. The value of $V_{W1}$ is about −1 V. The resistance ratio of the high resistance state to the low resistance state is about 10 to 100. When the above-described phenomenon that the resistance of the metal oxide layer 8604 is switched by the gate voltage is used, a nonvolatile functional element capable of a nondestructive read operation can be implemented by the 3-terminal element shown in FIGS. 86A and 86B.

A case wherein the 3-terminal element shown in FIGS. 86A and 86B is operated by using a DC voltage will be described next. First, a negative gate voltage equal to or higher than the low resistance transition voltage $V_{W1}$ is applied to change the metal oxide layer 8604 to the low resistance state. An ON state wherein a current readily flows between the source and drain is obtained. The ON state can be read out by measuring a current value $J_{R1}$ between the source and drain at a read voltage $V_R$. It is important to select, as the read voltage $V_R$, such a small value to obtain a sufficient resistance ratio and not to cause state transition (about 0.1 V in the above example). Hence, the read can be done many times without destroying the low resistance state, i.e., ON state.

On the other hand, when a positive gate voltage equal to or higher than the high resistance transition voltage $V_{W0}$ is applied, the metal oxide layer 8604 changes to the high resistance state, i.e., OFF state wherein a current hardly flows between the source and drain. The OFF state can also be read out by measuring a current value $J_{R0}$ between the source and drain at the read voltage $V_R$ ($J_{R1}/J_{R0} \approx 10$ to 100). When the electrodes are not energized, the metal oxide layer 8604 has nonvolatility to hold each state. Except in the write and read, no voltage need be applied. This element can also be used as a switching element to control the current.

Figure 87:
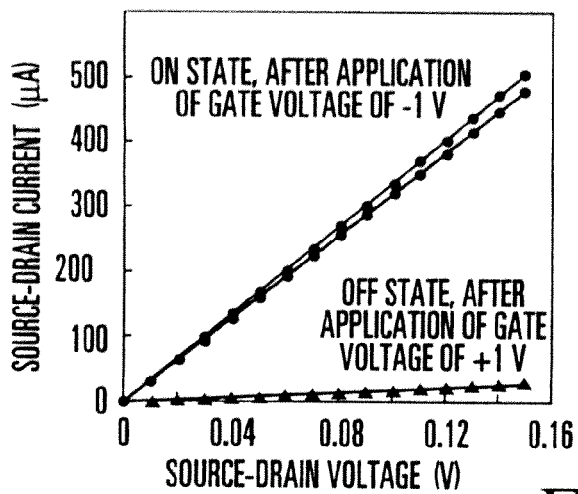
FIG. 87 is a graph showing a change in current which flows between a source electrode 8605 and a drain electrode 8606 when different gate voltages are applied through a gate electrode 8603.

A change in current (source-drain current) which flows between the source electrode 8605 and the drain electrode 8606 when different voltages are applied by the gate electrode 8603 will be described. As shown in FIG. 87, after a gate voltage of +1 V is applied to set the OFF state, the source-drain current rarely flows when the read voltage applied between the source and drain falls within the range of 0 to 0.15 V. On the other hand, when a gate voltage of −1 V is applied to set the ON state, and the read voltage applied between the source and drain is raised from 0 V to 0.15 V, the source-drain current flows in a larger amount almost in proportion to the increase in read voltage. In the ON state, a source-drain current of about 0.5 mA is measured at 0.15 V. As described above, according to the 3-terminal element shown in FIGS. 86A and 86B, the source-drain current can be controlled by the gate voltage.

Figure 88:
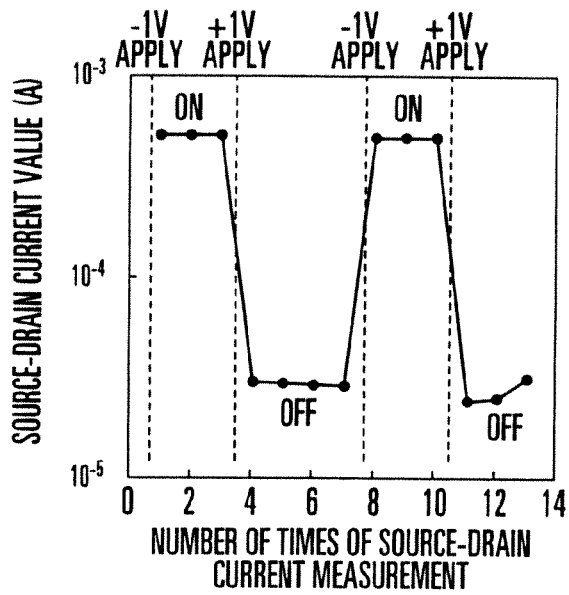
FIG. 88 is an explanatory view showing a change in each of ON and OFF states by a gate voltage.

When a positive or negative gate voltage is applied only once, the state changes to a corresponding ON or OFF state, and the state is maintained, as shown in FIG. 88. FIG. 88 shows a change in current flowing between the source and drain when a voltage of +1 V or −1 V is applied to the gate electrode 8603, and a read voltage of 0.15 V is then applied between the source electrode 8605 and the drain electrode 8606.

A case wherein the source electrode 8605 is set open, and in this state, a gate voltage is applied to set the ON or OFF state will be described. In this case, the gate voltage is applied between the gate electrode 8603 and the drain electrode 8606. The state is read out by applying a read voltage up to 0.2 V between the source electrode 8605 and the drain electrode 8606 and, in this state, measuring a current flowing between the source and drain.

Figure 89:
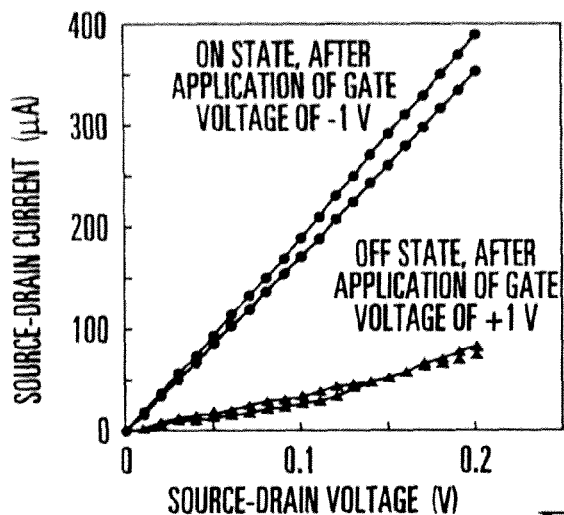
FIG. 89 is a graph showing the state of a current which flows when a gate voltage of +1 V is applied to set the OFF state, and then, a read voltage applied between the between the source and drain is raised from 0 V to 0.2 V.

As shown in FIG. 89, a gate voltage of +1 V is applied to set the OFF state. After that, the read voltage applied between the source and drain is increased from 0 V to 0.2 V. Then, a current to some extent flows between the source and drain. At a read voltage of 0.2 V, a current of about 0.1 mA flows between the source and drain. To the contrary, a gate voltage of −1 V is applied to set the ON state. After that, the read voltage applied between the source and drain is increased from 0 V to 0.2 V. Then, a larger source-drain current flows almost in proportion to the increase in read voltage. In the ON state, a source-drain current of about 0.4 mA is measured at a read voltage of 0.2 V. Hence, even when the source electrode 8605 is set open, and the gate voltage is applied in this state, the 3-terminal element shown in FIGS. 86A and 86B can perform the ON/OFF operation.

However, in the case wherein the source electrode 8605 is set open, and in this state, a gate voltage is applied to set the OFF state, when the read voltage is increased, a current to some extent flows between the source and drain, as described above. When the source electrode 8605 is set open, and the gate voltage is applied in this state, the applied voltage selectively acts depending on the region under the drain electrode 8606. The above-described result is supposed to be observed for this reason. As can be seen from this result, the source-drain current is supposed to flow through a path formed from the source electrode 8605, the metal oxide layer 8604 in the region under the source electrode 8605, the gate electrode 8603, the metal oxide layer 8604 in the region under the drain electrode 8606, and the drain electrode 8606.

As for the holding characteristic of the ON and OFF states in the 3-terminal element shown in FIGS. 86A and 86B, a holding time of at least 1,000 min is ensured, like the above-described element shown in FIG. 1. In the above description, the applied gate voltage is a DC voltage. However, the same effect can be obtained even by applying a pulse voltage having appropriate width and magnitude.

An example of a method of manufacturing the 3-terminal element shown in FIGS. 86A and 86B will be described next. A method of forming each thin film by using ECR plasma sputtering will be described below. However, the present invention is not limited to this, and any other film formation technique or method can be used, as a matter of course.

Figure 90A:
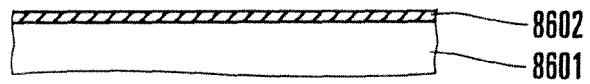
FIGS. 90A to 90D are views for explaining steps in manufacturing the 3-terminal element shown in FIGS. 86A and 86B.

As shown in FIG. 90A, the p-type silicon substrate 8601 having a plane orientation of (100) on the principal plane and a resistivity of 1 to 2 Ωcm is prepared. The surface of the substrate 8601 is cleaned by a solution mixture of sulfuric acid and a hydrogen peroxide solution, pure water, and a hydrogen fluoride solution and dried. The insulating layer 8602 is formed on the cleaned and dried substrate 8601. In forming the insulating layer 8602, e.g., an ECR sputtering apparatus and pure silicon (Si) as a target are used. The insulating layer 8602 in a metal mode by Si—O molecules is formed on the silicon substrate 8601 to a thickness to just cover its surface by ECR sputtering using argon (Ar) as a plasma gas and oxygen gas.

For example, Ar gas is supplied at a flow rate of 20 sccm into a plasma production chamber whose internal pressure is set on the order of $10^{-5}$ Pa. The internal pressure is set to about $10^{-3}$ to $10^{-2}$ Pa. A magnetic field of 0.0875 T and a microwave of 2.45 GHz (about 500 W) are supplied to set the electron cyclotron resonance condition, thereby producing Ar plasma in the plasma production chamber. Note that sccm is the unit of flow rate and indicates that a fluid at 0° C. and 1 atmospheric pressure flows 1 $cm^3$ in 1 min. T (tesla) is the unit of magnetic flux density, and 1 T=10,000 gauss.

The plasma produced by the above-described method is output from the plasma production chamber to the process chamber side by the divergent magnetic field of the magnetic coil. In addition, a high-frequency power of 13.56 MHz (e.g., 500 W) is supplied from a high-frequency power supply to the silicon target placed at the outlet of the plasma production chamber. When Ar ions collide against the silicon target, a sputtering phenomenon occurs to sputter Si particles. The Si particles sputtered from the silicon target reach the surface of the silicon substrate 8601 together with the plasma output from the plasma production chamber and the oxygen gas which is supplied and activated by the plasma and are oxidized to silicon dioxide by the activated oxygen. With the above process, the insulating layer 8602 made of silicon dioxide and having a thickness of, e.g., about 100 nm can be formed on the substrate 8601 (FIG. 90A).

The insulating layer 8602 ensures insulation to prevent a voltage from leaking to the substrate 8601 and influencing desired electrical characteristics when a voltage is applied between the electrodes to be formed later. For example, a silicon oxide film formed by oxidizing the surface of the silicon substrate by thermal oxidation may be used as the insulating layer 8602. The insulating layer 8602 may be made of any other insulating material except silicon oxide if the insulating properties can be ensured. The thickness of the insulating layer 8602 need not always be 100 nm and may be smaller or larger. In the above-described formation of the insulating layer 8602 by ECR sputtering, the substrate 8601 is not heated. However, the film may be formed while heating the substrate 8601.

Figure 90B:
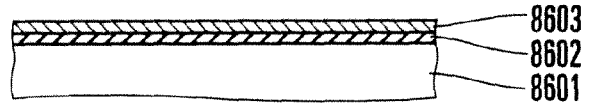

After the insulating layer 8602 is formed in the above-described manner, a ruthenium film is formed on the insulating layer 8602 by similar ECR sputtering using pure ruthenium (Ru) as a target, thereby forming the gate electrode 8603, as shown in FIG. 90B. Formation of the Ru film will be described in detail. In an ECR sputtering apparatus using a Ru target, for example, the silicon substrate with the insulating layer formed on it is heated to 400° C. Ar gas as a rare gas is supplied into the plasma production chamber at a flow rate of, e.g., 7 sccm. In addition, Xe gas is supplied at a flow rate of, e.g., 5 sccm to set the internal pressure of the plasma production chamber to on the order of, e.g., $10^{-2}$ to $10^{-3}$ Pa.

The magnetic field of the electron cyclotron resonance condition is given to the plasma production chamber. Then, a microwave of 2.45 GHz (about 500 W) is supplied into the plasma production chamber to produce ECR plasma of Ar and Xe in it. The produced ECR plasma is output from the plasma production chamber to the process chamber side by the divergent magnetic field of the magnetic coil. In addition, a high-frequency power of 13.56 MHz (e.g., 500 W) is supplied to the ruthenium target placed at the outlet of the plasma production chamber. The sputtering phenomenon occurs to sputter Ru particles from the ruthenium target. The Ru particles sputtered from the ruthenium target reach the surface of the insulating layer 8602 on the substrate 8601 and are deposited.

With the above process, the gate electrode 8603 having a thickness of, e.g., about 10 nm can be formed on the insulating layer 8602 (FIG. 90B). The gate electrode 8603 enables voltage application to the metal oxide layer 8604 when a voltage is applied between the source electrode 8605 and drain electrode 8606 to be formed later. The gate electrode 8603 may be made of any other material except ruthenium if the conductivity can be ensured. The gate electrode 8603 may be made of, e.g., platinum. A platinum film formed on silicon dioxide readily peels off, as is known. To prevent this, a layered structure is formed by inserting a titanium layer, titanium nitride layer, or ruthenium layer under the platinum layer. The thickness of the gate electrode 8603 need not always be 10 nm and may be smaller or larger.

As described above, in forming the Ru film by ECR sputtering, the substrate 8601 is heated to 400° C. However, the substrate need not always be heated. However, if the substrate is not heated, the adhesion of ruthenium to silicon dioxide becomes low, and the film may peel off. To prevent peeling, the film is formed preferably while heating the substrate.

Figure 90C:
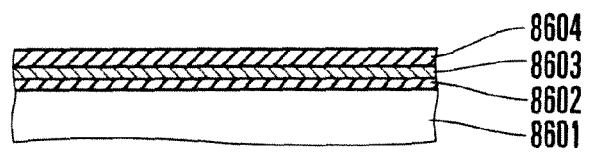

After the gate electrode 8603 is formed in the above-described manner, the metal oxide layer 8604 is formed on the gate electrode 8603 to a thickness to just cover its surface, as shown in FIG. 90C, by ECR sputtering using argon (Ar) as a plasma gas and oxygen gas and a target formed from an oxide sintered body (Bi—Ti—O) in which the ratio of Bi to Ti is 4:3.

Formation of the metal oxide layer 8604 will be described in detail. The substrate 8601 is heated to 300° C. to 700° C. Ar gas as a rare gas is supplied into the plasma production chamber at a flow rate of, e.g., 20 sccm to set the pressure on the order of, e.g., $10^{-3}$ to $10^{-2}$ Pa. In this state, the magnetic field of the electron cyclotron resonance condition is given to the plasma production chamber. Then, a microwave of 2.45 GHz (about 500 W) is supplied into the plasma production chamber to produce ECR plasma in it.

The produced ECR plasma is output from the plasma production chamber to the process chamber side by the divergent magnetic field of the magnetic coil. In addition, a high-frequency power of 13.56 MHz (e.g., 500 W) is supplied to the sintered body target placed at the outlet of the plasma production chamber. When Ar particles collide against the sintered body target, the sputtering phenomenon occurs to sputter Bi particles and Ti particles.

The Bi particles and Ti particles sputtered from the sintered body target reach the surface of the heated gate electrode 8603 together with the ECR plasma output from the plasma production chamber and the oxygen gas activated by the output ECR plasma and are oxidized by the activated oxygen. The oxygen ($O_2$) gas serving as a reactive gas is supplied at a flow rate of, e.g., 1 sccm separately from the Ar gas, as will be described later. Although the sintered body target contains oxygen, any shortage of oxygen in the deposited film can be prevented by supplying oxygen. With the above-described film formation by ECR sputtering, the metal oxide layer 8604 having a thickness of, e.g., about 40 nm can be formed (FIG. 90C).

The film quality may be improved by irradiating the formed metal oxide layer 8604 with ECR plasma of an inert gas and a reactive gas. As the reactive gas, not oxygen gas but nitrogen gas, fluorine gas, or hydrogen gas can be used. The film quality improvement can also be applied to formation of the insulating layer 8602. The metal oxide layer 8604 may be formed at a low substrate temperature of 300° C. or less and then annealed (heat-treated) in an appropriate gas atmosphere such as oxygen atmosphere to greatly improve the properties of the film.

Figure 90D:
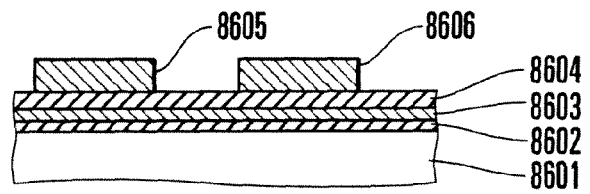

After the metal oxide layer 8604 is formed in the above-described way, the source electrode 8605 and drain electrode 8606 each made of Au and having a predetermined area are formed on the metal oxide layer 8604, as shown in FIG. 90D, thereby obtaining the 3-terminal element shown in FIGS. 86A and 86B. The source electrode 8605 and drain electrode 8606 can be formed by a well-known lift-off method and gold deposition by resistance heating vacuum deposition. The source electrode 8605 and drain electrode 8606 may be made of another metal material or conductive material such as Ru, Pt, or TiN. When Pt is used, the adhesion is poor, and the film may peel off. Hence, each electrode must be formed as an electrode with a predetermined area by using a structure such as Ti—Pt—Au that hardly peels off and executing a patterning process such as photolithography or lift-off on that structure.

The above-described layer formation by ECR sputtering is done by using an ECR sputtering apparatus shown in FIG. 89.

Figure 91:
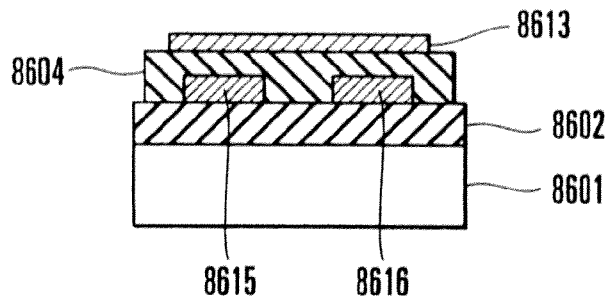
FIG. 91 is a schematic sectional view showing a structure example of another 3-terminal element according to an embodiment of the present invention.
Figure 92A:
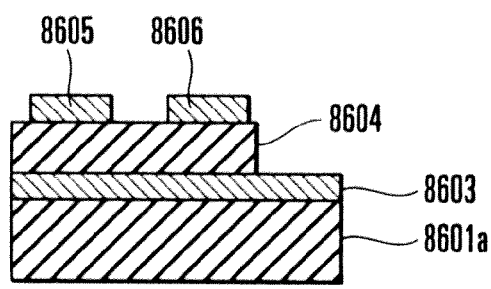
FIGS. 92A and 92B are schematic sectional views showing structure examples of still another 3-terminal element according to an embodiment of the present invention.
Figure 92B:
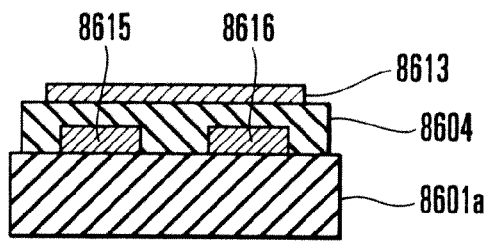

The 3-terminal element according to this embodiment is not limited to the structure example shown in FIGS. 86A and 86B. For example, as shown in FIG. 91, a source electrode 8615 and drain electrode 8616 may be formed on the insulating layer 8602 and covered with the metal oxide layer 8604, and a gate electrode 8613 may be formed on the metal oxide layer 8604. As shown in FIGS. 92A and 92B, an insulating substrate 8601a may be used, as a matter of course. In this case, the insulating layer 8602 can be omitted. Alternatively, the structure including the metal oxide layer 8604, source electrode 8605, and drain electrode 8606 shown in FIGS. 86A and 86B may be arranged on a conductive substrate. In this case, the substrate also serves as a gate electrode.

In the above-described example, the single-crystal silicon substrate 8601 is used. However, an insulating substrate made of glass or quartz may be used. With this structure, the present invention can be applied to, e.g. a glass substrate easy to process. The metal oxide layer 8604 which has a refractive index of about 2.6 measured at a wavelength of 632.8 nm is optically transparent. For this reason, when a transparent substrate is used, the 3-terminal element of this embodiment can be applied to a display. When the metal oxide layer 8604 is formed so thick in the range of 10 to 200 nm that an interference color is generated, the visual effect of a colored state can be obtained.

As the metal oxide layer becomes thick, the current flows more hardly, and the resistance increases. When a 3-terminal element is implemented by using a change in resistance value, the resistance value of in each of the low resistance state and high resistance state is important. For example, when the metal oxide layer becomes thick, the resistance value in the low resistance state increases. Since it is difficult to ensure a high S/N ratio, the ON or OFF state is hard to determine. On the other hand, when the metal oxide layer becomes thin, and the leakage current is dominant, the ON or OFF state can hardly be held, and the resistance value in the high resistance state decreases. It is therefore difficult to ensure a high S/N ratio.

Hence, the metal oxide layer preferably has an optimum thickness. For example, when the problem of leakage current is taken into consideration, the metal oxide layer need only have a thickness of at least 10 nm. When the resistance value in the low resistance state is taken into consideration, the metal oxide layer is preferably thinner than 300 nm. In experiments conducted by the present inventors, the operation of the 3-terminal element was confirmed when the thickness of the metal oxide layer was 30 to 200 nm.

Figure 93A:
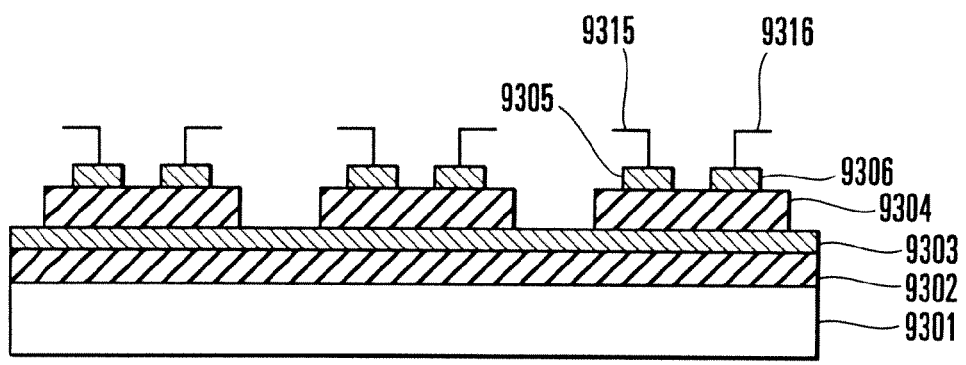
FIGS. 93A and 93B are schematic sectional views showing structure examples of still another 3-terminal element according to an embodiment of the present invention.
Figure 93B:
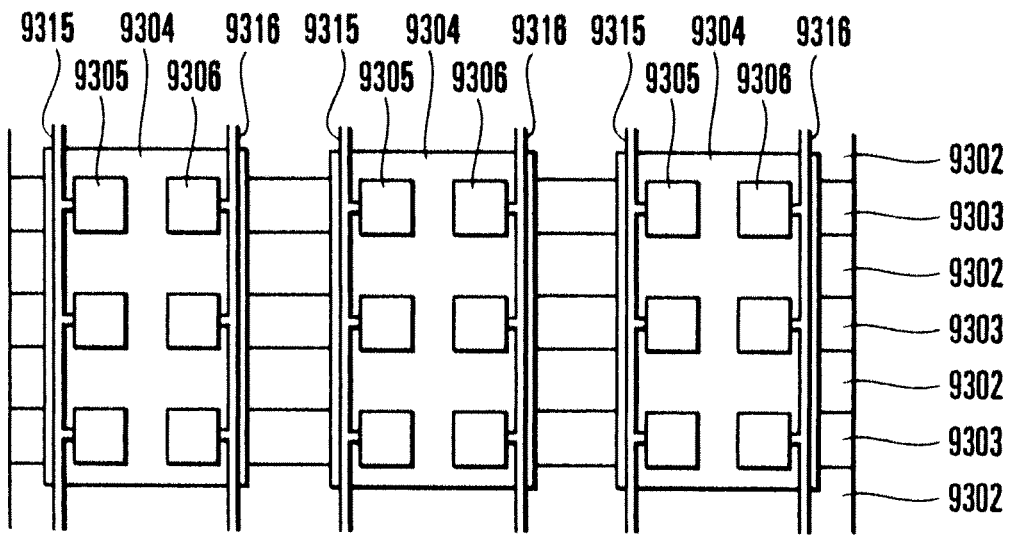

In the above description, one metal oxide element has been exemplified. However, a plurality of 3-terminal elements may be arrayed and integrated in a cross-point pattern, as will be described later. In the example shown in the sectional view of FIG. 93A and the plan view of FIG. 93B, word lines 9303 serving as gate electrodes are arranged on an insulating layer 9302 on a substrate 9301. Island-shaped metal oxide layers 9304 arrayed at a predetermined interval are arranged on the word lines 9303. A plurality of source electrodes 9305 and drain electrodes 9306 are arrayed on each metal oxide layer 9304. In addition, plate lines 9315 are commonly connected to the source electrodes 9305 arrayed in a direction perpendicular to the word lines 9303. Bit lines 9316 are commonly connected to the arrayed drain electrodes 9306. As described above, the 3-terminal elements according to this embodiment can be integrated. In FIGS. 93A and 93B, the metal oxide layers 9304 are spaced apart from each other to reduce interference between the plate lines or bit lines. However, the present invention is not limited to this. An integrated metal oxide layer may be formed.

Figure 94:
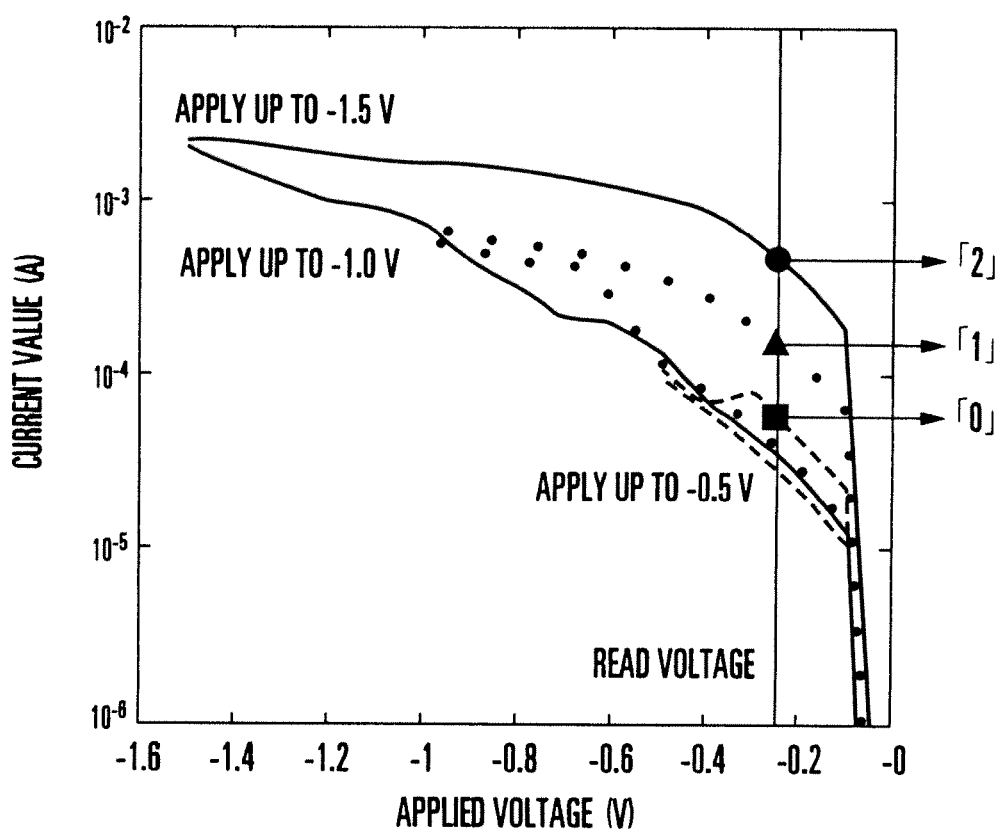
FIG. 94 is a graph showing the current-voltage characteristic of a metal oxide layer 8604 when a DC gate voltage is applied to the gate electrode 8603.

According to the 3-terminal element shown in FIGS. 86A and 86B, a multilevel operation is also possible. For example, in the current-voltage characteristic of the metal oxide layer 8604 when a DC gate voltage is applied to the gate electrode 8603, when the applied gate voltage is changed, the low resistance state changes to a different low resistance state, as shown in FIG. 94. In FIG. 94, the current value at the read voltage shown in FIG. 94 changes between the low resistance state after a voltage up to −0.5 V is applied, the low resistance state after a voltage up to −1.0 V is applied, and the low resistance state after a voltage up to −1.5 V is applied. These states can be read out by applying a read voltage between the source and drain and measuring a current flowing between the source and drain. Three states (three values) "0", "1", and "2" can be implemented in correspondence with the source-drain currents obtained by a predetermined read voltage.

According to the element shown in FIGS. 86A and 86B, a multilevel state can be implemented by the difference in pulse voltage value. As shown in FIG. 95, every time a predetermined pulse voltage with a predetermined pulse width is applied a predetermined number of times, the current value between the source and drain is read out at a read voltage of 0.2 V at a point indicated by a triangle. Then, as shown in FIG. 96, three states (three values) "0", "1", and "2" are obtained. In this example, the memory is reset by the state "2".

Figure 97B:
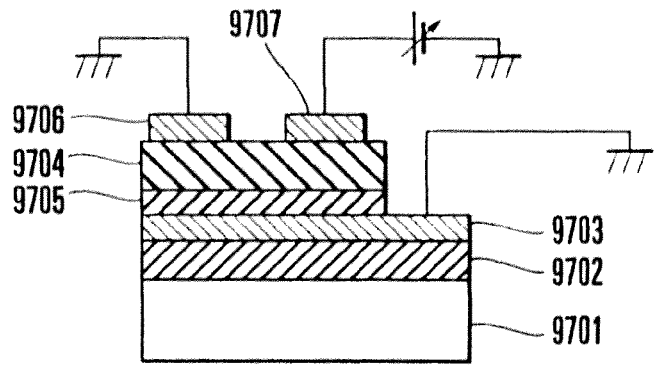

Still another embodiment of the present invention will be described below with reference to the accompanying drawings. FIGS. 97A and 97B are schematic sectional views schematically showing a structure example of a 3-terminal element according to another embodiment of the present invention. The 3-terminal element shown in FIGS. 97A and 97B comprises, on a substrate 9701 made of, e.g., single-crystal silicon, an insulating layer 9702, a gate electrode 9703, a metal oxide layer 9704 containing Bi, Ti, and O and having a thickness of about 30 to 200 nm, a source electrode 9706, a drain electrode 9707. In addition, an insulating layer 9705 is provided between the gate electrode 9703 and the metal oxide layer 9704. In the 3-terminal element having the above-described structure, a state wherein a potential is applied as shown in FIG. 97A will be defined as a write state, and a state wherein a potential is applied as shown in FIG. 97B will be defined as a read state.

The substrate 9701 can be made of any one of a semiconductor, insulator, and conductive material such as a metal. When the substrate 9701 is made of an insulating material, the insulating layer 9702 can be omitted. When the substrate 9701 is made of a conductive material, the insulating layer 9702 and gate electrode 9703 can be omitted. In this case, the substrate 9701 made of the conductive material serves as a gate electrode. The gate electrode 9703, source electrode 9706, and drain electrode 9707 need only be made of a transition metal including noble metals such as platinum (Pt), ruthenium (Ru), gold (Au), silver (Ag), and titanium (Ti). The electrodes may be made of a compound such as a nitride, oxide, or fluoride of a transition metal, such as titanium nitride (TiN), hafnium nitride (HfN), strontium ruthenate (SrRuO$_2$), zinc oxide (ZnO), indium tin oxide (ITO), or lanthanum fluoride (LaF$_3$), or a composite film formed by stacking them.

The insulating layer 9705 need only be made of silicon dioxide, silicon oxynitride, alumina, an oxide such as LiNbO$_3$ containing a light metal such as lithium, beryllium, magnesium, or calcium, or a fluoride such as LiCaAlF$_6$, LiSrAlF$_6$, LiYF$_4$, LiLuF$_4$, or KMgF$_3$. Alternatively, the insulating layer 9705 need only be made of an oxide or nitride of a transition metal such as scandium, titanium, strontium, yttrium, zirconium, hafnium, tantalum, or lanthanum series, a silicate (ternary compound of a metal, silicon, and oxygen) containing the above-described elements, an aluminate (ternary compound of a metal, aluminum, and oxygen) containing these elements, or an oxide or nitride containing at least two of the above elements.

Like the above-described ferroelectric layer 104 and the like, the metal oxide layer 9704 is formed by dispersing a plurality of microcrystalline grains and fine particles including a Bi$_4$Ti$_3$O$_{12}$ crystal and a part excessively containing bismuth and having a grain size of about 3 to 15 nm in a base layer, i.e., a layer containing titanium in an excessive amount relative to the stoichiometric composition of Bi$_4$Ti$_3$O$_{12}$. This is confirmed by observation using a transmission electron microscope. The base layer may be TiO$_x$ with a bismuth content of almost 0. In other words, the base layer is made of a metal oxide which contains two metals and in which the content of one metal is smaller in comparison with the stoichiometric composition.

A detailed example of the 3-terminal element shown in FIGS. 97A and 97B will be described. For example, the gate electrode 9703 is a ruthenium film having a thickness of 10 nm. The metal oxide layer 9704 is made of a metal oxide with the above-described composition and has a thickness of 40 nm. The insulating layer 9705 is a multilayered film made of tantalum pentoxide and silicon dioxide and having a thickness of 5 nm. The source electrode 9706 and drain electrode 9707 are made of gold. The source electrode 9706 and drain electrode 9707 may have a multilayered structure formed by stacking a titanium layer, titanium nitride layer, and gold layer in this order sequentially from the side of the metal oxide layer 9704. When the contact surface to the metal oxide layer 9704 is formed from a titanium layer, the adhesion can be increased. The interval between the source electrode 9706 and the drain electrode 9707 is, e.g., 1 mm. As described above, the structures of the substrate 9701 and insulating layer 9702 are not limited to those described above, and any other material can also be selected appropriately if it has no effect on the electrical characteristics.

A detailed method of forming the above-described insulating layer 9702, gate electrode 9703, insulating layer 9705, metal oxide layer 9704, source electrode 9706, and drain electrode 9707 will be described later. They can be formed by sputtering a metal target or sintered target in ECR plasma made of argon gas, oxygen gas, or nitrogen gas by using an ECR sputtering apparatus shown in FIG. 5.

Figure 98A:
FIGS. 98A to 98E are views for explaining steps in manufacturing the 3-terminal element shown in FIGS. 97A and 97B.

An example of a method of manufacturing the 3-terminal element shown in FIGS. 97A and 97B will be described next with reference to FIG. 98. As shown in FIG. 98A, the p-type silicon substrate 9701 having a plane orientation of (100) on the principal plane and a resistivity of 1 to 2 Ωcm is prepared. The surface of the substrate 9701 is cleaned by a solution mixture of sulfuric acid and a hydrogen peroxide solution, pure water, and a hydrogen fluoride solution and dried. The insulating layer 9702 is formed on the cleaned and dried substrate 9701. In forming the insulating layer 9702, the above-described ECR sputtering apparatus and pure silicon (Si) as a target are used. The insulating layer 9702 in a metal mode by Si—O molecules is formed on the silicon substrate 9701 to a thickness to just cover its surface by ECR sputtering using argon (Ar) as a plasma gas and oxygen gas.

For example, Ar gas is supplied at a flow rate of 20 sccm into a plasma production chamber whose internal pressure is set on the order of $10^{-5}$ Pa. The internal pressure is set to about $10^{-3}$ to $10^{-2}$ Pa. A magnetic field of 0.0875 T and a microwave of 2.45 GHz (about 500 W) are supplied to set the electron cyclotron resonance condition, thereby producing Ar plasma in the plasma production chamber. Note that sccm is the unit of flow rate and indicates that a fluid at 0° C. and 1 atmospheric pressure flows 1 cm$^3$ in 1 min.

The plasma produced by the above-described method is output from the plasma production chamber to the process chamber side by the divergent magnetic field of the magnetic coil. In addition, a high-frequency power of 13.56 MHz (e.g., 500 W) is supplied from a high-frequency power supply to the silicon target placed at the outlet of the plasma production chamber. When Ar ions collide against the silicon target, a sputtering phenomenon occurs to sputter Si particles. The Si particles sputtered from the silicon target reach the surface of the silicon substrate 9701 together with the plasma output from the plasma production chamber and the oxygen gas which is supplied and activated by the plasma and are oxidized to silicon dioxide by the activated oxygen. With the above process, the insulating layer 9702 made of silicon dioxide and having a thickness of, e.g., about 100 nm can be formed on the substrate 9701 (FIG. 98A).

The insulating layer 9702 ensures insulation to prevent a voltage from leaking to the substrate 9701 and influencing desired electrical characteristics when a voltage is applied between the electrodes to be formed later. For example, a silicon oxide film formed by oxidizing the surface of the silicon substrate by thermal oxidation may be used as the insulating layer 9702. The insulating layer 9702 may be made of any other insulating material except silicon oxide if the insulating properties can be ensured. The thickness of the insulating layer 9702 need not always be 100 nm and may be smaller or larger. In the above-described formation of the insulating layer 9702 by ECR sputtering, the substrate 9701 is not heated. However, the film may be formed while heating the substrate 9701.

Figure 98B:
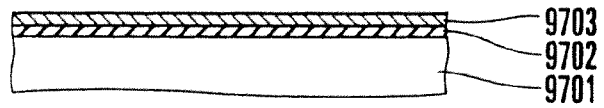

After the insulating layer 9702 is formed in the above-described manner, a ruthenium film is formed on the insulating layer 9702 by similar ECR sputtering using pure ruthenium (Ru) as a target, thereby forming the gate electrode 9703, as shown in FIG. 98B. Formation of the Ru film will be described in detail. In an ECR sputtering apparatus using a Ru target, for example, the silicon substrate with the insulating layer formed on it is heated to 400° C. Ar gas as a rare gas is supplied into the plasma production chamber at a flow rate of, e.g., 7 sccm. In addition, Xe gas is supplied at a flow rate of, e.g., 5 sccm to set the internal pressure of the plasma production chamber to on the order of, e.g., $10^{-2}$ to $10^{-3}$ Pa.

The magnetic field of the electron cyclotron resonance condition is given to the plasma production chamber. Then, a microwave of 2.45 GHz (about 500 W) is supplied into the plasma production chamber to produce ECR plasma of Ar and Xe in it. The produced ECR plasma is output from the plasma production chamber to the process chamber side by the divergent magnetic field of the magnetic coil. In addition, a high-frequency power of 13.56 MHz (e.g., 500 W) is supplied to the ruthenium target placed at the outlet of the plasma production chamber. The sputtering phenomenon occurs to sputter Ru particles from the ruthenium target. The Ru particles sputtered from the ruthenium target reach the surface of the insulating layer 9702 on the substrate 9701 and are deposited.

With the above process, the gate electrode 9703 having a thickness of, e.g., about 10 nm can be formed on the insulating layer 9702 (FIG. 98B). The gate electrode 9703 enables voltage application to the metal oxide layer 9704 when a voltage is applied between the gate electrode 9703 and the source electrode 9706 and drain electrode 9707 to be formed later. The gate electrode 9703 may be made of any other material except ruthenium if the conductivity can be ensured. The gate electrode 9703 may be made of, e.g., platinum. A platinum film formed on silicon dioxide readily peels off, as is known. To prevent this, a layered structure is formed by inserting a titanium layer, titanium nitride layer, or ruthenium layer under the platinum layer. The thickness of the gate electrode 9703 need not always be 10 nm and may be smaller or larger.

As described above, in forming the Ru film by ECR sputtering, the substrate 9701 is heated to 400° C. However, the substrate need not always be heated. However, if the substrate is not heated, the adhesion of ruthenium to silicon dioxide becomes low, and the film may peel off. To prevent peeling, the film is formed preferably while heating the substrate.

Figure 98C:
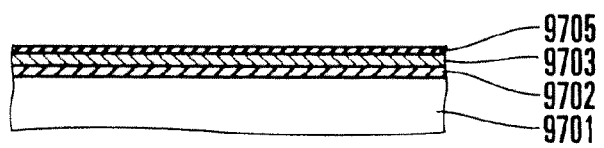

After the gate electrode 9703 is formed in the above-described manner, the substrate 9701 is unloaded from the apparatus to the atmosphere. The substrate 9701 is fixed on the substrate holder of the same ECR sputtering apparatus as in FIG. 5 in which pure tantalum (Ta) is used as the target. The insulating layer 9705 is formed on the gate electrode 9703 to a thickness to just cover its surface, as shown in FIG. 98C, by ECR sputtering using argon (Ar) as a plasma gas and oxygen gas. A metal mode film by Ta—O molecules is formed as the insulating layer 9705, as will be described below.

Formation of a metal mode film by Ta—O molecules will be described in detail. In the ECR sputtering apparatus shown in FIG. 5 in which the target made of tantalum is used, Ar gas as a rare gas is supplied at a flow rate of, e.g., 25 sccm from the inert gas supply unit into the plasma production chamber to set its internal pressure on the order of, e.g., $10^{-3}$ Pa. A coil current of, e.g., 28 A is supplied to the magnetic coil to give the magnetic field of the electron cyclotron resonance condition to the plasma production chamber.

A microwave of, e.g., 2.45 GHz (e.g., 500 W) is supplied from the microwave generation unit (not shown) into the plasma production chamber through the waveguide, quartz window, and vacuum waveguide. With this supply of the microwave, Ar plasma is produced in the plasma production chamber. The produced plasma is output from the plasma production chamber to the side of the process chamber by the divergent magnetic field of the magnetic coil. In addition, a high-frequency power (e.g., 500 W) is supplied from the high-frequency electrode supply unit to the target placed at the outlet of the plasma production chamber.

When Ar particles collide against the target, a sputtering phenomenon occurs to sputter Ta particles from the target. The Ta particles sputtered from the target reach the surface of the gate electrode 9703 on the substrate 9701 together with the plasma output from the plasma production chamber and the oxygen gas which is supplied from the reactive gas supply unit and activated by the plasma and are oxidized to tantalum pentoxide by the activated oxygen.

With the above process, a tantalum pentoxide film is formed on the gate electrode 9703. Subsequently, a silicon dioxide film is formed on the tantalum pentoxide film by ECR sputtering using the target made of pure silicon, like silicon dioxide deposition described with reference to FIG. 98A. The above-described formation of a tantalum pentoxide film and silicon dioxide film is repeated to form a multilayered film including the tantalum pentoxide films and silicon dioxide films to, e.g., about 5 nm, thereby obtaining the insulating layer 9705 (FIG. 98C).

The insulating layer 9705 including the tantalum pentoxide films and silicon dioxide films is used to control the voltage to be applied to the ferroelectric film upon voltage application to the metal oxide layer 9704. The insulating layer 9705 may have any other structure except the multilayered structure of tantalum pentoxide films and silicon dioxide films if it can control the voltage applied to the metal oxide layer 9704. The insulating layer 9705 may be a single layer. The thickness is not limited to 5 nm, either. In the above-described ECR sputtering, the substrate 9701 is not heated but may be heated.

Figure 98D:
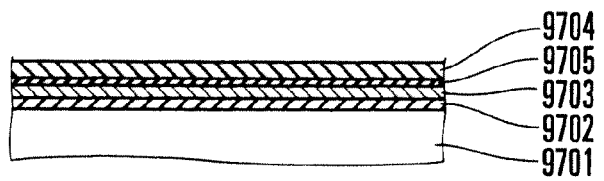

After the insulating layer 9705 is formed in the above-described manner, the metal oxide layer 9704 is formed on the insulating layer 9705 to a thickness to just cover its surface, as shown in FIG. 98D, by ECR sputtering using argon (Ar) as a plasma gas and oxygen gas and a target formed from an oxide sintered body (Bi—Ti—O) in which the ratio of Bi to Ti is 4:3.

Formation of the metal oxide layer 9704 will be described in detail. The substrate 9701 is heated to 300° C. to 700° C. Ar gas as a rare gas is supplied into the plasma production chamber at a flow rate of, e.g., 20 sccm to set the pressure on the order of, e.g., $10^{-3}$ to $10^{-2}$ Pa. In this state, the magnetic field of the electron cyclotron resonance condition is given to the plasma production chamber. Then, a microwave of 2.45 GHz (about 500 W) is supplied into the plasma production chamber to produce ECR plasma in it.

The produced ECR plasma is output from the plasma production chamber to the process chamber side by the divergent magnetic field of the magnetic coil. In addition, a high-frequency power of 13.56 MHz (e.g., 500 W) is supplied to the sintered body target placed at the outlet of the plasma production chamber. When Ar particles collide against the sintered body target, the sputtering phenomenon occurs to sputter Bi particles and Ti particles.

The Bi particles and Ti particles sputtered from the sintered body target reach the surface of the heated insulating layer 9705 together with the ECR plasma output from the plasma production chamber and the oxygen gas activated by the output ECR plasma and are oxidized by the activated oxygen. The oxygen ($O_2$) gas serving as a reactive gas is supplied at a flow rate of, e.g., 1 sccm separately from the Ar gas, as will be described later. Although the sintered body target contains oxygen, any shortage of oxygen in the deposited film can be prevented by supplying oxygen. With the above-described film formation by ECR sputtering, the metal oxide layer 9704 having a thickness of, e.g., about 40 nm can be formed (FIG. 98D).

The film quality may be improved by irradiating the formed metal oxide layer 9704 with ECR plasma of an inert gas and a reactive gas. As the reactive gas, not oxygen gas but nitrogen gas, fluorine gas, or hydrogen gas can be used. The film quality improvement can also be applied to formation of the insulating layer 9702. The metal oxide layer 9704 may be formed at a low substrate temperature of 300° C. or less and then annealed (heat-treated) in an appropriate gas atmosphere such as oxygen atmosphere to greatly improve the properties of the film.

Figure 98E:
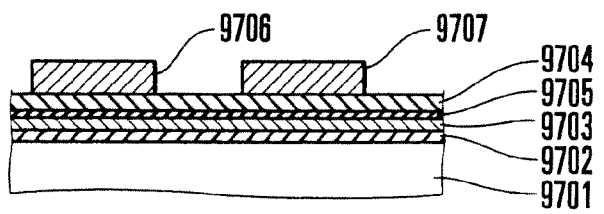

The source electrode 9706 and drain electrode 9707 each made of Au and having a predetermined area are formed on the metal oxide layer 9704, as shown in FIG. 98E, thereby obtaining the 3-terminal element shown in FIGS. 97A and 97B. The source electrode 9706 and drain electrode 9707 can be formed by a well-known lift-off method and gold deposition by resistance heating vacuum deposition. The source electrode 9706 and drain electrode 9707 may be made of another metal material or conductive material such as Ru, Pt, or TiN. When Pt is used, the adhesion is poor, and the film may peel off. Hence, each electrode must be formed as an electrode with a predetermined area by using a structure such as Ti—Pt—Au that hardly peels off and executing a patterning process such as photolithography or lift-off on that structure.

The characteristics of the 3-terminal element shown in FIGS. 97A and 97B will be described next. The characteristics were investigated by applying a voltage between the gate electrode 9703 and the drain electrode 9707 (source electrode 9706). When a voltage from a power supply was applied between the gate electrode 9703 and the drain electrode 9707, and a current flowing when the voltage was applied was measured by an ammeter, a result shown in FIG. 33 was obtained. As described above, in FIG. 33, the ordinate represents the current density obtained by dividing the current value by the area. FIG. 33 and the memory operation principle of the present invention will be described below. The voltage values and current values to be described here are mere examples measured in an actual element. Hence, the phenomenon is not limited to the following numerical values. Other numerical values can also be measured depending on the material and thickness of each film actually used in the element and other conditions.

When a negative voltage is applied to the gate electrode 9703, the flowing current is very small up to −0.8 V, as indicated by (1) in FIG. 33. However, as indicated by (2), when the voltage exceeds −0.8 V, a negative current flows abruptly. Actually, a current larger than −15 µA also flows. However, since flowing of a larger current is inhibited to protect the measurement device, the current is not measured. In the range from 0 V to −0.8 V indicated by (1), a high resistance state is held (maintained) by inhibiting flowing of a large current as indicated by (2).

When a negative voltage is applied again to the gate electrode 9703, a locus to flow a negative current of −10 µA or more is obtained at −0.5 V, as indicated by (3). When the negative voltage is further applied to the gate electrode 9703, a current of −10 µA or more flows at about −0.5 V, as indicated by (3). When a positive voltage is applied to the gate electrode 9703, a positive current flows up to about 0.2 V, as indicated by (4). The current increases to 3 µA at maximum. When the absolute value of the voltage is decreased, the current traces a locus indicated by (4).

When the positive voltage is applied up to 0.2 V again, the current traces the locus indicated by (4). After that, as indicated by (5), the value of the flowing current decreases, and no positive current flows. When the positive voltage is further applied to the gate electrode 9703, a locus to rarely flow a current is obtained, as indicated by (6). Even when the absolute value of the voltage is decreased then, the current rarely flows, as indicated by (6). When a negative voltage is applied to the gate electrode 9703, the current rarely flows up to about 0 to −0.8 V, as indicated by (1). Hence, the high resistance state wherein no current flows as in (1) is maintained unless a voltage of −0.8 V or more is applied to the gate electrode 9703 to prevent any sudden current flow as in (2). The state (1) will be referred to as a "negative high resistance mode".

For example, as indicated by (2), when a voltage of −0.8 V or more is applied to the gate electrode 9703 to abruptly flow a current, a low resistance state in which the current readily flows is obtained, as indicated by (3). This state is also maintained while a negative voltage is applied to the gate electrode 9703. The state (3) will be referred to as a "negative low resistance mode".

However, when a positive voltage is applied to the gate electrode 9703, a low resistance state in which the current flows in a positive voltage range from 0 to 0.2 V is obtained, as indicated by (4). This state is also maintained while a positive voltage in the range of 0 to 0.2 V is applied to the gate electrode 9703. The state (4) will be referred to as a "positive low resistance mode".

When a positive voltage of 0.2 V or more is applied to the gate electrode 9703, no current flows, and the state changes to a high resistance state, as indicated by (5). In this state, the state wherein the current value has a high resistance is maintained while a positive voltage in the range of 0 to 2 V is applied to the gate electrode 9703, as indicated by (6). The state (6) will be referred to as a "positive high resistance mode".

As described above, the element using the metal oxide layer 9704 apparently has four stable modes: "positive high resistance mode", "positive low resistance mode", "negative high resistance mode", and "negative low resistance mode". More specifically, the "positive high resistance mode" and "negative high resistance mode" are "high resistance modes" which exhibit the same high resistance state. The "positive low resistance mode" and "negative low resistance mode" are "low resistance modes" which exhibit the same low resistance state. That is, two modes are present. In the state of the "high resistance mode", the "high resistance mode" is maintained in the voltage range of −0.8 V to +0.8 V. When a voltage of −0.8 V or more is applied to change the state to the "low resistance mode", the "low resistance mode" is maintained in the voltage range of −0.5 V to +2.0 V. Switching between the two, "high resistance mode" and "low resistance mode" occurs. This also applied to the negative resistance modes, i.e., "negative high resistance mode" and "negative low resistance mode".

As for the actual current value in each "negative mode" when a voltage of −0.5 V is applied, the current value in the "negative high resistance mode" is $-5\times10^{-8}$ A, and that in the "negative low resistance mode" is $-1\times10^{-5}$ A. The ratio is as high as 200 times. This facilitates each mode identification. The present inventors estimate that the above-described phenomenon occurs when the resistance value of the metal oxide layer 9704 dramatically changes depending on the direction and magnitude of the applied voltage.

Since the insulating layer 9705 is provided between the metal oxide layer 9704 and the gate electrode 9703, carriers can be controlled by the band structure of the insulating layer 9705. More specifically, for example, tantalum pentoxide has a band gap of about 4.5 eV. The energy difference viewed from the Fermi level is about 1.2 eV in the conduction band and 2.3 eV in the valence band. That is, the barrier is higher on the valence band side. Hence, the barrier effect is high for holes in the valence band but low for electrons in the conduction band. For further information, see Wilk et al., "J. Appl. Phys.", No. 87, p. 484 (2000).

From the above-described characteristic, when, e.g., a tantalum pentoxide film is used as the insulating layer between the electrode and the metal oxide layer, a phenomenon that electrons readily flow but holes hardly flow can be expected. Actually, as shown in FIG. 33, the value of the flowing current largely changes between a case wherein a positive voltage is applied from the drain electrode 9707 to the gate electrode 9703 and a case wherein a negative voltage is applied. In discriminating the state of the metal oxide layer 9704, this has a large effect to increase the signal-to-noise ratio (S/N ratio) and facilitate data discrimination. This is the effect of use of the insulating layer 9705.

It was found that when the above-described "low resistance mode" and "high resistance mode" shown in FIG. 33 are applied as a memory operation, the element shown in FIGS. 97A and 97B can be used as a nonvolatile nondestructive 3-terminal element. More specifically, the OFF state wherein the current between the source and drain hardly flows is set by applying a positive voltage to the gate electrode 9703 and a negative voltage to the drain electrode 9707 to change the mode from the "low resistance mode" to the "high resistance mode", as indicated by (4) or (5) in FIG. 33.

The shift to the ON state wherein the current between the source and drain readily flows is done by applying a negative voltage to the gate electrode 9703 and a positive voltage of 1.1 V or more to the drain electrode 9707 to abruptly flow the current, as indicated by (2) in FIG. 33. With this operation, the mode is changed from the "high resistance mode" to the "low resistance mode", and the ON state is obtained. As described above, when a voltage is applied to the gate electrode 9703 (drain electrode 9707) to set the "high resistance mode" or "low resistance mode", switching between the OFF state and the ON state can be done.

The ON/OFF state between the source and drain controlled in the above-described way can easily be recognized by reading a current value when an appropriate voltage of 0 to 1.0 V is applied between the source and drain. For example, when the mode state of the 3-terminal element shown in FIGS. 97A and 97B is "off", i.e., "high resistance mode", it can be determined because a current hardly flows when an appropriate voltage of 0 to 1.0 V is applied, as indicated by (1) in FIG. 33.

When the mode state of the element shown in FIGS. 97A and 97B is "on", i.e., "low resistance mode", it can be determined because a current abruptly flows between the source and drain when an appropriate voltage of 0 to 0.8 V is applied, as indicated by (2) in FIG. 33. Since the difference in current value between the "positive high resistance mode" and the "positive low resistance mode", i.e., "off" and "on" is 5,000 times or more, "off" and "on" can easily be determined. Even in the negative voltage range, "off" and "on" can be determined in the voltage range of 0 to −0.2 V.

The above-described ON/OFF state of the 3-terminal element can easily be identified only by checking whether the element shown in FIGS. 97A and 97B is in the "high resistance mode" or "low resistance mode". In other words, while the 3-terminal element shown in FIGS. 97A and 97B can hold the two modes, data is held. Even when a voltage is applied to the electrode to check the mode, the held mode does not change, and data is not destroyed. Hence, according to the 3-terminal element shown in FIGS. 97A and 97B, a nondestructive operation is possible. The 3-terminal element shown in FIGS. 97A and 97B functions as a 3-terminal element to control ON/OFF between the source and drain since the resistance value of the metal oxide layer 9704 changes depending on the voltage applied between the gate electrode 9703 and the drain electrode 9707 (or source electrode 9706). This element can also be used as an element to control the current.

Even when the source electrode 9706 is set open, the ON state and OFF state can be controlled by applying a gate voltage. In the case wherein the source electrode 9706 is set open, when the read voltage is increased, a current to some extent flows between the source and drain even when a gate voltage is applied to set the OFF state. When the source electrode 9706 is set open, and the gate voltage is applied in this state, the applied voltage selectively acts depending on the region under the drain electrode 9707. As described above, a certain source-drain current is supposed to flow when the read voltage is high. Hence, the source-drain current is supposed to flow through a path formed from the source electrode 9706, the metal oxide layer 9704 in the region under the source electrode 9706, the gate electrode 9703, the metal oxide layer 9704 in the region under the drain electrode 9707, and the drain electrode 9707.

The voltage to operate the 3-terminal element shown in FIGS. 97A and 97B is maximized when a gate voltage to set the "positive low resistance mode" is applied. However, the voltage is about 1.1 V, and the power consumption is very low, as shown in FIG. 33. The low power consumption is very advantageous for devices. Devices using a 3-terminal element, e.g., not only mobile communication devices, digital general-purpose devices, digital image sensing devices, notebook personal computers, and PDAs (Personal Digital Appliances) but also all computers, personal computers, workstations, office computers, mainframes, communication units, and multifunction apparatuses can reduce the power consumption.

FIG. 34 shows the time of holding the ON or OFF state in the 3-terminal element shown in FIGS. 97A and 97B. After a negative voltage is applied from the drain electrode 9707 to the gate electrode 9703 to set the "negative high resistance state" shown in FIG. 33, i.e., "high resistance mode", a voltage of 1.1 V or more is applied from the drain electrode 9707 to the gate electrode 9703 to set the "positive low resistance state" ("low resistance mode"), i.e., ON state. A voltage of +0.5 V is applied from the drain electrode 9707 to the gate electrode 9703 every predetermined time, and the value of a current flowing between the source and drain after voltage application is measured. FIG. 34 shows the observation result.

The measured current is maximized about 10 min after and then moderately decreases up to 1,000 min. However, since the current value at this time is 97% of the maximum value, the data can be discriminated without any problem. As is predicted from the extrapolated line of 10,000,000 min corresponding to 10 years shown in FIG. 34, the current value after 10 years corresponding to 66% (⅔) of the maximum value, and the data can discriminated. As is apparent from the above description, the 3-terminal element shown in FIGS. 97A and 97B can hold the ON or OFF state for 10 years.

In the above-described example of the present invention, each of the insulating layer on the silicon substrate, the gate electrode layer on the insulating layer, and the metal oxide layer on the gate electrode is formed by ECR sputtering. However, the method of forming each layer is not limited to ECR sputtering. For example, the insulating layer to be formed on the silicon substrate may be formed by thermal oxidation or CVD (Chemical Vapor Deposition) or a conventional sputtering method.

The gate electrode layer may be formed by any other film formation method such as EB deposition, CVD, MBE, or IBD. The metal oxide layer can also be formed by the above-described MOD, conventional sputtering method, PLD, or MOCVD. However, when ECR sputtering is used, flat and excellent insulating film, metal film, and metal oxide film can easily be obtained.

In the above-described embodiment, after each layer is formed, the substrate is temporarily unloaded into the atmosphere. However, the layers may be formed by a continuous process without unloading the structure into the atmospheric by using an apparatus which connects, through vacuum transfer chambers, the process chambers to realize ECR sputtering to form the respective layers. With this arrangement, the substrate to be processed can be transported in vacuum and is therefore prevented from being influenced by disturbance such as water adhesion. Hence, the film quality and interface properties can be improved.

As shown in patent reference 7, after each layer is formed, the surface of the formed layer may be irradiated with ECR plasma to improve the properties. After each layer is formed, the formed layer may be annealed (heat-treated) in an appropriate gas atmosphere such as hydrogen atmosphere to greatly improve the properties of each layer.

The basic idea of the present invention is arranging an insulating layer in contact with a metal oxide layer and sandwiching these layers by the gate electrode and the source and drain electrodes, as shown in FIGS. 97A and 97B. With this structure, when a predetermined voltage (DC or pulse) is applied to the gate electrode to change the resistance value of the metal oxide layer and switch the stable high resistance mode and low resistance mode, an operation as a 3-terminal element can be implemented consequently.

Figure 99:
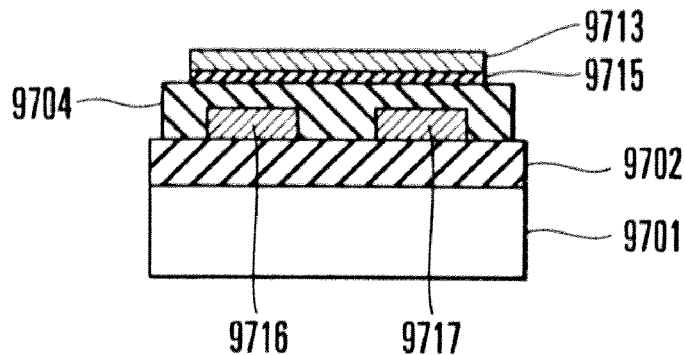
FIG. 99 is a schematic sectional view showing a structure example of still another 3-terminal element according to an embodiment of the present invention.
Figure 100A:
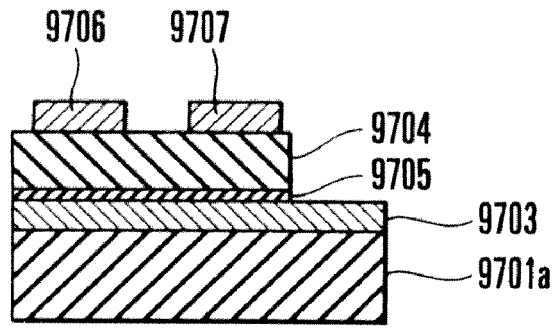
FIGS. 100A and 100B are schematic sectional views showing structure examples of still another 3-terminal element according to an embodiment of the present invention.
Figure 100B:
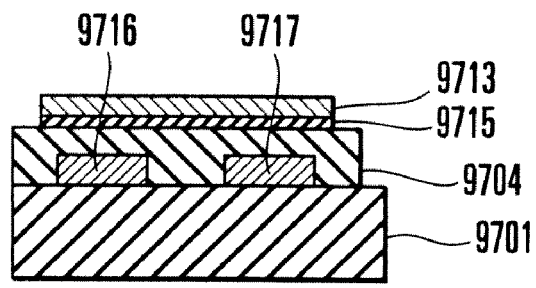

For example, as shown in FIG. 99, a source electrode 9716 and drain electrode 9717 may be formed on the insulating layer 9702 and covered with the metal oxide layer 9704, and a gate electrode 9713 may be formed on the metal oxide layer 9704 via an insulating layer 9715. As shown in FIGS. 100A and 100B, an insulating substrate 9701*a* may be used. In this case, the insulating layer 9702 shown in FIGS. 97A and 97B can be omitted. Alternatively, the structure including the insulating layer 9705, metal oxide layer 9704, source electrode 9706, and drain electrode 9707 shown in FIGS. 97A and 97B may be arranged on a conductive substrate. In this case, the substrate also serves as a gate electrode. When a metal substrate with high thermal conductivity is used as the conductive substrate, a higher cooling effect can be obtained, and a stable element operation can be expected.

An insulating substrate made of glass or quartz may be used. With this structure, the present invention can be applied to, e.g. a glass substrate easy to process. The metal oxide layer 9704 which has a refractive index of about 2.6 measured at a wavelength of 632.8 nm is optically transparent. For this reason, when a transparent substrate is used, the 3-terminal element of this embodiment can be applied to a display. When the metal oxide layer 9704 is formed so thick in the range of 10 to 200 nm that an interference color is generated, the visual effect of a colored state can be obtained.

Another form of the 3-terminal element of the present invention will be described next. In the above description, one ferroelectric element has been exemplified. However, as has been described with reference to FIGS. 93A and 93B, a plurality of 3-terminal elements may be arrayed and integrated in a cross-point pattern.

The change in resistance value of the metal oxide layer 9704 can also be controlled by a current, as described above. A predetermined voltage is applied to the metal oxide layer 9704 to flow a predetermined current. Immediately after that, a predetermined voltage (e.g., +0.5 V) is applied between the drain electrode 9707 and the gate electrode 9703. The current value changes then.

For example, after a current from $1 \times 10^{-9}$ A (inclusive) to $1 \times 10^{-6}$ A (exclusive) is supplied between the electrodes, the current value is small, and a high resistance state is obtained. After a current of $1 \times 10^{-6}$ A or more is supplied between the electrodes, the value of the flowing current becomes large (e.g., 0.7 mA), and the state changes to a low resistance state. As is apparent from this, the resistance of the metal oxide layer 9704 also changes depending on the current flowing to it. That is, two resistance values representing a high resistance state and low resistance state are present. Hence, the 3-terminal element shown in FIGS. 97A and 97B can be ON/OFF-controlled by both a voltage and a current.

As described above, the resistance change in the metal oxide layer 9704 can also be controlled by a pulse voltage. For example, as shown in FIG. 42, a negative pulse voltage (e.g., −4 V and 10 μs) is applied once between the gate electrode 9703 (positive electrode side) and the drain electrode 9707 (negative electrode side) of the element shown in FIGS. 97A and 97B whose metal oxide layer 9704 is in the high resistance state in the initial state. Then, the state changes to the low resistance state. After that, when a positive pulse voltage (e.g., +5 V and 10 μs) is applied between the electrodes a plurality of number of times (e.g., four times), the state changes to the high resistance state.

The above-described pulse voltage application is repeated. The current measured after each pulse voltage application changes as shown in FIG. 43. As shown in FIG. 43, the high resistance state is set in the initial state. After a negative pulse voltage is applied, the state changes to the low resistance state. When a positive pulse voltage is applied in this state a plurality of number of times, the state changes to the high resistance state. The resistance value of the metal oxide layer 9704 changes when a positive voltage pulse or negative voltage pulse is applied. Hence, for example, when a positive voltage pulse or negative voltage pulse is applied, the 3-terminal element shown in FIGS. 97A and 97B can also be changed from an "on" state to an "off" state or from an "off" state to an "on" state.

The voltage and time of the voltage pulse capable of changing the resistance state of the metal oxide layer 9704 can be changed in accordance with the situation. For example, when a voltage pulse of +5 V having a width of 10 μs is applied four times to set the high resistance state, and a short pulse of −4 V having a width of 1 μs is applied 10 times, the state can be changed to the low resistance state. When a short pulse of +5 V having a width of 1 μs is applied 100 times in this state, the state can be changed to the high resistance state. When a low voltage pulse of −3 V having a width of 100 μs is applied 100 times in this state, the state can be changed to the low resistance state.

Figure 101:
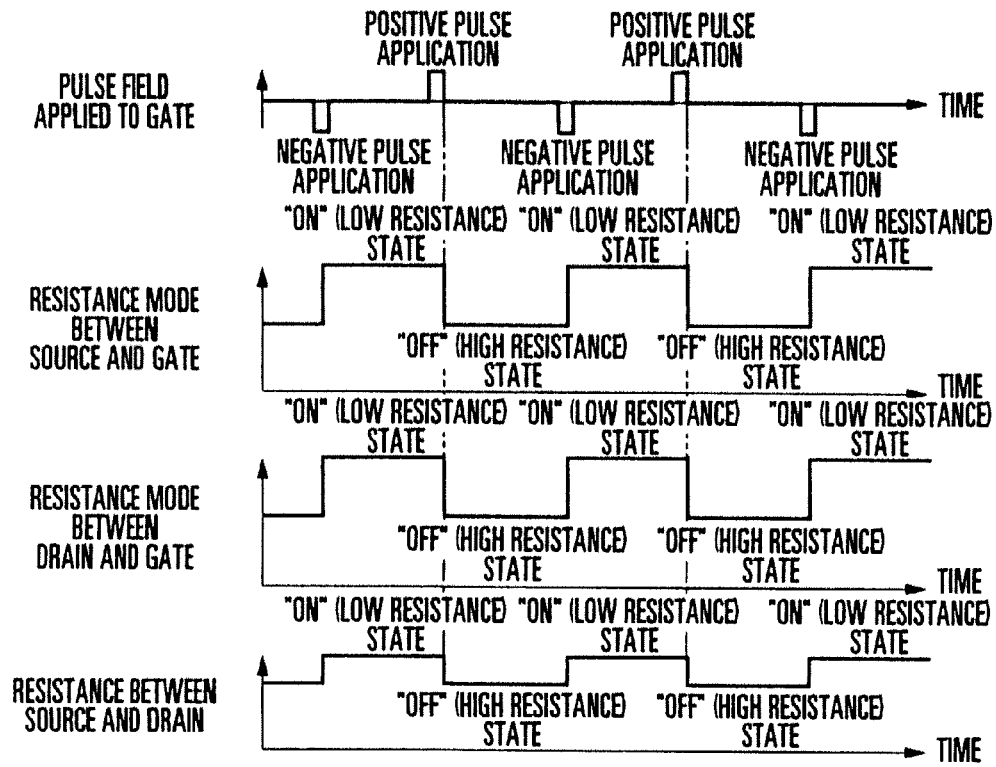
FIG. 101 is a timing chart showing an operation example in which the 3-terminal element shown in FIGS. 97A and 97B is driven by a pulse voltage.

A case wherein the 3-terminal element shown in FIGS. 97A and 97B is controlled by pulse voltage application will be described next. For example, as shown in the sequence of FIG. 101, when a negative pulse and positive pulse are alternately applied to the gate electrode 9703, the resistance mode between the source electrode 9706 and the gate electrode 9703 and that between the drain electrode 9707 and the gate electrode 9703 change. In correspondence with this, the ON state and OFF state of the current flowing between the source electrode 9706 and the drain electrode 9707 can alternately be switched.

Even in the 3-terminal element shown in FIGS. 97A and 97B using the metal oxide layer 9704 of this embodiment, the current-voltage characteristic when a DC voltage is applied between the gate electrode 9703 and the drain electrode 9707 (source electrode 9706) is changed to different low resistance states by changing the positive-side applied voltage, as shown in FIG. 46. In correspondence with these states, three states (three values) can be implemented in the value of the current flowing between the source and drain. For example, when the read voltage is about 0.5 V, ternary states can be implemented in the value of the current flowing between the source and drain. Before change to each state, a voltage of −2 V is applied to the gate electrode 9703 to return the state to the high resistance state (reset).

Figure 102A:
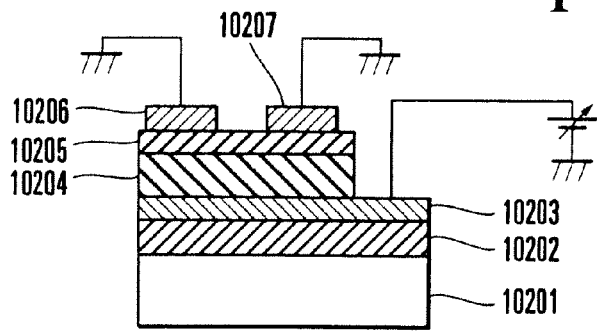
FIGS. 102A and 102B are schematic sectional views showing structure examples of still another 3-terminal element according to an embodiment of the present invention.
Figure 102B:
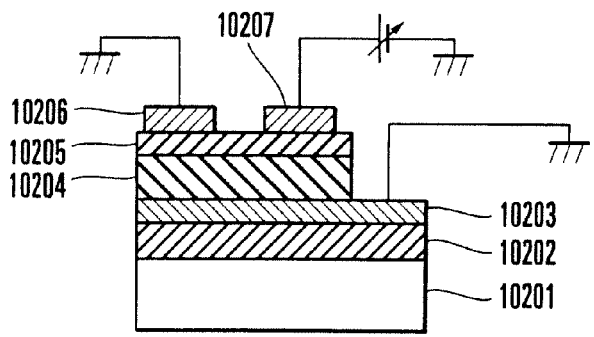

Still another embodiment of the present invention will be described below with reference to the accompanying drawings. FIGS. 102A and 102B are schematic sectional views schematically showing a structure example of a 3-terminal element according to still another embodiment of the present invention. The 3-terminal element shown in FIGS. 102A and 102B comprises, on a substrate 10201 made of, e.g., single-crystal silicon, an insulating layer 10202, a gate electrode 10203, a metal oxide layer 10204 containing Bi, Ti, and O and having a thickness of about 30 to 200 nm, an insulating layer 10205, a source electrode 10206, and a drain electrode 10207. In the 3-terminal element having the above-described structure, a state wherein a potential is applied as shown in FIG. 102A will be defined as a write state, and a state wherein a potential is applied as shown in FIG. 102B will be defined as a read state.

The substrate 10201 can be made of any one of a semiconductor, insulator, and conductive material such as a metal. When the substrate 10201 is made of an insulating material, the insulating layer 10202 can be omitted. When the substrate 10201 is made of a conductive material, the insulating layer 10202 and gate electrode 10203 can be omitted. In this case, the substrate 10201 made of the conductive material serves as a gate electrode. The gate electrode 10203, source electrode 10206, and drain electrode 10207 need only be made of a transition metal including noble metals such as platinum (Pt), ruthenium (Ru), gold (Au), silver (Ag), and titanium (Ti). The electrodes may be made of a compound such as a nitride, oxide, or fluoride of a transition metal, such as titanium nitride (TiN), hafnium nitride (HfN), strontium ruthenate (SrRuO$_2$), zinc oxide (ZnO), indium tin oxide (ITO), or lanthanum fluoride (LaF$_3$), or a composite film formed by stacking them.

The insulating layer 10205 need only be made of silicon dioxide, silicon oxynitride, alumina, an oxide such as LiNbO$_3$ containing a light metal such as lithium, beryllium, magnesium, or calcium, or a fluoride such as LiCaAlF$_6$, LiSrAlF$_6$, LiYF$_4$, LiLuF$_4$, or KMgF$_3$. Alternatively, the insulating layer 10205 need only be made of an oxide or nitride of a transition metal such as scandium, titanium, strontium, yttrium, zirconium, hafnium, tantalum, or lanthanum series, a silicate (ternary compound of a metal, silicon, and oxygen) containing the above-described elements, an aluminate (ternary compound of a metal, aluminum, and oxygen) containing these elements, or an oxide or nitride containing at least two of the above elements.

Like the above-described ferroelectric layer 104 and the like, the metal oxide layer 10204 is formed by dispersing a plurality of microcrystalline grains of Bi$_4$Ti$_3$O$_{12}$ crystal having a grain size of about 3 to 15 nm in a base layer, i.e., a layer containing titanium in an excessive amount relative to the stoichiometric composition of Bi$_4$Ti$_3$O$_{12}$. This is confirmed by observation using a transmission electron microscope. The base layer may be TiO$_x$ with a bismuth content of almost 0. In other words, the base layer is made of a metal oxide which contains two metals and in which the content of one metal is smaller in comparison with the stoichiometric composition.

A detailed example of the 3-terminal element shown in FIGS. 102A and 102B will be described. For example, the gate electrode 10203 is a ruthenium film having a thickness of 10 nm. The metal oxide layer 10204 is made of a metal oxide with the above-described composition and has a thickness of 40 nm. The insulating layer 10205 is a multilayered film made of tantalum pentoxide and silicon dioxide and having a thickness of 5 nm. The source electrode 10206 and drain electrode 10207 are made of gold. The source electrode 10206 and drain electrode 10207 may have a multilayered structure formed by stacking a titanium layer, titanium nitride layer, and gold layer in this order sequentially from the side of the insulating layer 10205. When the contact surface to the insulating layer 10205 is formed from a titanium layer, the adhesion can be increased. The interval between the source electrode 10206 and the drain electrode 10207 is, e.g., 1 mm. As described above, the structures of the substrate 10201 and insulating layer 10202 are not limited to those described above, and any other material can also be selected appropriately if it has no effect on the electrical characteristics.

A detailed method of forming the above-described insulating layer 10202, gate electrode 10203, metal oxide layer 10204, insulating layer 10205, source electrode 10206, and drain electrode 10207 will be described later. They can be formed by sputtering a metal target or sintered target in ECR plasma made of argon gas, oxygen gas, or nitrogen gas by using an ECR sputtering apparatus shown in FIG. 5.

Figure 103A:
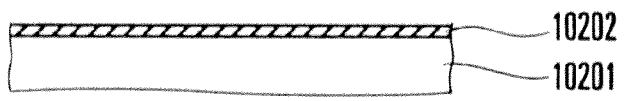
FIGS. 103A to 103E are views for explaining steps in manufacturing the 3-terminal element shown in FIGS. 102A and 102B.

An example of a method of manufacturing the 3-terminal element shown in FIGS. 102A and 102B will be described next with reference to FIG. 103. As shown in FIG. 103A, the p-type silicon substrate 10201 having a plane orientation of (100) on the principal plane and a resistivity of 1 to 2 Ωcm is prepared. The surface of the substrate 10201 is cleaned by a solution mixture of sulfuric acid and a hydrogen peroxide solution, pure water, and a hydrogen fluoride solution and dried. The insulating layer 10202 is formed on the cleaned and dried substrate 10201. In forming the insulating layer 10202, the above-described ECR sputtering apparatus and pure silicon (Si) as a target are used. The insulating layer 10202 in a metal mode by Si—O molecules is formed on the silicon substrate 10201 to a thickness to just cover its surface by ECR sputtering using argon (Ar) as a plasma gas and oxygen gas.

For example, Ar gas is supplied at a flow rate of 20 sccm into a plasma production chamber whose internal pressure is set on the order of $10^{-5}$ Pa. The internal pressure is set to about $10^{-3}$ to $10^{-2}$ Pa. A magnetic field of 0.0875 T and a microwave of 2.45 GHz (about 500 W) are supplied to set the electron cyclotron resonance condition, thereby producing Ar plasma in the plasma production chamber. Note that sccm is the unit of flow rate and indicates that a fluid at 0° C. and 1 atmospheric pressure flows 1 cm$^3$ in 1 min.

The plasma produced by the above-described method is output from the plasma production chamber to the process chamber side by the divergent magnetic field of the magnetic coil. In addition, a high-frequency power of 13.56 MHz (e.g., 500 W) is supplied from a high-frequency power supply to the silicon target placed at the outlet of the plasma production chamber. When Ar ions collide against the silicon target, a sputtering phenomenon occurs to sputter Si particles. The Si particles sputtered from the silicon target reach the surface of the silicon substrate 10201 together with the plasma output from the plasma production chamber and the oxygen gas which is supplied and activated by the plasma and are oxidized to silicon dioxide by the activated oxygen. With the above process, the insulating layer 10202 made of silicon dioxide and having a thickness of, e.g., about 100 nm can be formed on the substrate 10201 (FIG. 103A).

The insulating layer 10202 ensures insulation to prevent a voltage from leaking to the substrate 10201 and influencing desired electrical characteristics when a voltage is applied between the electrodes to be formed later. For example, a silicon oxide film formed by oxidizing the surface of the silicon substrate by thermal oxidation may be used as the insulating layer 10202. The insulating layer 10202 may be made of any other insulating material except silicon oxide if the insulating properties can be ensured. The thickness of the insulating layer 10202 need not always be 100 nm and may be smaller or larger. In the above-described formation of the insulating layer 10202 by ECR sputtering, the substrate 10201 is not heated. However, the film may be formed while heating the substrate 10201.

Figure 103B:
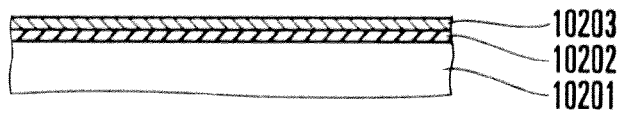

After the insulating layer 10202 is formed in the above-described manner, a ruthenium film is formed on the insulating layer 10202 by similar ECR sputtering using pure ruthenium (Ru) as a target, thereby forming the gate electrode 10203, as shown in FIG. 103B. Formation of the Ru film will be described in detail. In an ECR sputtering apparatus using a Ru target, for example, the silicon substrate with the insulating layer formed on it is heated to 400° C. Ar gas as a rare gas is supplied into the plasma production chamber at a flow rate of, e.g., 7 sccm. In addition, Xe gas is supplied at a flow rate of, e.g., 5 sccm to set the internal pressure of the plasma production chamber to on the order of, e.g., $10^{-2}$ to $10^{-3}$ Pa.

The magnetic field of the electron cyclotron resonance condition is given to the plasma production chamber. Then, a microwave of 2.45 GHz (about 500 W) is supplied into the plasma production chamber to produce ECR plasma of Ar and Xe in it. The produced ECR plasma is output from the plasma production chamber to the process chamber side by the divergent magnetic field of the magnetic coil. In addition, a high-frequency power of 13.56 MHz (e.g., 500 W) is supplied to the ruthenium target placed at the outlet of the plasma production chamber. The sputtering phenomenon occurs to sputter Ru particles from the ruthenium target. The Ru particles sputtered from the ruthenium target reach the surface of the insulating layer 10202 on the substrate 10201 and are deposited.

With the above process, the gate electrode 10203 having a thickness of, e.g., about 10 nm can be formed on the insulating layer 10202 (FIG. 103B). The gate electrode 10203 enables voltage application to the metal oxide layer 10204 when a voltage is applied between the source electrode 10206 and drain electrode 10207 to be formed later. The gate electrode 10203 may be made of any other material except ruthenium if the conductivity can be ensured. The gate electrode 10203 may be made of, e.g., platinum. A platinum film formed on silicon dioxide readily peels off, as is known. To prevent this, a layered structure is formed by inserting a titanium layer, titanium nitride layer, or ruthenium layer under the platinum layer. The thickness of the gate electrode 10203 need not always be 10 nm and may be smaller or larger.

As described above, in forming the Ru film by ECR sputtering, the substrate 10201 is heated to 400° C. However, the substrate need not always be heated. However, if the substrate is not heated, the adhesion of ruthenium to silicon dioxide becomes low, and the film may peel off. To prevent peeling, the film is formed preferably while heating the substrate.

Figure 103C:
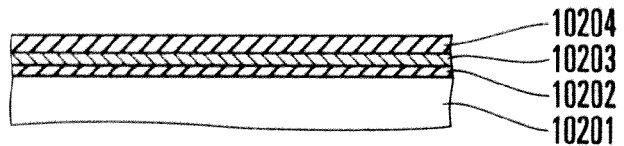

After the gate electrode 10203 is formed in the above-described manner, the metal oxide layer 10204 is formed on the gate electrode 10203 to a thickness to just cover its surface, as shown in FIG. 103C, by ECR sputtering using argon (Ar) as a plasma gas and oxygen gas and a target formed from an oxide sintered body (Bi—Ti—O) in which the ratio of Bi to Ti is 4:3.

Formation of the metal oxide layer 10204 will be described in detail. The substrate 10201 is heated to 300° C. to 700° C. Ar gas as a rare gas is supplied into the plasma production chamber at a flow rate of, e.g., 20 sccm to set the pressure on the order of, e.g., $10^{-3}$ to $10^{-2}$ Pa. In this state, the magnetic field of the electron cyclotron resonance condition is given to the plasma production chamber. Then, a microwave of 2.45 GHz (about 500 W) is supplied into the plasma production chamber to produce ECR plasma in it.

The produced ECR plasma is output from the plasma production chamber to the process chamber side by the divergent magnetic field of the magnetic coil. In addition, a high-frequency power of 13.56 MHz (e.g., 500 W) is supplied to the sintered body target placed at the outlet of the plasma production chamber. When Ar particles collide against the sintered body target, the sputtering phenomenon occurs to sputter Bi particles and Ti particles.

The Bi particles and Ti particles sputtered from the sintered body target reach the surface of the heated gate electrode 10203 together with the ECR plasma output from the plasma production chamber and the oxygen gas activated by the output ECR plasma and are oxidized by the activated oxygen. The oxygen ($O_2$) gas serving as a reactive gas is supplied at a flow rate of, e.g., 1 sccm separately from the Ar gas, as will be described later. Although the sintered body target contains oxygen, any shortage of oxygen in the deposited film can be prevented by supplying oxygen. With the above-described film formation by ECR sputtering, the metal oxide layer 10204 having a thickness of, e.g., about 40 nm can be formed (FIG. 103C).

The film quality may be improved by irradiating the formed metal oxide layer 10204 with ECR plasma of an inert gas and a reactive gas. As the reactive gas, not oxygen gas but nitrogen gas, fluorine gas, or hydrogen gas can be used. The film quality improvement can also be applied to formation of the insulating layer 10202. The metal oxide layer 10204 may be formed at a low substrate temperature of 300° C. or less and then annealed (heat-treated) in an appropriate gas atmosphere such as oxygen atmosphere to greatly improve the properties of the film.

Figure 103D:
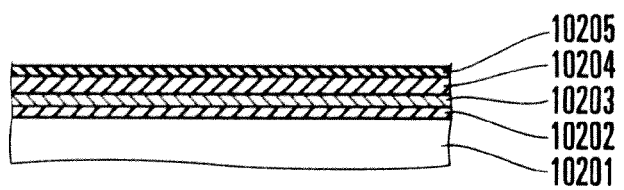

After the metal oxide layer 10204 is formed in the above-described manner, the substrate 10201 is unloaded from the apparatus to the atmosphere. The substrate 10201 is fixed on the substrate holder of the same ECR sputtering apparatus as in FIG. 5 in which pure tantalum (Ta) is used as the target. The insulating layer 10205 is formed on the metal oxide layer 10204 to a thickness to just cover its surface, as shown in FIG. 103D, by ECR sputtering using argon (Ar) as a plasma gas and oxygen gas. A metal mode film by Ta—O molecules is formed as the insulating layer 10205, as will be described below.

Formation of a metal mode film by Ta—O molecules will be described in detail. In the ECR sputtering apparatus shown in FIG. 5 in which the target made of tantalum is used, Ar gas as a rare gas is supplied at a flow rate of, e.g., 25 sccm from the inert gas supply unit into the plasma production chamber to set its internal pressure on the order of, e.g., $10^{-3}$ Pa. A coil current of, e.g., 28 A is supplied to the magnetic coil to give the magnetic field of the electron cyclotron resonance condition to the plasma production chamber.

A microwave of, e.g., 2.45 GHz (e.g., 500 W) is supplied from the microwave generation unit (not shown) into the plasma production chamber through the waveguide, quartz window, and vacuum waveguide. With this supply of the microwave, Ar plasma is produced in the plasma production chamber. The produced plasma is output from the plasma production chamber to the side of the process chamber by the divergent magnetic field of the magnetic coil. In addition, a high-frequency power (e.g., 500 W) is supplied from the high-frequency electrode supply unit to the target placed at the outlet of the plasma production chamber.

When Ar particles collide against the target, a sputtering phenomenon occurs to sputter Ta particles from the target. The Ta particles sputtered from the target reach the surface of the metal oxide layer 10204 on the substrate 10201 together with the plasma output from the plasma production chamber and the oxygen gas which is supplied from the reactive gas supply unit and activated by the plasma and are oxidized to tantalum pentoxide by the activated oxygen.

With the above process, a tantalum pentoxide film is formed on the metal oxide layer 10204. Subsequently, a silicon dioxide film is formed on the tantalum pentoxide film by ECR sputtering using the target made of pure silicon, like silicon dioxide deposition described with reference to FIG. 103A. The above-described formation of a tantalum pentoxide film and silicon dioxide film is repeated to form a multi-layered film including the tantalum pentoxide films and silicon dioxide films to, e.g., about 5 nm, thereby obtaining the insulating layer 10205 (FIG. 103D).

The insulating layer 10205 including the tantalum pentoxide films and silicon dioxide films is used to control the voltage to be applied to the ferroelectric film upon voltage application to the metal oxide layer 10204. The insulating layer 10205 may have any other structure except the multi-layered structure of tantalum pentoxide films and silicon dioxide films if it can control the voltage applied to the metal oxide layer 10204. The insulating layer 10205 may be a single layer. The thickness is not limited to 5 nm, either. In the above-described ECR sputtering, the substrate 10201 is not heated but may be heated.

Figure 103E:
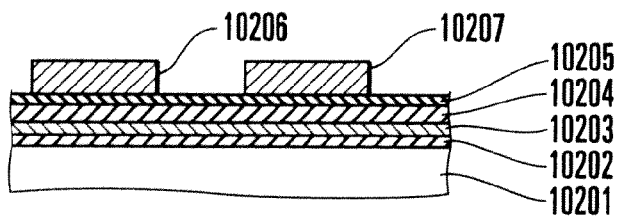

The source electrode 10206 and drain electrode 10207 each made of Au and having a predetermined area are formed on the insulating layer 10205, as shown in FIG. 103E, thereby obtaining the 3-terminal element shown in FIGS. 102A and 102B. The source electrode 10206 and drain electrode 10207 can be formed by a well-known lift-off method and gold deposition by resistance heating vacuum deposition. The source electrode 10206 and drain electrode 10207 may be made of another metal material or conductive material such as Ru, Pt, or TiN. When Pt is used, the adhesion is poor, and the film may peel off. Hence, each electrode must be formed as an electrode with a predetermined area by using a structure such as Ti—Pt—Au that hardly peels off and executing a patterning process such as photolithography or lift-off on that structure.

The characteristics of the element using the metal oxide layer 10204 will be described next. The characteristics were investigated by applying a voltage between the gate electrode 10203 and the drain electrode 10207. When a voltage from a power supply was applied between the gate electrode 10203 and the drain electrode 10207, and a current flowing when the voltage was applied was measured by an ammeter, a result shown in FIG. 49 was obtained. FIG. 49 and the operation principle of the element according to the present invention will be described below. The voltage values and current values to be described here are mere examples measured in an actual element. Hence, the phenomenon is not limited to the following numerical values. Other numerical values can also be measured depending on the material and thickness of each film actually used in the element and other conditions.

When a positive voltage is applied to the gate electrode 10203, the flowing current is very small in the range of 0 to 1.0 V, as indicated by (1) in FIG. 49. However, as indicated by (2), when the voltage exceeds 1.1 V, a positive current flows abruptly. Actually, a current larger than 0.1 A/cm$^2$ also flows. However, since flowing of a larger current is inhibited to protect the measurement device, the current is not measured. In the range of 0 to 1.0 V indicated by (1), a high resistance state is held (maintained) by inhibiting flowing of a large current as indicated by (2).

When a positive voltage is applied again to the gate electrode 10203, a locus to flow a positive current of 0.1 A/cm$^2$ or more is obtained at about 0.8 V, as indicated by (3). When the positive voltage is further applied to the gate electrode 10203, a current of 0.1 A/cm$^2$ or more flows at about 0.8 V, as indicated by (3).

When a negative voltage is applied to the gate electrode 10203, a negative current flows up to about −0.2 V, as indicated by (4). The current increases to −1.5×10$^{-2}$ A/cm$^2$ at maximum. When the absolute value of the voltage is decreased, the current traces a locus indicated by (4).

When the negative voltage is applied up to −0.2 V, the current-traces the locus indicated by (4). After that, as indicated by (5), the value of the flowing current decreases, and no negative current flows. When the negative voltage is further applied to the gate electrode 10203, a locus to rarely flow a current is obtained, as indicated by (6). Even when the absolute value of the voltage is decreased then, the current rarely flows, as indicated by (6). When a positive voltage is applied to the gate electrode 10203, the current rarely flows up to 0 to 1.0 V, as indicated by (1).

Hence, the high resistance state wherein no current flows as in (1) is maintained unless a voltage of 1.1 V or more is applied to the gate electrode 10203 to prevent any sudden current flow as in (2). The state (1) will be referred to as a "positive high resistance mode".

For example, as indicated by (2), when a voltage of 1.1 V or more is applied to abruptly flow a current, a low resistance state in which the current readily flows is obtained, as indicated by (3). This state is also maintained while a positive voltage is applied to the gate electrode 10203. The state (3) will be referred to as a "positive low resistance mode".

However, when a negative voltage is applied to the gate electrode 10203, a low resistance state in which a small current flows in the early stage in a negative voltage range from 0 to −0.2 V is obtained, as indicated by (4). This state is also maintained while a negative voltage in the range of 0 to −0.2 V is applied. The state (4) will be referred to as a "negative low resistance mode".

When a negative voltage of −0.2 V or more is applied, no current flows, and the state changes to a high resistance state, as indicated by (5). In this state, the state wherein the current value has a high resistance is maintained while a negative voltage in the range of 0 to −1.0 V is applied, as indicated by (6). The state (6) will be referred to as a "negative high resistance mode".

As described above, the metal oxide layer 10204 apparently has four stable modes: "positive high resistance mode", "positive low resistance mode", "negative high resistance mode", and "negative low resistance mode". More specifically, the "positive high resistance mode" and "negative high resistance mode" are "high resistance modes" which exhibit the same high resistance state. The "positive low resistance mode" and "negative low resistance mode" are "low resistance modes" which exhibit the same low resistance state. That is, two modes are present. In the state of the "high resistance mode", the "high resistance mode" is maintained in the voltage range of −1.5 V to +1.0 V. When a voltage of +1.0 V or more is applied to change the state to the "low resistance mode", the "low resistance mode" is maintained in the voltage range of −0.2 V to +0.8 V. Switching between the two, "high resistance mode" and "low resistance mode" occurs. This also applied to the negative resistance modes, i.e., "negative high resistance mode" and "negative low resistance mode".

As for the actual current value in each "positive mode" when a voltage of 0.5 V is applied, the current value in the "positive high resistance mode" is $1.0 \times 10^{-5}$ A/cm$^2$, and that in the "positive low resistance mode" is $5 \times 10^{-2}$ A/cm$^2$. The ratio is as high as 5,000 times. This facilitates each mode identification. The present inventors estimate that the above-described phenomenon occurs when the resistance value of the metal oxide layer 10204 dramatically changes depending on the direction and magnitude of the applied voltage.

Since the insulating layer 10205 is provided between the metal oxide layer 10204 and the drain electrode 10207 (source electrode 10206), carriers can be controlled by the band structure of the insulating layer 10205. More specifically, for example, tantalum pentoxide has a band gap of about 4.5 eV. The energy difference viewed from the Fermi level is about 1.2 eV in the conduction band and 2.3 eV in the valence band. That is, the barrier is higher on the valence band side. Hence, the barrier effect is high for holes in the valence band but low for electrons in the conduction band. For further information, see Wilk et al., "J. Appl. Phys.", No. 87, p. 484 (2000).

From the above-described characteristic, when, e.g., a tantalum pentoxide film is used as the insulating layer between the electrode and the metal oxide layer 10204, a phenomenon that electrons readily flow but holes hardly flow can be expected. Actually, as shown in FIG. 49, the value of the flowing current largely changes between a case wherein a positive voltage is applied to the drain electrode 10207 and a case wherein a negative voltage is applied. In discriminating the state of the metal oxide layer 10204, this has a large effect to increase the signal-to-noise ratio (S/N ratio) and facilitate state discrimination. This is the effect of use of the insulating layer 10205.

It was found that when the above-described "low resistance mode" and "high resistance mode" shown in FIG. 49 are applied, the element shown in FIGS. 102A and 102B can be used as a nonvolatile 3-terminal element capable of a nondestructive read. More specifically, the OFF state wherein the current between the source and drain hardly flows is set by applying a negative voltage to the gate electrode 10203 and a positive voltage to the drain electrode 10207 to change the mode from the "low resistance mode" to the "high resistance mode", as indicated by (4) or (5) in FIG. 49.

The ON state wherein the current between the source and drain readily flows is set by applying a positive voltage to the gate electrode 10203 and a negative voltage of $-0.8$ V or more to the drain electrode 10207 to abruptly flow the current, as indicated by (2) in FIG. 49. With this operation, the mode is changed from the "high resistance mode" to the "low resistance mode", and the ON state is obtained. As described above, when a voltage is applied to the gate electrode 10203 (drain electrode 10207) to set the "high resistance mode" or "low resistance mode", switching between the OFF state and the ON state can be done.

The ON/OFF state between the source and drain controlled in the above-described way can easily be recognized by reading a current value when an appropriate voltage of $-0.8$ to $+0.8$ V is applied between the source and drain. For example, when the mode state of the element shown in FIGS. 102A and 102B is "off", i.e., "high resistance mode", it can be determined because a current hardly flows when an appropriate voltage of $-0.8$ to $+0.8$ V is applied, as indicated by (1) in FIG. 49.

When the mode state of the element shown in FIGS. 102A and 102B is "on", i.e., "low resistance mode", it can be determined because a current abruptly flows when an appropriate voltage of $-0.5$ to $+0.2$ V is applied, as indicated by (2) in FIG. 49. Since the difference in current value between the "negative high resistance mode" and the "negative low resistance mode", i.e., "off" and "on" is 200 times or more, "off" and "on" can easily be determined. Even in the positive voltage range, "off" and "on" can be determined in the voltage range of 0 to +0.2 V.

The above-described ON/OFF state can easily be identified only by checking whether the element shown in FIGS. 102A and 102B is in the "high resistance mode" or "low resistance mode". Even when a positive voltage is applied to the electrode to check the mode, the held mode does not change. Hence, according to the 3-terminal element shown in FIGS. 102A and 102B, a nondestructive read operation is possible. The element shown in FIGS. 102A and 102B functions as a 3-terminal element to control ON/OFF between the source and drain since the resistance value of the metal oxide layer 10204 changes depending on the voltage applied between the gate electrode 10203 and the drain electrode 10207 (or source electrode 10206). This element can also be used as an element to control the current.

Even when the source electrode 10206 is set open, the ON state and OFF state can be controlled by applying a gate voltage. In the case wherein the source electrode 10206 is set open, when the read voltage is increased, a current to some extent flows between the source and drain even when a gate voltage is applied to set the OFF state. When the source electrode 10206 is set open, and the gate voltage is applied in this state, the applied voltage selectively acts depending on the region under the drain electrode 10207. As described above, a certain source-drain current is supposed to flow when the read voltage is high. Hence, the source-drain current is supposed to flow through a path formed from the source electrode 10206, the metal oxide layer 10204 in the region under the source electrode 10206, the gate electrode 10203, the metal oxide layer 10204 in the region under the drain electrode 10207, and the drain electrode 10207.

The voltage to operate the element shown in FIGS. 102A and 102B is maximized in the "negative low resistance mode". However, the voltage is about $-0.8$ V, and the power consumption is very low, as shown in FIG. 49. The low power consumption is very advantageous for devices. Devices using a 3-terminal element, e.g., not only mobile communication devices, digital general-purpose devices, digital image sensing devices, notebook personal computers, and PDAs (Personal Digital Appliances) but also all computers, personal computers, workstations, office computers, mainframes, communication units, and multifunction apparatuses can reduce the power consumption.

Like the above-described elements, the 3-terminal element shown in FIGS. 102A and 102B can also hold the ON or OFF state for 10 years.

In the above-described example of the present invention, each of the insulating layer on the silicon substrate, the gate electrode layer on the insulating layer, and the metal oxide layer on the gate electrode is formed by ECR sputtering. However, the method of forming each layer is not limited to ECR sputtering. For example, the insulating layer to be formed on the silicon substrate may be formed by thermal oxidation or CVD (Chemical Vapor Deposition) or a conventional sputtering method.

The gate electrode layer may be formed by any other film formation method such as EB deposition, CVD, MBE, or IBD. The metal oxide layer can also be formed by the above-described MOD, conventional sputtering method, PLD, or MOCVD. However, when ECR sputtering is used, flat and excellent insulating film, metal film, and metal oxide film can easily be obtained.

In the above-described embodiment, after each layer is formed, the substrate is temporarily unloaded into the atmosphere. However, the layers may be formed by a continuous process without unloading the structure into the atmospheric by using an apparatus which connects, through vacuum transfer chambers, the process chambers to realize ECR sputtering to form the respective layers. With this arrangement, the substrate to be processed can be transported in vacuum and is therefore prevented from being influenced by disturbance such as water adhesion. Hence, the film quality and interface properties can be improved.

As shown in patent reference 7, after each layer is formed, the surface of the formed layer may be irradiated with ECR plasma to improve the properties. After each layer is formed, the formed layer may be annealed (heat-treated) in an appropriate gas atmosphere such as hydrogen atmosphere to greatly improve the properties of each layer.

The basic idea of the present invention is arranging an insulating layer in contact with a metal oxide layer and sandwiching these layers by the gate electrode and the source and drain electrodes, as shown in FIGS. 102A and 102B. With this structure, when a predetermined voltage (DC or pulse) is applied to the gate electrode to change the resistance value of the metal oxide layer and switch the stable high resistance mode and low resistance mode, an operation as a 3-terminal element can be implemented consequently.

Figure 104:
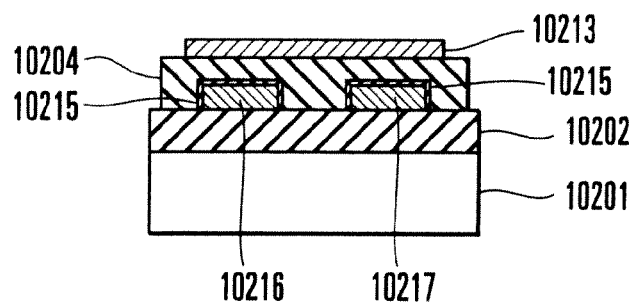
FIG. 104 is a schematic sectional view showing a structure example of still another 3-terminal element according to an embodiment of the present invention.
Figure 105A:
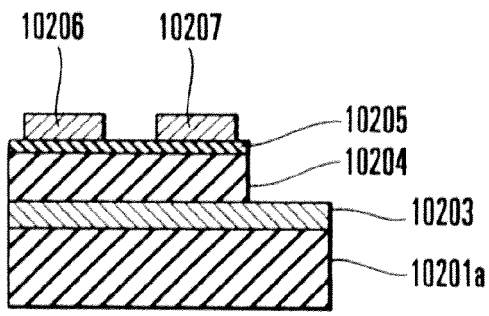
FIGS. 105A and 105B are schematic sectional views showing structure examples of still another 3-terminal element according to an embodiment of the present invention.
Figure 105B:
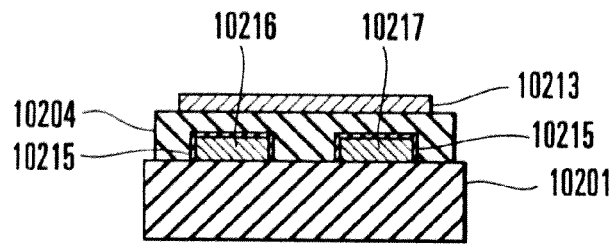

For example, as shown in FIG. 104, a source electrode 10216 and drain electrode 10217 may be formed on the insulating layer 10202 and covered with the metal oxide layer 10204 on an insulating layer 10215, and a gate electrode 10213 may be formed on the metal oxide layer 10204. As shown in FIGS. 105A and 105B, an insulating substrate 10201a may be used. In this case, the insulating layer 10202 shown in FIGS. 102A and 102B can be omitted. Alternatively, the structure including the metal oxide layer 10204, insulating layer 10205, source electrode 10206, and drain electrode 10207 shown in FIGS. 102A and 102B may be arranged on a conductive substrate. In this case, the substrate also serves as a gate electrode. When a metal substrate with high thermal conductivity is used as the conductive substrate, a higher cooling effect can be obtained, and a stable element operation can be expected.

An insulating substrate made of glass or quartz may be used. With this structure, the present invention can be applied to, e.g. a glass substrate easy to process. The metal oxide layer 10204 which has a refractive index of about 2.6 measured at a wavelength of 632.8 nm is optically transparent. For this reason, when a transparent substrate is used, the 3-terminal element of this embodiment can be applied to a display. When the metal oxide layer 10204 is formed so thick in the range of 10 to 200 nm that an interference color is generated, the visual effect of a colored state can be obtained.

In the above description, one ferroelectric element has been exemplified. However, as has been described with reference to FIG. 93, a plurality of 3-terminal elements may be arrayed and integrated in a cross-point pattern. The change in resistance value of the metal oxide layer 10204 of the 3-terminal element shown in FIGS. 102A and 102B can also be controlled by a current, like the above-described 3-terminal elements. The resistance change in the metal oxide layer 10204 can also be controlled by a pulse voltage. Even the 3-terminal element shown in FIGS. 102A and 102B can implement three states (three values) in the value of the current flowing between the source and drain.

Figure 106A:
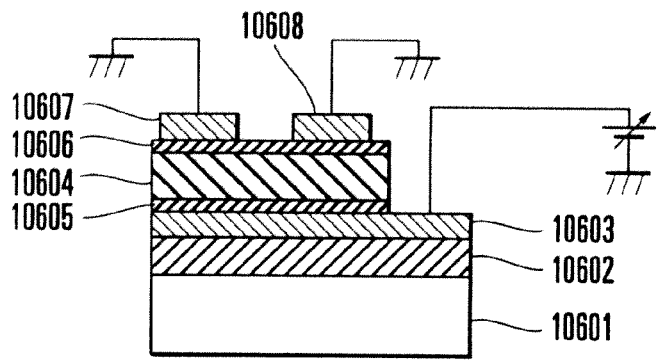
FIGS. 106A and 106B are schematic sectional views showing structure examples of still another 3-terminal element according to an embodiment of the present invention.
Figure 106B:
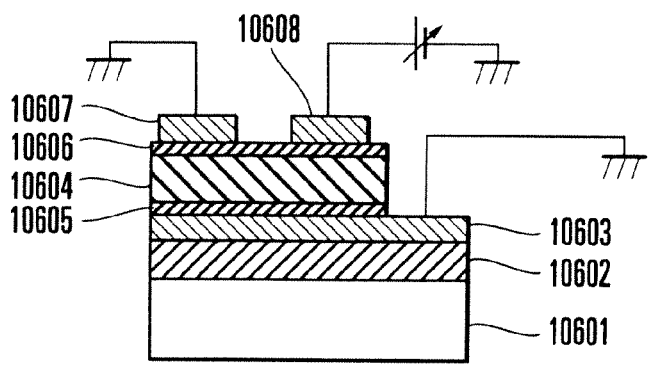

Still another embodiment of the present invention will be described below with reference to the accompanying drawings. FIGS. 106A and 106B are schematic sectional views schematically showing a structure example of a 3-terminal element according to still another embodiment of the present invention. The 3-terminal element shown in FIG. 106 comprises, on a substrate 10601 made of, e.g., single-crystal silicon, an insulating layer 10602, a gate electrode 10603, a metal oxide layer 10604 containing Bi, Ti, and O and having a thickness of about 30 to 200 nm, a source electrode 10607, and a drain electrode 10608. In addition, an insulating layer (first insulating layer) 10605 is provided between the gate electrode 10603 and the metal oxide layer 10604. An insulating layer (second insulating layer) 10606 is provided between the metal oxide layer 10604 and the source electrode 10607 and drain electrode 10608. In the 3-terminal element having the above-described structure, a state wherein a potential is applied as shown in FIG. 106A will be defined as a write state, and a state wherein a potential is applied as shown in FIG. 106B will be defined as a read state.

The substrate 10601 can be made of any one of a semiconductor, insulator, and conductive material such as a metal. When the substrate 10601 is made of an insulating material, the insulating layer 10602 can be omitted. When the substrate 10601 is made of a conductive material, the insulating layer 10602 and gate electrode 10603 can be omitted. In this case, the substrate 10601 made of the conductive material serves as a gate electrode. The gate electrode 10603, source electrode 10607, and drain electrode 10608 need only be made of a transition metal including noble metals such as platinum (Pt), ruthenium (Ru), gold (Au), silver (Ag), and titanium (Ti). The electrodes may be made of a compound such as a nitride, oxide, or fluoride of a transition metal, such as titanium nitride (TiN), hafnium nitride (HfN), strontium ruthenate (SrRuO$_2$), zinc oxide (ZnO), indium tin oxide (ITO), or lanthanum fluoride (LaF$_3$), or a composite film formed by stacking them.

The insulating layers 10605 and 10606 need only be made of silicon dioxide, silicon oxynitride, alumina, an oxide such as LiNbO$_3$ containing a light metal such as lithium, beryllium, magnesium, or calcium, or a fluoride such as LiCaAlF$_6$, LiSrAlF$_6$, LiYF$_4$, LiLuF$_4$, or KMgF$_3$. Alternatively, the insulating layers 10605 and 10606 need only be made of an oxide or nitride of a transition metal such as scandium, titanium, strontium, yttrium, zirconium, hafnium, tantalum, or lanthanum series, a silicate (ternary compound of a metal, silicon, and oxygen) containing the above-described elements, an aluminate (ternary compound of a metal, aluminum, and oxygen) containing these elements, or an oxide or nitride containing at least two of the above elements.

The metal oxide layer 10604 is the same as the above-described ferroelectric layer 10604, ferroelectric layer 310604, ferroelectric layer 4705, ferroelectric layer 6205, metal oxide layer 8604, metal oxide layer 9704, and metal oxide layer 10204.

A detailed example of the 3-terminal element shown in FIG. 106 will be described. For example, the gate electrode 10603 is a ruthenium film having a thickness of 10 nm. The metal oxide layer 10604 is made of a metal oxide with the above-described composition and has a thickness of 40 nm. Each of the insulating layers 10605 and 106 is a multilayered film made of tantalum pentoxide and silicon dioxide and having a thickness of 5 nm. The source electrode 10607 and drain electrode 10608 are made of gold. The source electrode 10607 and drain electrode 10608 may have a multilayered structure formed by stacking a titanium layer, titanium nitride layer, and gold layer in this order sequentially from the side of the metal oxide layer 10604. When the contact surface to the metal oxide layer 10604 is formed from a titanium layer, the adhesion can be increased. The interval between the source electrode 10607 and the drain electrode 10608 is, e.g., 1 mm. As described above, the structures of the substrate 10601 and insulating layer 10602 are not limited to those described above, and any other material can also be selected appropriately if it has no effect on the electrical characteristics.

A detailed method of forming the above-described insulating layer 10602, gate electrode 10603, insulating layer 10605, metal oxide layer 10604, insulating layer 10606, source electrode 10607, and drain electrode 10608 will be described later. They can be formed by sputtering a metal target or sintered target in ECR plasma made of argon gas, oxygen gas, or nitrogen gas by using an ECR sputtering apparatus shown in FIG. 5.

Figure 107A:
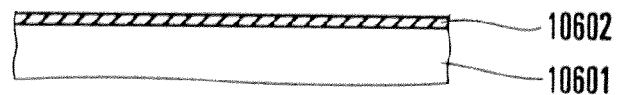
FIGS. 107A to 107F are views for explaining steps in manufacturing the 3-terminal element shown in FIGS. 106A and 106B.

An example of a method of manufacturing the 3-terminal element shown in FIG. 106 will be described next with reference to FIGS. 107A to 107F. As shown in FIG. 107A, the p-type silicon substrate 10601 having a plane orientation of (100) on the principal plane and a resistivity of 1 to 2 Ωcm is prepared. The surface of the substrate 10601 is cleaned by a solution mixture of sulfuric acid and a hydrogen peroxide solution, pure water, and a hydrogen fluoride solution and dried. The insulating layer 10602 is formed on the cleaned and dried substrate 10601. In forming the insulating layer 10602, the above-described ECR sputtering apparatus and pure silicon (Si) as a target are used. The insulating layer 10602 in a metal mode by Si—O molecules is formed on the silicon substrate 10601 to a thickness to just cover its surface by ECR sputtering using argon (Ar) as a plasma gas and oxygen gas.

For example, Ar gas is supplied at a flow rate of 20 sccm into a plasma production chamber whose internal pressure is set on the order of $10^{-5}$ Pa. The internal pressure is set to about $10^{-3}$ to $10^{-2}$ Pa. A magnetic field of 0.0875 T and a microwave of 2.45 GHz (about 500 W) are supplied to set the electron cyclotron resonance condition, thereby producing Ar plasma in the plasma production chamber. Note that sccm is the unit of flow rate and indicates that a fluid at 0° C. and 1 atmospheric pressure flows 1 cm$^3$ in 1 min.

The plasma produced by the above-described method is output from the plasma production chamber to the process chamber side by the divergent magnetic field of the magnetic coil. In addition, a high-frequency power of 13.56 MHz (e.g., 500 W) is supplied from a high-frequency power supply to the silicon target placed at the outlet of the plasma production chamber. When Ar ions collide against the silicon target, a sputtering phenomenon occurs to sputter Si particles. The Si particles sputtered from the silicon target reach the surface of the silicon substrate 10601 together with the plasma output from the plasma production chamber and the oxygen gas which is supplied and activated by the plasma and are oxidized to silicon dioxide by the activated oxygen. With the above process, the insulating layer 10602 made of silicon dioxide and having a thickness of, e.g., about 100 nm can be formed on the substrate 10601 (FIG. 107A).

The insulating layer 10602 ensures insulation to prevent a voltage from leaking to the substrate 10601 and influencing desired electrical characteristics when a voltage is applied between the electrodes to be formed later. For example, a silicon oxide film formed by oxidizing the surface of the silicon substrate by thermal oxidation may be used as the insulating layer 10602. The insulating layer 10602 may be made of any other insulating material except silicon oxide if the insulating properties can be ensured. The thickness of the insulating layer 10602 need not always be 100 nm and may be smaller or larger. In the above-described formation of the insulating layer 10602 by ECR sputtering, the substrate 10601 is not heated. However, the film may be formed while heating the substrate 10601.

Figure 107B:
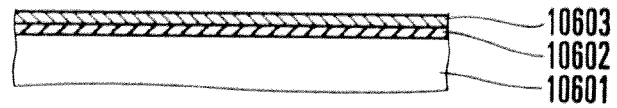

After the insulating layer 10602 is formed in the above-described manner, a ruthenium film is formed on the insulating layer 10602 by similar ECR sputtering using pure ruthenium (Ru) as a target, thereby forming the gate electrode 10603, as shown in FIG. 107B. Formation of the Ru film will be described in detail. In an ECR sputtering apparatus using a Ru target, for example, the silicon substrate with the insulating layer formed on it is heated to 400° C. Ar gas as a rare gas is supplied into the plasma production chamber at a flow rate of, e.g., 7 sccm. In addition, Xe gas is supplied at a flow rate of, e.g., 5 sccm to set the internal pressure of the plasma production chamber to on the order of, e.g., $10^{-2}$ to $10^{-3}$ Pa.

The magnetic field of the electron cyclotron resonance condition is given to the plasma production chamber. Then, a microwave of 2.45 GHz (about 500 W) is supplied into the plasma production chamber to produce ECR plasma of Ar and Xe in it. The produced ECR plasma is output from the plasma production chamber to the process chamber side by the divergent magnetic field of the magnetic coil. In addition, a high-frequency power of 13.56 MHz (e.g., 500 W) is supplied to the ruthenium target placed at the outlet of the plasma production chamber. The sputtering phenomenon occurs to sputter Ru particles from the ruthenium target. The Ru particles sputtered from the ruthenium target reach the surface of the insulating layer 10602 on the substrate 10601 and are deposited.

With the above process, the gate electrode 10603 having a thickness of, e.g., about 10 nm can be formed on the insulating layer 10602 (FIG. 107B). The gate electrode 10603 enables voltage application to the metal oxide layer 10604 when a voltage is applied between the source electrode 10607 and drain electrode 10608 to be formed later. The gate electrode 10603 may be made of any other material except ruthenium if the conductivity can be ensured. The gate electrode 10603 may be made of, e.g., platinum. A platinum film formed on silicon dioxide readily peels off, as is known. To prevent this, a layered structure is formed by inserting a titanium layer, titanium nitride layer, or ruthenium layer under the platinum layer. The thickness of the gate electrode 10603 need not always be 10 nm and may be smaller or larger.

As described above, in forming the Ru film by ECR sputtering, the substrate 10601 is heated to 400° C. However, the substrate need not always be heated. However, if the substrate is not heated, the adhesion of ruthenium to silicon dioxide becomes low, and the film may peel off. To prevent peeling, the film is formed preferably while heating the substrate.

Figure 107C:
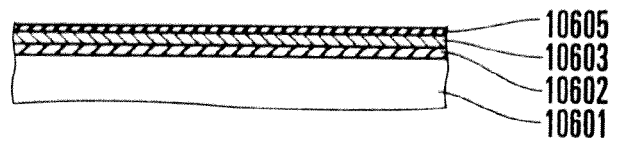

After the gate electrode 10603 is formed in the above-described manner, the substrate 10601 is unloaded from the apparatus to the atmosphere. The substrate 10601 is fixed on the substrate holder of the same ECR sputtering apparatus as in FIG. 5 in which pure tantalum (Ta) is used as the target. The insulating layer 10605 is formed on the gate electrode 10603 to a thickness to just cover its surface, as shown in FIG. 107C, by ECR sputtering using argon (Ar) as a plasma gas and oxygen gas. A metal mode film by Ta—O molecules is formed as the insulating layer 10605, as will be described below.

Formation of a metal mode film by Ta—O molecules will be described in detail. In the ECR sputtering apparatus shown in FIG. 5 in which the target made of tantalum is used, Ar gas as a rare gas is supplied at a flow rate of, e.g., 25 sccm from the inert gas supply unit into the plasma production chamber to set its internal pressure on the order of, e.g., $10^{-3}$ Pa. A coil current of, e.g., 28 A is supplied to the magnetic coil to give the magnetic field of the electron cyclotron resonance condition to the plasma production chamber.

A microwave of, e.g., 2.45 GHz (e.g., 500 W) is supplied from the microwave generation unit (not shown) into the plasma production chamber through the waveguide, quartz window, and vacuum waveguide. With this supply of the microwave, Ar plasma is produced in the plasma production chamber. The produced plasma is output from the plasma production chamber to the side of the process chamber by the divergent magnetic field of the magnetic coil. In addition, a high-frequency power (e.g., 500 W) is supplied from the high-frequency electrode supply unit to the target placed at the outlet of the plasma production chamber.

When Ar particles collide against the target, a sputtering phenomenon occurs to sputter Ta particles from the target. The Ta particles sputtered from the target reach the surface of the gate electrode 10603 on the substrate 10601 together with the plasma output from the plasma production chamber and the oxygen gas which is supplied from the reactive gas supply unit and activated by the plasma and are oxidized to tantalum pentoxide by the activated oxygen.

With the above process, a tantalum pentoxide film is formed on the gate electrode 10603. Subsequently, a silicon dioxide film is formed on the tantalum pentoxide film by ECR sputtering using the target made of pure silicon, like silicon dioxide deposition described with reference to FIG. 107A. The above-described formation of a tantalum pentoxide film and silicon dioxide film is repeated to form a multilayered film including the tantalum pentoxide films and silicon dioxide films to, e.g., about 5 nm, thereby obtaining the insulating layer 10605 (FIG. 107C).

The insulating layer 10605 including the tantalum pentoxide films and silicon dioxide films is used to control the voltage to be applied to the ferroelectric film upon voltage application to the metal oxide layer 10604. The insulating layer 10605 may have any other structure except the multilayered structure of tantalum pentoxide films and silicon dioxide films if it can control the voltage applied to the metal oxide layer 10604. The insulating layer 10605 may be a single layer. The thickness is not limited to 5 nm, either. In the above-described ECR sputtering, the substrate 10601 is not heated but may be heated.

Figure 107D:
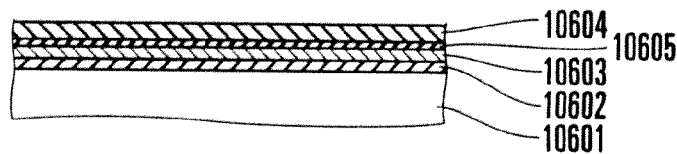

After the insulating layer 10605 is formed in the above-described manner, the metal oxide layer 10604 is formed on the insulating layer 10605 to a thickness to just cover its surface, as shown in FIG. 107D, by ECR sputtering using argon (Ar) as a plasma gas and oxygen gas and a target formed from an oxide sintered body (Bi—Ti—O) in which the ratio of Bi to Ti is 4:3.

Formation of the metal oxide layer 10604 will be described in detail. The substrate 10601 is heated to 300° C. to 700° C. Ar gas as a rare gas is supplied into the plasma production chamber at a flow rate of, e.g., 20 sccm to set the pressure on the order of, e.g., $10^{-3}$ to $10^{-2}$ Pa. In this state, the magnetic field of the electron cyclotron resonance condition is given to the plasma production chamber. Then, a microwave of 2.45 GHz (about 500 W) is supplied into the plasma production chamber to produce ECR plasma in it.

The produced ECR plasma is output from the plasma production chamber to the process chamber side by the divergent magnetic field of the magnetic coil. In addition, a high-frequency power of 13.56 MHz (e.g., 500 W) is supplied to the sintered body target placed at the outlet of the plasma production chamber. When Ar particles collide against the sintered body target, the sputtering phenomenon occurs to sputter Bi particles and Ti particles.

The Bi particles and Ti particles sputtered from the sintered body target reach the surface of the heated insulating layer 10605 together with the ECR plasma output from the plasma production chamber and the oxygen gas activated by the output ECR plasma and are oxidized by the activated oxygen. The oxygen ($O_2$) gas serving as a reactive gas is supplied at a flow rate of, e.g., 1 sccm separately from the Ar gas, as will be described later. Although the sintered body target contains oxygen, any shortage of oxygen in the deposited film can be prevented by supplying oxygen. With the above-described film-formation by ECR sputtering, the metal oxide layer 10604 having a thickness of, e.g., about 40 nm can be formed (FIG. 107D).

The film quality may be improved by irradiating the formed metal oxide layer 10604 with ECR plasma of an inert gas and a reactive gas. As the reactive gas, not oxygen gas but nitrogen gas, fluorine gas, or hydrogen gas can be used. The film quality improvement can also be applied to formation of the insulating layer 10602. The metal oxide layer 10604 may be formed at a low substrate temperature of 300° C. or less and then annealed (heat-treated) in an appropriate gas atmosphere such as oxygen atmosphere to greatly improve the properties of the film.

Figure 107E:
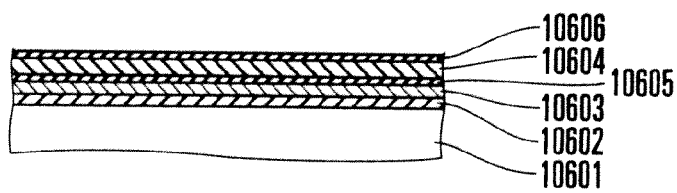

After the metal oxide layer 10604 is formed in the above-described manner, the insulating layer 10606 is formed on the metal oxide layer 10604 to a thickness to just cover its surface, as shown in FIG. 107E, as in the above-described formation of the insulating layer 10605.

Figure 107F:
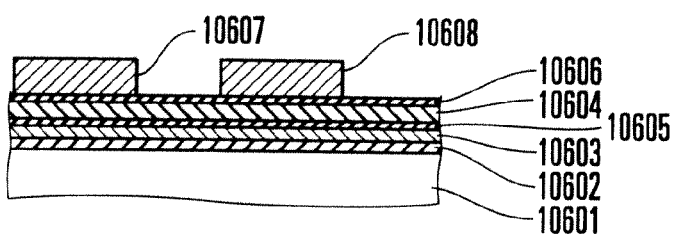

The source electrode 10607 and drain electrode 10608 each made of Au and having a predetermined area are formed on the insulating layer 10606, as shown in FIG. 107F, thereby obtaining the 3-terminal element shown in FIG. 106. The source electrode 10607 and drain electrode 10608 can be formed by a well-known lift-off method and gold deposition by resistance heating vacuum deposition. The source electrode 10607 and drain electrode 10608 may be made of another metal material or conductive material such as Ru, Pt, or TiN. When Pt is used, the adhesion is poor, and the film may peel off. Hence, each electrode must be formed as an electrode with a predetermined area by using a structure such as Ti—Pt—Au that hardly peels off and executing a patterning process such as photolithography or lift-off on that structure.

The characteristics of the 3-terminal element shown in FIG. 106 will be described next. The characteristics were investigated by applying a voltage between the gate electrode 10603 and the drain electrode 10608 (source electrode 10607). When a voltage from a power supply was applied between the gate electrode 10603 and the drain electrode 10608, and a current flowing when the voltage was applied was measured by an ammeter, a result shown in FIG. 64 was obtained. In FIG. 64, the ordinate represents the current density obtained by dividing the current value by the area. FIG. 64 and the memory operation principle of the present invention will be described below. The voltage values and current values to be described here are mere examples measured in an actual element. Hence, the phenomenon is not limited to the following numerical values. Other numerical values can also be measured depending on the material and thickness of each film actually used in the element and other conditions.

When a positive voltage is applied to the drain electrode 10608, the flowing current is very small in the range of 0 to 1.6 V, as indicated by (1) in FIG. 64. However, as indicated by (2), when the voltage exceeds 1.6 V, a positive current flows abruptly. Actually, a current larger than $5 \times 10^{-3}$ A/cm$^2$ also flows. However, since flowing of a larger current is inhibited to protect the measurement device, the current is not measured. When a voltage of 0 to 1.6 V is applied to inhibit abrupt current flow as indicated by (2), a state wherein the resistance is high, as indicated by (1), is maintained.

When a positive voltage is applied again to the drain electrode 10608, a locus to flow a positive current of $1\times10^{-3}$ A/cm$^2$ or more is obtained at about 0.5 V, as indicated by (3). When the positive voltage is further applied to the drain electrode 10608, a current of $1\times10^{-3}$ A/cm$^2$ or more flows at about 0.5 V, as indicated by (3). When a voltage of 0 to 0.5 V is applied, a state wherein the resistance is low, as indicated by (3), is maintained.

When a negative voltage is applied to the drain electrode 10608, a negative current flows up to about −0.5 V, as indicated by (4). The current increases to $-1.5\times10^{-3}$ A/cm$^2$ at maximum. When a voltage of 0 to −0.5 V is applied, a state wherein the resistance is low is maintained, as indicated by (4).

When a negative voltage is applied from −0.5 V to −1.6 V, the current value decreases, and no negative current flows, as indicated by (5). Even when the absolute value of the voltage from −1.6 V to 0 V is decreased then, the current rarely flows, as indicated by (6). When a negative voltage is applied to the drain electrode 10608, a locus to rarely flow a current is obtained, as indicated by (6).

When a positive voltage is applied to the drain electrode 10608, a locus to rarely flow a current t up 0 to 1.6 V is obtained, as indicated by (1) When a voltage of 1.6 V or more is applied, a state representing a low resistance indicated by (3) is obtained.

Hence, the high resistance state wherein no current flows as in (1) is maintained unless a voltage of 1.6 V or more is applied to the drain electrode 10608 to prevent any sudden current flow as in (2). The state (1) will be referred to as a "positive high resistance mode".

For example, as indicated by (2), when a voltage of 1.6 V or more is applied to abruptly flow a current, a low resistance state in which the current readily flows is obtained, as indicated by (3). This state is also maintained while a positive voltage is applied to the drain electrode 10608. The state (3) will be referred to as a "positive low resistance mode".

However, when a negative voltage is applied to the drain electrode 10608, a low resistance state in which a small current flows in the early stage in a negative voltage range from 0 to −0.5 V is obtained, as indicated by (4). This state is also maintained while a negative voltage in the range of 0 to −0.5 V is applied. The state (4) will be referred to as a "negative low resistance mode".

When a negative voltage exceeding −0.5 V is applied, no current flows, and the state changes to a high resistance state, as indicated by (5). In this state, the state wherein the current value has a high resistance is maintained while a negative voltage in the range of 0 to −1.6 V is applied, as indicated by (6). The state (6) will be referred to as a "negative high resistance mode".

As described above, the metal oxide layer 10604 apparently has four stable modes: "positive high resistance mode", "positive low resistance mode", "negative high resistance mode", and "negative low resistance mode". More specifically, the "positive high resistance mode" and "negative high resistance mode" are "high resistance modes" which exhibit the same high resistance state. The "positive low resistance mode" and "negative low resistance mode" are "low resistance modes" which exhibit the same low resistance state. That is, two modes are present. In the state of the "high resistance mode", the "high resistance mode" is maintained in the voltage range of −1.6 V to +1.6 V. When a voltage of +1.6 V or more is applied to change the state to the "low resistance mode", the "low resistance mode" is maintained in the voltage range of −0.5 V to +0.5 V. Switching between the two, "high resistance mode" and "low resistance mode" occurs. This also applied to the negative resistance modes, i.e., "negative high resistance mode" and "negative low resistance mode".

As for the actual current value in each "positive mode" when a voltage of 0.5 V is applied, the current value in the "positive high resistance mode" is $5.0\times10^{-6}$ A/cm, and that in the "positive low resistance mode" is $5\times10^{-3}$ A/cm$^2$. The ratio is as high as 1,000 times. This facilitates each mode identification. The present inventors estimate that the above-described phenomenon occurs when the resistance value of the metal oxide layer 6205 dramatically changes depending on the direction and magnitude of the applied voltage. This also applies to the "negative low resistance mode".

Since the insulating layer 10605 is provided between the metal oxide layer 10604 and the gate electrode 10603, and the insulating layer 10606 is provided between the metal oxide layer 10604 and the gate electrode 10603, and the insulating layer 10606 is provided between the metal oxide layer 10604 and the drain electrode 10608 (source electrode 10607), carriers can be controlled by the band structures of the insulating layers 10605 and 10606. More specifically, for example, tantalum pentoxide has a band gap of about 4.5 eV. The energy difference viewed from the Fermi level is about 1.2 eV in the conduction band and 2.3 eV in the valence band. That is, the barrier is higher on the valence band side. Hence, the barrier effect is high for holes in the valence band but low for electrons in the conduction band. For further information, see Wilk et al., "J. Appl. Phys.", No. 87, p. 484 (2000).

From the above-described characteristic, when, e.g., a tantalum pentoxide film is used as the insulating layer between the electrode and the metal oxide layer, a phenomenon that electrons readily flow but holes hardly flow can be expected. Actually, as shown in FIG. 64, the value of the flowing current largely changes between a case wherein a positive voltage is applied from the drain electrode 10608 to the gate electrode 10603 and a case wherein a negative voltage is applied. In discriminating the state of the metal oxide layer 10604, this has a large effect to increase the signal-to-noise ratio (S/N ratio) and facilitate state discrimination. This is the effect of use of the insulating layers 10605 and 10606.

It was found that when the above-described "low resistance mode" and "high resistance mode" shown in FIG. 64 are applied, the element shown in FIG. 106 can be used as a nonvolatile nondestructive 3-terminal element. More specifically, the OFF state wherein the current between the source and drain hardly flows is set by applying a positive voltage to the gate electrode 10603 and a negative voltage to the drain electrode 10608 to change the mode from the "low resistance mode" to the "high resistance mode", as indicated by (4) or (5) in FIG. 64.

The ON state wherein the current between the source and drain readily flows is set by applying a negative voltage to the gate electrode 10603 and a positive voltage of 1.6 V or more to the drain electrode 10608 to abruptly flow the current, as indicated by (2) in FIG. 64. With this operation, the mode is changed from the "high resistance mode" to the "low resistance mode", and the ON state is obtained. As described above, when a voltage is applied to the gate electrode 10603 (drain electrode 10608) to set the "high resistance mode" or "low resistance mode", switching between the OFF state and the ON state can be done.

The ON/OFF state between the source and drain controlled in the above-described way can easily be recognized by reading a current value when an appropriate voltage of 0 to 1.6 V is applied between the source and drain. For example, when the mode state of the 3-terminal element shown in FIG. 106 is "off", i.e., "high resistance mode", it can be determined because a current hardly flows when an appropriate voltage of 0.5 to 1.6 V is applied, as indicated by (1) in FIG. 64.

When the mode state of the element shown in FIG. 106 is "on", i.e., "low resistance mode", it can be determined because a current abruptly flows between the source and drain when an appropriate voltage of 1 to 0.6 V is applied, as indicated by (2) in FIG. 64. Since the difference in current value between the "positive high resistance mode" and the "positive low resistance mode", i.e., "off" and "on" is 1,000 times or more, "off" and "on" can easily be determined. Even in the negative voltage range, "off" and "on" can be determined in the voltage range of 0 to −2.6 V.

The above-described ON/OFF state of the 3-terminal element can easily be identified only by checking whether the element shown in FIG. 106 is in the "high resistance mode" or "low resistance mode". In other words, while the 3-terminal element shown in FIG. 106 can hold the two modes, data is held. Even when a voltage is applied to the electrode to check the mode, the held mode does not change, and data is not destroyed. Hence, according to the 3-terminal element element shown in FIG. 106, a nondestructive operation is possible. The 3-terminal element shown in FIG. 106 functions as a 3-terminal element to control ON/OFF between the source and drain since the resistance value of the metal oxide layer 10604 changes depending on the voltage applied between the gate electrode 10603 and the drain electrode 10608 (or source electrode 10607). This element can also be used as an element to control the current.

Even when the source electrode 10607 is set open, the ON state and OFF state can be controlled by applying a gate voltage. In the case wherein the source electrode 10607 is set open, when the read voltage is increased, a current to some extent flows between the source and drain even when a gate voltage is applied to set the OFF state. When the source electrode 10607 is set open, and the gate voltage is applied in this state, the applied voltage selectively acts depending on the region under the drain electrode 10608. As described above, a certain source-drain current is supposed to flow when the read voltage is high. Hence, the source-drain current is supposed to flow through a path formed from the source electrode 10607, the metal oxide layer 10604 in the region under the source electrode 10607, the gate electrode 10603, the metal oxide layer 10604 in the region under the drain electrode 10608, and the drain electrode 10608.

The voltage to operate the 3-terminal element shown in FIG. 106 is maximized when a gate voltage to set the "positive low resistance mode" is applied. However, the voltage is about 1.6 V at most, and the power consumption is very low, as shown in FIG. 64. The low power consumption is very advantageous for devices. Devices using a 3-terminal element, e.g., not only mobile communication devices, digital general-purpose devices, digital image sensing devices, notebook personal computers, and PDAs (Personal Digital Appliances) but also all computers, personal computers, workstations, office computers, mainframes, communication units, and multifunction apparatuses can reduce the power consumption. The 3-terminal element shown in FIG. 106 can also hold the ON or OFF state for 10 years.

The basic idea of the 3-terminal element shown in FIG. 106 is arranging an insulating layer in contact with a metal oxide layer and sandwiching these layers by the gate electrode and the source and drain electrodes. With this structure, when a predetermined voltage (DC or pulse) is applied to the gate electrode to change the resistance value of the metal oxide layer and switch the stable high resistance mode and low resistance mode, an operation as a 3-terminal element can be implemented consequently.

Figure 108:
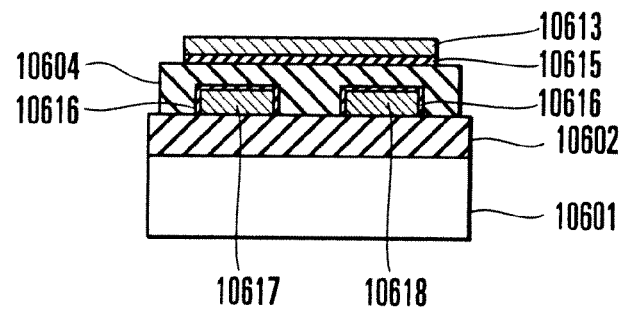
FIG. 108 is a schematic sectional view showing a structure example of still another 3-terminal element according to an embodiment of the present invention.
Figure 109A:
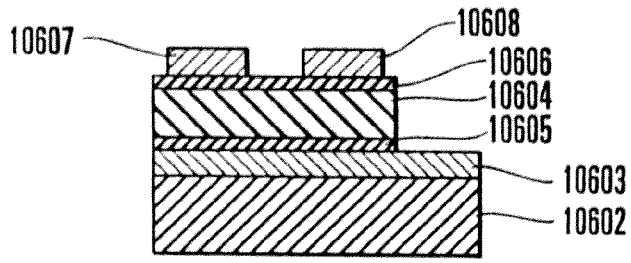
FIGS. 109A and 109B are schematic sectional views showing structure examples of still another 3-terminal element according to an embodiment of the present invention.
Figure 109B:
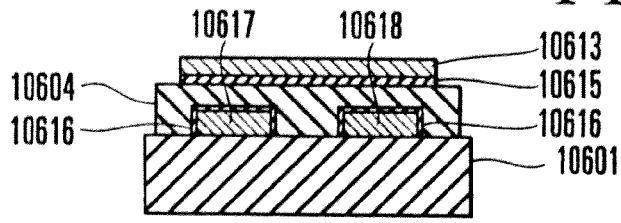

For example, as shown in FIG. 108, a source electrode 10617 and drain electrode 10618 may be formed on the insulating layer 10602 and covered with the metal oxide layer 10604 on an insulating layer 10616, and a gate electrode 10613 may be formed on the metal oxide layer 10604 via an insulating layer 10615. As shown in FIGS. 109A and 109B, an insulating substrate 10601*a* may be used. In this case, the insulating layer 10602 shown in FIG. 106 can be omitted. Alternatively, the structure including the insulating layer 10605, metal oxide layer 10604, insulating layer 10606, source electrode 10607, and drain electrode 10608 shown in FIG. 106 may be arranged on a conductive substrate. In this case, the substrate also serves as a gate electrode. When a metal substrate with high thermal conductivity is used as the conductive substrate, a higher cooling effect can be obtained, and a stable element operation can be expected.

An insulating substrate made of glass or quartz may be used. With this structure, the present invention can be applied to, e.g. a glass substrate easy to process. The metal oxide layer 10604 which has a refractive index of about 2.6 measured at a wavelength of 632.8 nm is optically transparent. For this reason, when a transparent substrate is used, the 3-terminal element of this embodiment can be applied to a display. When the metal oxide layer 10604 is formed so thick in the range of 10 to 200 nm that an interference color is generated, the visual effect of a colored state can be obtained.

Even in the 3-terminal element shown in FIG. 106, a plurality of 3-terminal elements may be arrayed and integrated in a cross-point pattern. The change in resistance value of the metal oxide layer 10604 can also be controlled by a current. The resistance change in the metal oxide layer 10604 can also be controlled by a pulse voltage. Even the 3-terminal element shown in FIG. 106 can implement three states (three values) in the value of the current flowing between the source and drain.

Figure 110:
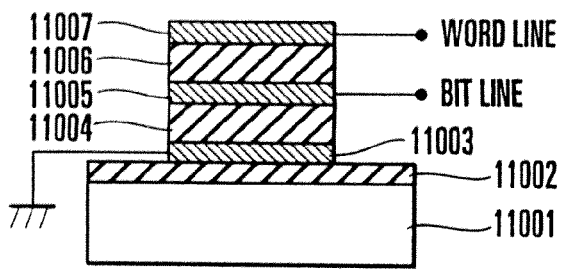
FIG. 110 is a schematic sectional view showing a structure example of a memory element according to an embodiment of the present invention.

Still another embodiment of the present invention will be described below with reference to the accompanying drawings. FIG. 110 is a schematic sectional view showing a structure example of a memory element according to an embodiment of the present invention. The memory element shown in FIG. 110 comprises, on a substrate 11001 made of, e.g., single-crystal silicon, an insulating layer 11002, a gate electrode 11003, a switching layer 11004 made of a metal oxide containing Bi, Ti, and O and having a thickness of about 30 to 200 nm, a bit electrode 11005, a memory layer 11006 made of a metal oxide containing Bi, Ti, and O and having a thickness of about 30 to 200 nm, and a word electrode 11007. In this memory element, the ground electrode 11003, switching layer 11004, memory layer 11006, and word electrode 11007 are connected in series in this order, and the bit electrode 11005 is provided on the switching layer 11004. FIG. 110 shows one memory cell portion connected to each of the intersections between a plurality of bit lines and a plurality of word lines arrayed in, e.g., a matrix.

The substrate 11001 can be made of any one of a semiconductor, insulator, and conductive material such as a metal. When the substrate 11001 is made of an insulating material, the insulating layer 11002 can be omitted. When the substrate 11001 is made of a conductive material, the insulating layer 11002 and ground electrode 11003 can be omitted. In this case, the substrate 11001 made of the conductive material serves as a ground electrode. The ground electrode 11003, bit electrode 11005, and word electrode 11007 need only be made of a transition metal including noble metals such as platinum (Pt), ruthenium (Ru), gold (Au), silver (Ag), and titanium (Ti). The electrodes may be made of a compound such as a nitride, oxide, or fluoride of a transition metal, such as titanium nitride (TiN), hafnium nitride (HfN), strontium ruthenate ($SrRuO_2$), zinc oxide (ZnO), indium tin oxide (ITO), or lanthanum fluoride ($LaF_3$), or a composite film formed by stacking them.

A detailed example of the memory element shown in FIG. 110 will be described. For example, the ground electrode 11003 is a ruthenium film having a thickness of 10 nm. The bit electrode 11005 is a layered film obtained by forming a ruthenium film having a thickness of 10 nm on a titanium (Ti) film having a thickness of about 20 nm. Each of the switching layer 11004 and memory layer 11006 is made of a metal oxide containing Bi and Ti and having a thickness of 40 nm. The word electrode 11007 is made of Au.

The switching layer 11004 and memory layer 11006 are the same as the above-described ferroelectric layer 10604, ferroelectric layer 310604, ferroelectric layer 4705, ferroelectric layer 6205, metal oxide layer 8604, metal oxide layer 9704, metal oxide layer 10204, and metal oxide layer 10604.

According to the memory element using the metal oxide layer (memory layer 11006), two states (ON and OFF) can be held, as will be described below. The characteristics of the metal oxide layer having the above-described structure were investigated by applying a voltage between the bit electrode 11005 and the word electrode 11007. When a voltage from a power supply was applied between the bit electrode 11005 and the word electrode 11007, and a current flowing from the bit electrode 11005 to the word electrode 11007 was measured by an ammeter, the same result as in FIG. 33 was obtained. Referring to FIG. 33, the ordinate represents the value of a current whose positive direction is set to the direction from the bit electrode 11005 to the word electrode 11007.

FIG. 33 and the operation principle of the memory element of the present invention will be described below. The voltage values and current values to be described here are mere examples measured in an actual element. Hence, the phenomenon is not limited to the following numerical values. Other numerical values can also be measured depending on the material and thickness of each film actually used in the element and other conditions.

FIG. 33 shows the hysteresis characteristics of the values of currents which flow in the memory layer 11006 when the voltage applied to the bit electrode 11005 is decreased from 0 in the negative direction, returned to 0, increased in the positive direction, and finally returned to 0 again. When the voltage applied to the bit electrode 11005 is gradually decreased from 0 V in the negative direction, the negative current flowing in the memory layer 11006 is relatively small (about −0.12 mA at −0.1 V).

When the voltage exceeds −0.4 V, the negative current value starts increasing. After the voltage is decreased up to about −1 V, the negative voltage is decreased. The negative current value decreases while keeping the state wherein a negative current having a larger absolute value than before flows. At this time, the current value is about −0.63 mA at −0.1 V. The resistance value is lower by about five times than the previous state, and the current readily flows. When the applied voltage is returned to 0, the current value also becomes 0.

Next, a positive voltage is applied to the bit electrode 11005. In this state, when the applied positive voltage is low, a relatively large positive current flows according to the previous hysteresis (about 0.63 mA at 0.1 V). When the positive voltage is applied up to about 0.7 V, the positive current suddenly decreases. Finally, the applied positive voltage is decreased from −1 V to 0 V, the positive current value also decreases while keeping the hardly current flowing state and returns to 0. At this time, the positive current is about 0.12 mA at 0.1 V.

The above-described hysteresis of the current flowing in the memory layer 11006 can be regarded as being generated because the resistance value of the memory layer 11006 changes depending on the voltage applied to the memory layer 11006. A case wherein a voltage is applied to the word electrode 11007 will be examined. When a positive voltage $V_{W1}$ with a predetermined magnitude or more is applied, the memory layer 11006 changes to a "low resistance mode" (ON state) wherein the current easily flows. When a negative voltage $V_{W0}$ with a predetermined magnitude is applied, the memory layer 11006 changes to a "high resistance mode" (OFF state) wherein the current hardly flows.

The memory layer 11006 has the two stable states, i.e., low resistance mode and high resistance mode. The ON or OFF state remains unless the above-described positive or negative voltage with a predetermined magnitude or more is applied. The value of $V_{W0}$ described above is about −1 V. The value of $V_{W1}$ is about +1 V. The resistance ratio of the high resistance mode to the low resistance mode is about 10 to 100. When the above-described phenomenon that the resistance of the switching layer 11004 and memory layer 11006 is switched (changed) by the voltage is used, a nonvolatile functional element capable of a nondestructive read operation can be implemented by the memory element shown in FIG. 110.

A case wherein the above-described two states are controlled by using a DC voltage will be described next. First, a positive voltage equal to or higher than the low resistance transition voltage $V_{W1}$ is applied to the word electrode 11007 to change the memory layer 11006 to the low resistance mode. An ON state wherein a current readily flows is obtained. The ON state can be read out by measuring a current value $J_{R1}$ between the electrodes at a read voltage $V_R$. It is important to select, as the read voltage $V_R$, such a small value to obtain a sufficient resistance ratio and not to cause state transition (about 0.1 V in the above example). Hence, the read can be done many times without destroying the low resistance mode, i.e., ON state.

On the other hand, when a negative voltage equal to or higher than the high resistance transition voltage $V_{W0}$ is applied to the word electrode 11007, the memory layer 11006 changes to the high resistance mode, i.e., OFF state wherein a current hardly flows between the electrodes. The OFF state can also be read out by measuring a current value $J_{R0}$ between the electrodes at the read voltage $V_R$ ($J_{R1}/J_{R0} \approx 10$ to 100). When the electrodes are not energized, the memory layer 11006 has nonvolatility to hold each state. Except in the write and read, no voltage need be applied.

The above-described characteristics with two states can also apply to the switching layer 11004. The operation of the memory element shown in FIG. 110, which has the switching layer 11004 and memory layer 11006, will be described below. The read operation will be described first. In the initial state, the switching layers 11004 of all memory cells are set in the high resistance state. In this state, the word electrode 11007 (word line) is opened, and an electrical signal to change the switching layer 11004 of a corresponding memory cell to the low resistance mode is applied to the bit electrode 11005 (corresponding bit line) to turn on the switching layer 11004 serving as a switch. Next, the bit electrode 11005 (bit line) is opened, and a read voltage is applied to the word electrode 11007 (word line). When the resistance value of the memory layer 11006 is measured in this state, the data is read out. Finally, the word electrode 11007 (word line) is opened, and an electrical signal to change the switching layer 11004 to the high resistance mode is applied to the bit electrode 11005 to turn off the switching layer 11004 serving as a switch.

The write operation will be described next. An electrical signal to change the memory layer 11006 to the high resistance mode or low resistance mode is applied to the word line and bit line corresponding to a memory cell as a write target. The signal applied to the bit line side at this time corresponds to a voltage not to change the resistance state of the switching layer 11004. With this operation, the memory layer 11006 of the memory cell (memory element) as a write target is changed to the desired high resistance mode or low resistance mode, thereby writing data.

Figure 111:
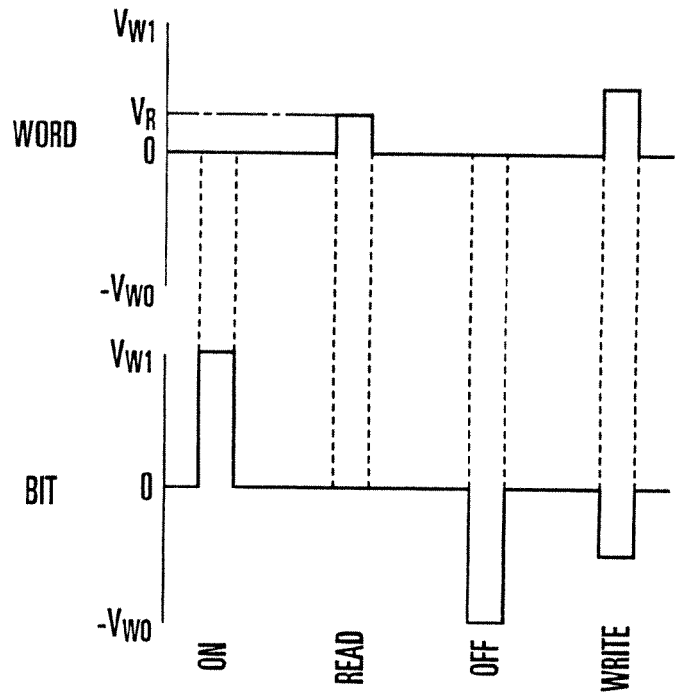
FIG. 111 is a timing chart showing read and write operations.

The above-described read and write operations are executed in accordance with, e.g., the flow shown in FIG. 111. First, the word electrode 11007 is opened, and the low resistance transition voltage $V_{W1}$ is applied to the bit electrode 11005 to change the switching layer 11004 of the memory element to the "ON" state, i.e., readable state. Next, when the bit electrode is opened, and the read voltage $V_R$ is applied to the word electrode 11007, the state of the memory layer 11006 can be read out. After that, the word electrode 11007 is opened, and the high resistance transition voltage $V_{W0}$ is applied to the bit electrode 11005 to change the switching layer 11004 of the memory element to the "OFF" state, i.e., unreadable state.

After that, when a write word signal having a voltage about ½ the low resistance transition voltage $V_{W1}$ is applied to the word electrode 11007, and a write bit signal having a voltage about ½ the low resistance transition voltage $V_{W1}$ and a polarity opposite to the above-described signal is applied to the bit electrode 11005, a "write state" of "1" is obtained. When a signal is applied to the word electrode 11007 and bit electrode 11005, as described above, a voltage equal to the low resistance transition voltage $V_{W1}$ is applied to the memory layer 11006. The memory layer 11006 is set in the low resistance mode. Hence, "1" is written in this "write state". To the contrary, when a write word signal having a voltage about ½ the high resistance transition voltage $V_{W0}$ is applied to the word electrode 11007, and a write bit signal having a voltage about ½ the high resistance transition voltage $V_{W0}$ and a polarity opposite to the above-described signal is applied to the bit electrode 11005, the memory layer 11006 is set in a "write state" of "0". In either "write state", since only a voltage about ½ each transition voltage is applied to the switching layer 11004, the resistance state does not change.

As described above, according to the memory element shown in FIG. 110, the "ON" state and "OFF" state of the memory cell are switched by using the switching layer 11004. When the switching layer 11004 is set in the "OFF" state independently of the resistance state of the memory layer 11006, the leakage current (interference current) from an unselected memory cell can be suppressed. According to the element shown in FIG. 110, the above-described switching between "ON" and "OFF" is done by the switching layer 11004 made of a metal oxide, like the memory layer 11006. Since no element made of another material such as a MOS transistor using a semiconductor such as silicon need be used, materials applicable to the substrate 11001 are not limited.

In the above-described embodiment, the applied gate voltage is a DC voltage. However, the same effect can be obtained even by applying a pulse voltage having appropriate width and magnitude. As for the ON or OFF state holding time of the memory element shown in FIG. 110, the element has a holding time of at least 1,000 min, like the above-described elements.

An example of a method of manufacturing the memory element shown in FIG. 110 will be described next. A method of forming each thin film by using ECR plasma sputtering will be described below. However, the present invention is not limited to this, and any other film formation technique or method can be used, as a matter of course.

Figure 112A:
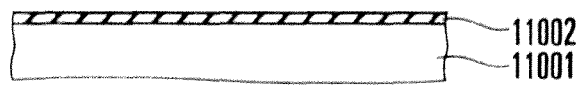
FIGS. 112A to 112F are views for explaining steps in manufacturing the memory element shown in FIG. 110.

As shown in FIG. 112A, the p-type silicon substrate 11001 having a plane orientation of (100) on the principal plane and a resistivity of 1 to 2 Ωcm is prepared. The surface of the substrate 11001 is cleaned by a solution mixture of sulfuric acid and a hydrogen peroxide solution, pure water, and a hydrogen fluoride solution and dried. The insulating layer 11002 is formed on the cleaned and dried substrate 11001. In forming the insulating layer 11002, e.g., an ECR sputtering apparatus and pure silicon (Si) as a target are used. The insulating layer 11002 in a metal mode by Si—O molecules is formed on the silicon substrate 11001 to a thickness to just cover its surface by ECR sputtering using argon (Ar) as a plasma gas and oxygen gas.

For example, Ar gas is supplied at a flow rate of 20 sccm into a plasma production chamber whose internal pressure is set on the order of $10^{-5}$ Pa. The internal pressure is set to about $10^{-3}$ to $10^{-2}$ Pa. A magnetic field of 0.0875 T and a microwave of 2.45 GHz (about 500 W) are supplied to set the electron cyclotron resonance condition, thereby producing Ar plasma in the plasma production chamber. Note that sccm is the unit of flow rate and indicates that a fluid at 0° C. and 1 atmospheric pressure flows 1 cm$^3$ in 1 min. T (tesla) is the unit of magnetic flux density, and 1 T=10,000 gauss.

The plasma produced by the above-described method is output from the plasma production chamber to the process chamber side by the divergent magnetic field of the magnetic coil. In addition, a high-frequency power of 13.56 MHz (e.g., 500 W) is supplied from a high-frequency power supply to the silicon target placed at the outlet of the plasma production chamber. When Ar ions collide against the silicon target, a sputtering phenomenon occurs to sputter Si particles. The Si particles sputtered from the silicon target reach the surface of the silicon substrate 11001 together with the plasma output from the plasma production chamber and the oxygen gas which is supplied and activated by the plasma and are oxidized to silicon dioxide by the activated oxygen. With the above process, the insulating layer 11002 made of silicon dioxide and having a thickness of, e.g., about 100 nm can be formed on the substrate 11001 (FIG. 112A).

The insulating layer 11002 ensures insulation to prevent a voltage from leaking to the substrate 11001 and influencing desired electrical characteristics when a voltage is applied between the electrodes to be formed later. For example, a silicon oxide film formed by oxidizing the surface of the silicon substrate by thermal oxidation may be used as the insulating layer 11002. The insulating layer 11002 may be made of any other insulating material except silicon oxide if the insulating properties can be ensured. The thickness of the insulating layer 11002 need not always be 100 nm and may be smaller or larger. In the above-described formation of the insulating layer 11002 by ECR sputtering, the substrate 11001 is not heated. However, the film may be formed while heating the substrate 11001.

Figure 112B:
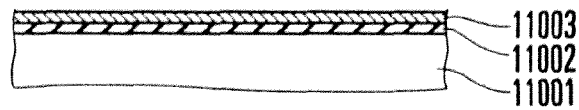

After the insulating layer 11002 is formed in the above-described manner, a ruthenium film is formed on the insulating layer 11002 by similar ECR sputtering using pure ruthenium (Ru) as a target, thereby forming the ground electrode 11003, as shown in FIG. 112B. Formation of the Ru film will be described in detail. In an ECR sputtering apparatus using a Ru target, for example, the silicon substrate with the insulating layer formed on it is heated to 400° C. Ar gas as a rare gas is supplied into the plasma production chamber at a flow rate of, e.g., 7 sccm. In addition, Xe gas is supplied at a flow rate of, e.g., 5 sccm to set the internal pressure of the plasma production chamber to on the order of, e.g., $10^{-2}$ to $10^{-3}$ Pa.

The magnetic field of the electron cyclotron resonance condition is given to the plasma production chamber. Then, a microwave of 2.45 GHz (about 500 W) is supplied into the plasma production chamber to produce ECR plasma of Ar and Xe in it. The produced ECR plasma is output from the plasma production chamber to the process chamber side by the divergent magnetic field of the magnetic coil. In addition, a high-frequency power of 13.56 MHz (e.g., 500 W) is supplied to the ruthenium target placed at the outlet of the plasma production chamber. The sputtering phenomenon occurs to sputter Ru particles from the ruthenium target. The Ru particles sputtered from the ruthenium target reach the surface of the insulating layer 11002 on the substrate 11001 and are deposited.

With the above process, the ground electrode 11003 having a thickness of, e.g., about 10 nm can be formed on the insulating layer 11002 (FIG. 112B). The ground electrode 11003 enables voltage application to the switching layer 11004 when a voltage is applied to the bit electrode 11005 to be formed later. The ground electrode 11003 may be made of any other material except ruthenium if the conductivity can be ensured. The ground electrode 11003 may be made of, e.g., platinum. A platinum film formed on silicon dioxide readily peels off, as is known. To prevent this, a layered structure is formed by inserting a titanium layer, titanium nitride layer, or ruthenium layer under the platinum layer. The thickness of the ground electrode 11003 need not always be 10 nm and may be smaller or larger.

As described above, in forming the Ru film by ECR sputtering, the substrate 11001 is heated to 400° C. However, the substrate need not always be heated. However, if the substrate is not heated, the adhesion of ruthenium to silicon dioxide becomes low, and the film may peel off. To prevent peeling, the film is formed preferably while heating the substrate.

Figure 112C:
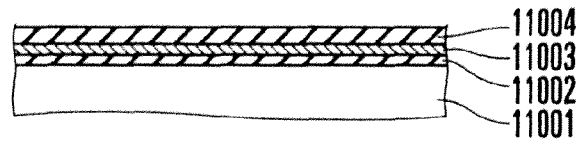

After the ground electrode 11003 is formed in the above-described manner, the switching layer 11004 is formed on the ground electrode 11003 to a thickness to just cover its surface, as shown in FIG. 112C, by ECR sputtering using argon (Ar) as a plasma gas and oxygen gas and a target formed from an oxide sintered body (Bi—Ti—O) in which the ratio of Bi to Ti is 4:3.

Formation of the switching layer 11004 will be described in detail. The substrate 11001 is heated to 300° C. to 700° C. Ar gas as a rare gas is supplied into the plasma production chamber at a flow rate of, e.g., 20 sccm to set the pressure on the order of, e.g., $10^{-3}$ to $10^{-2}$ Pa. In this state, the magnetic field of the electron cyclotron resonance condition is given to the plasma production chamber. Then, a microwave of 2.45 GHz (about 500 W) is supplied into the plasma production chamber to produce ECR plasma in it.

The produced ECR plasma is output from the plasma production chamber to the process chamber side by the divergent magnetic field of the magnetic coil. In addition, a high-frequency power of 13.56 MHz (e.g., 500 W) is supplied to the sintered body target placed at the outlet of the plasma production chamber. When Ar particles collide against the sintered body target, the sputtering phenomenon occurs to sputter Bi particles and Ti particles.

The Bi particles and Ti particles sputtered from the sintered body target reach the surface of the heated ground electrode 11003 together with the ECR plasma output from the plasma production chamber and the oxygen gas activated by the output ECR plasma and are oxidized by the activated oxygen. The oxygen ($O_2$) gas serving as a reactive gas is supplied at a flow rate of, e.g., 1 sccm separately from the Ar gas, as will be described later. Although the sintered body target contains oxygen, any shortage of oxygen in the deposited film can be prevented by supplying oxygen. With the above-described film formation by ECR sputtering, the switching layer 11004 having a thickness of, e.g., about 40 nm can be formed (FIG. 112C).

The film quality may be improved by irradiating the formed switching layer 11004 with ECR plasma of an inert gas and a reactive gas. As the reactive gas, not oxygen gas but nitrogen gas, fluorine gas, or hydrogen gas can be used. The film quality improvement can also be applied to formation of the insulating layer 11002. The switching layer 11004 may be formed at a low substrate temperature of 300° C. or less and then annealed (heat-treated) in an appropriate gas atmosphere such as oxygen atmosphere to greatly improve the properties of the film.

Figure 112D:
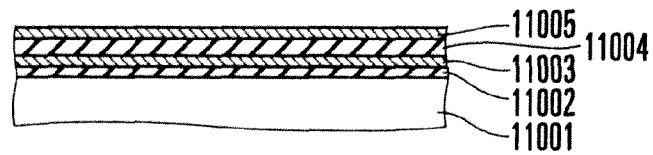
Figure 112E:
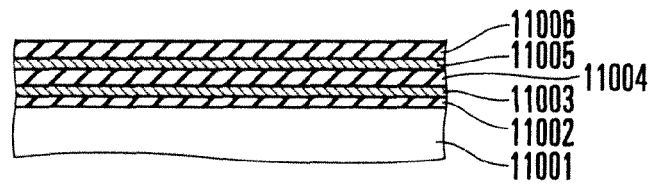
Figure 112F:
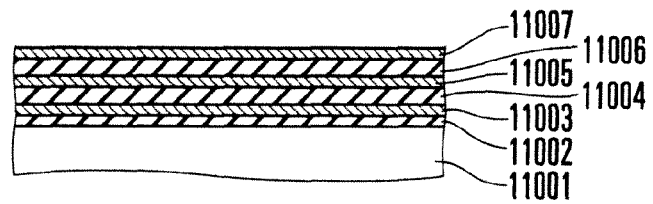

After the switching layer 11004 is formed in the above-described manner, a Ti film having a thickness of about 20 nm is formed by ECR sputtering. Next, a ruthenium film having a thickness of about 10 nm is formed again by the same ECR sputtering as described above using pure ruthenium (Ru) as a target, thereby forming the bit electrode 11005 having a layered structure on the switching layer 11004, as shown in FIG. 112D. Formation of the ruthenium film is the same as the above-described formation of the ground electrode 11003. Next, the memory layer 11006 is formed on the bit electrode 11005 to a thickness to just cover its surface, as shown in FIG. 112E, by ECR sputtering using argon (Ar) as a plasma gas and oxygen gas and a target formed from an oxide sintered body (Bi—Ti—O) in which the ratio of Bi to Ti is 4:3. Formation of the memory layer 11006 is the same as the above-described formation of the switching layer 11004.

After the memory layer 11006 is formed in the above-described way, the word electrode 11007 made of Au is formed on the memory layer 11006, thereby obtaining the memory element shown in FIG. 110. The word electrode 11007 can be formed by gold deposition by resistance heating vacuum deposition. The word electrode 11007 may be made of another metal material or conductive material such as Ru, Pt, or TiN. When Pt is used, the adhesion is poor, and the film may peel off. Hence, a structure such as Ti—Pt—Au that hardly peels off needs to be employed. The switching layer 11004, bit electrode 11005, memory layer 11006, and word electrode 11007 are formed into a memory cell structure by forming a layered structure thereof and patterning it by well-known photolithography and etching.

The above-described layer formation by ECR sputtering is done by using an ECR sputtering apparatus shown in FIG. 112.

Figure 113A:
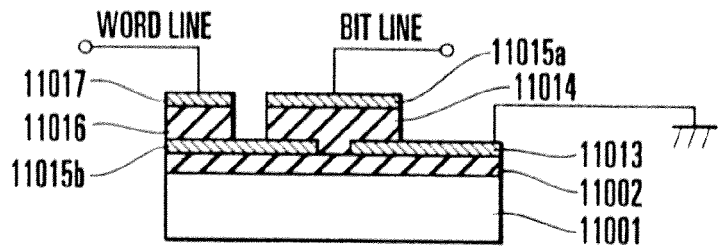
FIGS. 113A and 113B are schematic sectional views showing structure examples of another memory element according to an embodiment of the present invention.

The memory element according to this embodiment is not limited to the structure example shown in FIG. 110. For example, as shown in FIG. 113A, a switching layer and memory layer 11016 may be arrayed in the in-plane direction of the substrate 11001 in one memory cell. In the memory element shown in FIG. 113A, a ground electrode 11013 and a connection electrode 11015b spaced apart from it are arranged on the insulating layer 11002. The switching layer 11014 is formed across the ground electrode 11013 and connection electrode 11015b. The memory layer 11016 is formed in contact with the connection electrode 11015b. A bit electrode 11015a is formed on the switching layer 11014. A word electrode 11017 is formed on the memory layer 11016.

As described above, the connection electrode 11015*b* connected to the surface of the switching layer 11014 in the first direction is newly provided. The connection electrode 11015*b* is connected to the first-direction surface of the memory layer 11016. The ground electrode 11013 is connected to the first-direction surface of the switching layer 11014 while being isolated from the connection electrode 11015*b*. The bit electrode 11015*a* is connected to the surface of the switching layer 11014 in the second direction different from the first direction. The word electrode 11017 is connected to the second-direction surface of the memory layer 11016. Even in this structure, the ground electrode 11013, switching layer 11014, memory layer 11016, and word electrode 11017 are connected in series in this order, like the element shown in FIG. 110. Hence, the components may be reversed in the vertical direction on the substrate 11001 on the drawing surface of FIG. 113A.

An operation example of the memory element shown in FIG. 113A will be described. In the read, the switching layer 11014 is set in a high resistance "OFF" state. In this initial state, the connection electrode 11015*b* is grounded, and a low resistance transition voltage (e.g., pulse voltage) is applied to the bit electrode 11015*a* of a corresponding memory cell to turn on the switching layer 11014. Next, the connection electrode 11015*b* and bit electrode 11015*a* (corresponding bit line) are opened. A read voltage is applied to the word electrode 11017 (corresponding word line). When the resistance value of the memory layer 11016 is measured, data is read out. Finally, the connection electrode 11015*b* is grounded, and an electrical signal (e.g., pulse voltage) to change the switching layer 11014 to the high resistance mode is applied to the bit electrode 11015*a* to turn off the switching layer 11014 serving as a switch.

In the write operation of the memory element shown in FIG. 113A, the connection electrode 11015*b* is grounded, and a write voltage is applied to a word line corresponding to the memory cell as a write target. For example, to set a "write state" of "1", the low resistance transition voltage is applied to the word electrode 11017. To set a "write state" of "0", the high resistance transition voltage is applied to the word electrode 11017.

Figure 113B:
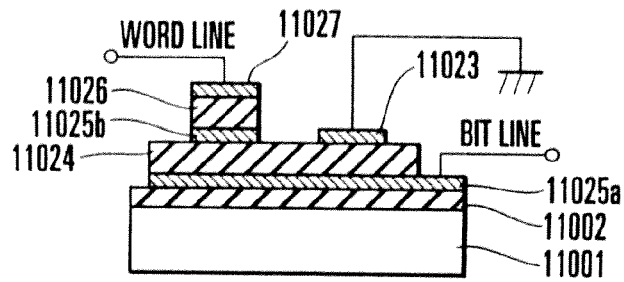

The memory element of the present invention may have the structure shown in FIG. 113B. In the memory element shown in FIG. 113B, a bit electrode 11025*a* is arranged on the insulating layer 11002. A switching layer 11024 is formed on the bit electrode 11025*a*. A ground electrode 11023 and a connection electrode 11025*b* spaced part from it are arranged on the switching layer 11024. A memory layer 11026 is formed on the connection electrode 11025*b*. A word electrode 11027 is formed on the memory layer 11026.

As described above, the connection electrode 11025*b* connected to the surface of the switching layer 11024 in the first direction is newly provided. The connection electrode 11025*b* is connected to the surface of the memory layer 11026 in the second direction different from the first direction. The ground electrode 11023 is connected to the first-direction surface of the switching layer 11024. The bit electrode 11025*a* is connected to the second-direction surface of the switching layer 11024. The word electrode 11027 is connected to the first-direction surface of the memory layer 11026. Even in this structure, the ground electrode 11023, switching layer 11024, memory layer 11026, and word electrode 11027 are connected in series in this order, like the element shown in FIG. 110. Hence, the components may be reversed in the vertical direction on the substrate 11001 on the drawing surface of FIG. 113B.

Figure 114A:
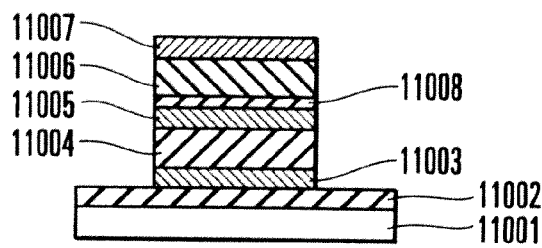
FIGS. 114A to 114C are schematic sectional views showing structure examples of another memory element according to an embodiment of the present invention.
Figure 114B:
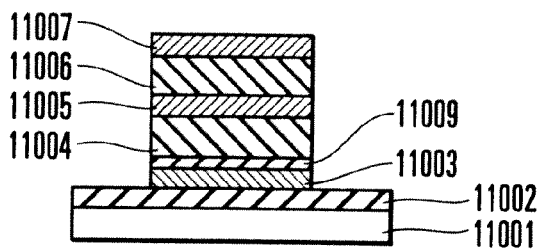
Figure 114C:
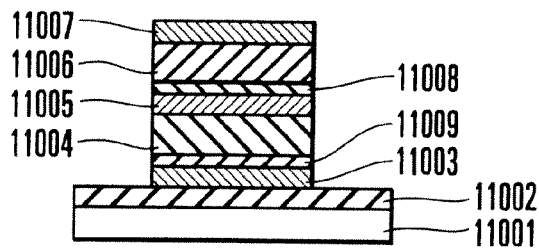
Figure 115A:
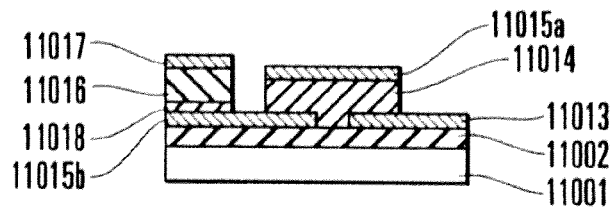
FIGS. 115A to 115F are schematic sectional views showing structure examples of another memory element according to an embodiment of the present invention.
Figure 115B:
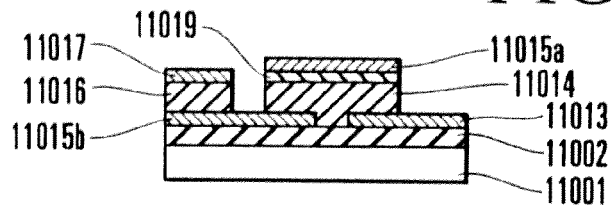
Figure 115C:
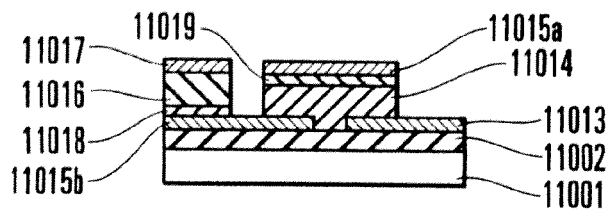
Figure 115D:
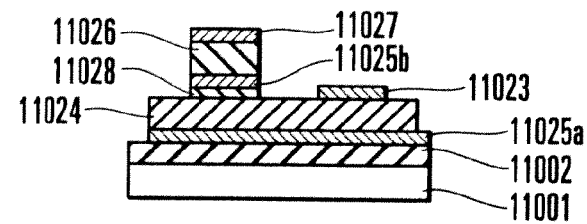
Figure 115E:
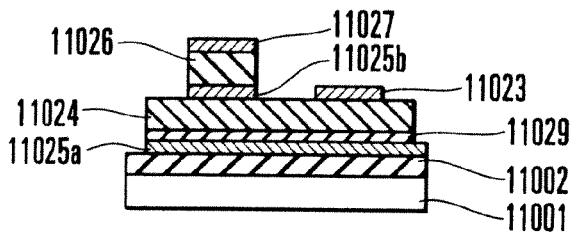
Figure 115F:
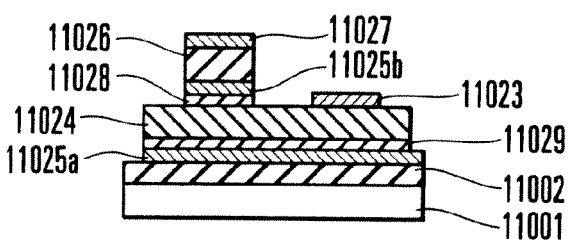

The memory element of the present invention may have an insulating layer between the electrode and the metal oxide layer, as shown in FIG. 114. The memory element shown in FIG. 114A comprises an insulating layer 11008 between the bit electrode 11005 and the memory layer 11006. The memory element shown in FIG. 114B comprises an insulating layer 11009 between the ground electrode 11003 and the switching layer 11004. The memory element shown in FIG. 114C comprises both the insulating layers 11008 and 11009.

In applying a voltage from the insulating layer 11008 or 11009 to memory layer 11006 or switching layer 11004, the voltage applied to each layer can be controlled. When an insulating layer is formed, and the switching layer 11004 or memory layer 11006 is formed on it, the switching layer 11004 or memory layer 11006 can be formed without degrading the morphology of the surface of the underlying metal film or the surface of the metal oxide layer in the above-described formation by ECR sputtering. For example, if the underlying layer is made of a metal material which is readily oxidized, the surface of the underlying layer may be partially oxidized in formation of the switching layer 11004, resulting in degradation in morphology. However, when an insulating layer is inserted, the switching layer 11004 can be formed while keeping the good surface morphology of the underlying layer. Hence, the switching layer 11004 with higher quality can be obtained.

As shown in FIG. 115, an insulating layer 11018, insulating layer 11019, insulating layer 11028, and insulating layer 11029 may be provided. The memory element shown in FIG. 115A comprises the insulating layer 11018 between the connection electrode 11015*b* and the memory layer 11016. The memory element shown in FIG. 115B comprises the insulating layer 11019 between the switching layer 11014 and the bit electrode 11015*a*. The memory element shown in FIG. 115C comprises the insulating layer 11018 between the connection electrode 11015*b* and the memory layer 11016 and the insulating layer 11019 between the switching layer 11014 and the bit electrode 11015*a*. The memory element shown in FIG. 115D comprises the insulating layer 11028 between the switching layer 11024 and the connection electrode 11025*b*. The memory element shown in FIG. 115E comprises the insulating layer 11029 between the bit electrode 11025*a* and the switching layer 11024. The memory element shown in FIG. 115F comprises the insulating layer 11028 between the switching layer 11024 and the connection electrode 11025*b* and the insulating layer 11029 between the bit electrode 11025*a* and the switching layer 11024.

FIGS. 114 and 115 show examples of a form including an insulating layer, and the present invention is not limited to those. The above-described insulating layer need only be provided in contact with the switching layer and memory layer. The insulating layer may be provided in contact with either the surface of one of the switching layer and memory layer or the surfaces of both the switching layer and memory layer. The insulating layer need only be provided between the metal oxide layer of the switching layer or memory layer and one of electrodes connected to it.

As the metal oxide layer of the switching layer 11004 or memory layer 11006 becomes thick, the current flows more hardly, and the resistance increases. When memory element is implemented by using a change in resistance value, the resistance value of in each of the low resistance mode and high resistance mode is important. For example, when the metal oxide layer becomes thick, the resistance value in the low resistance mode increases. Since it is difficult to ensure a high S/N ratio, the ON or OFF state is hard to determine. On the other hand, when the metal oxide layer becomes thin, and the leakage current is dominant, the ON or OFF state can hardly be held, and the resistance value in the high resistance mode decreases. It is therefore difficult to ensure a high S/N ratio.

Hence, the metal oxide layer preferably has an optimum thickness. For example, when the problem of leakage current is taken into consideration, the metal oxide layer need only have a thickness of at least 10 nm. When the resistance value in the low resistance mode is taken into consideration, the metal oxide layer is preferably thinner than 300 nm. In experiments conducted by the present inventors, the operation of the memory element was confirmed when the thickness of the metal oxide layer was 30 to 200 nm.

According to the memory element shown in FIG. 110, a multilevel operation is also possible. For example, in the current-voltage characteristic of the memory layer 11006 when a voltage is applied between the bit electrode 11005 (and the word electrode 11007), when the applied voltage is changed, the low resistance mode changes to a different low resistance state, as shown in FIG. 116. In FIG. 116, the current value at the read voltage shown in FIG. 116 changes between the low resistance mode after a voltage up to −0.5 V is applied, the low resistance mode after a voltage up to −1.0 V is applied, and the low resistance mode after a voltage up to −1.5 V is applied. These states can be read out by applying a read voltage between the electrodes and measuring a current flowing between the electrodes. Three states (three values) "0", "1", and "2" can be implemented in correspondence with the inter-electrode currents obtained by a predetermined read voltage.

According to the element shown in FIG. 110, a multilevel state can be implemented by the difference in pulse voltage value. As shown in FIG. 117, every time a predetermined pulse voltage with a predetermined pulse width is applied a predetermined number of times, the current value between the electrodes is read out at a read voltage of 0.2 V at a point indicated by a triangle. Then, as shown in FIG. 118, three states (three values) "0", "1", and "2" are obtained. In this example, the memory is reset by the state "2".

For example, when the insulating layer 11008 is provided between the bit electrode 11005 and the memory layer 11006, as shown in FIG. 114A, the current-voltage characteristic of the memory layer 11006 is changed as shown in FIG. 46 by changing the voltage applied to the word electrode 11007. In this case, for example, when the read voltage is about 0.5 V, ternary states can be implemented.

Figure 119A:
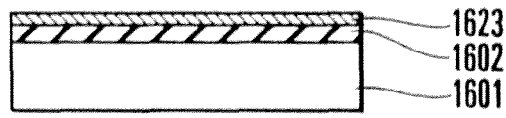
Figure 119B:
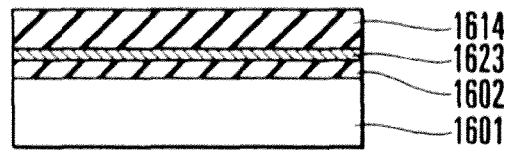
Figure 119C:
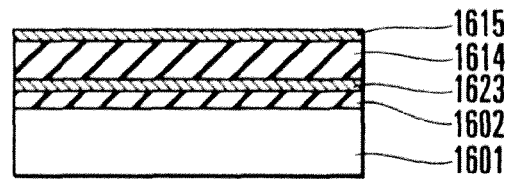

In many cases, a plurality of elements using a thin film made of a metal oxide as described above are monolithically integrated on a single substrate. When a plurality of elements are integrated in this way, adjacent elements are isolated, as shown in, e.g., FIG. 12D. The element isolation structure is formed in the following way. As shown in FIG. 119A, an insulating layer 1602 is formed on a substrate 1601. A metal film 1623 is formed on the insulating layer 1602. As shown in FIG. 119B, a ferroelectric thin film 1614 is formed on the metal film 1623. As shown in FIG. 119C, a metal film 1615 is formed on the ferroelectric thin film 1614.

Figure 119D:
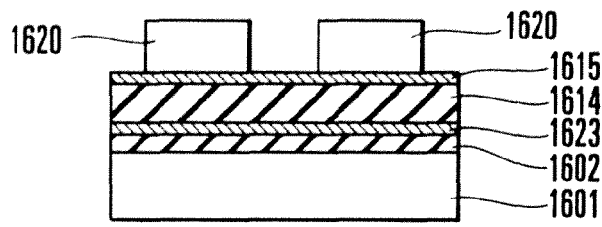
Figure 119E:
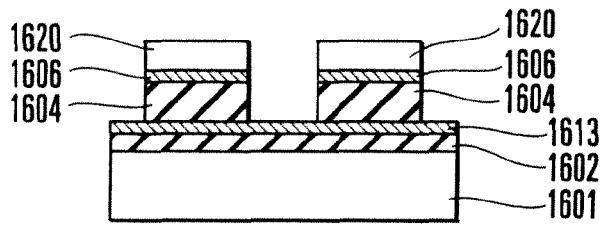
Figure 119F:
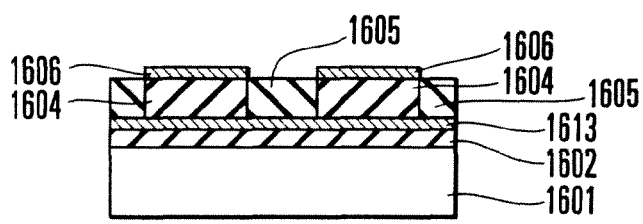

As shown in FIG. 119D, a plurality of mask patterns 1620 are formed on the metal film 1615. The metal film 1615 and ferroelectric thin film 1614 are selectively removed by etching using the mask pattern 1620 as a mask to form a plurality of elements each including a ferroelectric layer 1604 and upper electrode 1606 on a lower electrode layer 1613, as shown in FIG. 119E. After that, the mask patterns 1620 are removed. An insulating material is deposited between the elements to form element isolation insulating layers 1605 between the elements, as shown in FIG. 119F.

As described above, in the conventional element isolation, a thin film serving as a ferroelectric layer is formed, a plurality of element portions are formed by processing the thin film, and insulating layers for element isolation are formed between the elements. Conventionally, to obtain an element isolation structure, a number of thin film formation steps and thin film processing steps are required, resulting in an increase in number of steps. Especially, in the processing step, photolithography and etching are used in general. For this reason, one pattern must be formed using a number of steps.

Unlike the above-described situation, when elements are isolated in a manner to be described below, the element isolation structure can be formed without requiring many steps.

Figure 120:
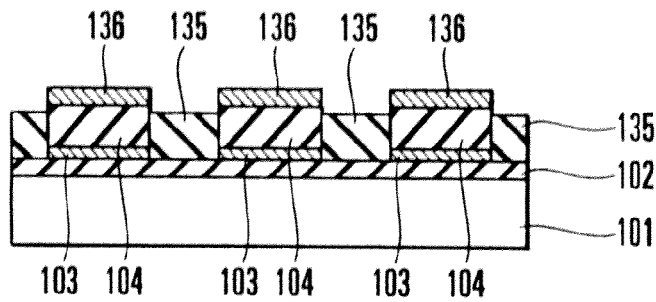

Element isolation will be described below with reference to the accompanying drawings. FIG. 120 is a schematic sectional view showing a structure example of the element isolation structure according to the embodiment of the present invention. As shown in FIG. 120, in the element isolation structure shown in FIG. 120, an insulating layer 102 is provided on a substrate 101, and a plurality of elements each including a lower electrode 103 formed on the insulating layer 102, a ferroelectric layer 104 having a thickness of about 30 to 200 nm, and an upper electrode 136 are isolated by an isolation layer 135. The ferroelectric layer 104 is formed on the lower electrode 103 made of a crystalline material. The isolation layer 135 is formed on the insulating layer 102 made of an amorphous material.

The ferroelectric layer 104 and isolation layer 135 are made of, e.g., Bi, Ti, and O and contain a plurality of microcrystalline grains of $Bi_4Ti_3O_{12}$ crystal having a stoichiometric composition and a grain size of about 3 to 15 nm. The ferroelectric layer 104 also contains column crystal with the stoichiometric composition of $Bi_4Ti_3O_{12}$ in addition to the microcrystalline grains. The isolation layer 135 having the above-described structure has a higher electrical resistance than the ferroelectric layer 104 so that the dielectric isolation for a breakdown voltage is large. On the other hand, the ferroelectric layer 104 has two stable states, i.e., low resistance state and high resistance state, as will be described later. An element using the ferroelectric layer 104 is a functional element to hold two states.

Figure 121A:
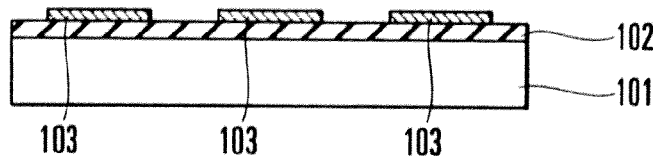

An example of a method of manufacturing the element isolation structure shown in FIG. 120 will be described next. As shown in FIG. 121A, the p-type silicon substrate 101 having a plane orientation of (100) on the principal plane and a resistivity of 1 to 2 Ωcm is prepared. The surface of the substrate 101 is cleaned by a solution mixture of sulfuric acid and a hydrogen peroxide solution, pure water, and a hydrogen fluoride solution and dried. The insulating layer 102 is formed on the cleaned and dried substrate 101. In forming the insulating layer 102, e.g., an ECR sputtering apparatus and pure silicon (Si) as a target are used. ECR sputtering is executed by using argon (Ar) as a plasma gas and oxygen gas. The insulating layer 102 in a metal mode by Si—O molecules is formed on the silicon substrate 101 to a thickness to just cover its surface by ECR sputtering.

For example, Ar gas is supplied at a flow rate of 20 sccm into a plasma production chamber whose internal pressure is set on the order of $10^{-5}$ Pa. The internal pressure is set to about $10^{-3}$ to $10^{-2}$ Pa. A magnetic field of 0.0875 T and a microwave of 2.45 GHz (about 500 W) are supplied to set the electron cyclotron resonance condition, thereby producing Ar plasma in the plasma production chamber. Note that sccm is the unit of flow rate and indicates that a fluid at 0° C. and 1 atmospheric pressure flows 1 cm$^3$ in 1 min. T (tesla) is the unit of magnetic flux density, and 1 T=10,000 gauss.

The plasma produced by the above-described method is output from the plasma production chamber to the process chamber side by the divergent magnetic field of the magnetic coil. In addition, a high-frequency power of 13.56 MHz (e.g., 500 W) is supplied from a high-frequency power supply to the silicon target placed at the outlet of the plasma production chamber. When Ar ions collide against the silicon target, a sputtering phenomenon occurs to sputter Si particles. The Si particles sputtered from the silicon target reach the surface of the silicon substrate 101 together with the plasma output from the plasma production chamber and the oxygen gas which is supplied and activated by the plasma and are oxidized to silicon dioxide by the activated oxygen. With the above process, the insulating layer 102 made of silicon dioxide and having a thickness of, e.g., about 100 nm can be formed on the substrate 101.

The insulating layer 102 ensures insulation to prevent a voltage from leaking to the substrate 101 and influencing desired electrical characteristics when a voltage is applied between the electrodes to be formed later. For example, a silicon oxide film formed by oxidizing the surface of the silicon substrate by thermal oxidation may be used as the insulating layer 102. The insulating layer 102 may be made of any other insulating material except silicon oxide if the insulating properties can be ensured. The thickness of the insulating layer 102 need not always be 100 nm and may be smaller or larger. In the above-described formation of the insulating layer 102 by ECR sputtering, the substrate 101 is not heated. However, the film may be formed while heating the substrate 101.

After the insulating layer 102 is formed in the above-described manner, a ruthenium film is formed on the insulating layer 102 by similar ECR sputtering using pure ruthenium (Ru) as a target. Formation of the Ru film will be described in detail. In an ECR sputtering apparatus using a Ru target, for example, the silicon substrate with the insulating layer formed on it is heated to 400° C. Ar gas as a rare gas is supplied into the plasma production chamber at a flow rate of, e.g., 7 sccm. In addition, Xe gas is supplied at a flow rate of, e.g., 5 sccm to set the internal pressure of the plasma production chamber to on the order of, e.g., $10^{-2}$ to $10^{-3}$ Pa.

The magnetic field of the electron cyclotron resonance condition is given to the plasma production chamber. Then, a microwave of 2.45 GHz (about 500 W) is supplied into the plasma production chamber to produce ECR plasma of Ar and Xe in it. The produced ECR plasma is output from the plasma production chamber to the process chamber side by the divergent magnetic field of the magnetic coil. In addition, a high-frequency power of 13.56 MHz (e.g., 500 W) is supplied to the ruthenium target placed at the outlet of the plasma production chamber. The sputtering phenomenon occurs to sputter Ru particles from the ruthenium target. The Ru particles sputtered from the ruthenium target reach the surface of the insulating layer 102 on the substrate 101 and are deposited.

With the above process, a metal film made of Ru and having a thickness of, e.g., about 10 nm can be formed on the insulating layer 102. When the metal film is patterned by known lithography and etching, the plurality of lower electrodes 103 arranged while spaced apart from each other are formed, as shown in FIG. 121A. When ruthenium is irradiated with oxygen plasma, ozone, or oxygen radicals, a ruthenium oxide (e.g., $RuO_2$ or $RuO_4$) having a high vapor pressure is formed, as is known. When ruthenium is oxidized by irradiation through a mask by using the above nature, selective etching can be done.

The dry etching using oxygen plasma, ozone, or oxygen radicals is an isotropic etching process so that so-called undercuts may be produced in the sectional shape after etching. To avoid this, the ruthenium film may be irradiated with plasma of a gas prepared by adding argon to oxygen. When anisotropy is imparted to etching in this way, a pattern without undercut can be formed.

The lower electrode 103 enables voltage application to the ferroelectric layer 104 when a voltage is applied between the lower electrode 103 and the upper electrode 136 to be formed later. The lower electrode 103 may be made of any other material except ruthenium if the conductivity can be ensured. The lower electrode 103 may be made of, e.g., platinum. A platinum film formed on silicon dioxide readily peels off, as is known. To prevent this, a layered structure is formed by inserting a titanium layer, titanium nitride layer, or ruthenium layer under the platinum layer. Platinum cannot be etched by oxygen plasma, unlike ruthenium. Patterning for electrode formation can be done by using a known lift-off method. The thickness of the lower electrode 103 need not always be 10 nm and may be smaller or larger.

As described above, in forming the Ru film by ECR sputtering, the substrate 101 is heated to 400° C. However, the substrate need not always be heated. However, if the substrate is not heated, the adhesion of ruthenium to silicon dioxide becomes low, and the film may peel off. To prevent peeling, the film is formed preferably while heating the substrate.

Figure 121B:
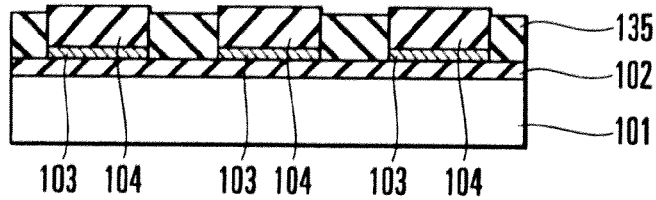

After the lower electrode 103 is formed in the above-described manner, the ferroelectric layer 104 is formed on the lower electrode 103, and the isolation layer 135 is formed on the insulating layer 102, as shown in FIG. 121B, by ECR sputtering using argon (Ar) as a plasma gas and oxygen gas and a target formed from an oxide sintered body (Bi—Ti—O) in which the ratio of Bi to Ti is 4:3. Formation of the ferroelectric layer 104 and isolation layer 135 will be described. The substrate 101 is heated to 400° C. to 450° C. Ar gas as a rare gas is supplied into the plasma production chamber at a flow rate of, e.g., 20 sccm to set the pressure on the order of, e.g., $10^{-3}$ to $10^{-2}$ Pa. In this state, the magnetic field of the electron cyclotron resonance condition is given to the plasma production chamber. Then, a microwave of 2.45 GHz (about 500 W) is supplied into the plasma production chamber to produce ECR plasma in it.

The produced ECR plasma is output from the plasma production chamber to the process chamber side by the divergent magnetic field of the magnetic coil. In addition, a high-frequency power of 13.56 MHz (e.g., 500 W) is supplied to the sintered body target placed at the outlet of the plasma production chamber. When Ar particles collide against the sintered body target, the sputtering phenomenon occurs to sputter Bi particles and Ti particles. The Bi particles and Ti particles sputtered from the sintered body target reach the surfaces of the heated insulating layer 102 and lower electrode 103 together with the ECR plasma output from the plasma production chamber and the oxygen gas activated by the output ECR plasma and are oxidized by the activated oxygen.

The oxygen ($O_2$) gas serving as a reactive gas is supplied at a flow rate of, e.g., 1 sccm separately from the Ar gas, as will be described later. Although the sintered body target contains oxygen, any shortage of oxygen in the deposited film can be prevented by supplying oxygen. With the above-described film formation by ECR sputtering, the ferroelectric layer 104 and isolation layer 135 each having a thickness of, e.g., about 40 can be formed (FIG. 121B). The isolation layer 135 formed on the insulating layer 102 in an amorphous state contains a plurality of microcrystalline grains of $Bi_4Ti_3O_{12}$ crystal having a stoichiometric composition and a grain size of about 3 to 15 nm. The ferroelectric layer 104 formed on the lower electrode 103 in a crystalline state also contains column crystal with the stoichiometric composition of $Bi_4Ti_3O_{12}$ in addition to the microcrystalline grains.

Figure 121C:
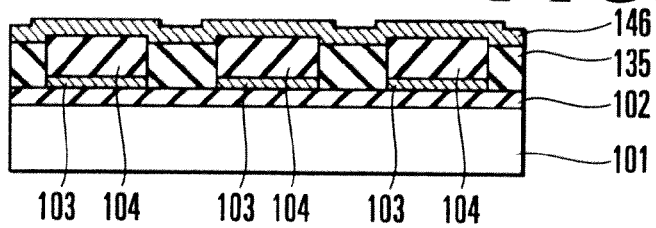
Figure 121D:
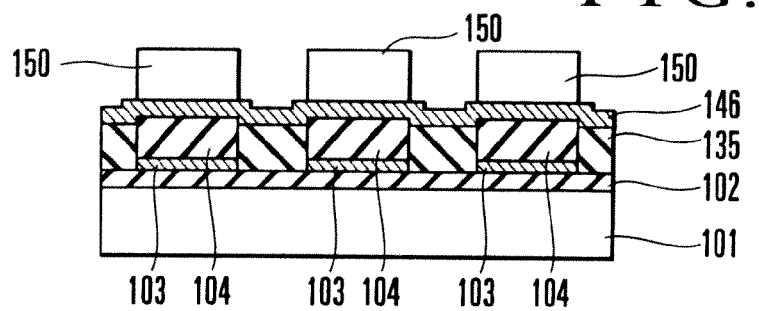
Figure 121E:
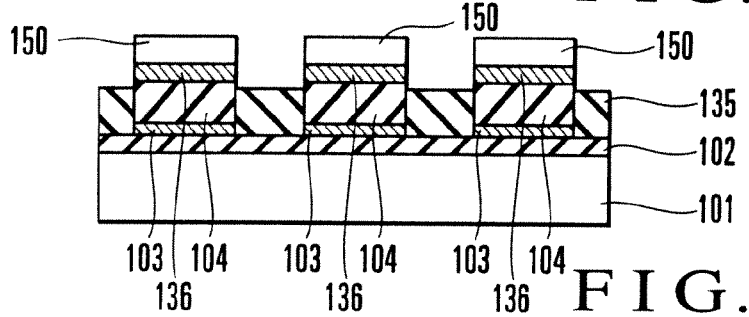

As shown in FIG. 121C, a metal film 146 made of, e.g., Au is formed on the ferroelectric layer 104 and isolation layer 135. As shown in FIG. 121D, resist patterns 150 are formed on portions as prospective elements by well-known lithography. The metal film 146 is patterned by dry etching using the resist patterns 150 as a mask to form the upper electrodes 136 on the ferroelectric layers 104, as shown in FIG. 121E. When the resist patterns 150 are removed then, the element isolation structure shown in FIG. 120 is obtained. The upper electrode 136 may be made of another metal material or conductive material such as Ru, Pt, or TiN. When Pt is used, the adhesion is poor, and the film may peel off. Hence, the upper electrode 136 must be formed as an electrode by forming a structure such as Ti—Pt—Au that hardly peels off and executing a patterning process by photolithography on that structure.

The above-described layer formation by ECR sputtering is done by using an ECR sputtering apparatus shown in FIG. 5.

Figure 122:
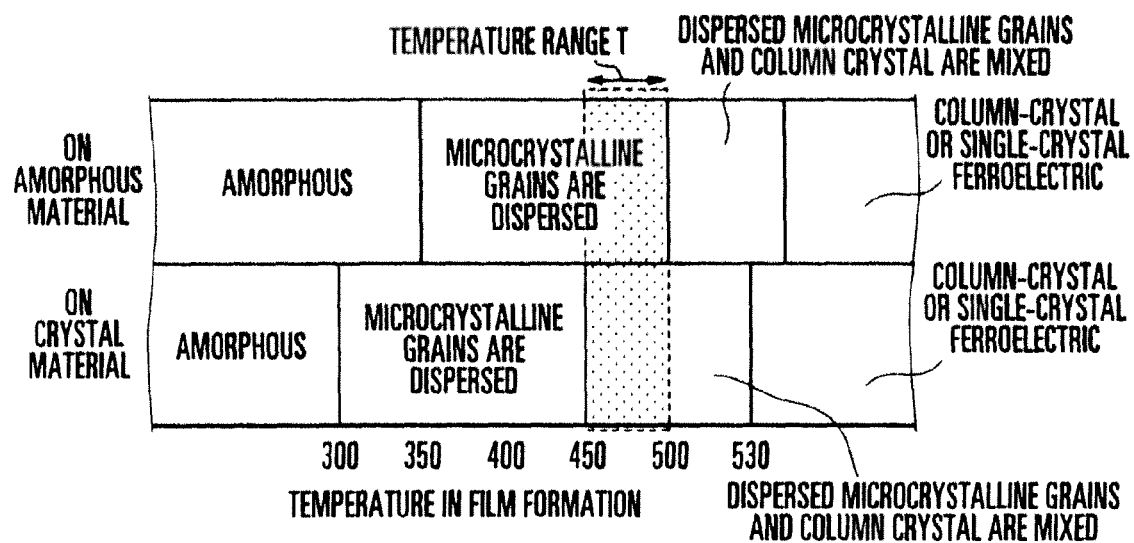

In the film formation condition range wherein microcrystalline grains are observed, as shown in FIGS. 7B and 7B', the base layer is amorphous, or column crystal is observed in it. In either case, the state of the microcrystalline grains does not change. The size of the observed microcrystalline grains is about 3 to 15 nm. In the film formation range wherein the microcrystalline grains are observed, different dependences are exhibited depending on the underlayer condition and temperature condition of the layer to be formed, as shown in FIG. 122. Temperatures to generate states "amorphous", "microcrystalline grains are dispersed", "dispersed microcrystalline grains and column crystal are mixed", and "column-crystal or single-crystal ferroelectric" change between film formation on an amorphous material such as oxide silicon and film formation on a crystal material such as ruthenium.

As shown in FIG. 122, on an amorphous material, an "amorphous" state is obtained under a film formation condition up to 350° C. "Microcrystalline grains are dispersed" under a film formation condition from 350° C. to 500° C. "Dispersed microcrystalline grains and column crystal are mixed" under a film formation condition from 500° C. to 540° C. A "column-crystal or single-crystal ferroelectric" is obtained under a film formation condition of 540° C. or more. On the other hand, on a crystal material, an "amorphous" state is obtained under a film formation condition up to 300° C. "Microcrystalline grains are dispersed" under a film formation condition from 300° C. to 450° C. "Dispersed microcrystalline grains and column crystal are mixed" under a film formation condition from 450° C. to 530° C. A "column-crystal or single-crystal ferroelectric" is obtained under a film formation condition of 530° C. or more.

Hence, when the film formation condition is set to 450° C. to 500° C. in a temperature range T shown in FIG. 122, a film in which "microcrystalline grains are dispersed" is formed on an amorphous material, and a film in which "dispersed microcrystalline grains and column crystal are mixed" is formed on a crystal material.

The film in which "microcrystalline grains are dispersed" and the film in which "dispersed microcrystalline grains and column crystal are mixed" will be described next. A sample element A is prepared by forming a film in which "microcrystalline grains are dispersed" (thickness: about 50 nm) on a lower electrode made of ruthenium at a temperature lower than 450° C. and forming an upper electrode made of gold on the film. A sample element B is prepared by forming a film in which "dispersed microcrystalline grains and column crystal are mixed" (thickness: about 50 nm) on a lower electrode made of ruthenium at a temperature of 450° C. to 500° C. and forming an upper electrode made of gold on the film.

Figure 123:
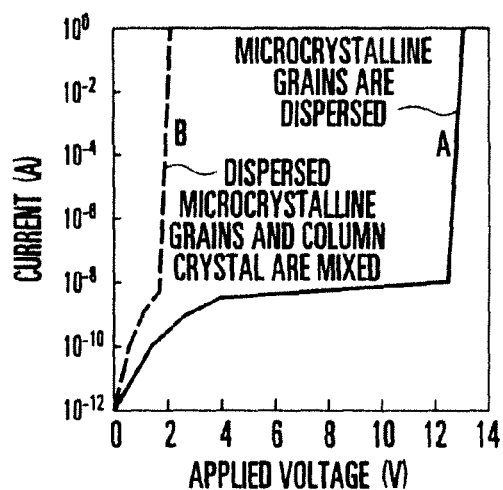

FIG. 123 shows a result obtained when a voltage was applied to the upper electrode and lower electrode in each of the above-described sample elements A and B, and the state of a current flowing between the upper electrode and the lower electrode was measured. As shown in FIG. 123, in the sample element A, even when a voltage of about 10 V is applied, no large current flows. To the contrary, in the sample element B, when a voltage of about 2 V is applied, a large current flows. That is, the dielectric isolation for a breakdown voltage is larger in the film in which "microcrystalline grains are dispersed" than the film in which "dispersed microcrystalline grains and column crystal are mixed".

After the EO process of applying a high voltage in the film formation initial state is executed to flow a current as shown in FIG. 123, these films exhibit a current-voltage characteristic (resistance change characteristic) to repeat the high resistance state and low resistance state in accordance with the applied voltage, as will be described later.

Figure 124:
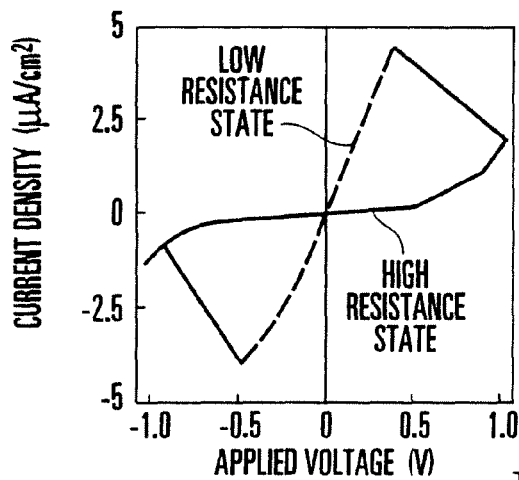

When the film in which "microcrystalline grains are dispersed" and film in which "dispersed microcrystalline grains and column crystal are mixed" undergo the EO process, they exhibit the resistance change characteristic shown in FIG. 124. As shown in FIG. 123, although the film in which "microcrystalline grains are dispersed" requires voltage application of 10 V or more for the EO process, the EO process of the film in which "dispersed microcrystalline grains and column crystal are mixed" can be executed by voltage application of about 2 V. Although the film in which "dispersed microcrystalline grains and column crystal are mixed" can be EO-processed by applying a voltage of about 2 V to obtain the resistance change characteristic, the film in which "microcrystalline grains are dispersed" is not EO-processed by the same voltage application and exhibits no resistance change characteristic.

When the film in which "dispersed microcrystalline grains and column crystal are mixed" is used as the ferroelectric layer 104, and the film in which "microcrystalline grains are dispersed" is used as the isolation layer 135, an element isolation structure can be obtained in which a plurality of elements using the ferroelectric layer 104 with the resistance change characteristic are isolated by the isolation layers 135 having a high resistance. As described above, by changing the underlayer condition, the ferroelectric layer 104 and isolation layer 135 can be formed simultaneously under the same sputtering film formation condition in the same temperature range T.

The above-described resistance change characteristics will be described next. The characteristics were investigated by applying a voltage between the lower electrode 103 and the upper electrode 136. When a voltage from a power supply was applied between the lower electrode 103 and the upper electrode 136 after the above-described EO process, and a current flowing when the voltage was applied was measured by an ammeter, a result shown in FIG. 124 was obtained. Referring to FIG. 124, the ordinate represents the current density obtained by dividing the current value by the area. FIG. 124 and the operation principle of each element isolated by the element isolation structure shown in FIG. 120 will be described below. The voltage values and current values to be described here are mere examples measured in an actual element. Hence, the phenomenon is not limited to the following numerical values. Other numerical values can also be measured depending on the material and thickness of each film actually used in the element and other conditions.

FIG. 124 shows the hysteresis characteristics of the values of currents which flow in the ferroelectric layer 104 when the voltage applied to the upper electrode 136 is increased from 0 in the positive direction, returned to 0, decreased in the negative direction, and finally returned to 0 again. When the voltage applied to the upper electrode 136 is gradually increased from 0 V in the positive direction, the positive current flowing in the ferroelectric layer 104 is relatively small (about 0.4 μA at 0.1 V).

When the voltage exceeds 0.5 V, the positive current value starts abruptly increasing. After the voltage is increased up to about 1 V, the positive voltage is decreased. Even when the voltage decreases from 1 V to about 0.7 V, the positive current value further increases. When the voltage is lower than about 0.7 V, the current value also starts decreasing. At this time, the positive current readily flows as compared to the previous state. The current value is about 4 μA at 0.1 V (10 times the previous current value). When the applied voltage is returned to 0, the current value also becomes 0.

Next, a negative voltage is applied to the upper electrode 136. In this state, when the negative voltage is low, a relatively large negative current flows according to the previous hysteresis. When the applied negative voltage is changed up to about −0.5 V, the negative current suddenly starts decreasing. Even when the applied negative voltage is changed up to about −1 V, the negative current value continuously decreases. Finally, the applied negative voltage is decreased from −1 V to 0 V, the negative current value further decreases together and returns to 0. In this case, the negative current hardly flows and about −0.5 μA at −0.1 V.

The above-described hysteresis of the current flowing in the ferroelectric layer 104 can be regarded as being generated because the resistance value of the ferroelectric layer 104 changes depending on the voltage applied to the upper electrode 136, as described above. When a positive voltage $V_{W1}$ with a predetermined magnitude or more is applied, the ferroelectric layer 104 changes to a "low resistance state" (data "1") wherein the current easily flows. When a negative voltage $V_{W0}$ with a predetermined magnitude is applied, the ferroelectric layer 104 changes to a "high resistance state" (data "0") wherein the current hardly flows.

The ferroelectric layer 104 in the element isolation structure also has the two stable states, i.e., low resistance state and high resistance state. Each state remains unless the above-described positive or negative voltage with a predetermined magnitude or more is applied. The value of $V_{W1}$ is about +1 V. The value of $V_{W0}$ is about −1 V. The resistance ratio of the high resistance state to the low resistance state is about 10 to 100. When the above-described phenomenon that the resistance of the ferroelectric layer 104 is switched by the voltage is used, a nonvolatile functional element capable of a nondestructive read operation can be implemented even in the element isolation structure, like the above-described functional elements.

Figure 125:
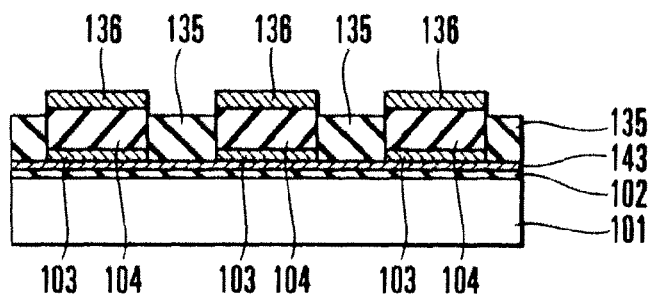

Another element isolation structure according to an embodiment of the present invention will be described next. FIG. 125 is a schematic sectional view showing another structure example of the element isolation structure according to the embodiment of the present invention. In the element isolation structure shown in FIG. 125, an insulating layer 102 is provided on a substrate 101 made of, e.g., single-crystal silicon, and a plurality of elements each including a common electrode layer 113 formed on the insulating layer 102, a lower electrode 103, a ferroelectric layer 104 having a thickness of about 30 to 200 nm, and an upper electrode 136 are isolated by an isolation layer 135.

The ferroelectric layer 104 and isolation layer 135 are made of, e.g., Bi, Ti, and O and contain a plurality of microcrystalline grains of $Bi_4Ti_3O_{12}$ crystal having a stoichiometric composition and a grain size of about 3 to 15 nm. The ferroelectric layer 104 also contains column crystal with the stoichiometric composition of $Bi_4Ti_3O_{12}$ in addition to the microcrystalline grains. The isolation layer 135 having the above-described structure has a higher electrical resistance than the ferroelectric layer 104 so that the dielectric isolation for a breakdown voltage is large. On the other hand, the ferroelectric layer 104 has two stable states, i.e., low resistance state and high resistance state, as will be described later. An element using the ferroelectric layer 104 is a functional element to hold two states. This is the same as in the structure shown in FIG. 120.

The element isolation structure shown in FIG. 125 is different from the element isolation structure shown in FIG. 120 in that the lower electrodes 103 are connected by the common electrode layer 113. In the element isolation structure shown in FIG. 125, the common electrode layer 113 is made of a conductive material in an amorphous state. The common electrode layer 113 is made of, e.g., titanium nitride, zinc oxide, or ITO (Indium Tin Oxide) in an amorphous state. Hence, even in the element isolation structure shown in FIG. 125, the isolation layer 135 is formed on an amorphous layer.

Figure 126A:
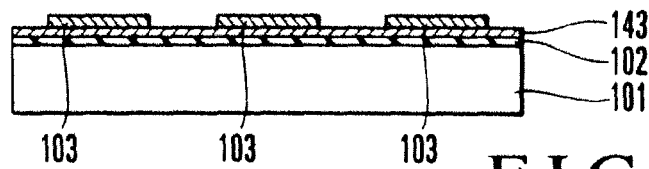

An example of a method of manufacturing the element isolation structure shown in FIG. 125 will be described next. As shown in FIG. 126A, the p-type silicon substrate 101 having a plane orientation of (100) on the principal plane and a resistivity of 1 to 2 Ωcm is prepared. The surface of the substrate 101 is cleaned by a solution mixture of sulfuric acid and a hydrogen peroxide solution, pure water, and a hydrogen fluoride solution and dried. The insulating layer 102 is formed on the cleaned and dried substrate 101. A common electrode layer 143 made of, e.g., titanium nitride is formed on the insulating layer 102. A metal film made of, e.g., Ru and having a thickness of about 10 nm is formed on the common electrode layer 143. When the metal film is patterned by known lithography and etching, the plurality of lower electrodes 103 spaced apart from each other are formed, as shown in FIG. 126A.

Figure 126B:
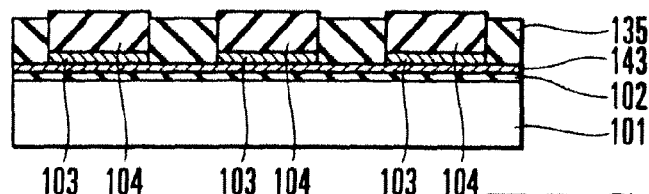

After the lower electrode 103 is formed in the above-described manner, the ferroelectric layer 104 is formed on the lower electrode 103, and the isolation layer 135 is formed on the common electrode layer 143, as shown in FIG. 126B, by ECR sputtering using argon (Ar) as a plasma gas and oxygen gas and a target formed from an oxide sintered body (Bi—Ti—O) in which the ratio of Bi to Ti is 4:3. Formation of the ferroelectric layer 104 and isolation layer 135 will be described. The substrate 101 is heated to 400° C. to 450° C. Ar gas as a rare gas is supplied into the plasma production chamber at a flow rate of, e.g., 20 sccm to set the pressure on the order of, e.g., $10^{-3}$ to $10^{-2}$ Pa. In this state, the magnetic field of the electron cyclotron resonance condition is given to the plasma production chamber. Then, a microwave of 2.45 GHz (about 500 W) is supplied into the plasma production chamber to produce ECR plasma in it.

The produced ECR plasma is output from the plasma production chamber to the process chamber side by the divergent magnetic field of the magnetic coil. In addition, a high-frequency power of 13.56 MHz (e.g., 500 W) is supplied to the sintered body target placed at the outlet of the plasma production chamber. When Ar particles collide against the sintered body target, the sputtering phenomenon occurs to sputter Bi particles and Ti particles. The Bi particles and Ti particles sputtered from the sintered body target reach the surfaces of the heated common electrode layer 143 and lower electrode 103 together with the ECR plasma output from the plasma production chamber and the oxygen gas activated by the output ECR plasma and are oxidized by the activated oxygen.

The oxygen ($O_2$) gas serving as a reactive gas is supplied at a flow rate of, e.g., 1 scam separately from the Ar gas, as will be described later. Although the sintered body target contains oxygen, any shortage of oxygen in the deposited film can be prevented by supplying oxygen. With the above-described film formation by ECR sputtering, the ferroelectric layer 104 and isolation layer 135 each having a thickness of, e.g., about 40 nm can be formed (FIG. 126B). The isolation layer 135 formed on the common electrode layer 143 in an amorphous state contains a plurality of microcrystalline grains of $Bi_4Ti_3O_{12}$ crystal having a stoichiometric composition and a grain size of about 3 to 15 nm. The ferroelectric layer 104 formed on the lower electrode 103 in a crystalline state also contains column crystal with the stoichiometric composition of $Bi_4Ti_3O_{12}$ in addition to the microcrystalline grains.

Figure 126C:
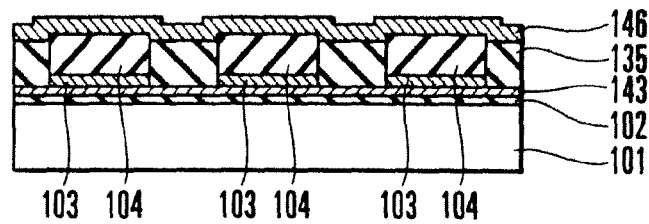
Figure 126D:
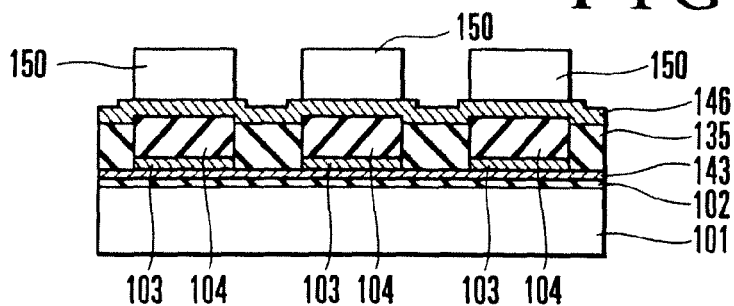
Figure 126E:
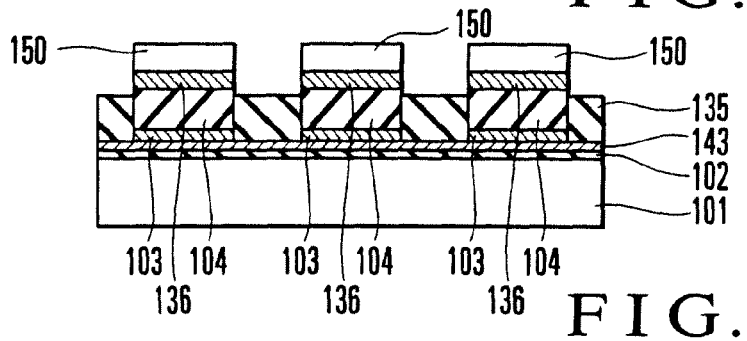
Figure 127:
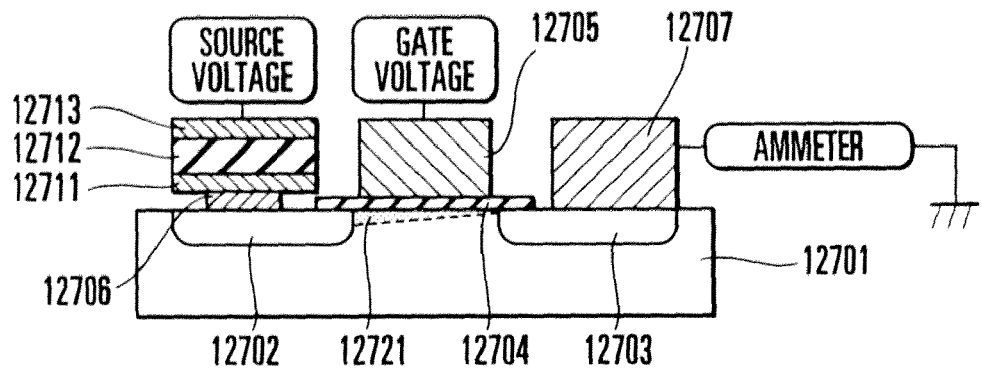
Figure 128:
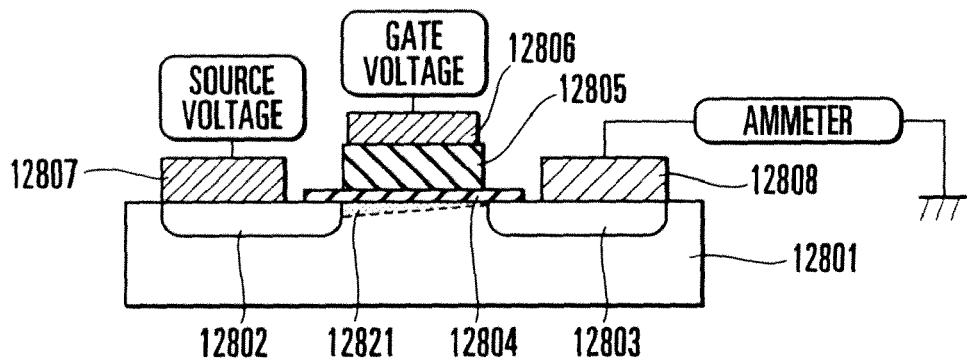
Figure 129:
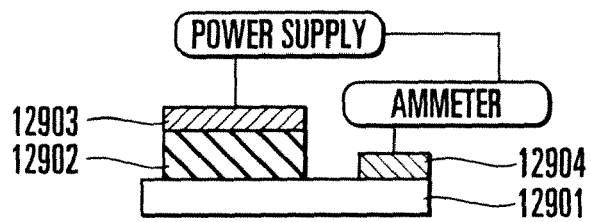

As shown in FIG. 126C, a metal film 146 made of, e.g., Au is formed on the ferroelectric layer 104 and isolation layer 135. As shown in FIG. 126D, resist patterns 150 are formed on portions as prospective elements by well-known lithography. The metal film 146 is patterned by dry etching using the resist patterns 150 as a mask to form the upper electrodes 136 on the ferroelectric layers 104, as shown in FIG. 126E. When the resist patterns 150 are removed then, the element isolation structure shown in FIG. 125 is obtained.

The substrate 101 can be made of any one of a semiconductor, insulator, and conductive material such as a metal. When the substrate 101 is made of an insulating material, the insulating layer 102 can be omitted. The lower electrode 103 and upper electrode 136 need only be made of a transition metal including noble metals such as gold (Au) and silver (Ag). The above-described electrodes may be made of a compound such as a nitride, oxide, or fluoride of a transition metal, such as titanium nitride (TiN), hafnium nitride (HfN), strontium ruthenate ($SrRuO_2$), zinc oxide (ZnO), indium tin oxide (ITO), or lanthanum fluoride ($LaF_3$) in a crystalline state, or a composite film formed by stacking them. The common electrode layer 143 may be made of a compound such as a nitride, oxide, or fluoride of a transition metal, such as hafnium nitride (HfN), strontium ruthenate ($SrRuO_2$), or lanthanum fluoride ($LaF_3$) in an amorphous state, or a composite film formed by stacking them.

FIGS. 120 and 125 show three element portions. A plurality of elements may be arrayed and integrated two-dimensionally. For example, when island-shaped metal oxide layers are arrayed on a substrate at a predetermined interval and connected by an electrode, the degree of integration can easily be increased.

The invention claimed is:

1. A metal oxide thin film comprising at least:
   a base layer formed of a material containing bismuth, titanium and oxygen with a titanium content thereof being in excess of a level given by a stoichiometric composition of $Bi_4Ti_3O_{12}$; and
   microcrystalline grains of $Bi_4Ti_3O_{12}$ dispersed in said base layer.

* * * * *

UNITED STATES PATENT AND TRADEMARK OFFICE
CERTIFICATE OF CORRECTION

| | | |
|---|---|---|
| PATENT NO. | : 7,875,872 B2 | Page 1 of 1 |
| APPLICATION NO. | : 12/712024 | |
| DATED | : January 25, 2011 | |
| INVENTOR(S) | : Jin et al. | |

It is certified that error appears in the above-identified patent and that said Letters Patent is hereby corrected as shown below:

On the Title page, in Item [30], under Foreign Application Priority Data, please insert
--07/22/2004 (JP) 214851/2004
  07/22/2004 (JP) 214858/2004
  07/22/2004 (JP) 214863/2004
  12/14/2004 (JP) 361152/2004
  12/14/2004 (JP) 361199/2004
  01/18/2005 (JP) 010202/2005
  11/02/2004 (JP) 319088/2004
  01/13/2005 (JP) 006254/2005
  03/11/2005 (JP) 068839/2005
  03/11/2005 (JP) 068853/2005
  02/28/2005 (JP) 052655/2005
  03/30/2005 (JP) 097714/2005
  03/14/2005 (JP) 070723/2005
  07/22/2004 (JP) 214849/2004
  12/09/2004 (JP) 357429/2004
03/28/2005 (JP)  091097/2005
04/08/2005 (JP)  111756/2005--.

Signed and Sealed this

Twenty-seventh Day of September, 2011

David J. Kappos
*Director of the United States Patent and Trademark Office*